United States Patent
Jeong et al.

(10) Patent No.: US 11,949,393 B2
(45) Date of Patent: Apr. 2, 2024

(54) DIVIDED ACTIVE ELECTROMAGNETIC INTERFERENCE FILTER MODULE AND MANUFACTURING METHOD THEREOF

(71) Applicants: EM CORETECH CO., LTD., Ulsan (KR); UNIST (ULSAN NATIONAL INSTITUTE OF SCIENCE AND TECHNOLOGY), Ulsan (KR)

(72) Inventors: Sang Yeong Jeong, Ulsan (KR); Jin Gook Kim, Ulsan (KR)

(73) Assignees: EM Coretech Co., Ltd., Ulsan (KR); UNIST (Ulsan National Institute of Science and Technology), Ulsan (KR)

( * ) Notice: Subject to any disclaimer, the term of this patent is extended or adjusted under 35 U.S.C. 154(b) by 203 days.

(21) Appl. No.: 17/449,038

(22) Filed: Sep. 27, 2021

(65) Prior Publication Data
US 2022/0014178 A1    Jan. 13, 2022

Related U.S. Application Data

(63) Continuation-in-part of application No. PCT/KR2020/004247, filed on Mar. 27, 2020.

(30) Foreign Application Priority Data

Mar. 28, 2019   (KR) .................. 10-2019-0036221
Apr. 17, 2019   (KR) .................. 10-2019-0045137
(Continued)

(51) Int. Cl.
*H03H 1/00*    (2006.01)
*H03H 11/04*   (2006.01)
(Continued)

(52) U.S. Cl.
CPC .......... *H03H 11/04* (2013.01); *H03H 1/0007* (2013.01); *H03H 11/126* (2013.01); *H05K 1/14* (2013.01); *H05K 2201/1006* (2013.01)

(58) Field of Classification Search
CPC ....... H03H 1/0007; H03H 11/126; H05K 1/14
See application file for complete search history.

(56) References Cited

U.S. PATENT DOCUMENTS 5,220,298  A  *  6/1993  Nagase .................. H01L 23/552
                                                       361/728
2014/0263983 A1*  9/2014  Hirokubo .................. G01J 3/26
                                                       359/578
(Continued)

FOREIGN PATENT DOCUMENTS

JP    H01-123381 U    8/1989
JP    2002-010650 A   1/2002
(Continued)

OTHER PUBLICATIONS

International Search Report and Written Opinion dated Jul. 8, 2020 in International Application No. PCT/KR2020/004247, in 9 pages. (English translation of ISR.).
(Continued)

*Primary Examiner* — Sibin Chen
(74) *Attorney, Agent, or Firm* — Knobbe, Martens, Olson & Bear, LLP

(57) ABSTRACT

This application relates to an independent active electromagnetic interference filter module. In one aspect, the filter module includes a first element group including a noise sensing unit provided to sense electromagnetic noise, and a second element group including a compensating unit provided to generate a compensation signal for the electromagnetic noise. The first group and the second group may be respectively mounted on different substrates. According to some embodiments, the filter module can reduce a volume (Continued)

of each element constituting an electromagnetic interference filter module, implement a single modularization of a compact structure. The filter module can also improve electromagnetic interference noise reduction performance and a manufacturing method thereof.

15 Claims, 79 Drawing Sheets

(30) Foreign Application Priority Data

| | | |
|---|---|---|
| May 23, 2019 | (KR) | 10-2019-0060808 |
| Sep. 19, 2019 | (KR) | 10-2019-0115476 |
| Dec. 23, 2020 | (KR) | 10-2020-0182641 |
| Dec. 23, 2020 | (KR) | 10-2020-0182642 |
| Dec. 24, 2020 | (KR) | 10-2020-0183864 |
| Feb. 24, 2021 | (KR) | 10-2021-0024761 |

(51) Int. Cl.
*H03H 11/12* (2006.01)
*H05K 1/14* (2006.01)

(56) References Cited

U.S. PATENT DOCUMENTS

| | | | | |
|---|---|---|---|---|
| 2015/0153565 | A1* | 6/2015 | Imai | G02B 7/006 361/679.01 |
| 2018/0295758 | A1* | 10/2018 | Chu | H02M 1/44 |
| 2019/0155015 | A1* | 5/2019 | Sano | G01J 3/26 |

FOREIGN PATENT DOCUMENTS

| | | |
|---|---|---|
| JP | 2005-124339 A | 5/2005 |
| JP | 2005-532027 A | 10/2005 |
| JP | 2009-105555 A | 5/2009 |
| JP | 2015-076580 A | 4/2015 |
| JP | 2018-191443 A | 11/2018 |
| KR | 10-0200117 B1 | 6/1999 |
| KR | 10-2016-0117703 A | 10/2016 |
| KR | 10-1889729 B1 | 8/2018 |
| KR | 10-1945463 B1 | 2/2019 |
| KR | 10-2019-0029420 A | 3/2019 |
| KR | 10-2019-0105849 A | 9/2019 |
| KR | 10-2071480 B1 | 3/2020 |
| KR | 10-2020-0122264 A | 10/2020 |

OTHER PUBLICATIONS

Office Action dated Nov. 23, 2022 in Korean Application No. 10-2020-0183864.
Office Action dated May 20, 2022 in Korean Application No. 10-2020-0183864.
Office Action dated May 20, 2022 in Korean Application No. 10-2020-0182641.
Office Action dated May 20, 2022 in Korean Application No. 10-2020-0182642.
Office Action dated Jan. 29, 2023 in Korean Application No. 10-2021-0024761.
International Search Report dated Dec. 14, 2021 in Application No. PCT/KR2021/007359.
"NCP1034—100V Synchronous PWM Buck Controller," Semiconductor Components Industries, LLC, downloaded from https://www.onsemi.com/download/data-sheet/pdf/ncp1034-d.pdf (Aug. 2008).

* cited by examiner

DIVIDED ACTIVE ELECTROMAGNETIC INTERFERENCE FILTER MODULE AND MANUFACTURING METHOD THEREOF

CROSS REFERENCE TO RELATED APPLICATIONS

This is a continuation-in-part application of International Patent Application No. PCT/KR2020/004247, filed on Mar. 27, 2020, which claims priority to Korean patent applications Nos. 10-2019-0036221 filed on Mar. 28, 2019, 10-2019-0045137 filed on Apr. 17, 2019, 10-2019-0060808 filed on May 23, 2019, 10-2019-0115476 filed on Sep. 19, 2019, 10-2020-0182641 filed on Dec. 23, 2020, 10-2020-0182642 filed on Dec. 23, 2020, 10-2020-0183864 filed on Dec. 24, 2020, and 10-2021-0024761 filed on Feb. 24, 2021, contents of each of which are incorporated herein by reference in their entireties.

BACKGROUND

Field

Embodiments relate to a divided active electromagnetic interference filter module and a manufacturing method thereof.

Description of the Related Technology

In general, electrical devices such as household electrical appliances, industrial electrical appliances, and electric vehicles emit noise during operation. For example, noise may be generated due to an internal switching operation of an electric device. Such noise is not only harmful to the human body, but also causes malfunction of other connected electronic devices.

Electromagnetic interference that an electronic device exerts on other devices is called EMI, and among them, noise transmitted through wires and substrate wiring is called conducted emission (CE) noise.

SUMMARY

An embodiment of the present disclosure is intended to solve the above problems and/or limitations, and to provide an independent active electromagnetic interference filter module and a manufacturing method thereof that are independent from an external environment and may reduce a volume. However, these problems are exemplary, and the scope of the present disclosure is not limited thereto.

In order to achieve the above object, one embodiment may provide an independent active electromagnetic interference filter module including a substrate including a first surface and a second surface opposite to each other, a first element group installed on at least one of the first surface or the second surface and provided to detect electromagnetic noise, a second element group installed on at least one of the first surface or the second surface and provided to generate a compensation signal for the electromagnetic noise, an encapsulation structure provided to separate the substrate, the first element group and the second element group from an outside, a first pin group exposed to an outside of the encapsulation structure and electrically connected to at least a portion of the first element group or the second element group, and a second pin group exposed to the outside of the encapsulation structure and electrically connected to at least a portion of the first element group or the second element group.

The encapsulation structure may include a space located therein, an opening connected to the space, a support provided to accommodate at least one of the substrate, the first element group and the second element group in the space, and a filling part provided to fill at least a part of the space.

At least some of the first pin group and the second pin group may be provided to be exposed to the outside of the support through the opening.

The filling part may be provided to close the opening.

The filling part may include a first filling part facing the first surface and a second filling part facing the second surface.

In order to achieve the above object, another embodiment may provide a manufacturing method of an independent active electromagnetic interference filter module including installing a first element group provided to detect an electromagnetic noise on at least one of a first surface and a second surface of a substrate including the first surface and the second surface facing each other, installing a second element group provided to generate a compensation signal for the electromagnetic noise on at least one of the first surface and the second surface, and forming an encapsulation structure separating the substrate, the first element group and the second element group from an outside and provided to expose a first pin group electrically connected to the first element group and a second pin group electrically connected to the second element group to the outside, respectively.

Forming the encapsulation structure may include preparing a support including a space located therein and an opening connected to the space, accommodating at least one of the substrate, a first element group and a second element group in the space, and forming a filling part provided to fill at least a part of the space.

Forming the encapsulation structure may further include exposing at least a portion of the first pin group and the second pin group to the outside of the support through the opening.

Forming the filling part may further include closing the opening using the filling part.

Forming the filling part may include forming a first filling part facing the first surface and forming a second filling part facing the second surface.

One embodiment may provide an independent active electromagnetic interference filter module including a substrate including a first surface and a second surface facing each other, a first element group installed on at least one of the first surface and the second surface and provided to detect an electromagnetic noise, a second element group provided to generate a compensation signal for electromagnetic noise and installed on at least one of the first surface and the second surface, an encapsulation structure provided to separate the substrate, first element group and second element group from an outside, a connection part provided to connect the first surface and the second surface and provided so as not to interfere with at least one of the first element group and the second element group, a connection body located in the connection part and connected to the encapsulation structure, and a pin group exposed to an outside of the encapsulation structure and electrically connected to at least a part of the first element group and the second element group.

The connection body may be coupled to at least a part of the encapsulation structure.

The encapsulation structure may include a space located therein, an opening connected to the space, a support provided to accommodate at least one of the substrate, the first element group and the second element group in the space, and a filling part provided to fill at least a part of the space.

The filling part may include a first filling part facing the first surface, and a second filling part facing the second surface, and the connection body may be provided to connect the first filling part and the second filling part.

Another embodiment may provide a manufacturing method of an independent active electromagnetic interference filter module including installing a first element group provided to detect electromagnetic noise on at least one of a first surface and second surface of a substrate including the first surface and second surface facing each other, installing a second element group provided to generate a compensation signal for the electromagnetic noise on at least one of the first surface and the second surface, forming a connection part provided to connect the first surface and the second surface and provided so as not to interfere with at least one of the first element group and the second element group, forming an encapsulation structure separating the substrate, the first element group and the second element group from an outside and provided so that a pin group electrically connected to at least a portion of the first element group and the second element group is exposed to the outside, and forming a connection body located in the connection part and connected to the encapsulation structure.

Forming the connection body may include coupling the connection body with at least a part of the encapsulation structure.

Forming the encapsulation structure may include preparing a support including a space located therein and an opening connected to the space, accommodating at least one of the substrate, a first element group and a second element group in the space, and forming a filling part provided to fill at least a part of the space.

Forming the filling part may include forming a first filling part facing the first surface and forming a second filling part facing the second surface, and forming the connection body may include connecting the first filling part and the second filling part with the connection body.

One embodiment may provide an independent active electromagnetic interference filter module including a substrate comprising a first surface and a second surface opposite to each other, a first element group installed on at least one of the first surface and the second surface and provided to detect electromagnetic noise, a second element group installed on at least one of the first surface and the second surface and provided to generate a compensation signal for the electromagnetic noise, a support including a space located therein and an opening connected to the space and provided to accommodate at least one of the substrate, the first element group and the second element group in the space, a filling part provided to fill at least a part of the space, and a junction connected to the support.

The independent active electromagnetic interference filter module may include a pin group exposed to the outside of the filling part and electrically connected to at least a portion of the first element group and the second element group.

The independent active electromagnetic interference filter module may further include a connection part provided to connect the first surface to a second surface and not to interfere with at least one of the first element group and the second element group, and a connection body located in the connection part and connected to the filling part.

The filling part may include a first filling part facing the first surface and a second filling part facing the second surface.

The independent active electromagnetic interference filter module further includes a connection part provided to connect with the first surface and the second surface and not to interfere with at least one of the first element group and the second element group, and a connection body located in the connection part and connected to the filling part, and the connection body may be provided to connect the first filling part and the second filling part.

Another embodiment may provide a manufacturing method of an independent active electromagnetic interference filter module including installing a first element group provided to detect electromagnetic noise on at least one of a first surface and second surface of a substrate including the first surface and second surface facing each other, providing a second element group provided to generate a compensation signal for the electromagnetic noise on at least one of the first surface and the second surface, forming a connection part provided to connect the first surface and the second surface and not to interfere with at least one of the first element group and the second element group, preparing a support including a space located therein and including an opening connected to the space, accommodating at least one of the substrate, the first element group and the second element group in the space, forming a filling part provided to fill at least a part of the space, and forming a junction connected to the support.

The manufacturing method may include exposing a pin group electrically connected to at least a portion of the first element group and the second element group to the outside of the filling part.

The manufacturing method may further include forming a connection part provided to connect the first surface with the second surface and not to interfere with at least one of the first element group and the second element group, and forming a connection body located in the connection part and connected to the filling part.

Forming the filling part may include forming a first filling part facing the first surface and forming a second filling part facing the second surface.

The manufacturing method may further include forming a connection part provided to be connected to the first surface and the second surface and not to interfere with at least one of the first element group and the second element group, and forming a connection body located in the connection part and connected to the filling part, and forming the connection body may include connecting the first filling part and the second filling part through the connection body.

One embodiment may provide a divided active electromagnetic interference filter module including a first element group including a noise sensing unit provided to sense electromagnetic noise, and a second element group including a compensating unit provided to generate a compensation signal for the electromagnetic noise, and the first group and the second group are provided to be respectively mounted on different substrates.

The divided active electromagnetic interference filter module may include a first substrate on which the first element group is mounted, a second substrate on which the second element group is mounted, and a first electrical connection part interposed between the first substrate and the second substrate and electrically connecting at least a portion of the first substrate and at least a portion of the second substrate.

The divided active electromagnetic interference filter module may include a second electrical connection part coupled to the second substrate and provided to be coupled to the first electrical connection part.

The second electrical connection part may be provided in-line along an edge of the second substrate.

The divided active electromagnetic interference filter module may further include an encapsulation structure provided to separate the second substrate and the second element group from an outside.

According to the embodiments of the present disclosure as described above, it is possible to reduce the volume of each element constituting an electromagnetic interference filter module, thereby implementing a single modularization of a compact structure, and improving the electromagnetic interference noise reduction performance.

In addition, it is possible to achieve an independent structure separated from an external environment by an encapsulation structure, thereby further improving durability.

By implementing a single modularity, it may be easily assembled and disassembled when installed in a system and/or other devices, and may exhibit very good performance for maintenance.

By selectively adding a heat dissipation function, it is possible to prevent deterioration of element properties and improve durability.

Costs may be reduced by eliminating or reducing the number of bulky common mode chokes.

The encapsulation structure may be fixed more firmly, and the durability of the encapsulation structure may be improved.

The substrate may be fixed more firmly by a junction, and thus the durability of the module may be further improved.

In order to overcome the limitations of a passive electromagnetic interference (EMI) filter, interest in an active EMI filter has emerged. The active EMI filter may remove EMI noise by detecting the EMI noise and generating a signal that cancels the noise. The active EMI filter includes an active circuit unit capable of generating an amplified signal from the detected noise signal.

However, it is difficult to identify a malfunction of the active circuit unit, with the naked eye. In addition, since the active EMI filter just performs a noise reduction function, the power system may still operate normally even when the active circuit unit is malfunctioning, and thus it is difficult to determine the malfunction of the active circuit unit from the phenomenon.

The present disclosure is designed to overcome the above problems, and the objective thereof is to provide an active current compensation device capable of detecting a malfunction. In particular, the objective of the present disclosure is to provide an active current compensation device in which an active circuit unit and a malfunction detection circuit are integrated together in one integrated circuit (IC) chip.

However, these problems are exemplary, and the scope of the present disclosure is not limited thereto.

An active circuit unit should be powered to operate in an active EMI filter. For example, an output of a switching mode power supply (SMPS) may be used as a power source for the active circuit unit. A specific voltage (e.g., 12 V) may be required in the active circuit unit, but the required voltage may not exist in an existing system. That is, the direct current (DC) voltage input to the active circuit unit varies depending on a system.

In summary, depending on the system, the SMPS may not output the specific voltage for driving the active circuit unit, and in this case, an operation of the active circuit unit becomes unstable.

The present disclosure has been made in view of the above problems, and it is an object of the present disclosure to provide an active current compensation device including a power conversion unit embedded therein.

However, these problems are exemplary, and the scope of the present disclosure is not limited thereto.

Meanwhile, in order to actually apply an active EMI filter to electronic products, it is necessary to mass-produce semiconductor devices that meet various demands. When discrete elements (or components) are used to produce an active EMI filter for actual use, in order to improve an active EMI filter function, the number of elements for an active circuit is increased and various components are required. Accordingly, the size and cost of the active EMI filter may be increased to achieve a higher function.

Thus, there is a need for an active EMI filter, which uses a customized IC that may be used in various power systems.

The present disclosure is designed to overcome the above problems, and the objective thereof is to provide an active current compensation device including an integrated circuit unit and a non-integrated circuit unit. The integrated circuit unit may be one chip including essential components of the active current compensation device, and the non-integrated circuit unit may be a configuration to implement an active EMI filter of various designs.

The active EMI filter may include, for example, bipolar junction transistors (BJTs). However, when a current flows through the BJT and heat is generated, there is an effect of increasing a current gain of the BJT (or an effect of reducing an internal resistance of the BJT). Then, positive feedback, in which heat is further generated due to the increased current, occurs. Due to the positive feedback, the heat may continue to increase, resulting in a problem that the BJT is damaged or loses its original properties. This phenomenon is referred to as a thermal runaway phenomenon.

The thermal runaway problem should be solved when configuring an amplification unit of the active EMI filter using BJTs.

The present disclosure has been made in view of the above problems, and it is an object of the present disclosure to provide an active current compensation device including a one-chip IC.

However, these problems are exemplary, and the scope of the present disclosure is not limited thereto.

Additional aspects will be set forth in part in the description which follows and, in part, will be apparent from the description, or may be learned by practice of the presented embodiments of the disclosure.

According to an embodiment of the present disclosure, an active current compensation device which actively compensates for a noise occurring in a common mode in each of two or more high-current paths, includes a sensing unit configured to generate an output signal corresponding to a common-mode noise current on the high-current paths, an amplification unit configured to amplify the output signal to generate an amplified current, a compensation unit configured to generate a compensation current on the basis of the amplified current and allow the compensation current to flow to each of the two or more high-current paths, and a malfunction detection unit configured to detect a malfunction of the amplification unit, wherein the malfunction detection unit and at least a portion of the amplification unit may be embedded in one integrated circuit (IC) chip.

According to an embodiment, signals at two nodes included in the amplification unit may be differentially input to the malfunction detection unit.

According to an embodiment, the amplification unit may include a first transistor and a second transistor, and one node of the first transistor and one node of the second transistor may be respectively connected to input terminals of the malfunction detection unit.

According to an embodiment, the malfunction detection unit may detect a differential direct current (DC) voltage at two nodes included in the amplification unit, and detect whether the differential DC voltage is in a predetermined range.

According to an embodiment, the IC chip may include a terminal to be connected to a power supply, which is configured to supply power to the amplification unit and the malfunction detection unit, a terminal to be connected to a reference potential of the amplification unit and the malfunction detection unit, and an output terminal of the malfunction detection unit.

According to an embodiment, the IC chip may include a terminal to be connected to a switch for selectively supplying power to the malfunction detection unit.

Other aspects, features and advantages other than those described above will become apparent from the following drawings, claims, and detailed description of the disclosure.

According to an embodiment of the present disclosure, an active current compensation device which actively compensates for a noise occurring in a common mode in each of two or more high-current paths, includes a sensing unit configured to generate an output signal corresponding to a common-mode noise current on the high-current paths, a power management unit configured to receive a first voltage from a power supply for supplying power and convert the first voltage into a second voltage of a specified magnitude, an amplification unit driven by the second voltage and configured to amplify the output signal to generate an amplified current, and a compensation unit configured to generate a compensation current on the basis of the amplified current and allow the compensation current to flow to each of the two or more high-current paths, wherein active elements included in the amplification unit and active elements included in the power management unit may be embedded in one integrated circuit (IC) chip.

According to an embodiment, the power management unit may include a power conversion unit configured to generate a switching signal for outputting the second voltage of a constant magnitude from the first voltage of any magnitude, a feedback unit configured to transmit a voltage signal output from the power conversion unit back to the power conversion unit so that the power management unit outputs the second voltage of a constant magnitude, and a filter unit configured to pass only a direct current (DC) component of the voltage signal.

According to an embodiment, the power conversion unit may be embedded in the one-chip IC, and the filter unit and at least a portion of the feedback unit may be commercial discrete elements disposed outside the one-chip IC.

According to an embodiment, the power conversion unit may include a regulator configured to generate a DC low voltage for driving an internal circuit of the power conversion unit.

According to an embodiment, the power conversion unit may include a pulse width modulation circuit configured to generate the switching signal using the DC low voltage provided from the regulator, and a first switch and a second switch that are selectively turned on according to the switching signal.

According to an embodiment, a high current supplied by a second device may be transmitted to a first device through the two or more high-current paths, and the power supply may be a power supply device of the first device or the second device.

According to an embodiment of the present disclosure, an active current compensation device which actively compensates for a noise occurring in a common mode in each of two or more high-current paths, includes two or more high-current paths through which power supplied by a second device is transmitted to a first device, a sensing unit configured to generate an output signal corresponding to a common-mode noise current on the high-current paths, an amplification unit configured to amplify the output signal to generate an amplified current, and a compensation unit configured to generate a compensation current on the basis of the amplified current and allow the compensation current to flow to each of the two or more high-current paths, wherein the amplification unit may include a non-integrated circuit unit and a one-chip integrated circuit unit, the non-integrated circuit unit may be designed according to a power system of at least one of the first device and the second device, and the one-chip integrated circuit unit may be independent of power rating specifications of the first device and the second device.

According to an embodiment, the non-integrated circuit unit may be designed according to power rating of the first device.

According to an embodiment, the one-chip integrated circuit unit may include a first transistor, a second transistor, and one or more resistors.

According to an embodiment, the non-integrated circuit unit may include a first impedance (Z1) connecting an emitter node side of each of the first transistor and the second transistor to an input terminal of the compensation unit, and a second impedance (Z2) connecting a base node side of each of the first transistor and the second transistor to an input terminal of the compensation unit.

According to an embodiment, the sensing unit may include a sensing transformer, the compensation unit may include a compensation transformer, a value of the first impedance or the second impedance may be determined on the basis of a turns ratio of each of the sensing transformer and the compensation transformer and a target current gain of the amplification unit, and a configuration of the one-chip integrated circuit unit may be independent of the turns ratio and the target current gain.

According to an embodiment, the one-chip integrated circuit unit may be used for the first device of various power systems depending on a design of the first impedance and the second impedance.

According to an embodiment of the present disclosure, an active current compensation device which actively compensates for a noise occurring in a common mode in each of two or more high-current paths, includes a sensing unit configured to generate an output signal corresponding to a common-mode noise current on the high-current paths, an amplification unit configured to amplify the output signal to generate an amplified current, and a compensation unit configured to generate a compensation current on the basis of the amplified current and allow the compensation current to flow to each of the two or more high-current paths, wherein the amplification unit may include a non-integrated circuit unit and a one-chip integrated circuit, active elements whose element characteristics change according to a change in temperature may be embedded in the one-chip integrated circuit, and the one-chip integrated circuit may be designed so that the amplification unit maintains a performance in a certain range even when a temperature changes.

According to an embodiment, an npn bipolar junction transistor (BJT) and a pnp BJT may be embedded in the one-chip integrated circuit, and a diode may be connected between a base node of the npn BJT and a base node of the pnp BJT.

According to an embodiment, a resistor may be connected between an emitter node of the npn BJT and an emitter node of the pnp BJT.

According to an embodiment, the diode may serve to reduce an emitter current flowing through the resistor.

According to an embodiment, the diode and the resistor may adjust a direct current (DC) bias current of each of the npn BJT and the pnp BJT.

According to an embodiment, an emitter current flowing through the resistor may be maintained in a predetermined range in response to a change in temperature.

Other aspects, features and advantages other than those described above will become apparent from the following drawings, claims, and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
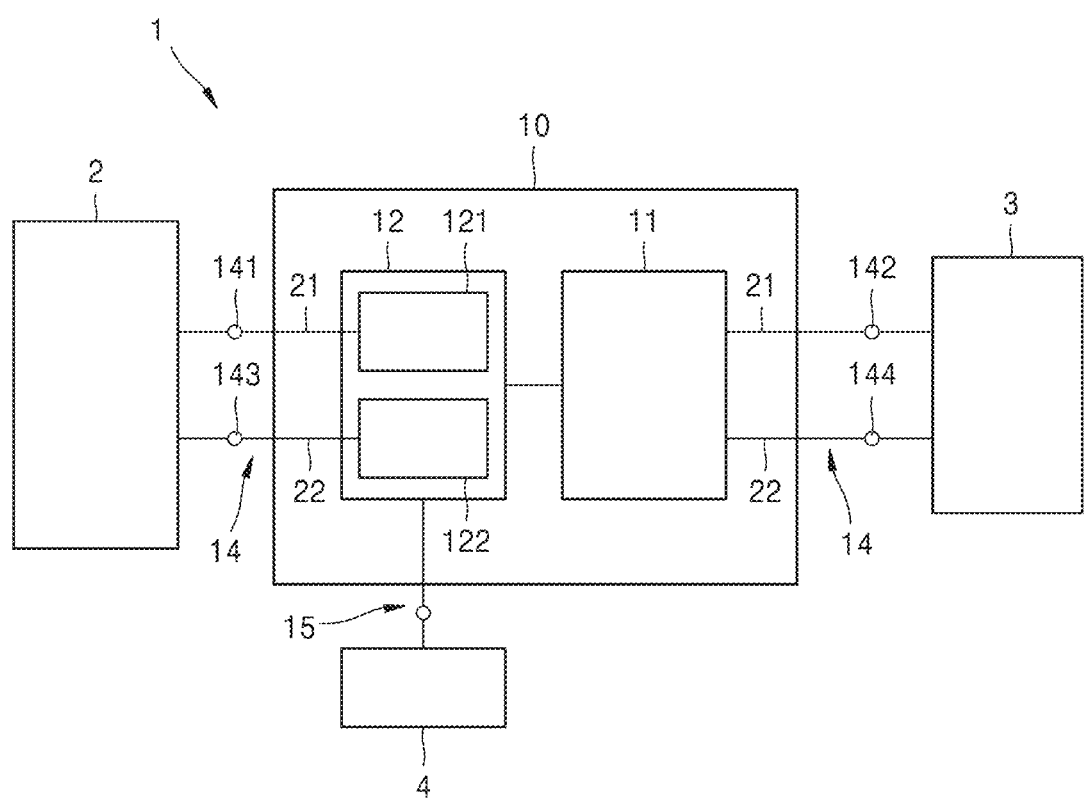
FIG. 1 is a block diagram of an independent active electromagnetic interference filter module according to an embodiment.

In order for electronic devices to operate without causing malfunctions in peripheral components and other devices, the amount of electromagnetic interference noise emission from all electronic products is strictly regulated. Therefore, most electronic products necessarily include an electromagnetic wave noise reduction device such as an electromagnetic interference filter reducing electromagnetic interference noise in order to satisfy the regulation on the amount of noise emission.

For example, a current compensation device is essentially included in white goods such as air conditioners, electric vehicles, aviation, energy storage systems (ESSs), and the like. A conventional current compensation device uses a common mode choke (CM choke) to reduce common mode (CM) noise among conducted emission (CE) noise.

However, in the case of common mode (CM) chokes, there is a problem in that noise reduction performance in high power/high current systems drops sharply due to magnetic saturation, and there is a problem in that the size and price of the electromagnetic interference filter are greatly increased when the size or number of common mode chokes is increased in order to maintain noise reduction performance.

In addition, since the conventional electromagnetic interference filter is bulky and has a structure in which the devices are exposed to an external environment as they are, when used in a system placed in an external environment, the devices may be easily deteriorated from external impacts or environmental influences, this may greatly affect the characteristics of the filter.

While the present disclosure is susceptible to various modifications and alternative embodiments, specific embodiments thereof are shown by way of example in the drawings and will herein be described in detail. Advantages and features of the present disclosure and a method of achieving the same should become clear with embodiments described in detail below with reference to the drawings. However, the present disclosure is not limited to the embodiments disclosed below, but may be implemented in various forms.

Hereinafter, the embodiments of the present disclosure will be described below in detail with reference to the accompanying drawings, and when the embodiments of the present disclosure are described with reference to the drawings, the same or corresponding components are given the same reference numerals, and repetitive descriptions thereof will be omitted.

In the following embodiments, singular forms are intended to include plural forms as well, unless the context clearly indicates otherwise.

In the following embodiments, the terms such as "including," "having," and "comprising" are intended to indicate the existence of features or components disclosed in the specification, and are not intended to preclude the possibility that one or more other features or components may be added.

In the following embodiments, the expression that a part of a film, region, component, etc. is on or on another part does not only mean that it is directly on the other part, but also mean that another film, region, component, etc. is interposed therebetween.

In cases where certain embodiments may be implemented otherwise, a specific process sequence may be performed different from the described sequence. For example, two processes described in succession may be performed substantially simultaneously, or may be performed in an order opposite to the order described.

In the drawings, the size of the components may be exaggerated or reduced for convenience of description. For example, since the size and thickness of each component shown in the drawings are arbitrarily indicated for convenience of description, the following embodiment is not necessarily limited to the illustrated bar.

FIG. 1 is a block diagram of an electromagnetic interference filter module according to an embodiment.

An independent active electromagnetic interference filter module 1 according to an embodiment may include a substrate 10, a first element group 11, a second element group 12, a pin group installed on the substrate 10.

The substrate 10 may be an insulating and/or conductive substrate having conductive pattern formed on at least one surface of the substrate, and according to an embodiment, it may be a printed circuit board provided in a flat plate shape. The substrate 10 may be a rigid or flexible printed circuit board.

A first through line 21 and a second through line 22 pass through the substrate 10. The first through line 21 and the second through line 22 may be electrically connected to a power line, the first through line 21 may be electrically connected to a live line L, and the second through line 22 may be electrically connected to a neutral line N.

According to an embodiment, the first through line 21 and the second through line 22 may be conductive patterns formed to electrically pass through the substrate 10 from one end to the other end, respectively. The conductive pattern is not necessarily limited to extending in a straight line, and may extend in a complex path.

The first through line 21 and the second through line 22, which are the power lines as described above, may be electrically connected to the pin group, specifically, may be electrically connected to a first pin group 14. According to an embodiment, the first pin group 14 may include a 1-1 th pin 141 to a 1-4 th pin 144.

The 1-1 th pin 141 may be electrically connected to one end of the first through line 21, and the 1-2 th pin 142 may be electrically connected to the other end of the first through line 21.

The 1-3 th pin 143 may be electrically connected to one end of the second through line 22, and the 1-4 th pin 144 may be electrically connected to the other end of the second through line 22.

According to an embodiment, the 1-1 th pin 141 and the 1-3 th pin 143 may be electrically connected to a first device 2 positioned outside the independent active electromagnetic interference filter module 1.

The first device 2 may be various types of devices for supplying power in the form of current and/or voltage to the independent active electromagnetic interference filter module 1. For example, the first device 2 may be a device that generates and supplies power, or a device that supplies power generated by another device (e.g., a charging device for an electric vehicle). Of course, the first device 2 may be a device that supplies stored energy. However, this is an example, and the spirit of the present disclosure is not limited thereto.

According to an embodiment, the 1-2 th pin 142 and 1-4 th pin 144 may be electrically connected to a second device 3 positioned outside the independent active electromagnetic interference filter module 1.

The second device 3 may be various types of devices and/or loads using power supplied by the first device 2. The second device 3 may be a load driven using power supplied by the first device 2. The second device 3 may be a load (e.g., at least one component of an electric vehicle) that stores energy using the power supplied by the first device 2 and is driven using the stored energy. However, this is an example, and the spirit of the present disclosure is not limited thereto.

Each of the first through line 21 and the second through line 22 may be a path through which electromagnetic noise generated in the second device 3 is transmitted to the first device 2. In this case, the electromagnetic noise may be input to each of the first through line 21 and the second through line 22 in a common mode.

The first element group 11 may include at least one element electrically connected to the first through line 21 and the second through line 22. According to an embodiment, the first element group 11 may include an element provided to sense electromagnetic noise generated from the second device 3.

The second element group 12 may include at least one element electrically connected to the first element group 11, the first through line 21 and the second through line 22.

According to an embodiment, the second element group 12 may include an active circuit unit 121 and a compensating unit 122.

According to an embodiment, the active circuit unit 121 may serve as an amplifier, and may amplify a current corresponding to the electromagnetic noise sensed by the first element group 11 at a predetermined rate.

According to an embodiment, the active circuit unit 121 may compensate for noise by generating an amplified current equal in magnitude to and out of phase with the current corresponding to electromagnetic noise and flowing it to the first through line 141 and/or the second through line 142 through the compensating unit 122.

That is, the current amplified through the active circuit unit 121 flows to the compensating unit 122, and the compensating unit 122 causes compensating current to flow through the first through line 141 and/or the second through line 142.

A more specific embodiment constituting the active circuit unit 121 and the compensating unit 122 will be described later.

Meanwhile, the first element group 11 and/or the second element group 12 may be electrically connected to a third device 4.

The third device 4 may be electrically connected to a pin group protruding to the outside of the substrate 10. Specifically, the third device 4 may be electrically connected to the first element group 11 and/or the second element group 12 through a second pin group 15.

According to an embodiment, the third device 4 may include a device that provides power to the active circuit unit 121. For example, the third device 4 may include a device generating input power of the active circuit unit 121, and the input power may include direct current power.

The second pin group 15 may include pins not directly connected to first through line 141 and/or second through line 142, which are power lines, and may include pins electrically connected to the third device 4 and used for grounding as described above. Specific examples will be described later.

Figure 2:
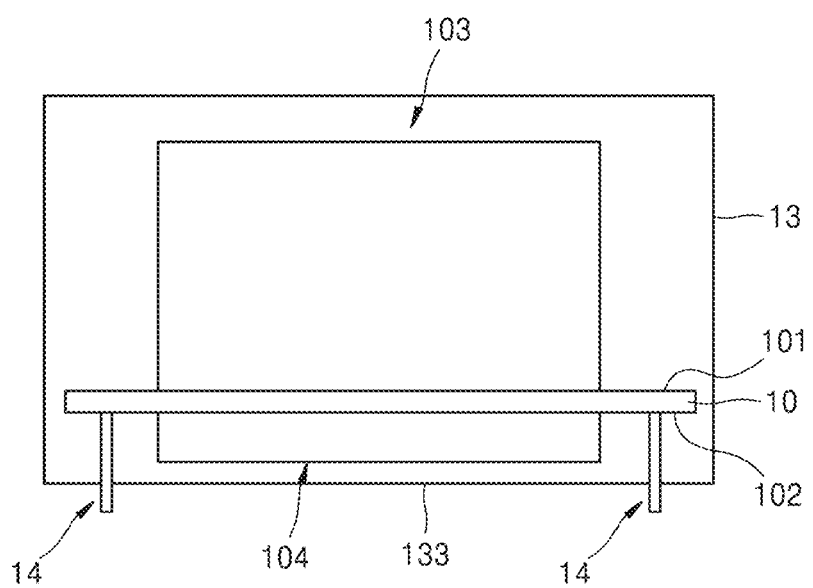
FIG. 2 schematically illustrates a cross-section according to an embodiment of the independent active electromagnetic interference filter module of FIG. 1.

FIG. 2 schematically illustrates a cross-section according to an embodiment of the independent active electromagnetic interference filter module 1.

An independent active electromagnetic interference filter module 1 according to an embodiment as shown in FIG. 2 may include a substrate 10 having a first surface 101 and a second surface 102 facing each other. The first surface 101 and the second surface 102 may include conductive patterns, and at least some of the conductive patterns of the first surface 101 and the second surface 102 may be electrically connected to each other.

A third element group 103 may be installed on the first surface 101 of the substrate 10 and a fourth element group 104 may be installed on the second surface 102. The third element group 103 and the fourth element group 104 may each include at least one element, and at least some of them may be electrically connected to each other.

According to an embodiment, at least some of the elements belonging to the third element group 103 may have a larger volume than at least some of the elements belonging to the fourth element group 104. The third element group 103 may have a larger volume than the fourth element group 104 as a whole. Accordingly, it is possible to give stability to the module design, and in particular, it is possible to further increase the insulation properties by an encapsulation structure 13 of the bulky third element group 103.

According to an embodiment, the third element group 103 may include the first element group 11 and/or the compensating unit 122 illustrated in FIG. 1.

According to another embodiment, the fourth element group 104 may include the active circuit unit 121 illustrated in FIG. 1.

The first pin group 14 and the second pin group 15 described above may be installed to protrude in a direction perpendicular to one surface of the substrate 10, and according to an embodiment, may be installed to protrude from the second surface 102 of the substrate 10. The first pin group 14 and the second pin group 15 are preferably installed on the surface on which the fourth element group 104 having a relatively small volume is installed, and accordingly, the protrusion length of each pin may be reduced.

According to one embodiment, at least one of the substrate 10, the third element group 103 and the fourth element group 104 may be separated from an outside by the encapsulation structure 13. The encapsulation structure 13 may include various insulating encapsulation structures capable of separating at least one of the substrate 10, the third element group 103 and the fourth element group from the outside, and may be formed of an insulating material.

In FIG. 2, the encapsulation structure 13 is provided to seal all of the substrate 10, the third element group 103 and the fourth element group 104, but the present disclosure is not limited thereto, and may include a structure for sealing a part of the third element group 103 and a part of the substrate 10 or the fourth element group 104 and the substrate 10, respectively.

The first pin group 14 and the second pin group 15 may be formed to protrude so that their ends are exposed to the outside of the encapsulation structure 13, respectively. As illustrated in FIG. 2, the first pin group 14 and the second pin group 15 may protrude directly, but the present invention is not limited thereto, and separate terminals electrically connected to the first pin group 14 and the second pin group 15 may be exposed.

Figure 3:
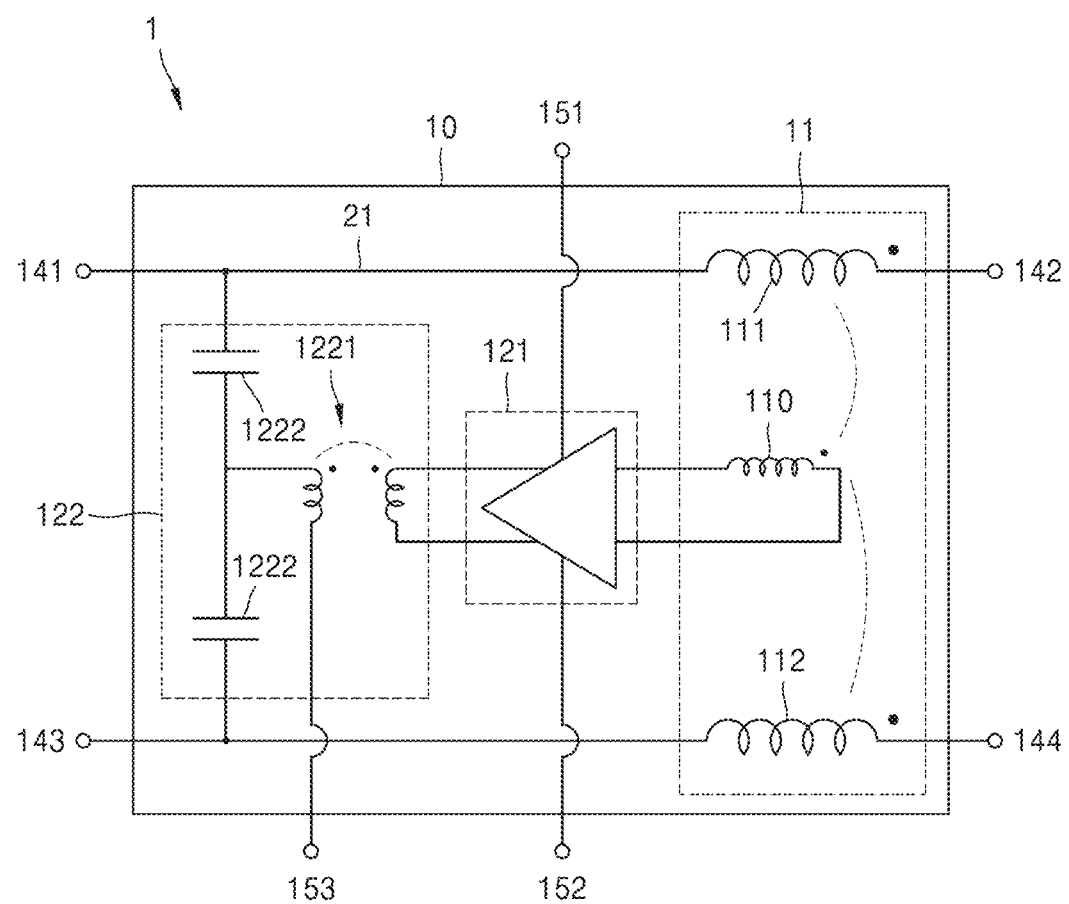
FIG. 3 is a diagram illustrating a more detailed configuration of an independent active electromagnetic interference filter module according to an embodiment.

FIG. 3 illustrates a more specific example of the first element group 11 and the second element group 12 according to an embodiment.

According to an embodiment, a first through line 21 and a second through line 22 may be designed to pass through a substrate 10.

Both ends of first through line 21 are connected to 1-1 th pin 141 and 1-2 th pin 142. And both ends of the second through line 22 are connected to 1-3 th pin 143 and 1-4 th pin 144.

According to an embodiment, the first element group 11 may include a sensing transformer capable of sensing noise.

The sensing transformer may include a first reference winding 111 and a second reference winding 112 electrically connected to the first through line 21 and the second through line 22 which are power lines, respectively, and a sensing winding 110 formed in the same core as the first and second reference windings 111 and 112.

The first reference winding 111 and the second reference winding 112 may be a primary winding connected to the power line, and the sensing winding 110 may be a secondary winding.

Each of the first reference winding 111 and the second reference winding 112 may be in the form of a winding wound around the core, but is not limited thereto, and may have a structure in which at least one of the first reference winding 111 and the second reference winding 112 passes through the core.

The sensing winding 110 may have a structure in which the core on which the first reference winding 111 and the second reference winding 112 are wound or passed is wound at least once or more.

This sensing winding 110 may be electrically insulated from the primary winding which is the power line, and may sense a noise current generated by the second device 3, and may induce a current converted from the noise current at a certain rate.

The primary winding and secondary winding may be wound in consideration of the direction of generation of magnetic flux and/or magnetic flux density.

For example, as a first current, which is noise, is input to the first reference winding 111, a first magnetic flux density may be induced in the core. Similarly, as the first current is input to the second reference winding 112, a second magnetic flux density may be induced in the core.

A first induced current may be induced in the sensing winding 110, which is secondary side, by the induced first and second magnetic flux densities.

At this time, the sensing transformer is configured such that the first magnetic flux density and the second magnetic flux density induced by the first current may overlap (or reinforce each other), thus may generate the first induced current corresponding to the first current in the secondary side (i.e., sensing winding 110) insulated from the first through line 21 and the second through line 22.

Meanwhile, the number of first reference winding 111, second reference winding 112 and sensing winding 110 wound around the core may be appropriately determined according to the requirements of the system in which the independent active electromagnetic interference filter module 1 is used.

For example, a turns ratio of primary winding as first reference winding 111 and second reference winding 112 and secondary winding as sensing winding 110 may be 1:Nsen. Also, if a self-inductance of the primary winding of the sensing transformer is Lsen, the secondary winding may have a self-inductance of Nsen2·Lsen. The primary winding and secondary winding of the sensing transformer 120 may be coupled by a coupling coefficient of ksen.

Meanwhile, the above-described sensing transformer may be configured such that a magnetic flux density induced by a second current that is a normal current flowing through each of the first through line 21 and the second through line 22 satisfies a predetermined magnetic flux density condition.

That is, a third magnetic flux density and a fourth magnetic flux density may be induced in the core by the second current flowing in the first reference winding 111 and second reference winding 112, respectively. At this time, the third magnetic flux density and the fourth magnetic flux density may be a condition that cancels each other.

In other words, the sensing transformer may cause a second induced current induced in the sensing winding 120 as the secondary side by the second current being the normal current flowing through the first through line 21 and the second through line 22 respectively to be less than a predetermined threshold magnitude, and the sensing transformer is configured such that the magnetic flux densities being induced by the second current cancel each other, so that only the above-described first current may be sensed.

The sensing transformer may be configured such that the size of the first and second magnetic flux densities induced by the first current which is a noise current in a first frequency band (e.g., a band having a range of 150 KHz to 30 MHz) is greater than the size of the third and fourth magnetic flux densities induced by the second current that is the normal current of a second frequency band (e.g., a band of 50 Hz to 60 Hz).

In the present disclosure, 'component A is configured to do B' may mean that a design parameter of component A is set to be appropriate for B. For example, 'the sensing transformer is configured so that the magnitude of the magnetic flux induced by the current in a specific frequency band is large' may mean that the parameters such as the size of the sensing transformer, the diameter of the core, the number of turns, the magnitude of the inductance, and the magnitude of the mutual inductance are appropriately set so that the magnitude of the magnetic flux induced by the current in the specific frequency band becomes strong.

The sensing winding 110, which is the secondary side of the sensing transformer, may be disposed on a path connecting an input terminal of the active circuit unit 121 and a reference potential of the active circuit unit 121 as illustrated in FIG. 3 to supply the first induced current to the active circuit unit 121.

According to an embodiment, the active circuit unit 121 may be a means for generating the amplified current by amplifying the first induced current generated by the sensing transformer.

According to an embodiment, the sensing winding 110 may be differentially connected to the input terminal of the active circuit unit 121.

In the present disclosure, amplification by the active circuit unit 121 may mean adjusting the size and/or phase of the amplification target. For example, the active circuit unit 121 may change the phase of the first induced current by 180 degrees and increase the magnitude by k times (k>=1) to generate the amplified current.

The active circuit unit 121 may be designed to generate the amplified current in consideration of the above-described transformation ratio of the sensing transformer and a transformation ratio of a compensation transformer 1221 to be described later. For example, when the sensing transformer of the first element group 11 converts the first current which is noise current into the first induced current with magnitude 1/F1 times, and the compensation transformer 1221 converts the amplified current into the compensating current with magnitude 1/F2 times, the active circuit unit 121 may generate the amplified current with magnitude F1×F2 times magnitude of first induced current.

In this case, the active circuit unit 121 may generate the amplified current so that the phase of the amplified current is opposite to the phase of the first induced current.

The active circuit unit 121 may be implemented by various means, and according to an embodiment, the active circuit unit 121 may include an OP AMP. According to another embodiment, the active circuit unit 121 may include a plurality of passive elements such as resistors and capacitors in addition to an OP AMP. Further, according to another embodiment, the active circuit unit 121 may include a bipolar junction transistor (BJT) and/or a plurality of passive elements such as resistors and capacitors. However, the present disclosure is not necessarily limited thereto, and the means for amplification described in the present disclosure may be used without limitation as the active circuit unit 121 of the present disclosure.

The active circuit unit 121 may receive power from the separate third device 4 separate from the first device 2 and/or the second device 3 and amplify the first induced current to generate the amplified current. In this case, the third device 4 may be a device that receives power from a power source independent of the first device 2 and the second device 3 and generates input power of the active circuit unit 121. In addition, the third device 4 may be a device that receives power from any one of the first device 2 and the second device 3 and generates input power of the active circuit unit 121. The active circuit unit 121 may be electrically connected to the third device 4 through a 2-1 th pin 151 coupled to the substrate 10.

The amplified current flows through the compensating unit 122 to the first through line 141 and/or the second through line 142 to compensate for noise.

According to an embodiment, the compensating unit 122 may include the compensation transformer 1221 and a compensation capacitor 1222.

The compensation transformer 1221 may include a primary winding located at an output of the active circuit unit 121 and a secondary winding electrically connected to the compensation capacitor 1222. The secondary winding of compensation transformer 1221 is interposed on compensation capacitor 1222 and electrically connected to first through line 21 and second through line 22 which are the power lines. Accordingly, the active circuit unit 121 may be electrically insulated from the power line, and thus the active circuit unit 121 may be protected.

The compensation transformer 1221 may be a means for generating the compensating current on the first through line 21 and second through line 22 side (or on a secondary side to be described later) based on the amplified current in a state insulated or isolated from the first through line 21 and the second through line 22 described above.

More specifically, the compensation transformer 1221 may generate the compensating current on the secondary side based on the magnetic flux density induced by the amplified current generated by the active circuit unit 121 on the primary side disposed on the path connecting the output terminal of the active circuit unit 121 and the reference potential of the active circuit unit 121. The reference potential (second reference potential) of the active circuit unit 121 may be grounded through a 2-2 th pin 152.

In this case, the secondary side may be disposed on a path connecting a reference potential of the compensation capacitor 1222 and the independent active electromagnetic interference filter module 1 to be described later. The reference potential (first reference potential) of the independent active electromagnetic interference filter module 1 may be grounded through a 2-3 th pin 153.

In this way, the compensation transformer 1221 may transmit the amplified current generated by the active circuit unit 121 to first through line 21 and second through line 22 in a state insulated or isolated from first through line 21 and second through line 22.

Meanwhile, according to another embodiment, the primary side of the compensation transformer 1221, the active circuit unit 121 and the sensing winding 110 may be connected to a reference potential (second reference potential) distinct from the rest of the components of the independent active electromagnetic interference filter module 1.

That is, the reference potential (second reference potential) of the active circuit unit 121 and the reference potential (first reference potential) of the independent active electromagnetic interference filter module 1 may be different potentials.

As such, according to an embodiment of the present disclosure, the component generating the compensating current may be operated in a state in which the component generating the compensating current insulated by using a different reference potential and a separate power source from the other components, so that the reliability of the independent active electromagnetic interference filter module 1 may be improved.

As described above, the compensation transformer 1221 may convert the current that is amplified by the active circuit unit 121 and flows through the primary side of the compensation transformer 1221 at a certain rate and induce it to the secondary side of the compensation transformer 1221.

For example, in the compensation transformer 1221, the turns ratio of the primary side and the secondary side may be 1:Ninj. Also, if a self-inductance of the primary side of the compensation transformer 1221 is Linj, the secondary side of the compensation transformer may have a self-inductance of Ninj2·Linj. The primary side and the secondary side of compensation transformer 1221 may be coupled by a coupling coefficient of kinj. Current converted through compensation transformer 1221 may be injected as compensating current Icomp into first through line 21 and second through line 22 which are power lines through compensation capacitor 1222.

The compensation capacitor 1222 may be a means for providing a path through which the current generated by the compensation transformer 1221 flows to first through line 21 and second through line 22, respectively.

The compensation capacitor 1222 may include at least two compensation capacitors connecting the reference potential (first reference potential) of the independent active electromagnetic interference filter module 1 to each of the first through line 21 and the second through line 22. Each compensation capacitor may include a Y-capacitor (Y-cap). One end of each compensation capacitor shares a node connected to the secondary side of the compensation transformer 1221, and the other end may each have a node connected to the first through line 21 and the second through line 22.

The compensation capacitor 1222 may be configured such that the current flowing between first through line 21 and second through line 22 satisfies a first predetermined condition through the at least two compensation capacitors. In this case, the first predetermined condition may be a condition in which the magnitude of the current is less than a first predetermined threshold.

Also, the compensation capacitor 1222 may be configured such that the current flowing between each of the first through line 21 and the second through line 22 and the reference potential (first reference potential) of the independent active electromagnetic interference filter module 1 satisfies a second predetermined condition through at least two compensation capacitors. In this case, the second predetermined condition may be a condition in which the magnitude of the current is less than a second predetermined threshold.

The compensating current flowing through compensation capacitor 1222 into first through line 21 and second through line 22, respectively cancels the first current on first through line 21 and second through line 22, so that the first current may be prevented from being transmitted to the above-described second device 2. In this case, the first current and the compensating current may be currents having the same magnitude and opposite phases.

Accordingly, the independent active electromagnetic interference filter module 1 according to an embodiment of the present disclosure actively compensates the first current which is the noise current input in common mode to the first through line 21 and the second through line 22 which are at least two high-current paths connected to the first device 2, respectively to suppress the noise current emitted to the first device 2. In this way, malfunction or damage of other devices connected to the second device 3 and/or the first device 2 may be prevented.

In the above structure, the second pin group 15 may include the 2-1 th pin 151, the 2-2 th pin 152 and the 2-3 th pin 153. The 2-1 th pin 151 may electrically connect the active circuit unit 121 to the third device 4. The 2-2 th pin 152 may be electrically connected to the reference potential (second reference potential) of the active circuit unit 121, and the 2-3 th pin 153 may be electrically connected to the reference potential (first reference potential) of the independent active electromagnetic interference filter module 1. According to an embodiment, the 2-2 th pin 152 and the 2-3 th pin 153 may be grounded.

The independent active electromagnetic interference filter module 1 illustrated in FIG. 3 represents an independent active electromagnetic interference filter module of the current-sensing current-compensation (CSCC) type that senses a current and compensates for the current. In particular, the independent active electromagnetic interference filter module 1 of FIG. 3 may be a feedforward type compensation filter compensating for the noise input from the second device 3 in the front stage that is the power supply. That is, in the independent active electromagnetic interference filter module 1, first element group 11, which is the sensing transformer, may be disposed on the electromagnetic interference source side, and compensation capacitor 1222 may be disposed on the power supply side. In addition, the independent active electromagnetic interference filter module 1 may realize an isolated structure by using compensation transformer 1221 in spite of compensating with current using compensation capacitor 1222, and/or by using the first element group 11 which is the sensing transformer. That is, the independent active electromagnetic interference filter module 1 according to an embodiment of the present disclosure may have an insulated feedforward current-sensing current-compensation structure.

As described above, in the independent active electromagnetic interference filter module 1, the compensating current Icomp may have the same magnitude as the noise current In and may be out of phase. That is, the active circuit unit 121, the first element group 11 and the compensation transformer 1221 may be designed to have a current gain ratio representing compensating current Icomp to noise current In input to the independent active electromagnetic interference filter module 1 of −1. Through this, the independent active electromagnetic interference filter module 1 capable of reducing electromagnetic interference noise by canceling the noise current In generated from the electromagnetic interference source may be provided.

An independent active electromagnetic interference filter module 1 according to another embodiment of the present disclosure may not include a common mode (CM) choke. Since the common mode choke functions as a passive filter, it must have a very large inductance to prevent leakage of noise current. Therefore, in the case of a common mode choke, the number of windings increases and the size of the core is also very large. Unlike this common mode choke, the first element group 11 which is the sensing transformer included in the independent active electromagnetic interference filter module 1 according to an embodiment of the present disclosure does not need to have a large impedance because it is intended to sense noise current. The sensing transformer may have an impedance of one thousandth to one hundredth of the impedance of the common mode choke. Therefore, the size of the sensing transformer may be much smaller than that of the common mode choke. The independent active electromagnetic interference filter module 1 according to an embodiment of the present disclosure may operate independently without parasitic to the common mode choke. Accordingly, the independent active electromagnetic interference filter module may be manufactured by reducing the size and weight in a module form corresponding to the size of the substrate 10, and through this, sealing by the encapsulation structure 13 may be made simple.

The present disclosure is not necessarily limited thereto, and according to other embodiments, the independent active electromagnetic interference filter module 1 may operate in combination with an independent external common mode choke.

Figure 4:
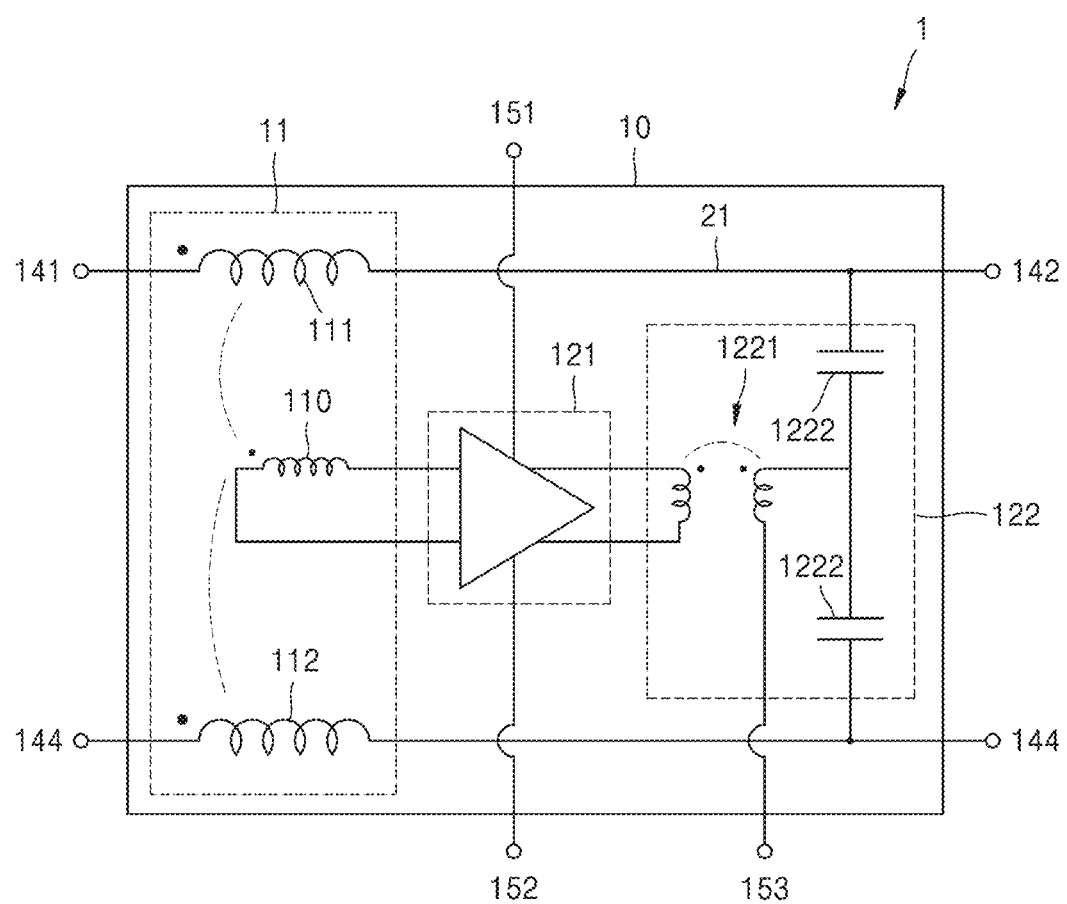
FIG. 4 is a view illustrating a more detailed configuration of an independent active electromagnetic interference filter module according to another embodiment.

FIG. 4 illustrates a more specific example of a first element group 11 and a second element group 12 according to another embodiment.

Referring to FIG. 4, an independent active electromagnetic interference filter module 1 according to another embodiment may include a first element group 11 and a second element group 12 which are installed on a substrate 10, wherein a first through line 21 and a second through line 22 may pass through the substrate 10.

In the embodiment illustrated in FIG. 4, unlike the embodiment illustrated in FIG. 3, the first element group 11 is electrically connected to a 1-1 th pin 141 and a 1-3 th pin 143 of a first device 2 which is the power supply side. And the second element group 12 is electrically connected to a 1-2 th pin 142 and a 1-4 th pin 144 of a second device 3. Therefore, the embodiment illustrated in FIG. 4 illustrates a current-sensing current-compensation active electromagnetic interference filter of a feedback type that senses a noise current flowing out to the first device 2 and compensates with a current in the second device 3.

The first element group 11 which is the sensing transformer illustrated in FIG. 4, an active circuit unit 121, a compensation transformer 1221 and a compensation capacitor 1222 may perform the same functions as the elements illustrated in FIG. 3, respectively. In addition, the independent active electromagnetic interference filter module 1 illustrated in FIG. 4 may also realize an isolated structure.

Figure 5:
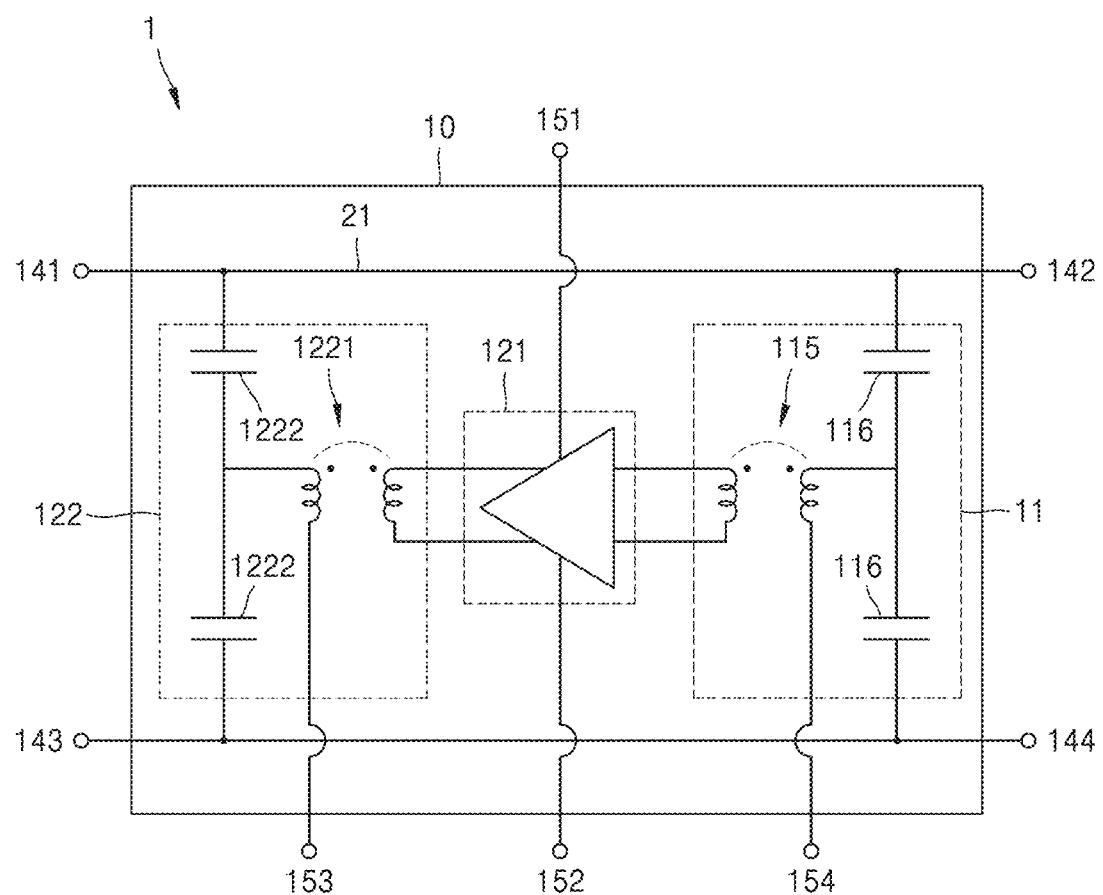
FIG. 5 is a diagram illustrating a more detailed configuration of an independent active electromagnetic interference filter module according to another embodiment.

FIG. 5 illustrates a more specific example of a first element group 11 and a second element group 12 according to another embodiment.

Referring to FIG. 5, an independent active electromagnetic interference filter module 1 according to another embodiment may include a first element group 11 and a second element group 12 installed on a substrate 10, wherein a first through line 21 and a second through line 22 may pass through the substrate 10.

According to the embodiment illustrated in FIG. 5, the first element group 11 may include a sensing capacitor unit 116. And the second element group 12 may include an active circuit unit 121 and a compensation capacitor 1222. Therefore, the independent active electromagnetic interference filter module 1 according to the embodiment illustrated in FIG. 5 represents an active electromagnetic interference filter of a voltage-sensing current-compensation (VSCC)

type that detects noise voltage using the sensing capacitor unit 116 and compensates with current using the compensation capacitor 1222. In the voltage-sensing current-compensation structure such as the active electromagnetic interference filter 1 according to this embodiment, feedforward and feedback may not be distinguished in terms of operation principle. That is, in the independent active electromagnetic interference filter module 1 illustrated in FIG. 5, there may be no distinction between input/output units. In addition, the independent active electromagnetic interference filter module 1 according to the embodiment may also have an isolated structure by using a compensation transformer 1221 and a sensing transformer 115.

The sensing capacitor unit 116 may sense a noise voltage input to the first through line 21 and the second through line 22, which are power lines. The sensing capacitor unit 116 may include two sensing capacitors, and each sensing capacitor may include a Y-capacitor. One end of each of the two sensing capacitors may be electrically connected to the first through line 21 and the second through line 22, and the other end may share a node connected to a primary side of the sensing transformer 115. The primary side of the sensing transformer 115 may be electrically connected to the first through line 21 and second through line 22, which are the power lines, through the sensing capacitor unit 116. A primary winding of the sensing transformer 115 may be electrically connected to a 2-4 th pin 154 of a second pin group 15 coupled to the substrate 10.

The sensing transformer 115 may include the primary side connected to the power line side and a secondary side connected to the active circuit unit 121 to sense noise flowing through the power line. The secondary side of the sensing transformer 115 may be differentially connected to an input terminal of the active circuit unit 121.

The sensing transformer 115, the active circuit unit 121, the compensation transformer 1221 and the compensation capacitor 1222 included in the independent active electromagnetic interference filter module 1 according to the embodiment illustrated in FIG. 5 may perform operations corresponding to the sensing transformer, the active circuit unit 121, the compensation transformer 1221, and the compensation capacitor 1222 of the above-described embodiments, respectively.

Although not illustrated, in the above-described embodiments, the active circuit unit 121 may further include a high-pass filter (not illustrated) between the compensation transformer 1221 and the active circuit unit, so that operation of the active circuit unit 121 at low frequencies below a frequency band that is the target of noise reduction may be blocked.

Figure 6:
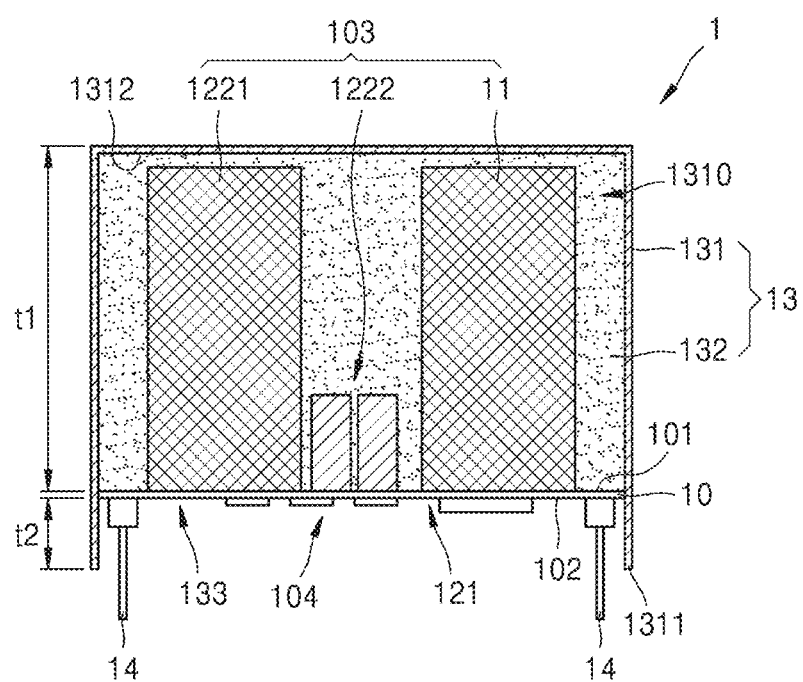
FIG. 6 is a cross-sectional view of an independent active electromagnetic interference filter module according to another embodiment.

In the case of the independent active electromagnetic interference filter module 1 of the embodiments illustrated in FIGS. 3 to 5 as described above, a sealing structure blocked from an outside may be implemented through an encapsulation structure 13 as illustrated in FIG. 6, and a single modularity may be achieved.

According to an embodiment illustrated in FIG. 6, a third element group 103 may be installed on a first surface 101 of a substrate 10, and a fourth element group 104 may be installed on a second surface 102 of the substrate 10. According to an embodiment, the third element group 103 may include the various transformers and capacitors of FIGS. 3 to 5 described above, for example, a Y-capacitor. More specifically, the third element group 103 may include a sensing transformer, a compensation transformer 1221, and a compensation capacitor 1222, which are a first element group 11.

In the case of the embodiment illustrated in FIG. 5, the third element group 103 may include at least one of the sensing capacitor unit 116 and the sensing transformer 115 of the first element group 11 in addition to the compensation transformer 1221 and the compensation capacitor 1222. If the third element group 103 includes the sensing capacitor unit 116 or the sensing transformer 115 of first element group 11, the other element may be included in the fourth element group 14.

The fourth element group 104 may include an active circuit unit 121. Accordingly, the fourth element group 104 may have a smaller volume than the third element group 103.

According to an embodiment, the encapsulation structure 13 may include a support 131 and a filling part 132.

The support 131 is formed of an insulating material, and includes a space 1310 located therein. The space 1310 of the support 131 may be defined by an opening 1311 and a bottom 1312. In some cases, the support 131 may be formed of a heat transferable material. In this case, a heat dissipation mechanism such as a heat sink may be further installed on the support 131, and thus the heat dissipation by the support 131 may be smoothly performed.

The above-mentioned substrate 10 is accommodated in the space 1310 of the support 131. At this time, an edge of the substrate 10 is formed to correspond to a size of a side of the space 1310, and accordingly, the edge of the substrate 10 may be in close contact with the side of the space 1310. Therefore, the space 1310 may be divided into two spaces with respect to the substrate 10.

The substrate 10 may be disposed such that the first surface 101 faces the bottom 1312 of the support 131, and the second surface 102 may face the opening 1311 of the support 131. At this time, a first distance t1 between the bottom 1312 and the first surface 101 of the substrate 10 may be greater than half of a distance between the bottom 1312 and the opening 1311. According to an embodiment, the first distance t1 between the bottom 1312 and the first surface 101 of the substrate 10 may be greater than a second distance t2 between the opening 1311 and the second surface 102 of the substrate 10. Accordingly, a length of the pin group exposed to the outside of the support 131 through the opening 1311 on the second surface 102 may be designed to be small, and thus structural stability may be provided when the independent active electromagnetic interference filter module 1 is installed.

Meanwhile, according to an embodiment, the independent active electromagnetic interference filter module 1 may include the filling part 132 provided to fill at least a part of the space 1310.

The filling part 132 may be filled at least between the substrate 10 and the bottom 1312, and the substrate 10 may be fixedly bonded to an inner wall of the support 131 by the filling part 132.

The filling part 132 may be made of a heat-resistant and/or insulating resin material. According to an embodiment, the filling part 132 may include an epoxy resin and further include a curing agent.

In the independent active electromagnetic interference filter module 1 having the above structure, the second surface 102 of the substrate 10 on which pins 14 protrude may constitute a bottom surface 133 of the module.

Since the independent active electromagnetic interference filter module 1 may be easily installed in various devices, and has a structure independent from external devices, in particular, the third element group 103 may be protected from external stimuli and/or impact, and breakage of the independent active electromagnetic interference filter module 1 may be prevented. Accordingly, the durability of equipment requiring the independent active electromagnetic interference filter module 1 may be improved. In addition, the third element group 103 may be protected from a polluting environment such as external dust. And, when the support 131 and/or the filling part 132 includes a heat-dissipating material, since the heat emitted from the third element group 103 may be radiated to the outside, deterioration of the third element group 103 may be prevented.

Figure 7:
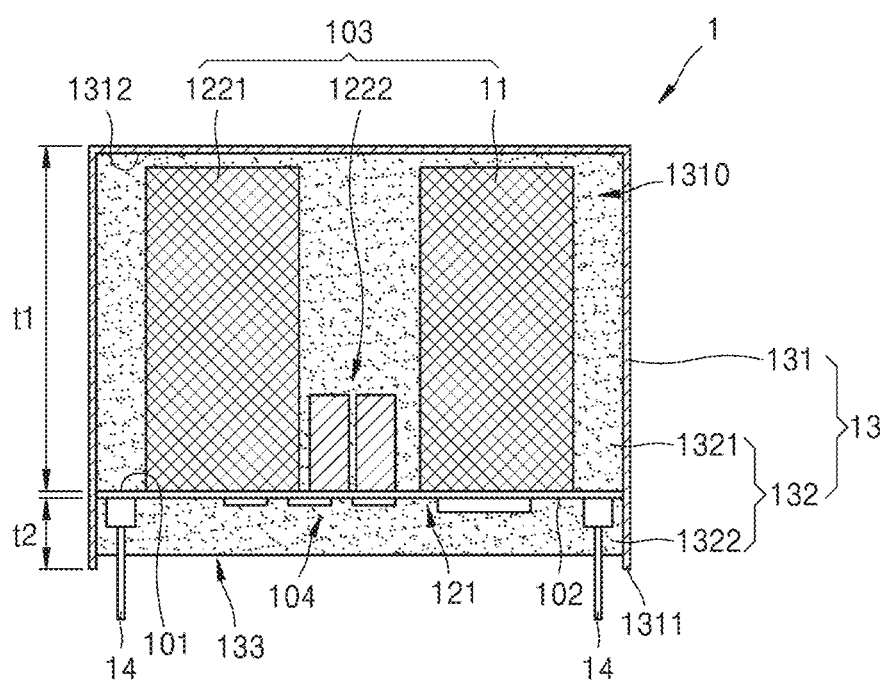
FIG. 7 is a cross-sectional view of an independent active electromagnetic interference filter module according to another embodiment.

FIG. 7 is an independent active electromagnetic interference filter module 1 according to another embodiment, unlike the embodiment illustrated in FIG. 6, a filling part 132 may include a first filling part 1321 and a second filling part 1322.

The first filling part 1321 may face a first surface 101 of a substrate 10, and the second filling part 1322 may face a second surface 102 of the substrate 10. An opening 1311 may be closed by the second filling part 1322 as described above, and the second filling part 1322 may constitute a bottom surface 133 of the module. The second filling part 1322 is provided to completely cover a fourth element group 104, and thus pins 14 may protrude to the outside of the module through the second filling part 1322.

Since the independent active electromagnetic interference filter module 1 according to this embodiment has an independent structure from an external device, a third element group 103 and the fourth element group 104 may be protected from external stimuli, and/or impact, and damage to the independent active electromagnetic interference filter module 1 may be prevented. Accordingly, the durability of equipment requiring the independent active electromagnetic interference filter module 1 may be improved. In addition, the third element group 103 and the fourth element group 104 may be protected from a polluting environment such as external dust. And, when a support 131 and/or the filling part 132 includes a heat-dissipating material, since the heat emitted from the third element group 103 and/or the fourth element group 104 may be radiated to the outside, deterioration of the third element group 103 and/or the fourth element group 104 may be prevented.

Figure 8A:
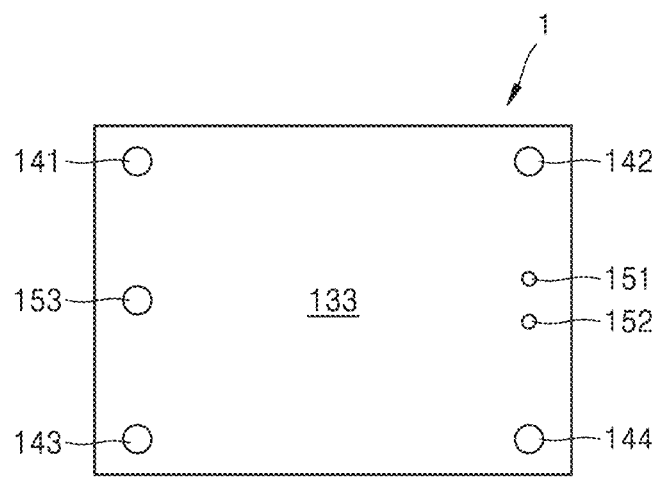
FIGS. 8A and 8B are bottom views illustrating an arrangement state of a first pin group and a second pin group according to another embodiment.

As in FIG. 8A, in the case of the independent active electromagnetic interference filter module 1 as described above, a plurality of pins are exposed through a bottom surface 133. At this time, a 1-1 th pin 141, 1-2 th pin 142, 1-3 th pin 143 and 1-4 th pin 144 of a first pin group 14 electrically connected to a power line are respectively disposed on corners of the bottom surface 133, a 2-1 th pin 151, 2-2 th pin 152 and 2-3 th pin 153 of a second pin group 15 are disposed between the respective corners. The pins of the first pin group 14 electrically connected to the power line may be formed to be relatively thicker than the pins of the second pin group 15, and these pins of the first pin group 14 are disposed at the corners of the bottom surface 133, so that structural stability may be provided when the independent active electromagnetic interference filter module 1 is mounted on another device. In addition, since the pins of the first pin group 14 are mainly electrically connected to the bulky transformer, the transformers 11 and 1221 are arranged on the edge in the third element group 103 as illustrated in FIGS. 6 and 7, and dispersion of the weight of the entire module may be achieved and stability may be provided when installed. Even if the third element group 103 is designed in this way, the pins of the first pin group 14 are arranged on the edge of the bottom surface 133, so that a design margin may be obtained. On the other hand, it is not necessarily limited to the embodiment illustrated in FIG. 8A, after the pins of the first pin group 14 are disposed, the pins of the second pin group 15 may be relatively freely disposed, and may be variously installed in the region between the pins of the first pin group 14.

Figure 8B:
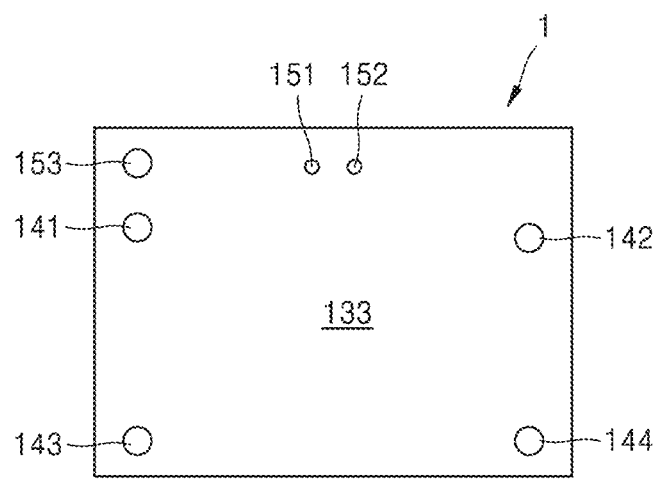

On the other hand, the pins of the first pin group 14 do not necessarily have to be installed at the edge of the bottom surface 133, and as illustrated in FIG. 8B, at least some of the pins of the first pin group 14 can be installed on a position inwardly spaced apart from the edge of the bottom surface 133. However, even in this case, the distance between the pins of the first pin group from the edge does not exceed ¼ of the sides, so that structural stability may be secured. According to the embodiment illustrated in FIG. 8B, a 1-1 th pin 141 and a 1-2 th pin 142 are installed at positions spaced apart from the edge of the bottom surface 133, in this case, a 2-3 th pin 153 may be installed at one corner of the bottom surface 133. The 2-3 th pin 153 is a line electrically connected to the reference potential of the compensation transformer 1221 according to the embodiment illustrated in FIGS. 3 to 5, and thus the thickness of the pin may be as thick as the pins of the first pin group 14. By placing this thick 2-3 th pin 153 on the edge of the bottom surface 133, structural stability may be secured.

Figure 9:
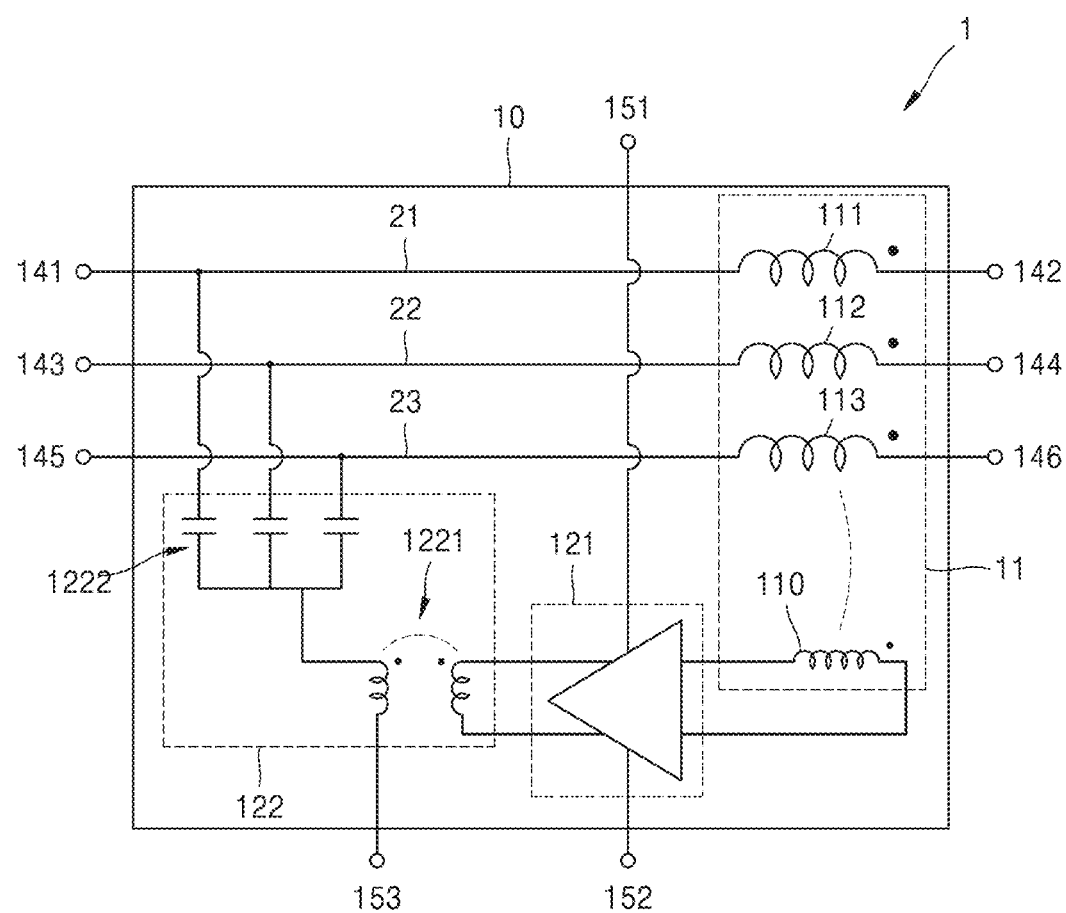
FIG. 9 is a view illustrating a more detailed configuration of an independent active electromagnetic interference filter module according to another embodiment.

FIG. 9 illustrates a configuration of an independent active electromagnetic interference filter module 1 according to another embodiment.

The embodiment illustrated in FIG. 9 is an independent active electromagnetic interference filter module 1 of a three-phase three-wire structure, unlike the single-phase embodiment illustrated in FIG. 3.

Referring to FIG. 9, a first through line 21, a second through line 22 and a third through line 23 pass through a substrate 10, and their opposite ends may be electrically connected to a 1-1 th pin 141 to a 1-6 th pin 146, respectively. According to the embodiment, the first through line 21 may be an R-phase, the second through line 22 may be an S-phase, and the third through line 23 may be a T-phase power line.

A first element group 11 may include a sensing transformer capable of sensing noise, wherein the sensing transformer may include a first reference winding 111 to a third reference winding 113 connected to the first through line 21 to the third through line 23 respectively and a sensing winding 110 formed on the same core as the first reference winding 111 to the third reference winding 113.

The first reference winding 111 to third reference winding 113 may be a primary winding connected to a power line, and the sensing winding 110 may be a secondary winding.

Each of the first reference winding 111 to third reference winding 113 may be in the form of a winding wound around the core, but is not necessarily limited thereto, and at least one of the first reference winding 111, the second reference winding 112 and the third reference winding 113 may be a structure passing through the core.

The sensing winding 110 may have a structure in which the core, which the first reference winding 111 to the third reference winding 113 are wound on and/or pass through, is wound at least once or more.

Similar to the above-described embodiment of FIG. 3, the sensing winding 110 is insulated from the power line and may sense a noise current generated from a second device 3. As in the embodiment of FIG. 3, the primary winding and the secondary winding may be wound in consideration of the direction of production of magnetic flux and/or magnetic flux density.

The sensing winding 110 supplies an induced current to an active circuit unit 121, and the active circuit unit 121 amplifies it to generate an amplified current. The active circuit unit 121 may be designed to generate the amplified current in consideration of the above-described transformation ratio of the sensing transformer and a transformation ratio of a compensation transformer 1221 to be described later. The active circuit unit 121 may be implemented by various means, and according to an embodiment, the active circuit unit 121 may include an OP AMP. According to another embodiment, the active circuit unit 121 may include a plurality of passive elements such as resistors and capacitors in addition to an OP AMP. Further, according to another embodiment, the active circuit unit 121 may include a bipolar junction transistor (BJT) and/or a plurality of passive elements such as resistors and capacitors. However, the present disclosure is not necessarily limited thereto, and the means for amplification described in the present disclosure may be used without limitation as the active circuit unit 121 of the present disclosure. The active circuit unit 121 is electrically connected to a third device 4 through a 2-1 th pin 151 coupled to the substrate 10.

The amplified current flows to the first through line 21, the second through line 22, and/or the third through line 23 through the compensating unit 122 to compensate for noise.

The compensating unit 122 may include a compensation transformer 1221 and a compensation capacitor 1222, and specific configurations and functions may be applied in the same manner as in the embodiment illustrated in FIG. 3. For each capacitor of compensation capacitor 1222, one end is connected to the compensation transformer 1221, and the other end is connected to the first through line 21 to the third through line 23, respectively.

The embodiment illustrated in FIG. 9 is illustrated in a three-phase three-wire structure based on the embodiment illustrated in FIG. 3, but the present disclosure is not necessarily limited thereto, and the embodiment illustrated in FIG. 9 may be applied to the embodiment illustrated in FIGS. 4 and 5.

Figure 10:
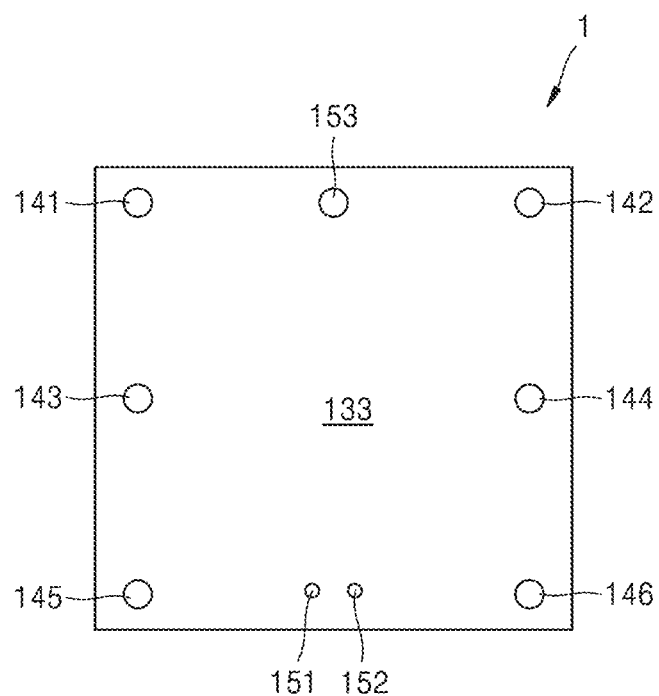
FIG. 10 is a bottom view illustrating an example of an arrangement state of a first pin group and a second pin group according to the embodiment shown in FIG. 9.

In this embodiment, the arrangement of the pins may be implemented as illustrated in FIG. 10. That is, the 1-1 th pin 141 to the 1-6 th pin 146 of a first pin group 14 are arranged on a border including an edge of a bottom surface 133 if possible. And a 2-1 th pin 151 to a 2-3 th pin 153 of a second pin group 15 are disposed on the remaining area of the border of the bottom surface 133. In this case, the 2-3 th pin 153 which is a thick pin connected to the compensation transformer 1221 is disposed to face the 2-1 th pin 151 and the 2-2 th pin 152 which are relatively thin pins, so that the overall arrangement may be evenly distributed. According to this structure, the pins may be uniformly arranged around the border of the bottom surface 133.

Figure 11:
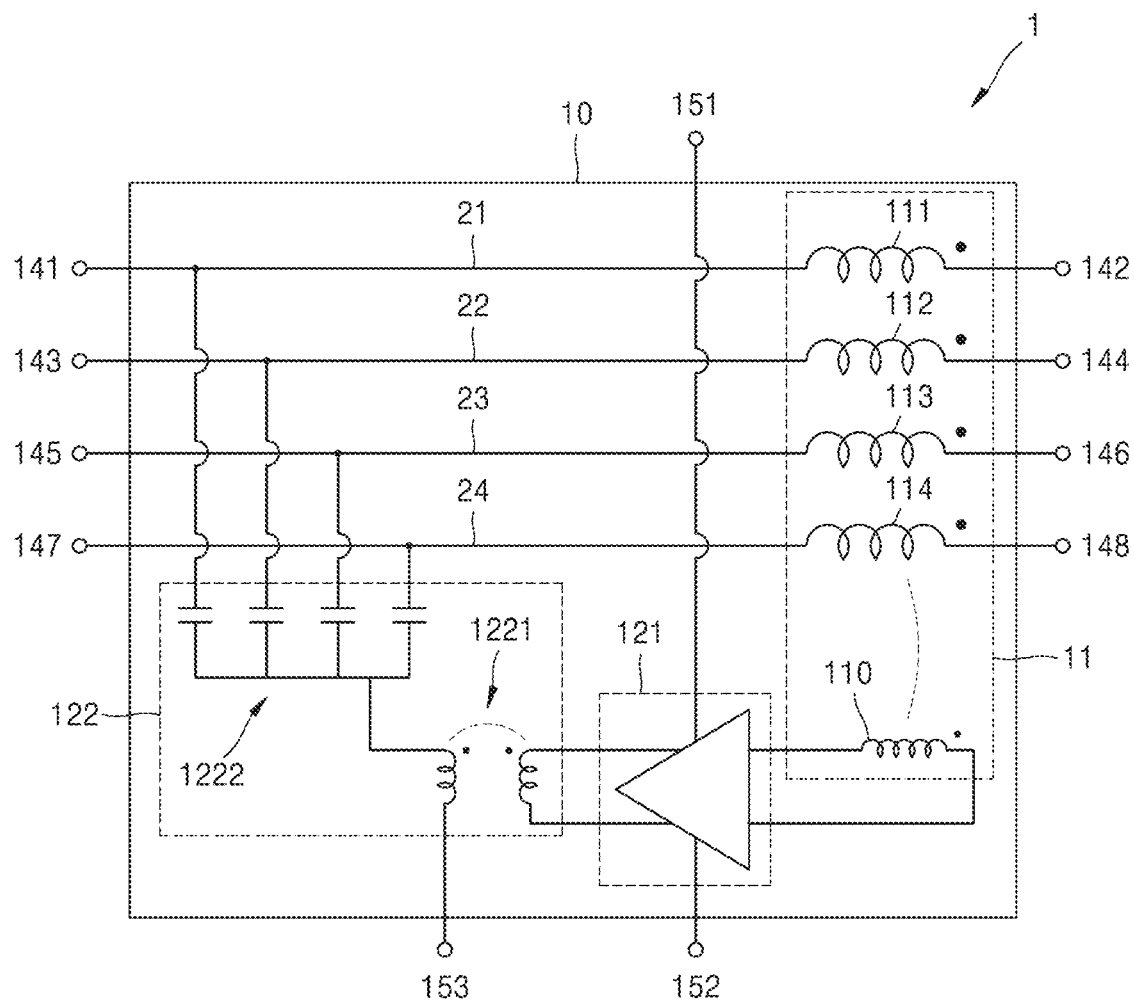
FIG. 11 is a view illustrating a more detailed configuration of an independent active electromagnetic interference filter module according to another embodiment.

FIG. 11 illustrates a configuration of an independent active electromagnetic interference filter module 1 according to another embodiment.

Unlike the embodiment for single-phase illustrated in FIG. 3 and the embodiment for three-phase three-wire structure illustrated in FIG. 9, the embodiment illustrated in FIG. 11 is an independent active electromagnetic interference filter module 1 for three-phase four-wire structure.

Referring to FIG. 11, a first through line 21, a second through line 22, a third through line 23 and a fourth through line 24 pass through a substrate 10, and both ends thereof may be electrically connected to a 1-1 th pin 141 to a 1-8 th pin 148. According to the embodiment, the first through line 21 may be R-phase, the second through line 22 may be S-phase, the third through line 23 may be T-phase, and the fourth through line 24 may be an N-phase power line.

A first element group 11 may include a sensing transformer capable of sensing noise, and the sensing transformer may include a first reference winding 111 to a fourth reference winding 114 connected to the first through line 21 to the fourth through line 24 respectively and a sensing winding 110 formed on the same core as the first reference winding 111 to the fourth reference winding 114.

The first reference winding 111 to the fourth reference winding 114 may be a primary winding connected to a power line, and the sensing winding 110 may be a secondary winding.

The first reference winding 111 to the fourth reference winding 114 may be in the form of windings wound around the core, respectively, but are not necessarily limited thereto, at least one of the first reference winding 111, the second reference winding 112, the third reference winding 113 and the fourth reference winding 114 may be a structure passing through the core.

The sensing winding 110 may have a structure in which the core which the first reference winding 111 to the fourth reference winding 114 is wound on or passed through is wound at least once or more.

Similar to the above-described embodiments of FIGS. 3 and 9, the sensing winding 110 is insulated from the power line and may sense a noise current generated from a second device 3. As in the embodiment of FIGS. 3 and 9, the primary winding and the secondary winding may be wound in consideration of the direction of generation of magnetic flux and/or magnetic flux density.

The sensing winding 110 supplies an induced current to an active circuit unit 121, and the active circuit unit 121 amplifies it to generate an amplified current. The active circuit unit 121 may be designed to generate the amplified current in consideration of the above-described transformation ratio of the sensing transformer and a transformation ratio of a compensation transformer 1221 to be described later. The active circuit unit 121 may be implemented by various means, and according to an embodiment, the active circuit unit 121 may include an OP AMP. According to another embodiment, the active circuit unit 121 may include a plurality of passive elements such as resistors and capacitors in addition to an OP AMP. Further, according to another embodiment, the active circuit unit 121 may include a bipolar junction transistor (BJT) and/or a plurality of passive elements such as resistors and capacitors. However, the present disclosure is not necessarily limited thereto, and the means for amplification described in the present disclosure may be used without limitation as the active circuit unit 121 of the present disclosure. The active circuit unit 121 is electrically connected to a third device 4 through a 2-1 th pin 151 coupled to the substrate 10.

The amplified current flows to the first through line 21, the second through line 22, the third through line 23, and/or the fourth through line 24 through the compensating unit 122 to compensate for noise.

The compensating unit 122 may include a compensation transformer 1221 and a compensation capacitor 1222, and specific configurations and functions may be applied in the same manner as in the embodiments illustrated in FIGS. 3 and 9. For each capacitor of the compensation capacitor 1222, one end is connected to the compensation transformer 1221, and the other end is connected to the first through line 21 to the fourth through line 24, respectively.

The embodiment illustrated in FIG. 11 is illustrated in a three-phase four-wire structure based on the embodiment illustrated in FIG. 3, but the present disclosure is not necessarily limited thereto, the embodiment illustrated in FIG. 11 may be applied to the embodiment illustrated in FIGS. 4 and 5.

Figure 12:
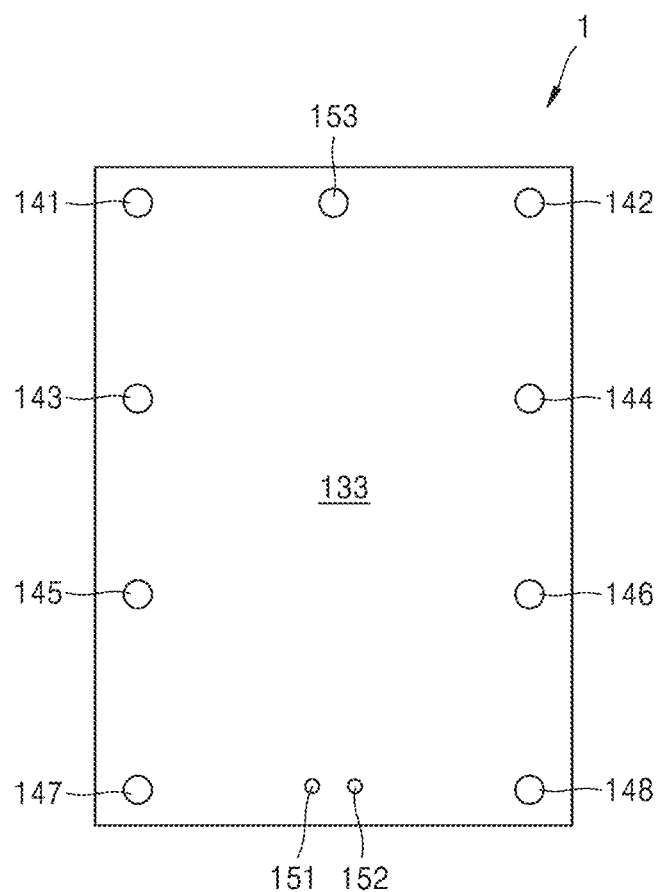
FIG. 12 is a bottom view illustrating an example of an arrangement state of a first pin group and a second pin group according to the embodiment shown in FIG. 11.

In this embodiment, the arrangement of the pins may be implemented as illustrated in FIG. 12. That is, the 1-1 th pin 141 to the 1-8 th pin 148 of a first pin group 14 are arranged on a border including an edge of a bottom surface 133, if possible. And a 2-1 th pin 151 to a 2-3 th pin 153 of a second pin group 15 are disposed on the remaining area of the border of the bottom surface 133. In this case, the 2-3 th pin 153 which is a thick pin connected to the compensation transformer 1221 is disposed to face the 2-1 th pin 151 and the 2-2 th pin 152 which are relatively thin pins, so that the overall arrangement may be evenly distributed. According to this structure, the pins may be uniformly arranged around the border of the bottom surface 133.

The independent active electromagnetic interference filter module 1 as described above may be manufactured in a following way.

Figure 13:
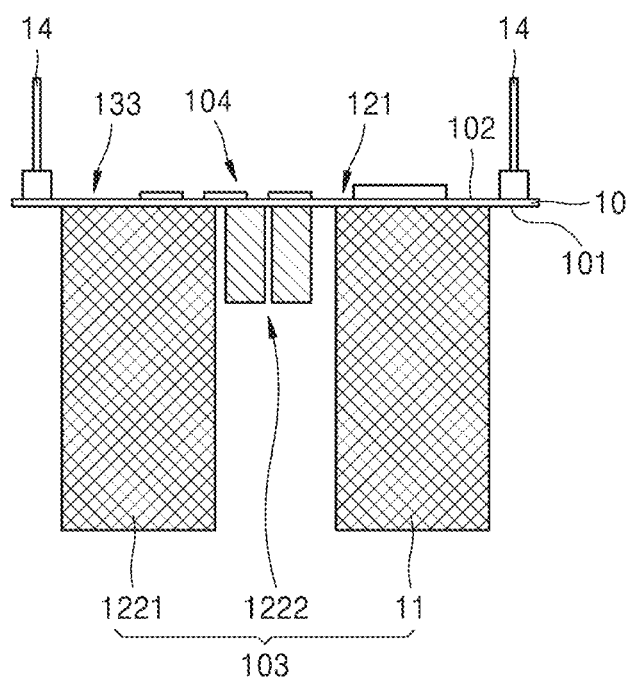
FIGS. 13 to 17 are views illustrating a manufacturing process of an independent active electromagnetic interference filter module according to embodiments.

First, as illustrated in FIG. 13, a substrate 10 including a first surface 101 and a second surface 102 facing each other is prepared, and a first element group 11 and a second element group 12 are installed on the substrate 10. As described above, the first element group 11 is an element group provided to sense electromagnetic noise, and the second element group 12 is an element group provided to generate a compensation signal for electromagnetic noise.

These first element group 11 and second element group 12 are installed on the first surface 101 and/or the second surface 102 of the substrate 10, and are reclassified into a larger third element group 103 and a smaller fourth element group 104 according to the volume of elements constituting each element group.

According to an embodiment, the third element group 103 includes transformer elements and capacitors, and may include a sensing transformer of the first element group 11, a compensation transformer 1221 and a compensation capacitor 1222 of the second element group 12. The fourth element group 104 may include an active circuit unit 121.

The classified third element group 103 and fourth element group 104 are installed on the first surface 101 and the second surface 102 of the substrate 10, respectively. At this time, the transformers of the third element group 103, that is, the sensing transformer of the first element group 11 and the compensation transformer 1221 of the second element group 12 are placed on both borders of the first surface 101, and the compensation capacitor 1222 is placed between the sensing transformer and the compensation transformer 1221, so that the weight is balanced.

Next, the substrate 10 on which the elements are mounted as described above is sealed.

Figure 14:
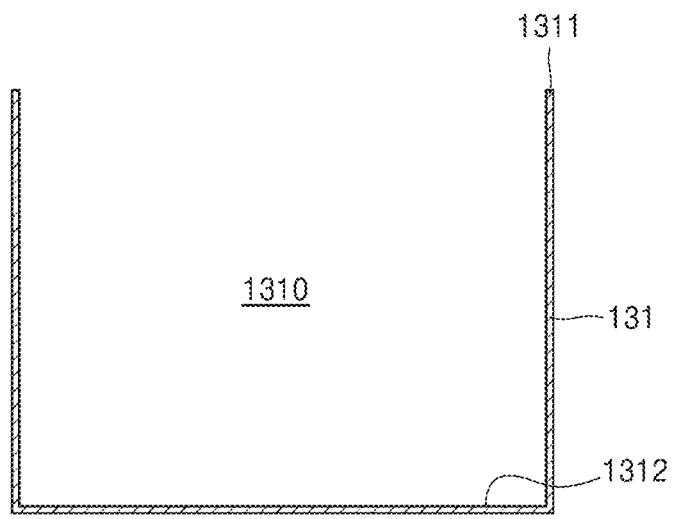

According to one embodiment, for the sealing, as in FIG. 14, a support 131 is prepared.

The support 131 is formed of an insulating material, and includes a space 1310 located therein. The space 1310 of the support 131 may be defined by an opening 1311 and a bottom 1312.

Figure 15:
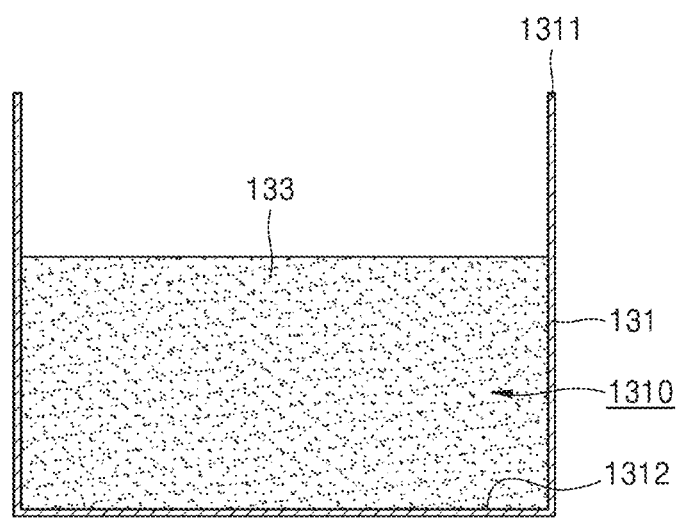

As in FIG. 15, a filling solution 133 is put into the space 1310 through the opening 1311 of the support 131. The filling solution 133 is preferably in a liquid state, may include a liquid epoxy resin, and may further include a curing agent. The filling solution 133 is sufficient if the amount is sufficient to submerge the third element group 103 installed on the substrate 10.

Figure 16:
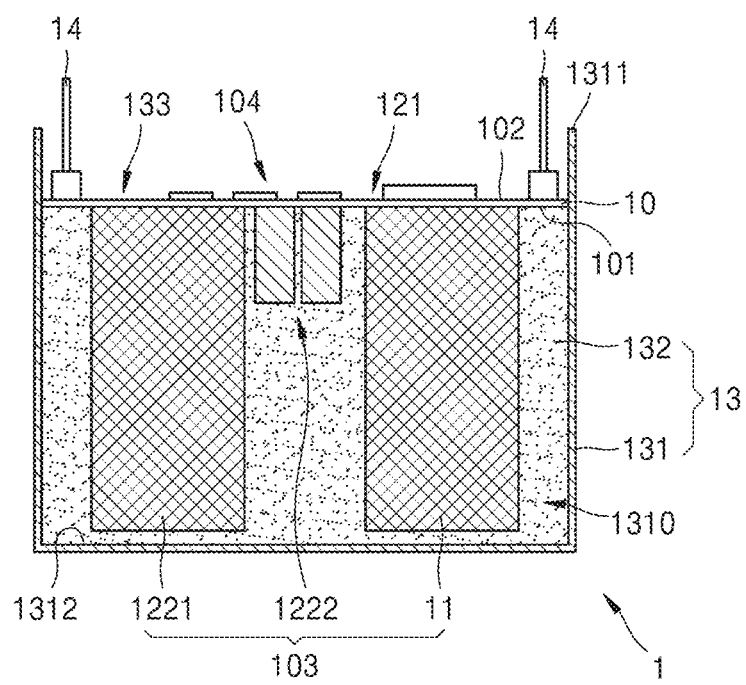

Next, as illustrated in FIG. 16, the above-described substrate 10 is accommodated in the space 1310 in which the filling solution 133 is accommodated. At this time, the first surface 101 of the substrate 10 faces the bottom 1312 of the space 1310, and the third element group 103 mounted on first surface 101 may be sufficiently immersed in the filling solution 133.

In a state in which the third element group 103 is submerged in the filling solution 133, an upper portion of the third element group 103 may be spaced apart from the bottom 1312 of the space 1310 by a predetermined distance. And in this state, the second surface 102 of the substrate 10 is not sufficiently immersed in the filling solution 133.

When the filling solution 133 is cured in this state, the filling part 132 of the independent active electromagnetic interference filter module 1 as illustrated in FIG. 6 may be completed. In the case of the independent active electromagnetic interference filter module 1 of this structure, not all elements are sealed by the filling part 132, the active circuit unit 121 is exposed, but the third element group 103 is sealed by the filling part 132 and may be sufficiently protected. In addition, when the substrate 10 is a metal printed circuit board, since heat dissipation through the substrate 10 is also possible, the durability of the independent active electromagnetic interference filter module 1 according to the embodiment may be further improved.

Figure 17:
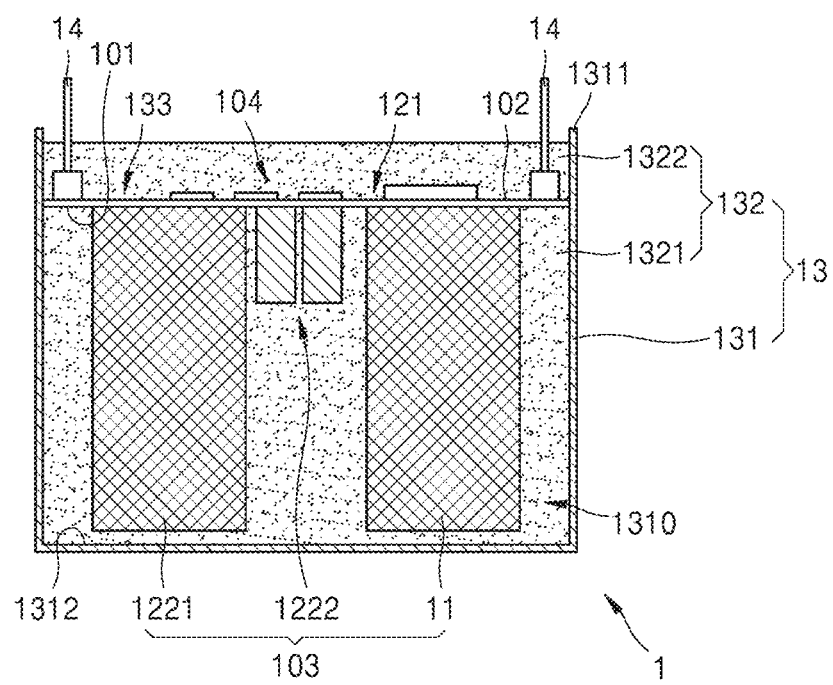

Next, as illustrated in FIG. 17, a filling solution 133 is additionally filled between an opening 1311 of a support 131 and a second surface 102 of a substrate 10. The filling solution 133 causes the fourth element group 104 to be completely submerged, and then the filling solution 133 is cured to form the filling part 132. In this case, the filling part 132 includes a first filling part 1321 positioned between the substrate 10 and the bottom 1312 and a second filling part 1322 covering the fourth element group 104 of the substrate 10. In addition, pins 14 protrude out of the module through the second filling part 1322.

In this way, the present disclosure may simply implement the independent active electromagnetic interference filter module 1 equipped in a modular form, and may enable the independent active electromagnetic interference filter module 1 to implement more advanced functions by mixing various materials in the filling solution 133 in the manufacturing process. For example, by adding an insulating, heat transfer and/or heat-dissipating material to the filling solution 133, an additional configuration related to cooling may be implemented.

In addition, physical protection for internal elements may be provided by the support 131 provided in the form of a hard case, and in some cases, a heat dissipation mechanism such as a heat sink is further installed on the support 131, so that heat dissipation by the support 131 may be smoothly performed.

Figure 18:
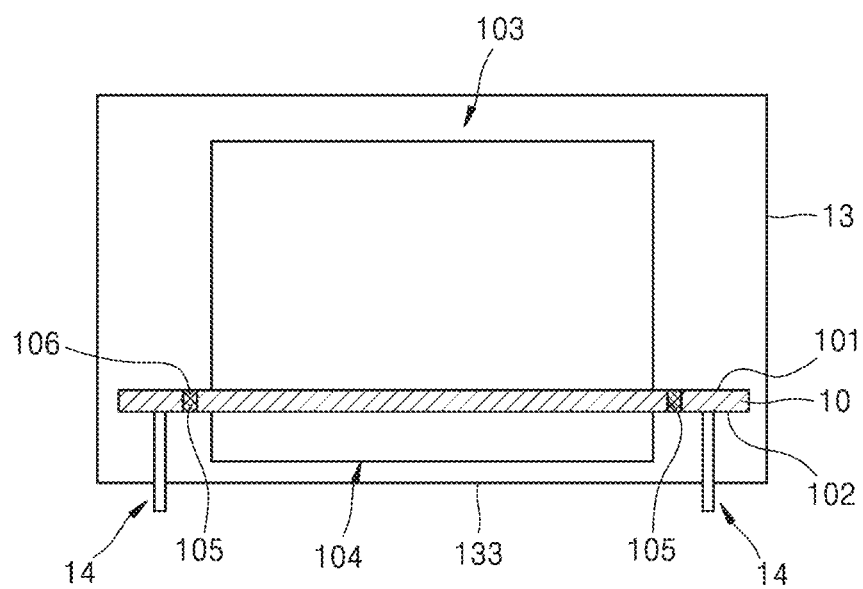
FIG. 18 schematically illustrates a cross-section according to another embodiment of the independent active electromagnetic interference filter module of FIG. 1.

FIG. 18 is a cross-sectional view of an electromagnetic interference filter module according to another embodiment. Referring to FIG. 18, an independent active electromagnetic interference filter module according to another embodiment may further include a connection part 105 and a connection body 106 compared to the embodiment illustrated in FIG. 2.

The connection part 105 is connected to a first surface 101 and a second surface 102 of a substrate 10, and according to an embodiment, may include a hole shape penetrating the first surface 101 and the second surface 102 of the substrate 10. The hole shape may have a circular or polygonal plane, and may have a normal structure or a step structure.

The connection part 105 may be arranged so as not to interfere with at least one of a first element group 11 and a second element group 12, when the connection part 105 has the hole shape formed in the substrate 10, the connection part 105 may be provided so as not to interfere with a third element group 103 and a fourth element group 104.

According to an embodiment, the connection part 105 may be disposed at a plurality of locations that do not interfere with the third element group 103 and the fourth element group 104.

The connection body 106 may be positioned in the connection part 105 and connected to an encapsulation structure 13.

The connection body 106 may be provided with a filler capable of filling at least a portion of the hole of the connection part 105. The filler may be exposed to at least one of the first surface 101 and the second surface 102 to be connected to the encapsulation structure 13.

According to an embodiment, the connection body 106 may be formed of the same material as some of the materials forming the encapsulation structure 13, and optionally may be formed integrally with the encapsulation structure 13.

The encapsulation structure 13 may cross the substrate 10 through the connection part 105. According to an embodiment, at least a portion of the encapsulation structure 13 crossing the connection part 105 may form the connection body 106.

However, the present invention is not necessarily limited thereto, and the connection body 105 is formed of a separate material and may be connected to the encapsulation structure 13. Optionally, according to an embodiment, the connection body 105 may include an adhesive material. Accordingly, the connection body 105 may be joined to the encapsulation structure 13 to fix the encapsulation structure 13.

Figure 19:
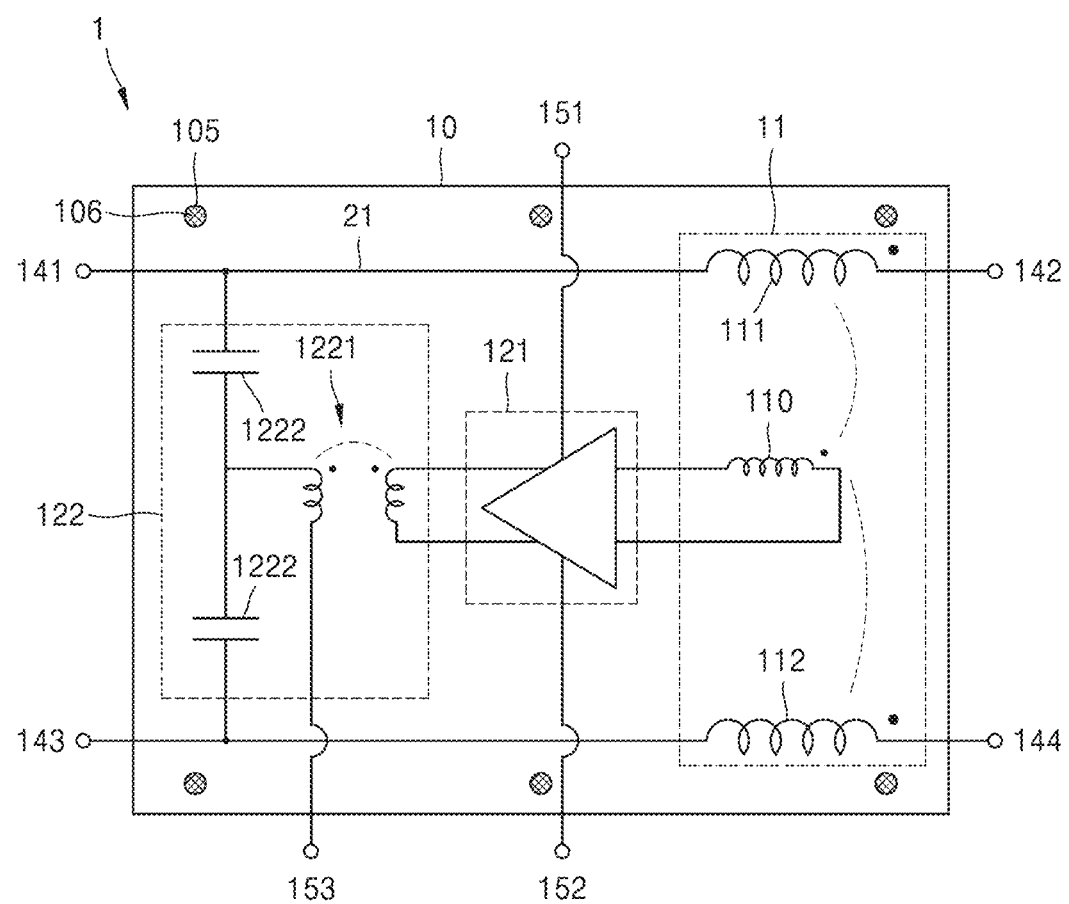
FIG. 19 is a view showing a more detailed configuration of an independent active electromagnetic interference filter module according to another embodiment.

FIG. 19 illustrates a structure in which a connection part 105 and a connection body 106 are further provided compared to the embodiment illustrated in FIG. 3.

As in FIG. 19, the connection part 105 and the connection body 106 may be disposed on the substrate 10 in plurality, and at least a portion of the connection part 105 may be formed in a position where there is no interference with a plurality of passive elements and/or active elements formed on the substrate 10. However, the present invention is not necessarily limited thereto, and at least a part of the connection part 105 and the connection body 106 may function as a conductive line connecting a first surface and a second surface of the substrate 10, and may function to electrically connect some elements installed on the first surface and the second surface.

It goes without saying that the embodiments for the connection part 105 and the connection body 106 may be equally applied to all embodiments of the present specification to be described below. That is, although not illustrated, a connection part 105 and a connection body 106 of the form illustrated in FIG. 19 may be applied to the embodiments illustrated in FIGS. 4, 5, 9 and 11, respectively.

Figure 20:
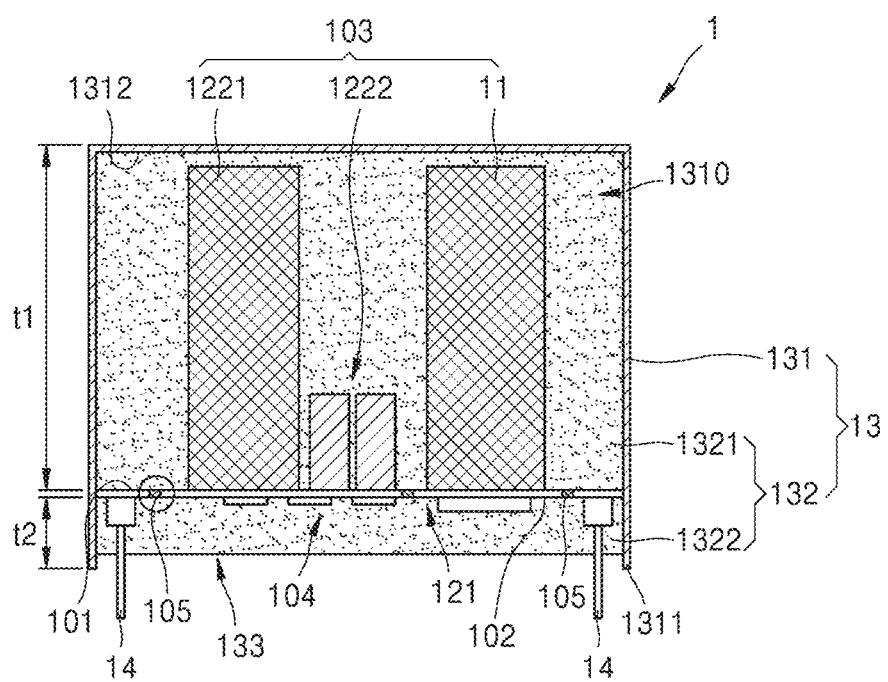
FIG. 20 is a cross-sectional view of an independent active electromagnetic interference filter module according to another embodiment.
Figure 21:
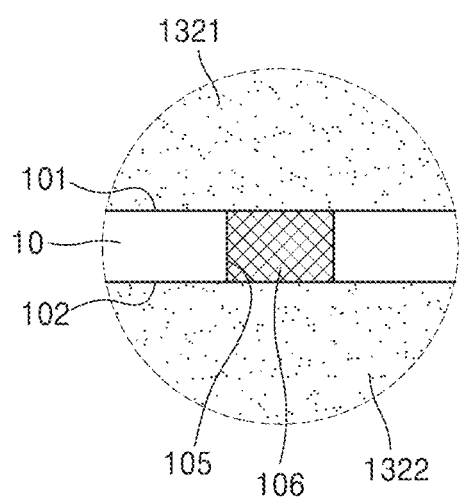
FIG. 21 is a cross-sectional view illustrating an embodiment of a connection part and a connection body of FIG. 20.

FIG. 20 is a view illustrating a cross-section of an independent active electromagnetic interference filter module 1 according to another embodiment, and FIG. 21 is an enlarged cross-sectional view of the part.

Referring to FIG. 20, a filling part 132 of the independent active electromagnetic interference filter module 1 according to another embodiment may include a first filling part 1321 and a second filling part 1322. The first filling part 1321 may face a first surface 101 of a substrate 10, and the second filling part 1322 may face a second surface 102 of the substrate 10. An opening 1311 may be closed by the second filling part 1322 as described above, and the second filling part 1322 may constitute a bottom surface 133 of the module. The second filling part 1322 is provided to completely cover a fourth element group 104, and thus pins 14 may protrude to the outside of the module through the second filling part 1322.

The independent active electromagnetic interference filter module 1 may include a connection part 105 and a connection body 106.

The connection part 105 is connected to the first surface 101 and the second surface 102 of the substrate 10, and as in FIG. 21, according to an embodiment, it may include a hole shape penetrating the first surface 101 and the second surface 102 of the substrate 10. The hole shape may have a circular or polygonal plane, and may have a normal structure or a step structure.

The connection part 105 may be arranged so as not to interfere with at least one of a first element group 11 and a second element group 12, when the connection part 105 has the hole shape formed in the substrate 10, the connection part 105 may be provided so as not to interfere with a third element group 103 and a fourth element group 104.

According to an embodiment, the connection part 105 may be disposed at a plurality of locations that do not interfere with the third element group 103 and the fourth element group 104.

The connection body 106 may be located in the connection part 105 and connected to the encapsulation structure 13.

The connection body 106 may be provided with a filler capable of filling at least a portion of the hole of the connection part 105. The filler may be exposed to at least one of the first surface 101 and the second surface 102 to be connected to the encapsulation structure 13.

According to an embodiment, the connection body 106 may be formed of the same material as some of the materials forming the encapsulation structure 13, and optionally may be formed integrally with the encapsulation structure 13.

The encapsulation structure 13 may cross the substrate 10 through the connection part 105. According to an embodiment, at least a portion of the encapsulation structure 13 crossing the connection part 105 may form the connection body 106.

Specifically, as illustrated in FIG. 21, the connection body 106 may be provided to connect the first filling part 1321 and the second filling part 1322 to each other. Since the first filling part 1321 and the second filling part 1322 may be connected to each other by the connection body 106, separation of the first filling part 1321 and the second filling part 1322 is prevented, and the structural stability and durability of the filling part 13 may be improved. Accordingly, it is possible to prevent the first filling part 1321 and the second filling part 1322 from being separated from each other even when the filling part 13 is deteriorated due to heat dissipation.

According to an embodiment, the connection body 105 may further include a separate material different from the filling part 13 and be connected to the encapsulation structure 13. Optionally, according to an embodiment, the connection body 105 may include an adhesive material. Accordingly, the connection body 105 may be joined to the first filling part 1321 and the second filling part 1322 to firmly fix the filling part 132.

Figure 22:
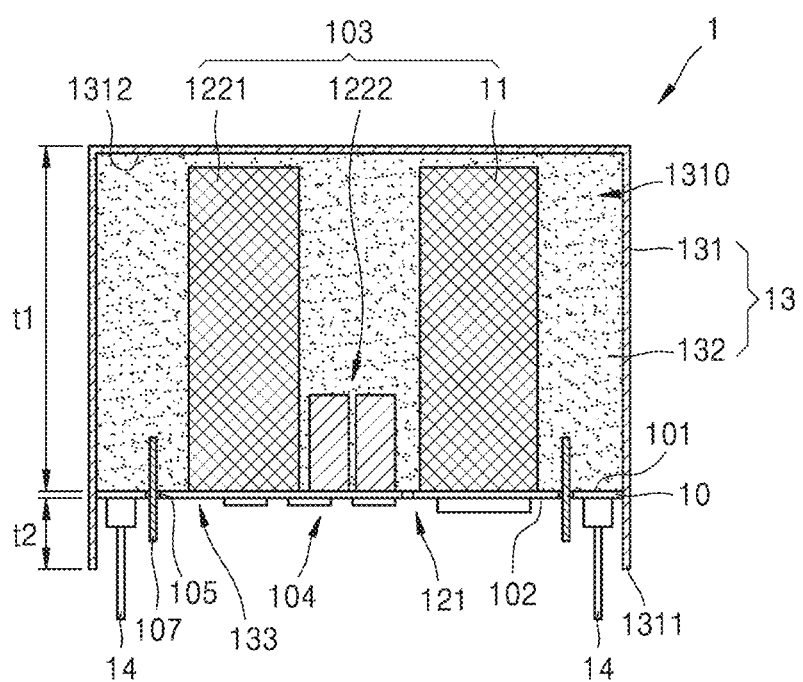
FIG. 22 is a cross-sectional view of an independent active electromagnetic interference filter module according to another embodiment.

FIG. 22 is an independent active electromagnetic interference filter module 1 according to another embodiment, unlike the embodiment illustrated in FIG. 20, a filling part 132 may be filled at least between a substrate 10 and a bottom 1312, the substrate 10 may be fixedly bonded to an inner wall of a support 131 by the filling part 132. In the independent active electromagnetic interference filter module 1 having the above structure, the second surface 102 of the substrate 10 on which pins 14 protrude may constitute a bottom surface 133 of the module.

According to an embodiment, a pin-shaped second connection body 107 may be coupled to the connection part 105. In the case of the second connection body 107, one end may be inserted into the filling part 132, and the other end may be exposed to the outside. The second connection body 107 may be formed of a conductive material, and thus may be used as a path for discharging heat inside the filling part 132. Optionally, the second connection body 107 may be connected to a ground line to improve electrical stability of the independent active electromagnetic interference filter module 1. Although not illustrated, the second connection body 107 may also be applied to the embodiment illustrated in FIG. 6.

Figure 23A:
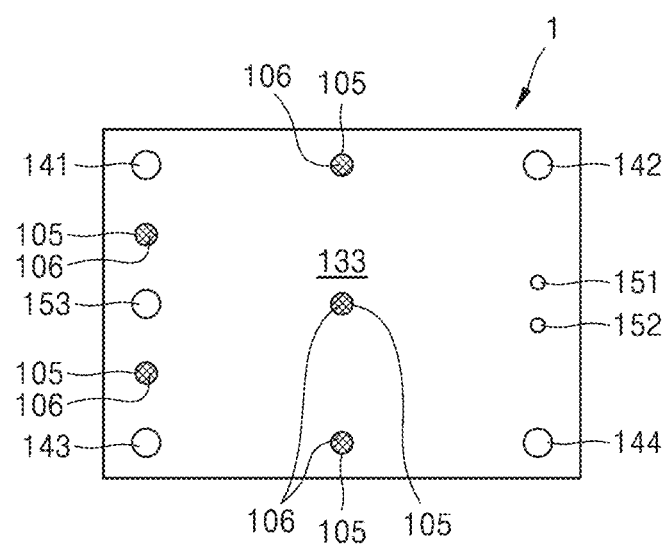
FIGS. 23A and 23B are bottom views illustrating an arrangement state of a first pin group and a second pin group according to another embodiment.
Figure 23B:
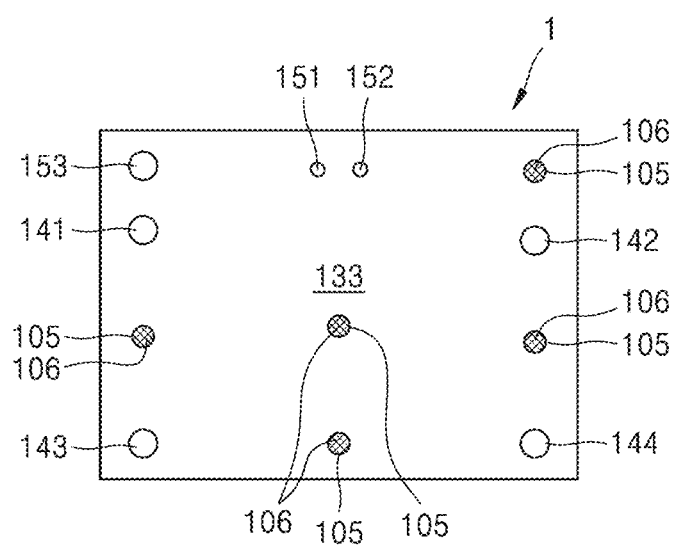

FIGS. 23A and 23B are at least one of a connection part 105 and a connection body 106 applied to FIGS. 8A and 8B, respectively. As in FIGS. 23A and 23B, at least one of the connection part 105 and the connection body 106 may be disposed so as not to interfere with passive elements and/or active elements formed on a substrate 10, and may be installed in a position where various wirings are not formed. Specifically, the connection part 105 and/or the connection body 106 may be installed at a plurality of locations along the substantially central portion of the substrate 10 and the border of the substrate 10.

Figure 24:
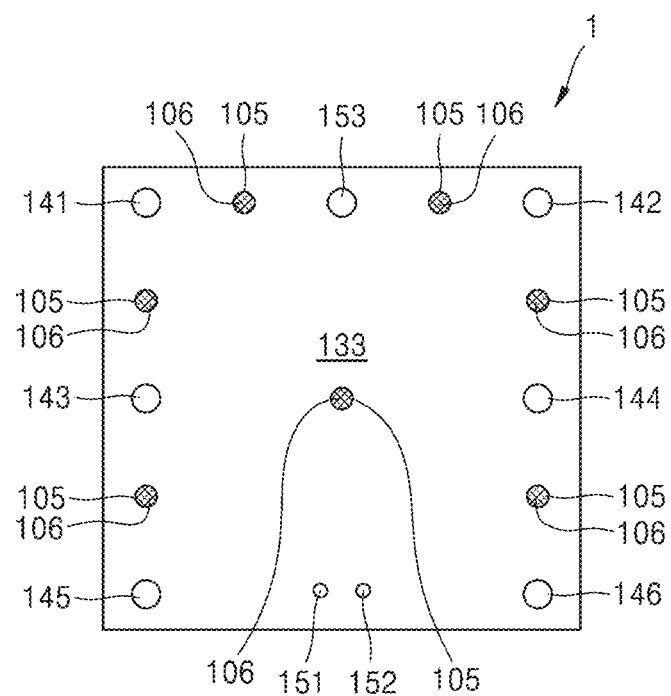
FIG. 24 is a bottom view illustrating an example of an arrangement state of another pin of the embodiment illustrated in FIG. 9.

Likewise, in the embodiment illustrated in FIG. 9, the arrangement of the pins may be implemented as illustrated in FIG. 24. That is, compared to the embodiment illustrated in FIG. 10, at least one of the connection part 105 and the connection body 106 may be disposed so as not to interfere with the passive elements and/or active elements formed on the substrate 10, and may be installed in a position where various wirings are not formed. Specifically, the connection part 105 and/or the connection body 106 may be installed at a plurality of locations along the substantially central portion of the substrate 10 and the border of the substrate 10.

Figure 25:
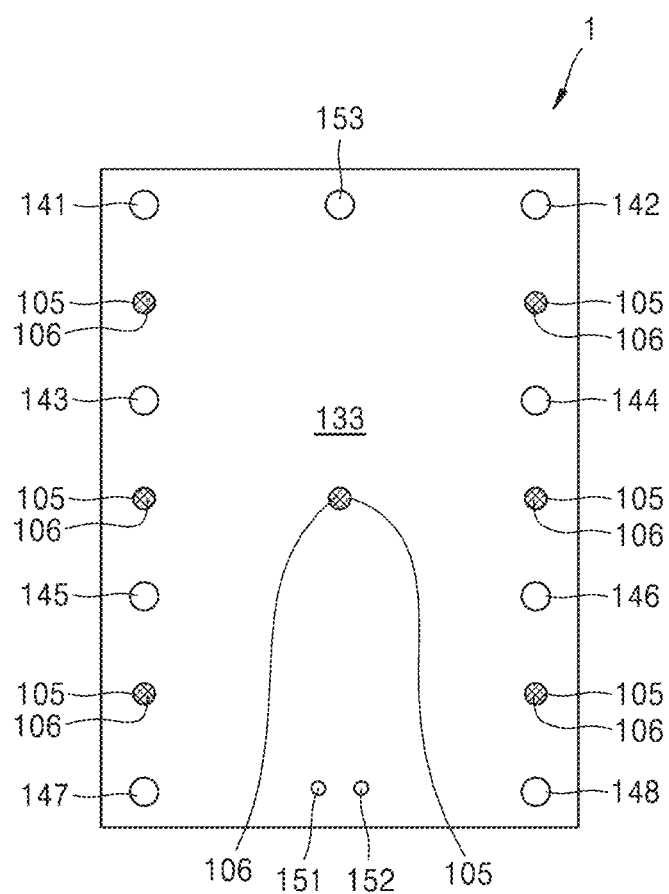
FIG. 25 is a bottom view illustrating an example of an arrangement state of another pin of the embodiment illustrated in FIG. 11.

The embodiment illustrated in FIG. 25 illustrates the pin arrangement of the embodiment illustrated in FIG. 11, compared to the embodiment illustrated in FIG. 12, a connection part 105 and/or a connection body 106 can be installed in a plurality of locations along a center of a substrate 10 and a border of the substrate 10.

The independent active electromagnetic interference filter module 1 as described above may be manufactured in a following way.

Figure 26:
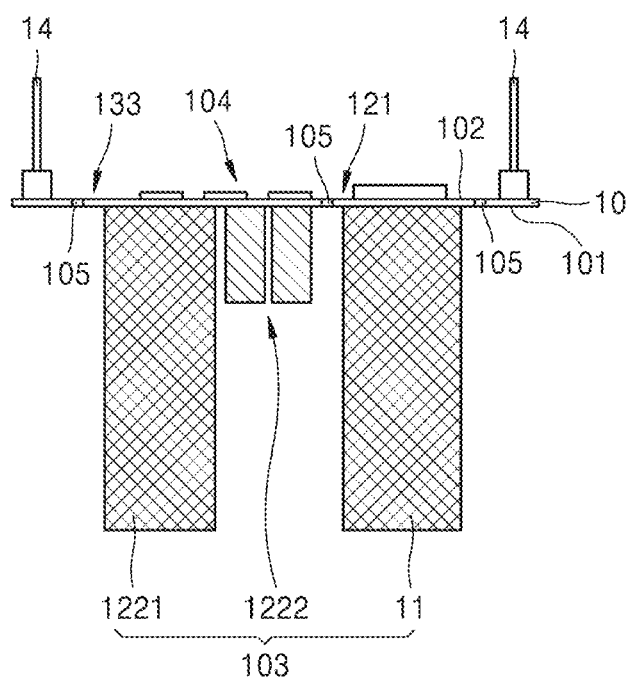
FIGS. 26 to 27 are views illustrating a manufacturing process of an independent active electromagnetic interference filter module according to still other embodiments.

First, as illustrated in FIG. 26, a substrate 10 including a first surface 101 and a second surface 102 facing each other is prepared, and a first element group 11 and a second element group 12 are installed on the substrate 10. As described above, the first element group 11 is an element group provided to sense electromagnetic noise, and the second element group 12 is an element group provided to generate a compensation signal for electromagnetic noise. Hereinafter, descriptions overlapping those of the above-described embodiments illustrated in FIGS. 13 to 17 will be omitted.

At least one connection part 105 may be formed on the substrate 10. The connection part 105 may be formed in a hole shape penetrating through the substrate 10, may be disposed so as not to interfere with passive elements and/or active elements formed on the substrate 10, and may be installed in a position where various wirings are not formed. Specifically, the connection part 105 may be installed in a plurality of locations along a central portion of the substrate 10 and/or a border of the substrate 10.

Although not illustrated, according to another embodiment, a connection body 106 may be previously formed in at least one of a connection part 105. The connection body 106 may include a heat-dissipating material, a heat transfer material and/or an adhesive material, and a material may be selected according to a required function.

Next, the substrate 10 on which the elements are mounted as described above is sealed.

According to one embodiment, for the sealing, a support 131 is prepared as illustrated in FIG. 14, and a filling solution 133 is put into a space 1310 through an opening 1311 of the support 131 as illustrated in FIG. 15.

Figure 27:
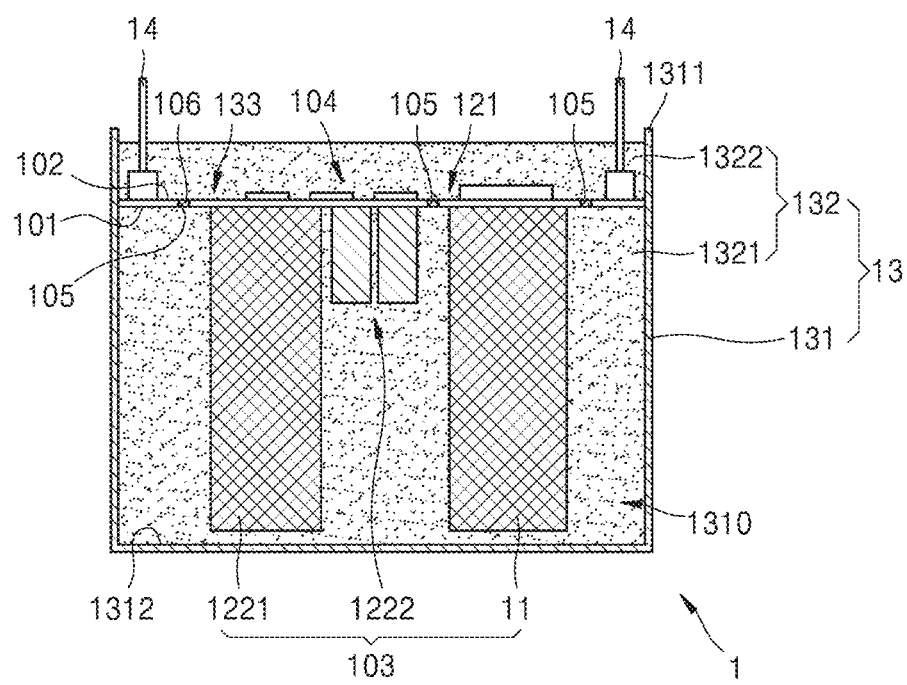

Next, as illustrated in FIG. 27, the above-described substrate 10 is accommodated in the space 1310 in which the filling solution 133 is accommodated. At this time, the first surface 101 of the substrate 10 faces the bottom 1312 of the space 1310, and the third element group 103 mounted on first surface 101 may be sufficiently immersed in the filling solution 133.

In a state in which the third element group 103 is submerged in the filling solution 133, an upper portion of the third element group 103 may be spaced apart from the bottom 1312 of the space 1310 by a predetermined distance.

At this time, since the connection part 105 is formed in at least one region of the substrate 10, the filling solution 133 may pass from the first surface 101 to the second surface 102 of the substrate 10 through the connection part 105. Accordingly, the filling solution 133 passing through the connection part 105 may completely submerge a fourth element group 104 installed on a second surface 102 of the substrate 10 in the filling solution 133. After that, the filling solution 133 is cured to form a filling part 132. According to an embodiment, the filling solution 133 passing through the connection part 105 may form the connection body 106.

The filling part 132 includes a first filling part 1321 positioned between the substrate 10 and the bottom 1312 and a second filling part 1322 covering the fourth element group 104 of the substrate 10. In addition, pins 14 protrude out of the module through the second filling part 1322.

In this structure, the first filling part 1321 and the second filling part 1322 may be connected to each other by the connection body 106 located in the connection part 105, and thus a coupling structure of the filling part 132 may be further strengthened.

Figure 28:
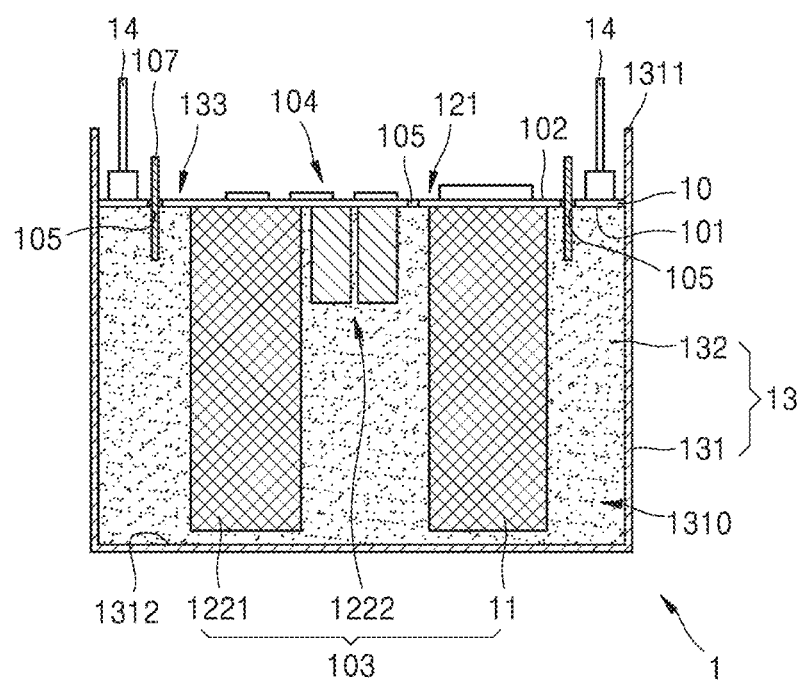
FIG. 28 is a diagram illustrating a part of a manufacturing process of an independent active electromagnetic interference filter module according to another embodiment.

FIG. 28 illustrates a manufacturing method according to another embodiment, and as illustrated in FIG. 15, a substrate 10 is immersed in a filling solution 133 filled in a space 1310 of a support 131.

a plurality of connection part 105 are formed on the substrate 10, and a second connection body 107 may be coupled to at least some of them. The filling solution 133 is sufficient if the amount is sufficient to submerge the third element group 103 installed on the substrate 10.

Here, when the substrate 10 is immersed, a second surface 102 of the substrate 10 is not sufficiently immersed in the filling solution 133. When the filling solution 133 is cured in this state, the filling part 132 of the independent active electromagnetic interference filter module 1 as illustrated in FIG. 22 may be completed. In the case of the independent active electromagnetic interference filter module 1 of this structure, not all elements are sealed by the filling part 132, the active circuit unit 121 is exposed, but the third element group 103 is sealed by the filling part 132 and may be sufficiently protected. In addition, when the substrate 10 is a metal printed circuit board, since heat dissipation through the substrate 10 is also possible, the durability of the independent active electromagnetic interference filter module 1 according to the embodiment may be further improved.

Although not illustrated, the second connection body 107 may not be coupled to a part of the connection part 105 in the above structure, and thus the filling solution may penetrate the substrate 10 through a portion of the connection part 105 that is not coupled to the second connection body 107 and seal the fourth element group 104.

Figure 29:
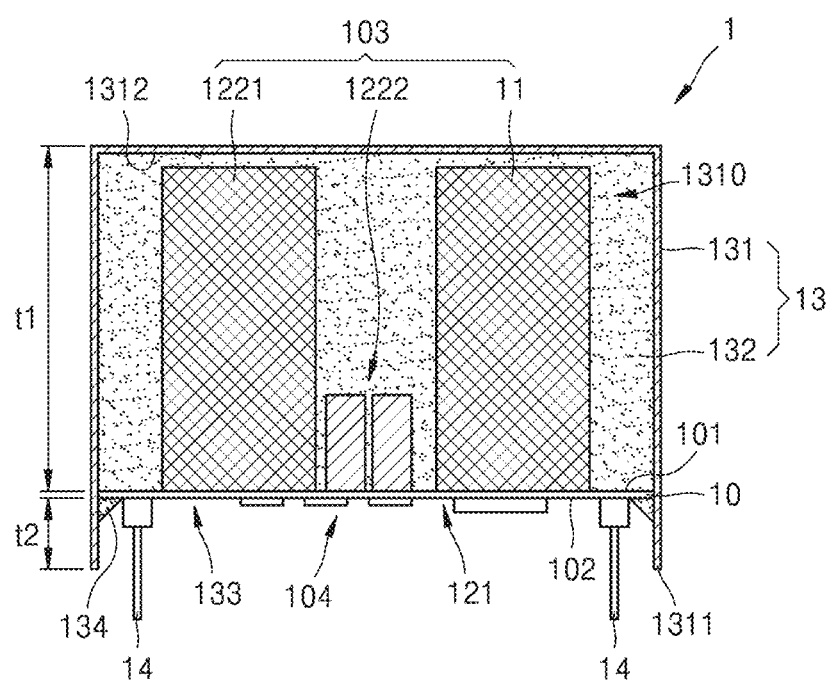
FIG. 29 is a cross-sectional view of an independent active electromagnetic interference filter module according to another embodiment.

FIG. 29 illustrates an encapsulation structure 13 of an independent active electromagnetic interference filter module 1 according to another embodiment.

According to the embodiment illustrated in FIG. 29, the independent active electromagnetic interference filter module 1 may include a filling part 132 provided to fill at least a portion of a space 1310. The filling part 132 may be filled at least between the substrate 10 and the bottom 1312, and the substrate 10 may be fixedly bonded to an inner wall of the support 131 by the filling part 132.

Figure 31:
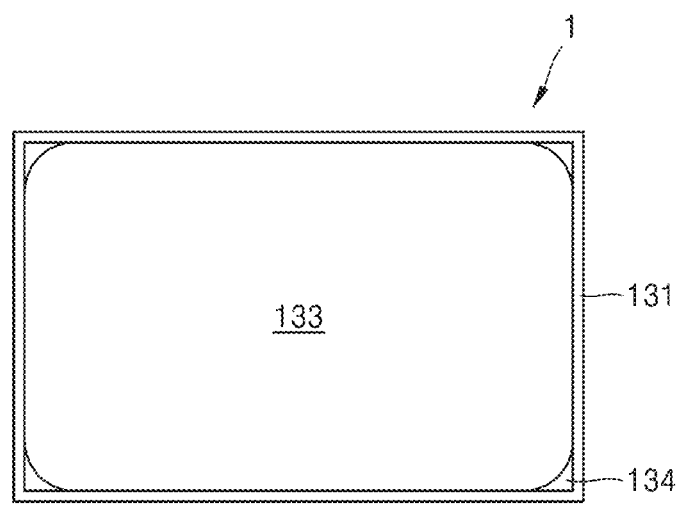
FIG. 31 is a bottom view of an independent active electromagnetic interference filter module according to an embodiment.

The independent active electromagnetic interference filter module 1 may include at least one junction 134 connected to at least the support 131, according to the embodiment illustrated in FIG. 31, the junction 134 may be bonded to a second surface 102 of the substrate 10 and an inner surface of the support 131. A second distance t2 that the second surface 102 of the substrate 10 is spaced apart from an opening 1311 may be a sufficient distance for the junction 134 to be installed. The second distance t2 may be defined as a margin through which the junction 134 may be installed. The substrate 10 may be more firmly bonded to the support 131 by the junction 134, and the junction 134 may prevent the substrate 10 from being separated from the support 131. The junction 134 may be provided so that the other portion not in contact with the substrate 10 and the support 131 has an inclined surface, and thus the space in which the junction 134 exists is minimized, and interference of the junction 134 with other members may be minimized.

The junction 134 may be formed of the same material as the filling part 132. However, the present invention is not limited thereto, and the junction 134 may include a material different from that of the filling part 132.

According to an embodiment, the substrate 10 may have a gap spaced apart from the support 131 in at least a part of the border, and a part of the filling part 132 may protrude in the direction of the second surface 102 of the substrate 10 by the gap. A portion of the protruding filling part 132 may spread to the outside of the gap to form the junction 134. In this case, the junction 134 may be connected to the filling part 132, and thus the substrate 10 may be more firmly fixed.

Figure 30:
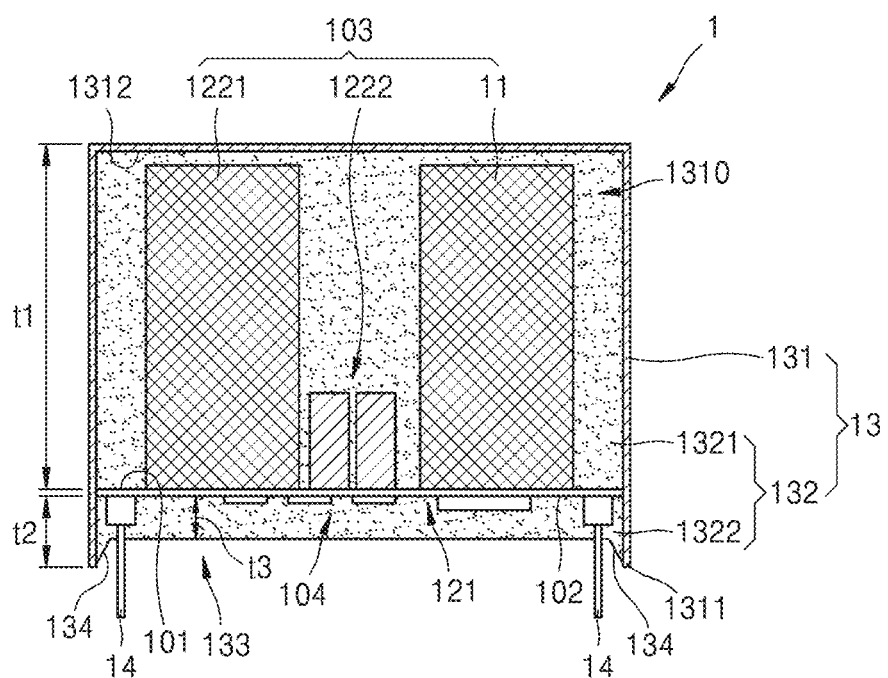
FIG. 30 is a cross-sectional view of an independent active electromagnetic interference filter module according to another embodiment.

FIG. 30 is an independent active electromagnetic interference filter module 1 according to another embodiment, unlike the embodiment illustrated in FIG. 31, a filling part 132 may include a first filling part 1321 and a second filling part 1322. The first filling part 1321 may face a first surface 101 of a substrate 10, and the second filling part 1322 may face a second surface 102 of the substrate 10. The second filling part 1322 is provided to completely cover a fourth element group 104, and thus pins 14 may protrude to an outside of the module through the second filling part 1322. According to an embodiment shown in FIG. 32, an independent active electromagnetic interference filter module 1 may include at least one junction 134 connected to at least a support 131. The junction 134 may be joined to a second filling part 1322 and an inner surface of the support 131.

A second distance t2 that the second surface 102 of the substrate 10 is spaced apart from an opening 1311 may be greater than a third distance t3 from the second surface 102 of the substrate 10 to a bottom surface 133 of the second filling part 1322. Accordingly, the second distance t2 may be such that the third distance t3 and a sufficient distance for the junction 134 to be installed are secured. The second distance t2 may be defined as a margin allowing the second filling part 1322 and the junction 134 to be installed. Accordingly, it may be prevented that the second filling part 1322 is formed to protrude beyond the opening 1311.

As in FIG. 30, the end of the junction 134 may be provided to be in contact with the opening 1311, but is not limited thereto, and may be spaced apart from the opening 1311 in the direction of the substrate 10. The junction 134 may be formed with a sufficient size when the end of the junction 134 is positioned to be spaced apart from the opening 1311, and it may be sufficiently prevented that the second filling part 1322 protrudes beyond the opening 1311 when the junction 134 is integrally formed with the second filling part 1322.

The substrate 10 may be more firmly bonded to the support 131 by the junction 134 as described above, and the junction 134 may prevent the substrate 10 from being separated from the support 131. In the case of such the junction 134, other parts not in contact with the second filling part 1322 and the support 131 may be provided to have an inclined surface, so that the space in which the junction 134 exists may be minimized and interference of the junction 134 with other members may be minimized.

The junction 134 may be formed of at least the same material as the second filling part 1322. According to one embodiment, the junction 134 may include a portion protruding from the second filling part 1322 to the inner wall of the support 131 by surface tension. The junction 134 may be integrally formed with the bottom surface 133 without interfering with the members forming the bottom surface 133.

FIG. 31 illustrates a bottom surface of an independent active electromagnetic interference filter module 1 according to an embodiment, as may be seen in FIG. 31, a junction 134 is located opposite an edge of a support 131, on each edge of the support 131 may be joined.

According to this structure, a fixing force of a substrate 10 and the support 131 may be secured while the junction 134 minimizes interference with members exposed to a bottom surface 133.

Figure 32:
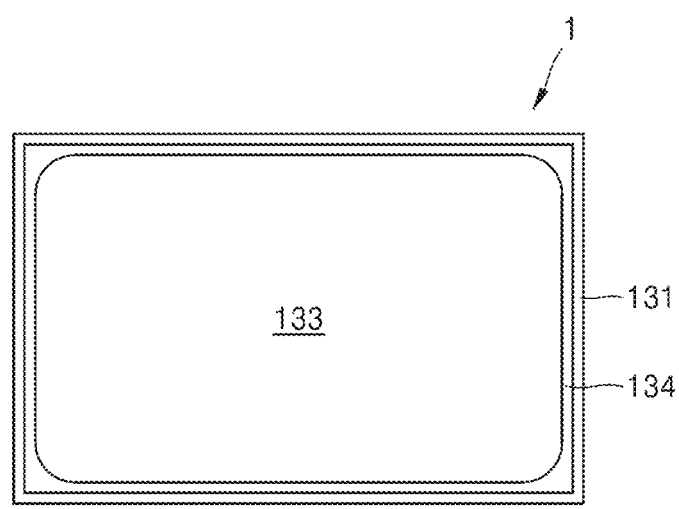
FIG. 32 is a bottom view of an independent active electromagnetic interference filter module according to another embodiment.
Figure 34:
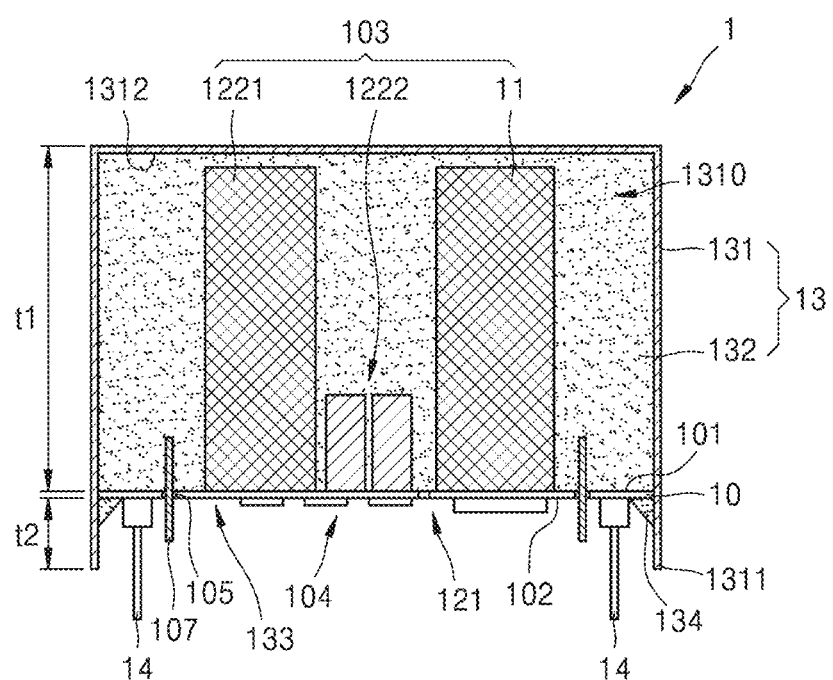
FIG. 34 is a cross-sectional view of an independent active electromagnetic interference filter module according to another embodiment.

FIG. 32 illustrates a bottom surface of an independent active electromagnetic interference filter module 1 according to another embodiment, and a junction 134 as seen in FIG. 34 may be formed to form a closed loop, may be positioned opposite to an edge and each side of a support 131, and may be joined to the entire inner surface of the support 131.

According to this structure, the junction 134 may further increase the fixing force of the substrate 10 and the support 131. It goes without saying that the embodiment illustrated in FIGS. 31 and 32 may be equally applied to other embodiments of the present specification.

Figure 33:
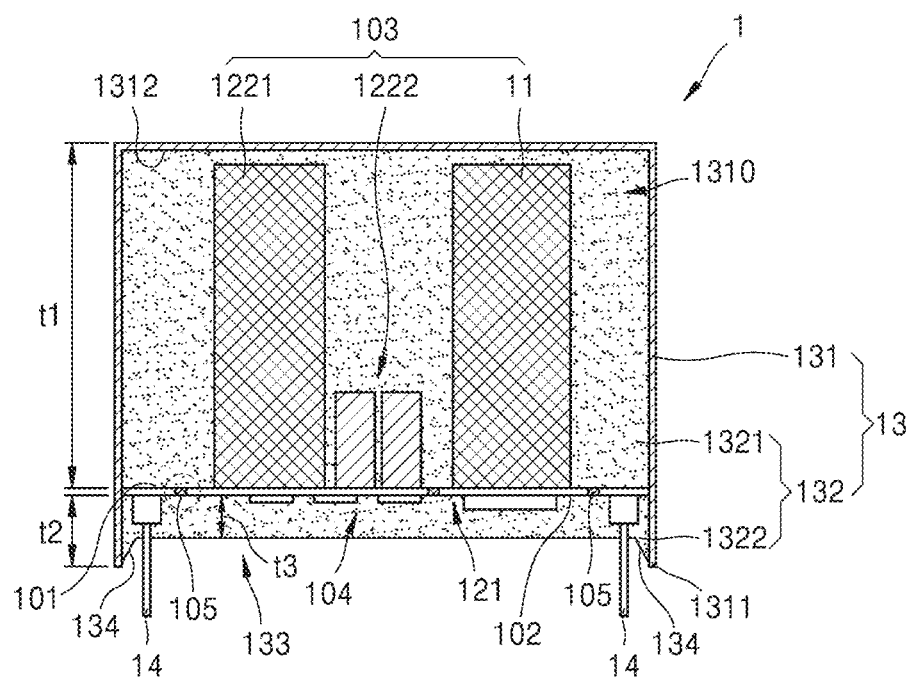
FIG. 33 is a cross-sectional view of an independent active electromagnetic interference filter module according to another embodiment.

FIG. 33 is a cross-sectional view illustrating an independent active electromagnetic interference filter module 1 according to another embodiment. An independent active electromagnetic interference filter module 1 according to the embodiment illustrated in FIG. 33 may further include a connection part 105 and a connection body 106 compared to the embodiment illustrated in FIG. 30. Parts overlapping with the embodiment illustrated in FIG. 30 will be omitted.

The connection part 105 is connected to a first surface 101 and a second surface 102 of a substrate 10 and may include a hole shape penetrating the first surface 101 and the second surface 102 of the substrate 10. The hole shape may have a circular or polygonal plane, and may have a normal structure or a step structure.

The connection part 105 may be arranged so as not to interfere with at least one of a first element group 11 and a second element group 12, when the connection part 105 has the hole shape formed in the substrate 10, the connection part 105 may be provided so as not to interfere with a third element group 103 and a fourth element group 104.

FIG. 34 is an independent active electromagnetic interference filter module 1 according to another embodiment, and an independent active electromagnetic interference filter module 1 according to the embodiment illustrated in FIG. 34, in compared to the embodiment illustrated in FIG. 31, may further include a connection part 105 and a second connection body 107. Parts overlapping with the embodiment shown in FIG. 29 will be omitted. In this embodiment, a junction 134 may be formed so as not to interfere with a second connection body 107.

The independent active electromagnetic interference filter module 1 as described above may be manufactured in a following way.

First, as illustrated in FIG. 13, a substrate 10 including a first surface 101 and a second surface 102 facing each other is prepared, and a first element group 11 and a second element group 12 are installed on the substrate 10. As described above, the first element group 11 is an element group provided to sense electromagnetic noise, and the second element group 12 is an element group provided to generate a compensation signal for electromagnetic noise.

Next, the substrate 10 on which the elements are mounted as described above is sealed.

According to one embodiment, for the sealing, a support 131 is prepared as illustrated in FIG. 14, and a filling solution 130 is put into a space 1310 through an opening 1311 of the support 131 as illustrated in FIG. 15.

Next, the above-described substrate 10 is accommodated in the space 1310 in which the filling solution 130 is accommodated. At this time, since the first surface 101 of the substrate 10 faces a bottom 1312 of the space 1310, a third element group 103 mounted on the first surface 101 may be sufficiently immersed in the filling solution 130.

When the filling solution 130 is cured, the filling part 132 of the independent active electromagnetic interference filter module 1 as illustrated in FIG. 29 may be completed. According to an embodiment, a junction 134 may be formed. The junction 134 may be formed by applying and curing the same material as the filling solution 130 between the second surface 102 of the substrate 10 and the inner wall of the support 131. According to an embodiment, the substrate 10 may have a gap spaced apart from the support 131 on at least a part of a border, and a part of the filling solution 130 may protrude in the direction of the second surface 102 of the substrate 10 by the gap. A portion of the protruding filling part 132 may spread to an outside of the gap, and the junction 134 may be formed by curing the filling solution 130. The curing of the junction 134 is not necessarily performed simultaneously with the formation of the filling part 132, but may also be performed after the filling part 132 is formed. In addition, the junction 134 is not limited to being formed of the same material as the filling part 132, and may be formed between the second surface 102 of the substrate 10 and the inner wall of the support 131 as a separate material.

According to another embodiment, a filling solution 130 may be further filled and then cured between an opening 1311 of a support 131 and a second surface 102 of the substrate 10. The filling solution 130 completely submerges a fourth element group 104, and then the filling solution 130 is cured to form a filling part 132. Accordingly, as in FIG. 30, the filling part 132 includes a first filling part 1321 positioned between a substrate 10 and a bottom 1312, and a second filling part 1322 covering the fourth element group 104 of the substrate 10. In addition, pins 14 protrude out of the module through the second filling part 1322. In addition, a junction 134 may be joined to the second filling part 1322 and an inner surface of the support 131.

When the junction 134 is formed of the same material as the filling part 132, the junction 134 may be cured simultaneously with the second filling part 1322.

In the structure having the connection part 105 as illustrated in FIG. 33, when the substrate 10 is immersed in the filling solution 130, since the connection part 105 is formed in at least one region of the substrate 10, the filling solution 130 may pass from the first surface 101 to the second surface 102 of the substrate 10 through the connection part 105. Accordingly, the filling solution 130 passing through the connection part 105 may completely submerge the fourth element group 104 installed on the second surface 102 of the substrate 10 in the filling solution 130. After that, the filling solution 130 is cured to form the filling part 132 as illustrated in FIG. 33. According to an embodiment, the filling solution 133 passing through the connection part 105 may form the connection body 106. Also, the junction 134 may be formed by the filling solution 130, and the junction 134 may be cured simultaneously with the filling solution 130.

The manufacturing method may be equally applied to a structure in which the second connection body 107 is coupled to a part of the connection part 105 as illustrated in FIG. 34.

Figure 35:
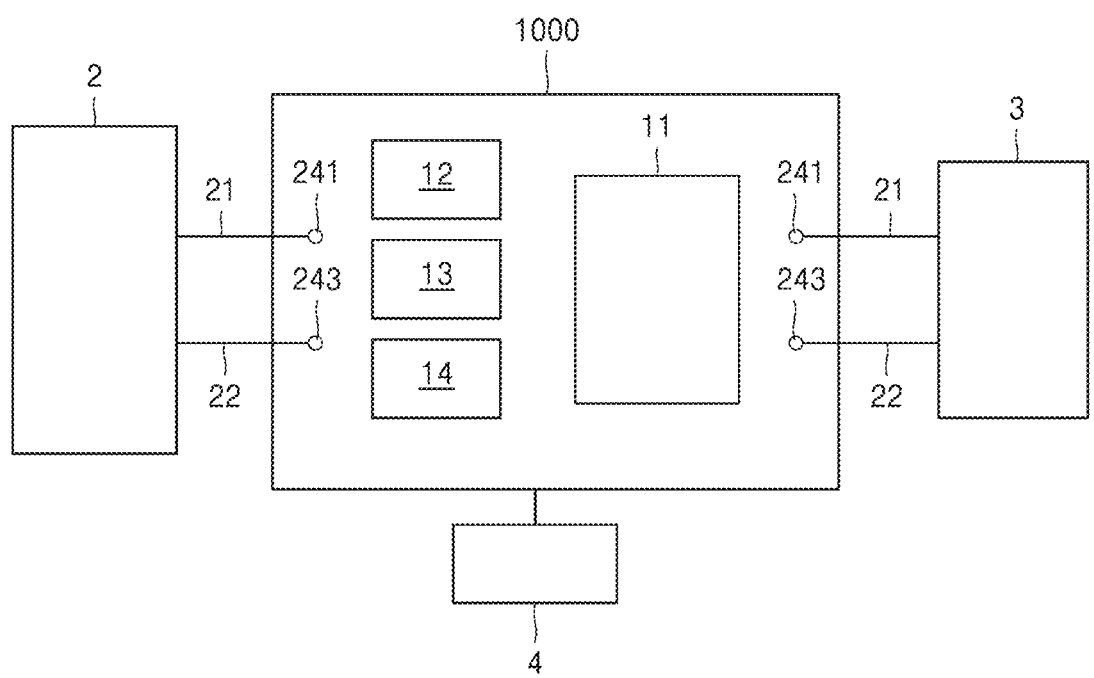
FIG. 35 is a block diagram of a divided active electromagnetic interference filter module according to another embodiment.

FIG. 35 is a block diagram of a divided electromagnetic interference filter module according to another embodiment.

A divided active electromagnetic interference filter module 1000 according to an embodiment may be interposed between a first through line 21 and a second through line 22. The first through line 21 and the second through line 22 may be electrically connected to a power line, the first through line 21 may be electrically connected to a live line L, and the second through line 22 may be electrically connected to a neutral line N.

According to an embodiment, the first through line 21 and the second through line 22 may be conductive patterns formed to electrically pass through a printed circuit board substrate of the divided active electromagnetic interference filter module 1000 from one end to the other end, respectively. The conductive pattern is not necessarily limited to extending in a straight line, and may extend in a complex path.

According to an embodiment, the divided active electromagnetic interference filter module 1000 may be electrically connected to a first device 2 and a second device 3 positioned outside.

The first device 2 may be various types of devices for supplying power in the form of current and/or voltage to the divided active electromagnetic interference filter module 1000. For example, the first device 2 may be a device that generates and supplies power, or a device that supplies power generated by another device (e.g., a charging device for an electric vehicle). Of course, the first device 2 may be a device that supplies stored energy. However, this is an example, and the spirit of the present disclosure is not limited thereto.

The second device 3 may be various types of devices and/or loads using power supplied by the first device 2. The second device 3 may be loads using power supplied by the first device 2. The second device 3 may be a load (e.g., at least one component of an electric vehicle) that stores energy using the power supplied by the first device 2 and is driven using the stored energy. However, this is an example, and the spirit of the present disclosure is not limited thereto.

Each of the first through line 21 and the second through line 22 may be a path through which electromagnetic noise generated in the second device 3 is transmitted to the first device 2. In this case, the electromagnetic noise may be input to each of the first through line 21 and the second through line 22 in a common mode.

The divided active electromagnetic interference filter module 1000 according to an embodiment may include a noise sensing unit 11, an active circuit unit 12, a compensating unit 13 and a transmission unit 14.

The noise sensing unit 11 may include at least one element electrically connected to the first through line 21 and the second through line 22. According to an embodiment, the noise sensing unit 11 may include an element provided to sense electromagnetic noise generated from the second device 3.

The active circuit unit 12 may serve as an amplifier, and may amplify a current corresponding to the electromagnetic noise sensed by the noise sensing unit 11 at a predetermined rate. According to an embodiment, the active circuit unit 121 may generate an amplified current having the same magnitude as a current corresponding to the electromagnetic noise and having an opposite phase.

The amplified current flows through the compensating unit 13 and the transmission unit 14 to the first through line 21 and/or the second through line 22 to compensate for noise.

The compensating unit 13 may generate a compensation signal based on the amplified current.

The transmission unit 14 may provide a path through which the compensation signal flows through the first through line 21 and/or the second through line 22.

On the other hand, at least a portion of the divided active electromagnetic interference filter module 1000 may be electrically connected to a third device 4.

According to an embodiment, the third device 4 may include a device that provides power to the active circuit unit 12. For example, the third device 4 may include a direct current power unit generating input power of the active circuit unit 12.

Figure 36:
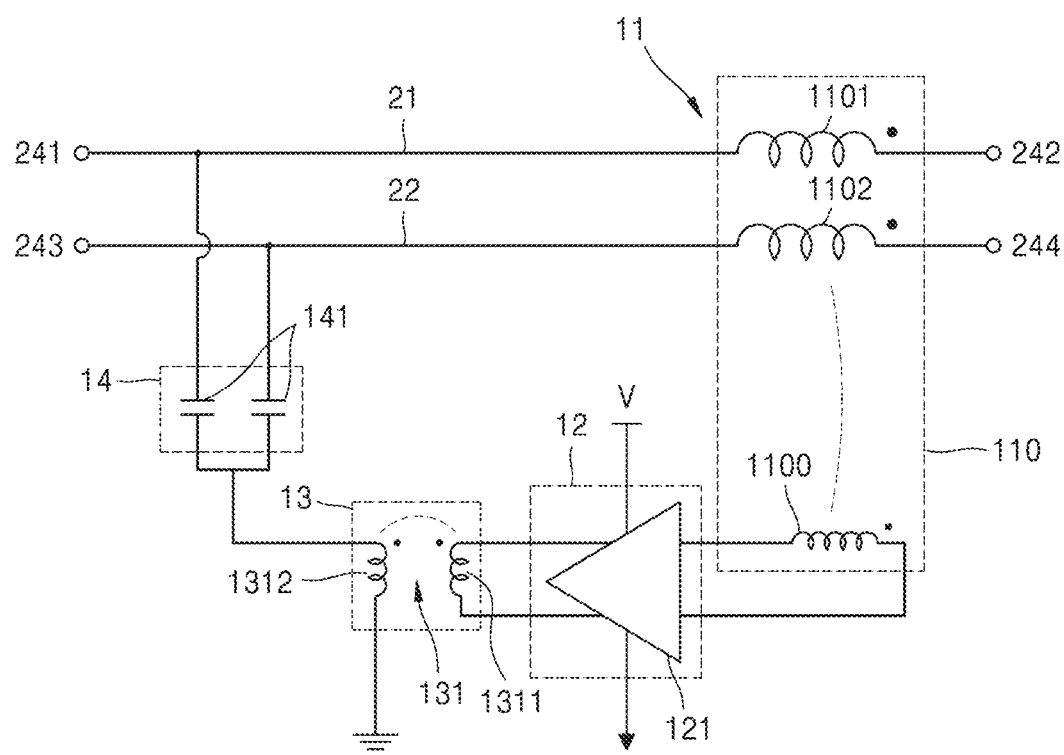
FIG. 36 is a view illustrating a more detailed configuration of a divided active electromagnetic interference filter module according to another embodiment.

FIG. 36 illustrates a more specific example of a divided active electromagnetic interference filter module 1000 according to another embodiment.

According to an embodiment, a first through line 21 and a second through line 22 may be designed to pass through a divided active electromagnetic interference filter module 1000.

Both ends of first through line 21 are connected to 1-1 th pin 241 and 1-2 th pin 242. And both ends of the second through line 22 are connected to 1-3 th pin 243 and 1-4 th pin 244.

As described above, the divided active electromagnetic interference filter module 1000 according to an embodiment may include a noise sensing unit 11, an active circuit unit 12, a compensating unit 13 and a transmission unit 14.

According to an embodiment, the noise sensing unit 11 may include a sensing transformer 110.

The sensing transformer 110 may include a first reference winding 1101 and a second reference winding 1102 electrically connected to the first through line 21 and the second through line 22 which are power lines, respectively, and a sensing winding 1100 formed in the same core as the first and second reference windings 1101 and 1102.

The first reference winding 1101 and the second reference winding 1102 may be a primary winding connected to the power line, and the sensing winding 1100 may be a secondary winding.

Each of the first reference winding 1101 and the second reference winding 1102 may be in the form of a winding wound around the core, but is not limited thereto, and may have a structure in which at least one of the first reference winding 1101 and the second reference winding 1102 passes through the core.

The sensing winding 1100 may have a structure in which the core on which the first reference winding 1101 and the second reference winding 1102 are wound or passed is wound at least once or more. However, the present disclosure is not limited thereto, and the sensing winding 1100 may be formed in a structure penetrating the core.

This sensing winding 1100 may be electrically insulated from the primary winding which is the power line, and may sense a noise current generated by the second device 3, and may induce a current converted from the noise current at a certain rate.

The primary winding and secondary winding may be wound in consideration of the direction of generation of magnetic flux and/or magnetic flux density.

For example, as a first current, which is noise, is input to the first reference winding 1101, a first magnetic flux density may be induced in the core. Similarly, as the first current, which is noise, is input to the second reference winding 1102, a second magnetic flux density may be induced in the core.

A first induced current may be induced in the sensing winding 1100, which is secondary side, by the induced first and second magnetic flux densities.

At this time, the sensing transformer is configured such that the first magnetic flux density and the second magnetic flux density induced by the first current may overlap (or reinforce each other), thus may generate the first induced current corresponding to the first current in the secondary side (i.e., sensing winding 1100) insulated from the first through line 21 and the second through line 22.

Meanwhile, the number of first reference winding 1101, second reference winding 1102 and sensing winding 1100 wound around the core may be appropriately determined according to the requirements of the system in which the divided active electromagnetic interference filter module 1000 is used.

For example, a turns ratio of primary winding as first reference winding 1101 and second reference winding 1102 and secondary winding as sensing winding 1100 may be 1:Nsen. Also, if a self-inductance of the primary winding of the sensing transformer is Lsen, the secondary winding may have a self-inductance of Nsen2·Lsen. The primary winding and secondary winding of the sensing transformer 120 may be coupled by a coupling coefficient of ksen.

Meanwhile, the above-described sensing transformer 110 may be configured such that a magnetic flux density induced by a second current that is a normal current flowing through each of the first through line 21 and the second through line 22 satisfies a predetermined magnetic flux density condition.

That is, a third magnetic flux density and a fourth magnetic flux density may be induced in the core by the second current flowing in the first reference winding 1101 and second reference winding 1102, respectively. At this time, the third magnetic flux density and the fourth magnetic flux density may be a condition that cancels each other.

In other words, the sensing transformer 110 may cause a second induced current induced in the sensing winding 1100 as the secondary side by the second current being the normal current flowing through the first through line 21 and the second through line 22 respectively to be less than a predetermined threshold magnitude, and the sensing transformer is configured such that the magnetic flux densities being induced by the second current cancel each other, so that only the above-described first current may be sensed.

The sensing transformer 110 may be configured such that the size of the first and second magnetic flux densities induced by the first current which is a noise current in a first frequency band (e.g., a band having a range of 150 KHz to 30 MHz) is greater than the size of the third and fourth magnetic flux densities induced by the second current that is the normal current of a second frequency band (e.g., a band of 50 Hz to 60 Hz).

In the present disclosure, 'component A is configured to do B' may mean that a design parameter of component A is set to be appropriate for B. For example, 'the sensing transformer is configured so that the magnitude of the magnetic flux induced by the current in a specific frequency band is large' may mean that the parameters such as the size of the sensing transformer, the diameter of the core, the number of turns, the magnitude of the inductance, and the magnitude of the mutual inductance are appropriately set so that the magnitude of the magnetic flux induced by the current in the specific frequency band becomes strong.

The sensing winding 1100, which is the secondary side of the sensing transformer 110, may be disposed on a path connecting an input terminal of the active circuit unit 12 and a reference potential of the active circuit unit 12 as illustrated in FIG. 36 to supply the first induced current to the active circuit unit 12.

According to an embodiment, the active circuit unit 12 may be a means for generating the amplified current by amplifying the first induced current generated by the sensing transformer.

According to an embodiment, the sensing winding 1100 may be differentially connected to the input terminal of the active circuit unit 12.

In the present disclosure, amplification by the active circuit unit 12 may mean adjusting the size and/or phase of the amplification target. For example, the active circuit unit 12 may change the phase of the first induced current by 180 degrees and increase the magnitude by k times (k>=1) to generate the amplified current.

The active circuit unit 12 may be designed to generate the amplified current in consideration of the above-described transformation ratio of the sensing transformer 110 and a transformation ratio of a compensation transformer 131 to be described later. For example, when the sensing transformer 110 converts the first current which is noise current into the first induced current with magnitude 1/F1 times, and the compensation transformer 131 converts the amplified current into the compensating current with magnitude 1/F2 times, the active circuit unit 12 may generate the amplified current with magnitude F1×F2 times magnitude of first induced current.

In this case, the active circuit unit 12 may generate the amplified current so that the phase of the amplified current is opposite to the phase of the first induced current.

The active circuit unit 12 may be implemented by various means, and according to an embodiment, the active circuit unit 12 may include an OP AMP 121. According to another embodiment, the active circuit unit 12 may include a plurality of passive elements such as resistors and capacitors in addition to an OP AMP. Further, according to another embodiment, the active circuit unit 12 may include a bipolar junction transistor (BJT) and/or a plurality of passive elements such as resistors and capacitors. However, the present disclosure is not necessarily limited thereto, and the means for amplification described in the present disclosure may be used without limitation as the active circuit unit 12 of the present disclosure.

The active circuit unit 12 may receive power from the separate third device 4 (refer to FIG. 35) separate from the first device 2 and/or the second device 3 and amplify the first induced current to generate the amplified current. In this case, the third device 4 may be a device that receives power from a power source independent of the first device 2 and the second device 3 and generates input power of the active circuit unit 12. In addition, the third device 4 may be a device that receives power from any one of the first device 2 and the second device 3 and generates input power of the active circuit unit 12.

The compensating unit 13 may generate a compensation signal based on the amplified output signal.

According to an embodiment, the compensating unit 13 may include the compensation transformer 131. At this time, the compensation transformer 131 may be a means for generating the compensating current on the first through line 21 and second through line 22 side or on a secondary side 1312 based on the amplified current in a state insulated or isolated from the first through line 21 and the second through line 22.

More specifically, the compensation transformer 131 may generate a compensating current in the secondary side 1312 based on the third magnetic flux density induced by the amplified current generated by the active circuit unit 12 in a primary side 1311 differentially connected to the output terminal of the active circuit unit 12. At this time, the secondary side 1312 may be grounded as a reference potential (first reference potential) of the transmission unit 14 and the divided active electromagnetic interference filter module 1000 to be described later.

The secondary side 1312 of the compensation transformer 131 is electrically connected to the first through line 21 and the second through line 22, which are the power lines, while being interposed in a transmission unit 14. Accordingly, the active circuit unit 12 may be insulated from the power line, and thus the active circuit unit 12 may be protected.

Meanwhile, according to another embodiment, the primary side 1311 of the compensation transformer 131, the active circuit unit 12 and the sensing winding 1100 may be connected to a reference potential (second reference potential) distinct from the rest of the components of the divided active electromagnetic interference filter module 1000. That is, the reference potential (second reference potential) of the active circuit unit 12 and the reference potential (first reference potential) of the divided active electromagnetic interference filter module 1000 may be different potentials. However, the present disclosure is not necessarily limited thereto, and the first reference potential and the second reference potential may be the same potential.

As such, according to an embodiment of the present disclosure, the component generating the compensating current may be operated in a state in which the component generating the compensating current insulated by using a different reference potential and a separate power source from the other components, so that the reliability of the divided active electromagnetic interference filter module 1000 may be improved.

As described above, the compensation transformer 131 may convert the current that is amplified by the active circuit unit 12 and flows through the primary side 1311 of the compensation transformer 131 at a certain rate and induce it to the secondary side 1312 of the compensation transformer 131.

For example, in the compensation transformer 131, the turns ratio of the primary side 1311 and the secondary side 1312 may be 1:Ninj. Also, if a self-inductance of the primary side 1311 of the compensation transformer 131 is Linj, the secondary side 1312 of the compensation transformer 131 may have a self-inductance of Ninj2·Linj. The primary side and the secondary side of compensation transformer 131 may be coupled by a coupling coefficient of kinj. Current converted through compensation transformer 131 may be injected as compensating current Icomp into the first through line 21 and the second through line 22 which are power lines through a compensation capacitor 141.

The transmission unit 14 may be a means for providing a path through which the current generated by the compensation transformer 131 flows to the first through line 21 and the second through line 22, respectively, according to an embodiment, the transmission unit 14 may include the compensation capacitor 141.

The compensation capacitor 141 may include at least two compensation capacitors connecting the reference potential (first reference potential) of the divided active electromagnetic interference filter module 1000 to each of the first through line 21 and the second through line 22. Each compensation capacitor may include a Y-capacitor (Y-cap). One end of each compensation capacitor shares a node connected to the secondary side 1312 of the compensation transformer 131, and the other end may each have a node connected to the first through line 21 and the second through line 22.

The compensation capacitor 141 may be configured such that the current flowing between first through line 21 and second through line 22 satisfies a first predetermined current condition through the at least two compensation capacitors. In this case, the first predetermined current condition may be a condition in which the magnitude of the current is less than a first predetermined threshold.

Also, the compensation capacitor 141 may be configured such that the current flowing between each of the first through line 21 and the second through line 22 and the reference potential (first reference potential) of the divided active electromagnetic interference filter module 1000 satisfies a second predetermined condition through at least two compensation capacitors. In this case, the second predetermined condition may be a condition in which the magnitude of the current is less than a second predetermined threshold.

The compensating current flowing through compensation capacitor 141 into first through line 21 and second through line 22, respectively, cancels the first current on first through line 21 and second through line 22, so that the first current may be prevented from being transmitted to the above-described second device 2. In this case, the first current and the compensating current may be currents having the same magnitude and opposite phases.

Accordingly, the divided active electromagnetic interference filter module 1000 according to an embodiment of the present disclosure actively compensates the first current which is the noise current input in common mode to the first through line 21 and the second through line 22 which are at least two high-current paths connected to the first device 2, respectively to suppress the noise current emitted to the first device 2. In this way, malfunction or damage of other devices connected to the second device 3 and/or the first device 2 may be prevented.

The divided active electromagnetic interference filter module 1000 having the above structure may be implemented on the substrate, and the first element group G1 including the noise sensing unit 11 provided to sense electromagnetic noise and the second element group G2 including the compensating unit 13 provided to generate the compensation signal for electromagnetic noise may be provided to be mounted on different substrates, respectively.

Figure 37:
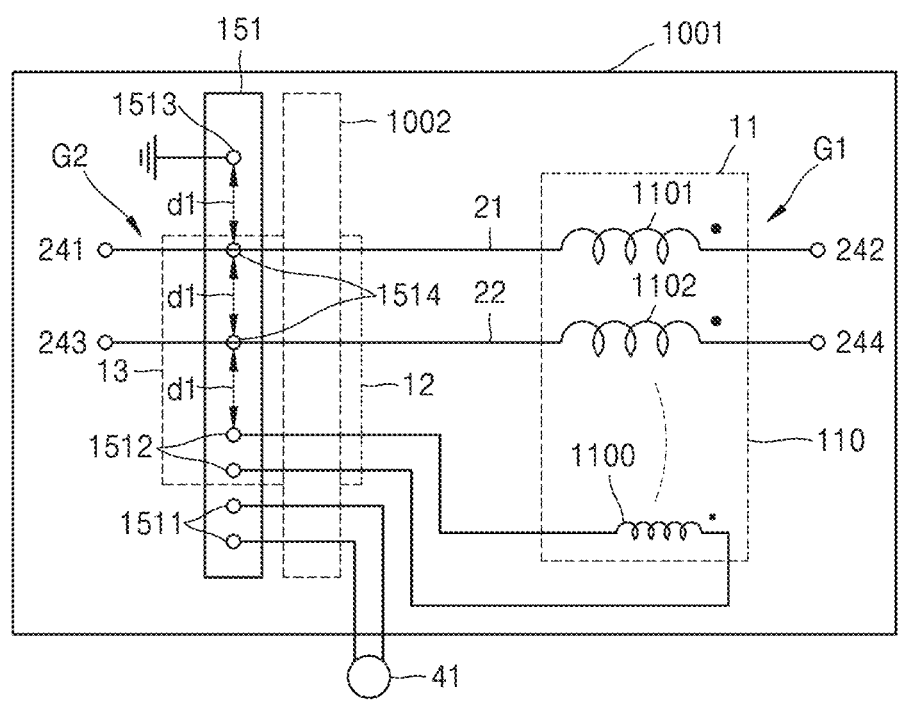
FIG. 37 is a plan view illustrating a first substrate of a divided active electromagnetic interference filter module according to another embodiment.
Figure 38:
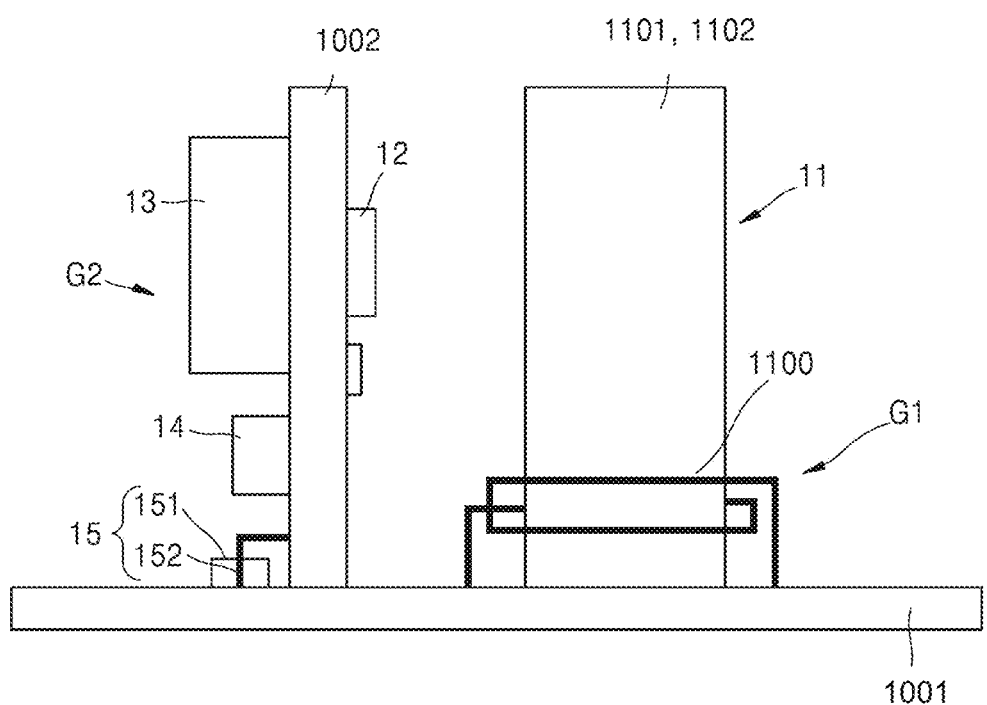
FIG. 38 is a side view in which a second substrate is coupled to a first substrate in a divided active electromagnetic interference filter module according to another embodiment.

FIGS. 37 and 38 illustrate that a divided active electromagnetic interference filter module 1000 according to an embodiment is implemented on a substrate, FIG. 37 is a plan view illustrating a first substrate 1001, and FIG. 38 is a side view illustrating that a second substrate 1002 is combined with the first substrate 1001.

Referring to FIGS. 37 and 38, a first element group G1 is mounted on the first substrate 1001. A first through line 21 and a second through line 22 may be designed to pass through the first substrate 1001. The first through line 21 and the second through line 22 may be implemented as a wiring thin film patterned between a 1-1 th pin 241 to a 1-4 th pin 244.

A noise sensing unit 11 of the first element group G1 is installed on the first substrate 1001. Specifically, a first reference winding 1101 and a second reference winding 1102 of the noise sensing unit 11 are electrically connected to the first through line 21 and the second through line 22, respectively. And a sensing winding 1100 may be connected to the wiring thin film patterned on the first substrate 1001 and electrically connected to a first electrical connection part 151 to be described later.

A second element group G2 may be mounted on the second substrate 1002 being an independent substrate separated from the first substrate 1001.

The second element group G2 may include an active circuit unit 12, a compensating unit 13 and a transmission unit 14 electrically connected to each other.

According to one embodiment, as illustrated in FIG. 38, the second substrate 1002 formed separately from the first substrate 1001 may be vertically coupled to the first substrate 1001. In addition, the first element group G1 and the second element group G2 may be electrically connected.

For electrical connection of the first element group G1 and the second element group G2, an electrical connection part 15 is interposed between the first substrate 1001 and the second substrate 1002.

A first electrical connection part 151 may be installed on the first substrate 1001. According to an embodiment, the first electrical connection part 151 may be a bar-shaped block structure provided in a straight line, and may include a plurality of electrical connection terminals arranged in-line along a straight line.

The electrical connection terminals provided in the first electrical connection part 151 may include a first connection terminal 1511, a second connection terminal 1512, a third connection terminal 1513 and a fourth connection terminal 1514.

The first connection terminal 1511 may include a pair of connection terminals located at one end of the first electrical connection part 151 and arranged in-line, and may be electrically connected to an external power supply 41. As illustrated in FIG. 2, the external power supply 41 may be a direct current power supplying power to the active circuit unit 12.

The second connection terminal 1512 may include pair of connection terminals located in-line adjacent to the first connection terminal 1511 and arranged in-line. The second connection terminal 1512 may be electrically connected to the sensing winding 1100 of a sensing transformer 110 constituting the noise sensing unit 11.

The third connection terminal 1513 may include a connection terminal located at the other end of the first electrical connection part 151 and located in-line adjacent to a fourth connection terminal 1514 to be described later. The third connection terminal 1513 is electrically connected to a ground line.

The fourth connection terminal 1514 may include a pair of connection terminals located adjacently in-line between the second connection terminal 1512 and the third connection terminal 1513. The fourth connection terminal 1514 is electrically connected to the first through line 21 and the second through line 22, and the number of connection terminals corresponds to the number of through lines.

On the other hand, since the fourth connection terminal 1514 is electrically connected to the first through line 21 and the second through line 22 becoming power lines, a first gap d1 must be maintained between each fourth connection terminal 1514 and between the other connection terminals (e.g., second connection terminal 1512 and third connection terminal 1513) adjacent to the fourth connection terminal 1514. This first gap d1 is a required insulation distance for safety, and is desirable that the first gap be larger than the gap between the first connection terminals 1511, the gap between the second connection terminals 1512 and/or the gap between the first connection terminal 1511 and the second connection terminal 1512. Therefore, a vertical length of the first electrical connection part 151 is set in consideration of the first gap d1.

This first gap d1 may also be applied between the first through line 21 and the second through line 22 patterned on the first substrate 1001.

The connection terminals as described above may be formed in a hole-shape in the block structure constituting the first electrical connection part 151.

As in FIG. 38, the second substrate 1002 is coupled to the first substrate 1001 adjacent to the first electrical connection part 151, and the second substrate 1002 has an extended second electrical connection part 152. The second electrical connection part 152 may include a plurality of connection pins, and the connection pins may be inserted into the connection terminals of the first electrical connection part 151 and thus may be electrically connected to each of the connection terminals of the first electrical connection part 151. According to an embodiment, the connection pins constituting the second electrical connection part 152 may have a bent pin structure extending vertically from the surface of the second substrate 1002 and bent horizontally on the surface of the second substrate 1002.

According to a specific embodiment, the second electrical connection part 152 may include two pairs of connection pins electrically connected to the active circuit unit 12. One pair may be inserted into the first connection terminals 1511, and the other pair may be inserted into the second connection terminals 1512.

The second electrical connection part 152 may include a pair of connection pins electrically connected to the transmission unit 14. This pair of connection pins may be inserted into the fourth connection terminals 1514.

The second electrical connection part 152 may include a connection pin electrically connected to the compensating unit 13. This connection pin may be inserted into the third connection terminal 1513.

As such, the second electrical connection part 152 includes the plurality of connection pins arranged in-line to correspond to the number and arrangement of the connection terminals of the first electrical connection part 151, and these connection pins are electrically connected to the first electrical connection part 151 by being respectively inserted into the connection terminals of the first electrical connection part 151.

Meanwhile, although the first electrical connection part 151 is illustrated as a block structure including the plurality of connection terminals in FIG. 38, the present disclosure is not necessarily limited thereto. Optionally, according to another embodiment, the first electrical connection part 151 may include a via hole formed in a first substrate 1001, and the connection terminals may be conductively patterned terminals in the via hole. Therefore, in this case, the second electrical connection part 152 may be electrically coupled by being directly inserted and fixed to the connection terminals formed in the via hole.

The present disclosure may significantly reduce the total area of the substrate on which the divided active electromagnetic interference filter module 1000 is installed and/or the volume of the divided active electromagnetic interference filter module 1000 by installing the first element group G1 and the second element group G2 on the separate substrates and combining them through the simple electrical connection part 15 as described above. In addition, the first substrate 1001 and the second substrate 1002 may be simply connected and/or disconnected, and assembly and maintenance may be simpler because the component elements are distributed and installed on the separate substrates.

Figure 39:
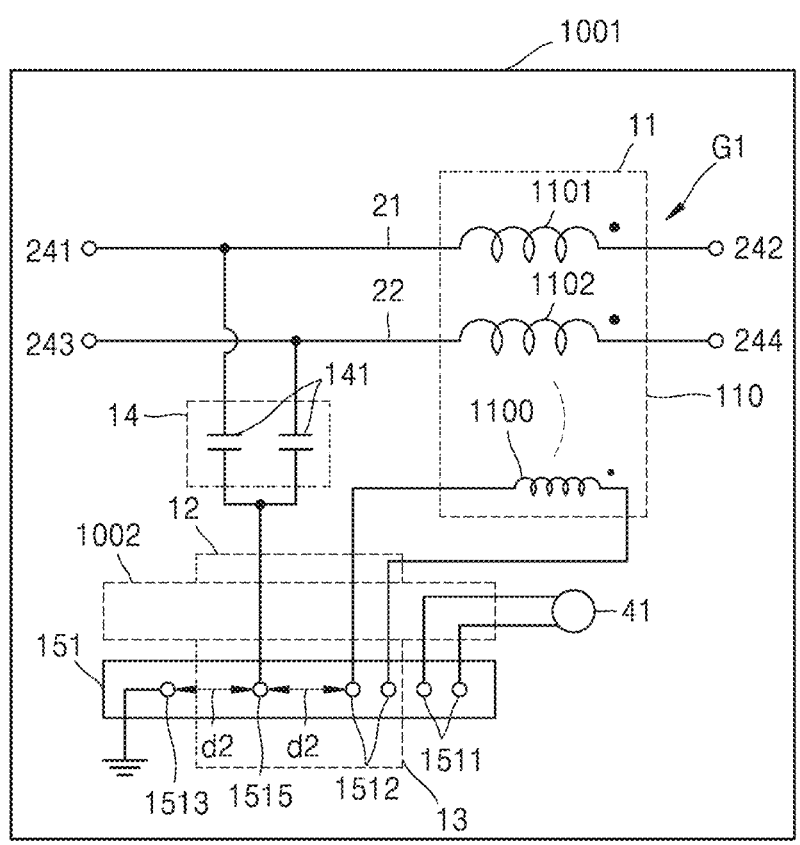
FIG. 39 is a plan view illustrating a first substrate of a divided active electromagnetic interference filter module according to another embodiment.
Figure 40:
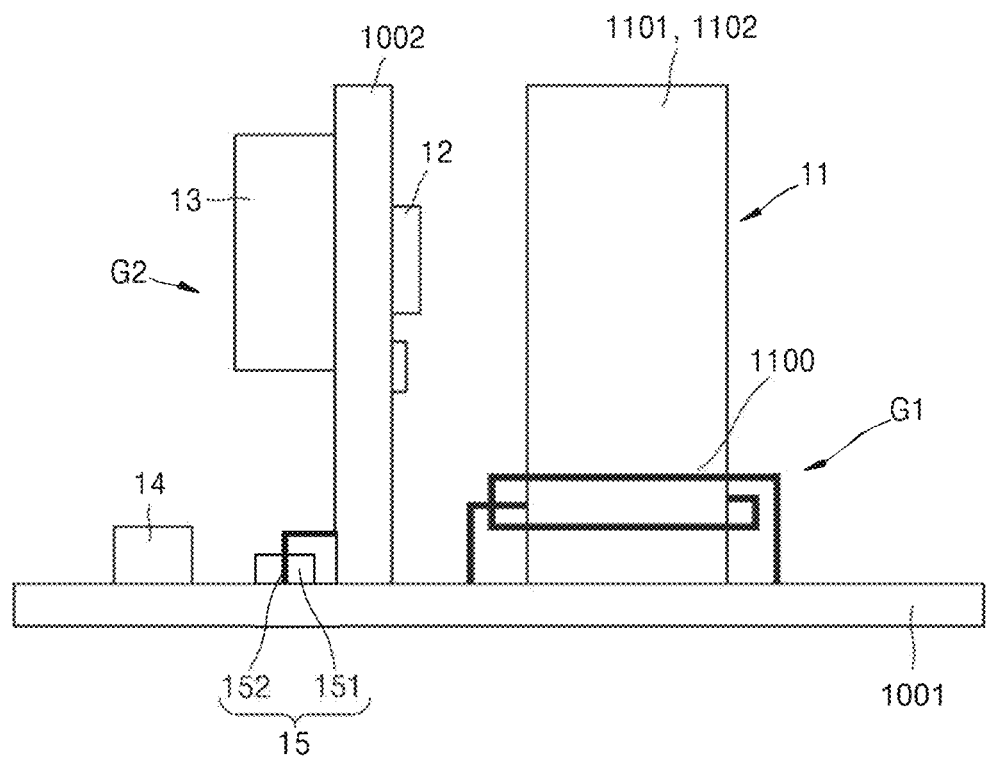
FIG. 40 is a side view in which a second substrate is coupled to a first substrate in a divided active electromagnetic interference filter module according to another embodiment.

FIGS. 39 and 40 illustrates that a divided active electromagnetic interference filter module 1000 according to another embodiment is implemented on a substrate, FIG. 5 is a plan view illustrating a first substrate 1001, and FIG. 6 is a side view illustrating that a second substrate 1002 is coupled to a first substrate 1001.

Referring to FIGS. 39 and 40, a first element group G1 is mounted on a first substrate 1001, and a second element group G2 is mounted on a second substrate 1002.

A first through line 21 and a second through line 22 may be designed to pass through the first substrate 1001. The first through line 21 and the second through line 22 may be implemented as a wiring thin film patterned between a 1-1 th pin 241 to a 1-4 th pin 244.

According to the embodiment illustrated in FIGS. 39 and 40, the first element group G1 may include a noise sensing unit 11 and a transmission unit 14. The noise sensing unit 11 and the transmission unit 14 may be coupled to the first substrate 1001 to be electrically connected to the first through line 21 and the second through line 22 implemented on the first substrate 1001, respectively.

A second element group G2 may be mounted on the second substrate 1002 being an independent substrate separated from the first substrate 1001.

An active circuit unit 12 and a compensating unit 13 electrically connected to each other may be included in the second element group G2.

According to an embodiment, as illustrated in FIG. 40, the second substrate 1002 formed separately from the first substrate 1001 may be vertically coupled to the first substrate 1001. In addition, the first element group G1 and the second element group G2 may be electrically connected.

For electrical connection of the first element group G1 and the second element group G2, an electrical connection part 15 may be interposed between the first substrate 1001 and the second substrate 1002, as in the above-described embodiment, the first electrical connection part 151 may be a bar-shaped block structure provided in a straight line, and may include a plurality of electrical connection terminals arranged in an in-line shape along a straight line.

Electrical connection terminals provided in the first electrical connection part 151 may include a first connection terminal 1511, a second connection terminal 1512, a third connection terminal 1513 and a fifth connection terminal 1515. In this embodiment, unlike the above embodiment, a fourth connection terminal electrically connected to the first through line 21 and the second through line 22 is not included. Since the first connection terminal 1511 to the third connection terminal 1513 are the same as in the above-described embodiment, hereinafter, the fifth connection terminal 1515 will be mainly described.

The fifth connection terminal 1515 may include a connection terminal located adjacently in-line between the second connection terminal 1512 and the third connection terminal 1513. The fifth connection terminal 1515 may be electrically connected to the transmission unit 14 installed on the first substrate 1001.

Optionally, a second gap d2 may be maintained between the fifth connection terminal 1515 and other adjacent connection terminals (e.g., second connection terminal 1512 and/or third connection terminal 1513). The second gap d2 may be an insulation distance necessary for safety, and may be larger than the gap between first connection terminals 1511, the gap between second connection terminals 1512, and/or the gap between first connection terminal 1511 and second connection terminal 1512. Accordingly, an insulation distance from a ground line to the second connection terminal 1512 which is a signal line may be sufficiently secured.

According to an embodiment, the second gap d2 may be less than or equal to the above-described first gap d1. The first gap d1 is an insulation distance by the first through line 21 and the second through line 22, which are the power lines, because the second gap d2 is an insulation distance from the power line through which the transmission unit 14 is interposed and/or the ground line.

Meanwhile, between the first through line 21 and the second through line 22 patterned on the first substrate 1001 may be spaced apart from the same as the first gap as described above.

An extended second electrical connection part 152 is formed on the second substrate 1002. The second electrical connection part 152 may include a plurality of connection pins, and the connection pins may be inserted into the connection terminals of the first electrical connection part 151 and thus may be electrically connected to each of the connection terminals of the first electrical connection part 151.

According to a specific embodiment, the second electrical connection part 152 may include two pairs of connection pins electrically connected to the active circuit unit 12. One pair may be inserted into the first connection terminals 1511, and the other pair may be inserted into the second connection terminals 1512.

The second electrical connection part 152 may include a connection pin electrically connected to the compensating unit 13. This connection pin may be inserted into the fifth connection terminal 1515.

As such, the second electrical connection part 152 includes the plurality of connection pins arranged in-line to correspond to the number and arrangement of the connection terminals of the first electrical connection part 151, and these connection pins are electrically connected to the first electrical connection part 151 by being respectively inserted into the connection terminals of the first electrical connection part 151.

Meanwhile, as described above, although the first electrical connection part 151 is illustrated as the block structure including the plurality of connection terminals in FIG. 40, the present disclosure is not necessarily limited thereto. Optionally, according to another embodiment, the first electrical connection part 151 may include a via hole formed in a first substrate 1001, and the connection terminals may be conductively patterned terminals in the via hole. Therefore, in this case, the second electrical connection part 152 may be electrically coupled by being directly inserted and fixed to the connection terminals formed in the via hole.

According to the above embodiment, by the transmission unit 14 is installed on the first substrate 1001, the length of the second substrate 1002 may be further reduced, there is no need to install the connection terminal electrically connected to the first through line 21 and second through line 22, which are the power lines, to the first electrical connection part 151, the need to secure the insulation distance due to the power line is reduced, and the second substrate 1002 may be designed smaller. In addition, the arrangement design of the elements is free, and it may be more effective to minimize the overall size.

Figure 41:
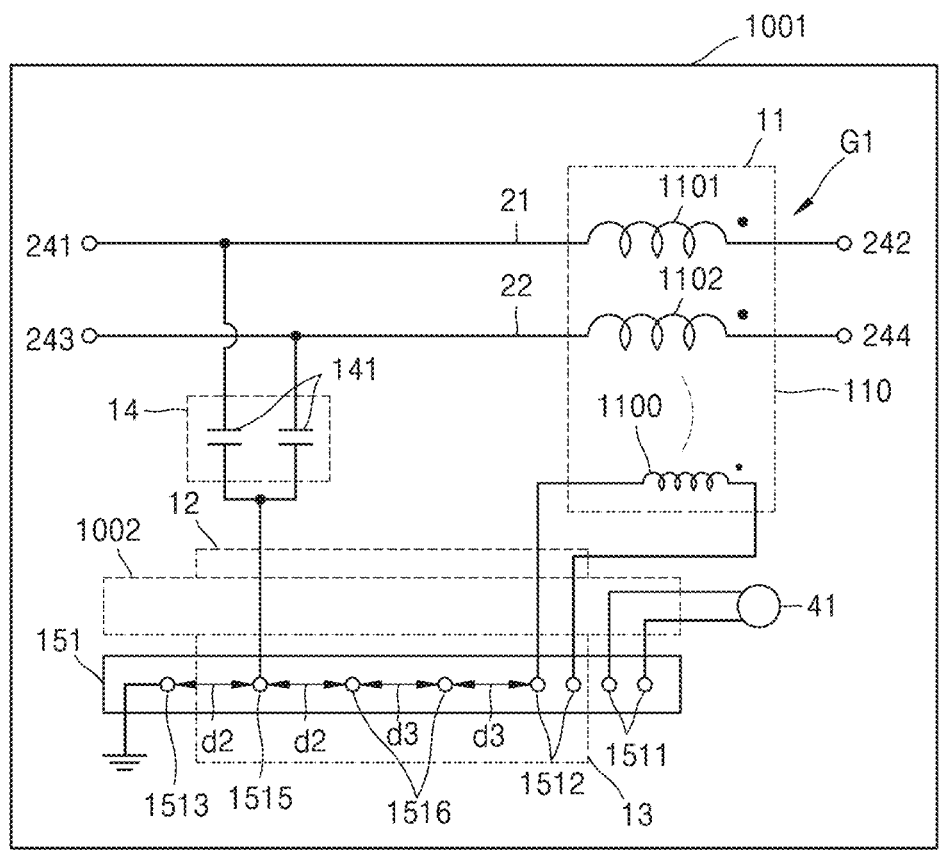
FIG. 41 is a plan view illustrating a first substrate of a divided active electromagnetic interference filter module according to another embodiment.

FIG. 41 is a plan view illustrating a first substrate 1001 of a divided active electromagnetic interference filter module 1000 according to another embodiment.

Unlike the embodiment illustrated in FIG. 39, in the embodiment illustrated in FIG. 41, a sixth connection terminal 1516 may be further disposed between a fifth connection terminal 1515 and a second connection terminal 1512.

The sixth connection terminal 1516 may be a dummy connection terminal, that is, a connection terminal to which no elements are connected. Thus, by installing the sixth connection terminal 1516, the second connection terminal 1512 and/or a first connection terminal 1511, which are signal lines, is sufficiently spaced from a ground line, an insulation distance may be secured. Accordingly, the sixth connection terminal 1516 does not have to be provided as a pair of connection terminals as illustrated in FIG. 7, but one or more may be provided.

In FIG. 41, between a third connection terminal 1513 and the fifth connection terminal 1515 and between the fifth connection terminal 1515 and the sixth connection terminal 1516 may have a second gap d2, between the sixth connection terminals 1516 and between the sixth connection terminal 1516 and the second connection terminal 1512 may have a third gap d3. The description of the second gap d2 is the same as the description of the second gap d2 illustrated in FIG. 6, and thus will be omitted. The third gap d3 may be equal to or smaller than the second gap d2. The third gap d3 may be designed in consideration of the number of the sixth connection terminals 1516 and an insulation distance to be secured, when the number of the sixth connection terminals 1516 increases, the third gap d3 may also decrease. Although not illustrated, optionally, according to another embodiment, at least a portion of the second gap d2 and at least a portion of the third gap d3 may be the same as the gap between the first connection terminals 1511 and/or the gap between the second connection terminals 1512. Optionally, the gap between all connection terminals may be regularly arranged equal to the gap between the first connection terminals 1511 and/or the gap between the second connection terminals 1512. This is because the second connection terminal 1512 and/or the first connection terminal 1511, which are the signal lines, may be sufficiently separated from the ground line to secure the insulation distance due to the sixth connection terminal 1516 which is the dummy connection terminal. Accordingly, optionally, a first electrical connection part 151 having the same horizontal length as the embodiment illustrated in FIG. 5 may be formed.

According to the above embodiment, the second substrate 1002 having a minimized size may be implemented while the insulation distance between the ground line and the signal line is sufficiently secured.

In the above-described embodiments, the first electrical connection part 151 has a plurality of hole-shaped connection terminals, and the second electrical connection part 152 is provided in the form of a pin and inserted into the first electrical connection part 151, thereby making electrical connection. However, the present disclosure is not necessarily limited to this form.

Figure 42:
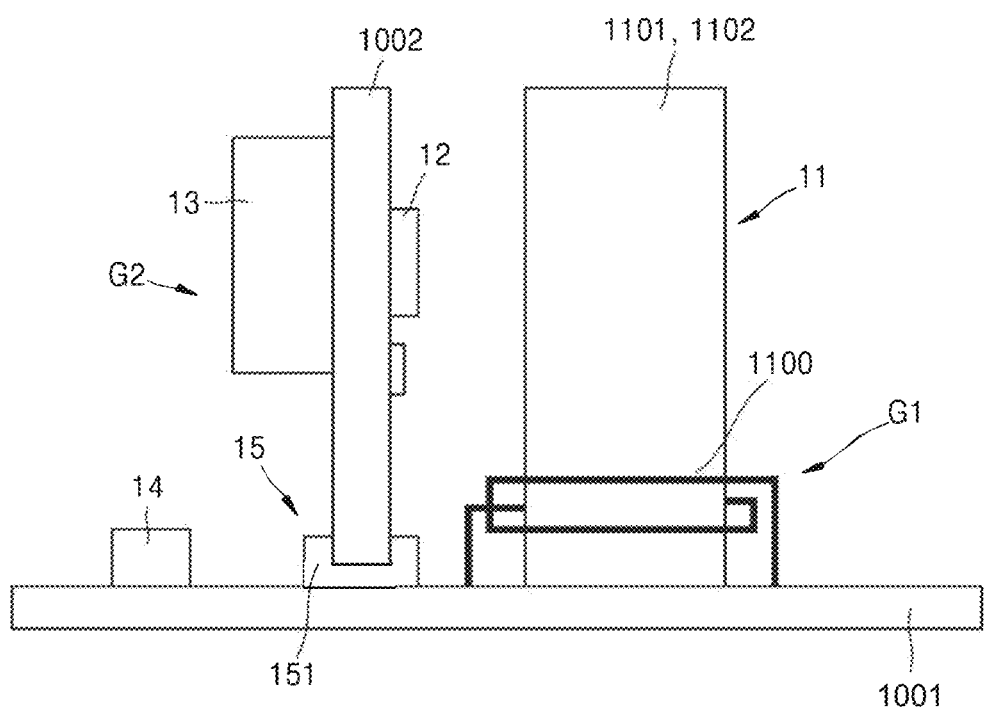
FIG. 42 is a side view in which a second substrate is coupled to a first substrate according to another embodiment.

FIG. 42 illustrates a side view in which a second substrate 1002 is coupled to a first substrate 1001 according to another embodiment.

According to the embodiment illustrated in FIG. 42, a first electrical connection part 151 may include a slot into which the second substrate 1002 may be fixedly inserted. The above-mentioned connection terminals are installed inside this slot. And the second substrate 1002 itself is inserted into the slot of the first electrical connection part 151. At this time, a plurality of connection terminals are installed on a side of an end of the second substrate, and when the second substrate 1002 is inserted into the slot of the first electrical connection part 151, the connection terminals of the second substrate are electrically connected to the connection terminals inside the slot. The plurality of connection terminals formed on the side surface of the end of the second substrate may be a second electrical connection part. In this case, the second substrate 1002 may be coupled to the first substrate 1001 only by inserting the second substrate 1002 into the slot of the first electrical connection part 151, and at the same time, a first element group G1 and a second element group G2 may be electrically connected. Therefore, a coupling structure of the first substrate 1001 and the second substrate 1002 may be further simplified.

Figure 43:
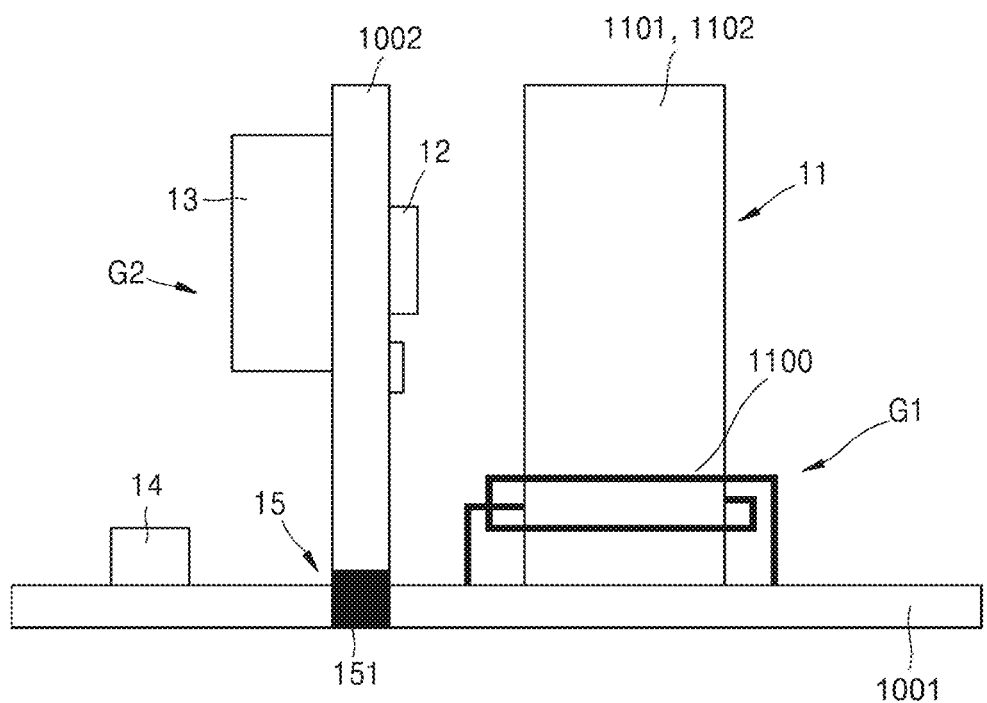
FIG. 43 is a side view in which a second substrate is coupled to a first substrate according to another embodiment.

FIG. 43 illustrates a side view in which a second substrate 1002 is coupled to a first substrate 1001) according to another embodiment.

According to the embodiment shown in FIG. 43, the first substrate 1001 may include a groove and/or via hole into which the second substrate 1002 may be fixedly inserted. The above-described connection terminals are installed according to conductive patterning on the inside of this groove and/or hole, and these connection terminals become a first electrical connection part 151. Then, the second substrate 1002 itself is inserted into the groove and/or hole. At this time, a plurality of connection terminals are installed on a side surface of an end of the second substrate, so that when the second substrate 1002 is inserted into the groove and/or hole of the first substrate 1001, the connection terminals of the second substrate are electrically connected to the connection terminals inside the groove and/or hole. The plurality of connection terminals formed on the side surface of the end of the second substrate may be a second electrical connection part. In this case, the second substrate 1002 may be coupled to the first substrate 1001 simply by inserting the second substrate 1002 into the groove and/or hole of the first substrate 1001, and at the same time, a first element group G1 and a second element group G2 may be electrically connected. The end of the second substrate 1001 may have a protrusion inserted into the groove and/or hole, and connection terminals may be designed by conducting conductive patterning on the protrusion. Therefore, even in this embodiment, the first element group G1 and the second element group G2 may be electrically connected only by combining the first substrate 1001 and the second substrate 1002, so that the overall structure of the device may be simplified.

In the case of the structures illustrated in FIGS. 37 to 43 described above, the embodiment illustrated in FIG. 36 is applied, and the structures illustrated in FIGS. 37 to 43 are applicable to various circuit configurations to be described below.

Figure 44:
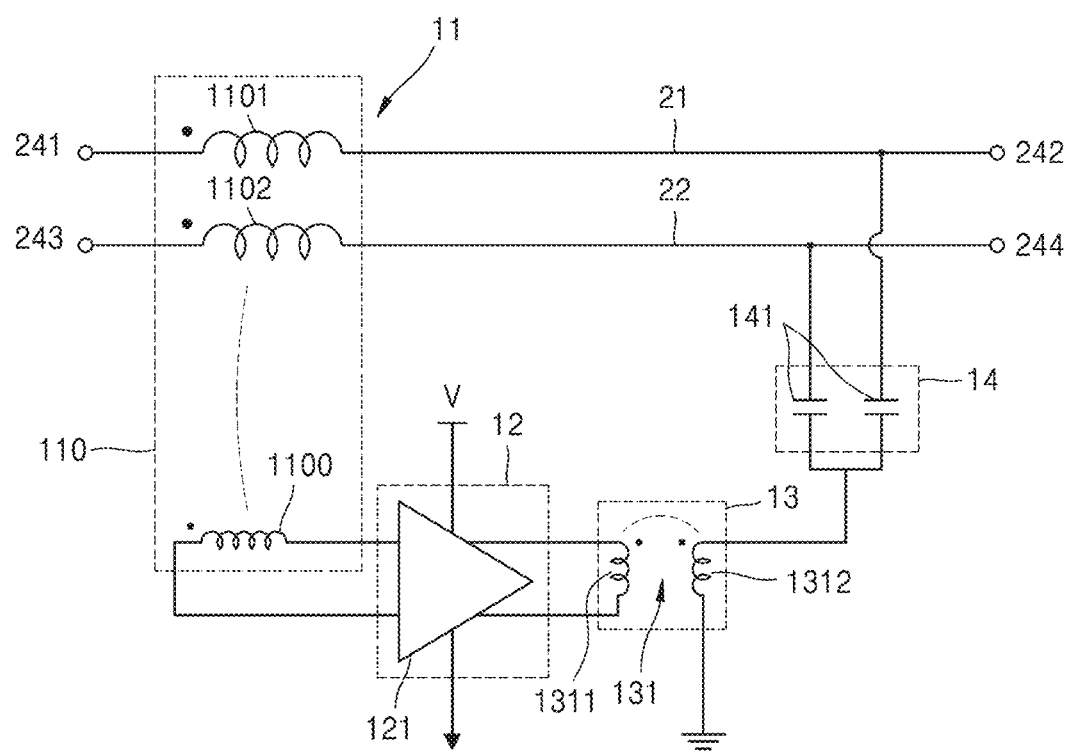
FIG. 44 illustrates a more specific example of a divided active electromagnetic interference filter module according to another embodiment.

FIG. 44 illustrates a more specific example of a divided active electromagnetic interference filter module 1000 according to another embodiment.

In the embodiment illustrated in FIG. 44, a noise sensing unit 11 is electrically connected to a 1-1 th pin 141 and a 1-3 th pin 143 of a first device 2 on a power side, unlike the embodiment illustrated in FIG. 36 described above. And a compensating unit 13 and a transmission unit 14 are electrically connected to a 1-2 th pin 142 and a 1-4 th pin 144 of a second device 3. Accordingly, the embodiment illustrated in FIG. 10 illustrates a feedback type current-sensing current-compensation active electromagnetic interference filter that detects a noise current going out to the first device 2 and compensates it with a current in the second device 3. The noise sensing unit 11, an active circuit unit 12, the compensating unit 13 and the transmission unit 14 illustrated in FIG. 44 may each perform the same function as the elements illustrated in FIG. 2.

Figure 45:
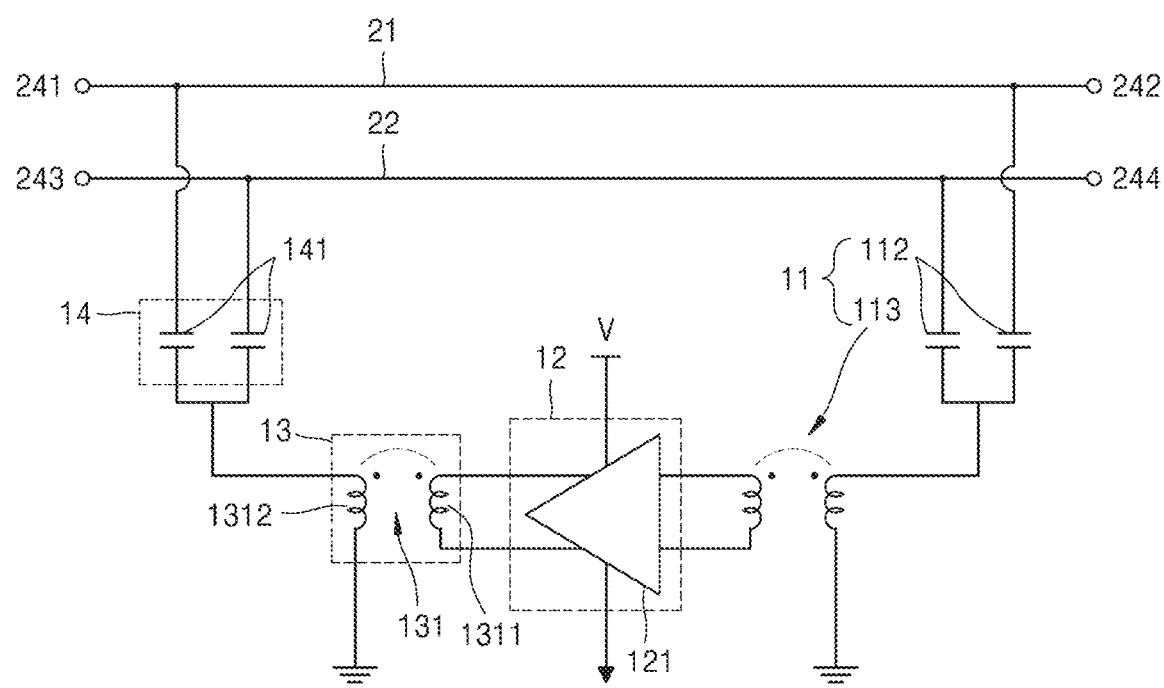
FIG. 45 illustrates a more specific example of a divided active electromagnetic interference filter module according to another embodiment.

FIG. 45 illustrates a more specific example of a divided active electromagnetic interference filter module 1000 according to another embodiment.

Referring to FIG. 45, in the case of the divided active electromagnetic interference filter module 1000 according to another embodiment, a noise sensing unit 11 may include a sensing capacitor unit 112. The divided active electromagnetic interference filter module 1000 according to the embodiment illustrated in FIG. 45 represents a voltage-sensing current-compensation (VSCC) type active electromagnetic interference filter that senses noise voltage using the sensing capacitor unit 112 and compensates with current using a compensation capacitor 141 of a transmission unit 14. In the voltage-sensing current-compensation structure such as the active electromagnetic interference filter 1 according to this embodiment, feedforward and feedback may not be distinguished in terms of operation principle. That is, in the divided active electromagnetic interference filter module 1000 illustrated in FIG. 45, there may be no distinction between input/output units. In addition, the divided active electromagnetic interference filter module 1000 according to the embodiment may also have an isolated structure by using a compensation transformer 131 and a sensing transformer 113.

The sensing capacitor unit 112 may sense noise voltage input to a first through line 21 and a second through line 22, which are power lines. The sensing capacitor unit 112 may include two sensing capacitors, and each sensing capacitor may include a Y-capacitor. One end of each of the two sensing capacitors may be electrically connected to the first through line 21 and the second through line 22, and the other end may share a node connected to a primary side of the sensing transformer 113. The primary side of the sensing transformer 113 may be electrically connected to the first through line 21 and the second through line 22, which are the power lines, through the sensing capacitor unit 112.

The sensing transformer 113 may include a primary side connected to the power line side and a secondary side connected to an active circuit unit 12 to sense noise flowing through the power line. The secondary side of sensing transformer 113 may be differentially connected to an input terminal of the active circuit unit 12.

The sensing transformer 113, the active circuit unit 12, the compensation transformer 131 and the compensation capacitor 141, which are included in the divided active electromagnetic interference filter module 1000 according to the embodiment illustrated shown in FIG. 45, may perform operations corresponding to the sensing transformer, the active circuit unit 121, the compensation transformer 131 and the compensation capacitor 141 of the above-described embodiments, respectively.

Although not illustrated, in the above-described embodiments, a high-pass filter (not illustrated) is further included between an active circuit unit 12 and a compensation transformer 131, so that the operation of the active circuit unit 12 at a low frequency below a frequency band that is the target of noise reduction may be blocked.

Figure 46:
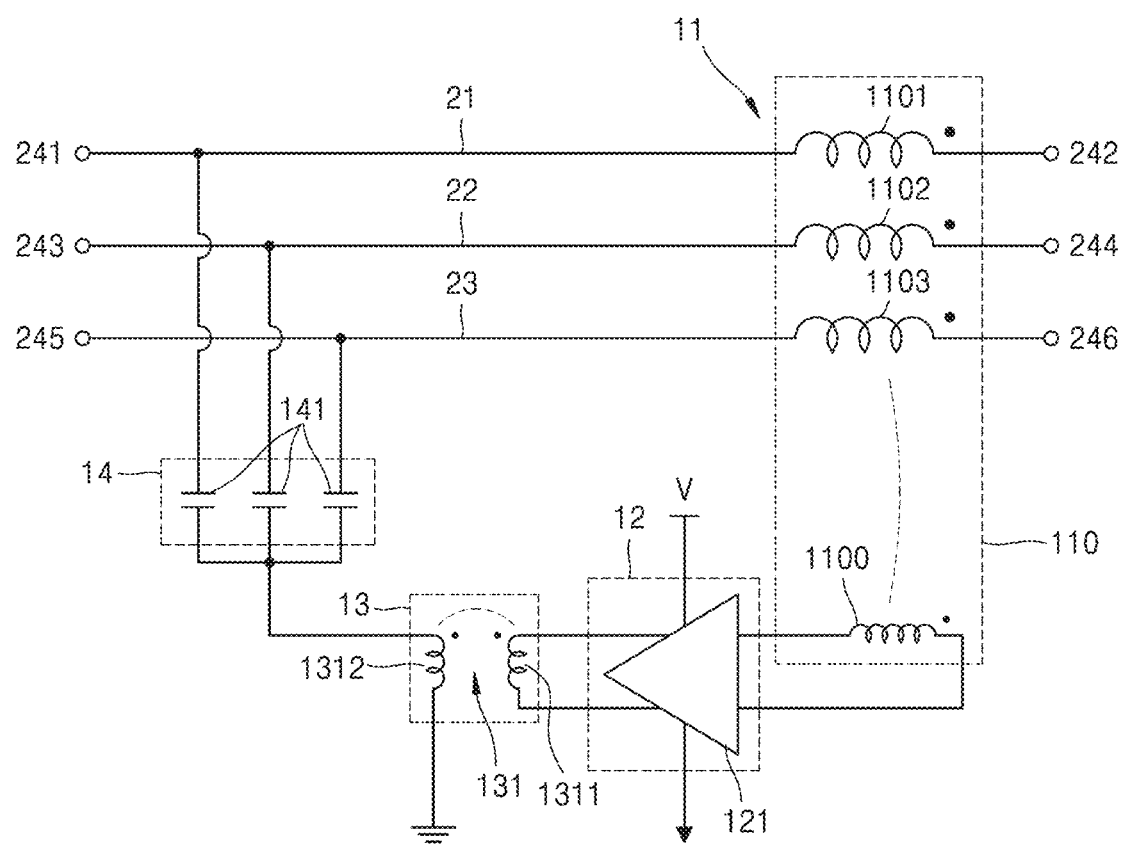
FIG. 46 illustrates a more specific example of a divided active electromagnetic interference filter module according to another embodiment.

FIG. 46 illustrates a configuration of a divided active electromagnetic interference filter module 1000 according to another embodiment.

The embodiment illustrated in FIG. 46 is a divided active electromagnetic interference filter module 1000 of a three-phase three-wire structure, unlike the single-phase embodiment illustrated in FIG. 2.

Referring to FIG. 46, a first through line 21, a second through line 22 and a third through line 23 pass through a substrate, and both ends thereof may be electrically connected to a 1-1 th pin 241 to a 1-6 th pin 146, respectively. According to the embodiment, the first through line 21 may be an R-phase, the second through line 22 may be an S-phase, and the third through line 23 may be a T-phase power line.

A noise sensing unit 11 may include a sensing transformer capable of sensing noise, and the sensing transformer may include a first reference winding 1101 to a third reference winding 1103 connected to the first through line 21 to the third through line 23, respectively, and a sensing winding 1100 formed on the same core as the first reference winding 1101 to third reference winding 113.

The first reference winding 1101 to the third reference winding 1103 may be a primary winding connected to a power line, and the sensing winding 1100 may be a secondary winding.

Each of the first reference winding 1101 to the third reference winding 1103 may be in the form of a winding wound around the core, but is not limited thereto, and at least one of the first reference winding 1101, the second reference winding 1102 and the third reference winding 1103 may be a structure passing through the core.

The sensing winding 1100 may have a structure wound around the core at least once or passing through the core on which the first reference winding 1101 to the third reference winding 1103 are wound or passed.

Similar to the above-described embodiment of FIG. 36, the sensing winding 1100 is insulated from the power line and may sense a noise current generated from a second device 3. As in the embodiment of FIG. 2, the primary winding and the secondary winding may be wound in consideration of the direction of generation of magnetic flux and/or magnetic flux density.

The sensing winding 1100 supplies induced current to an active circuit unit 12, and the active circuit unit 12 amplifies it to generate an amplified current. The active circuit unit 12 may be designed to generate the amplified current in consideration of the transformation ratio of the sensing transformer described above and a transformation ratio of a compensation transformer 131 described later. The active circuit unit 12 may be implemented by various means, and according to an embodiment, the active circuit unit 12 may include an OP AMP 121. According to another embodiment, the active circuit unit 12 may include a plurality of passive elements such as resistors and capacitors in addition to an OP AMP. Further, according to another embodiment, the active circuit unit 12 may include a bipolar junction transistor (BJT) and/or a plurality of passive elements such as resistors and capacitors. However, the present disclosure is not necessarily limited thereto, and the means for amplification described in the present disclosure may be used without limitation as the active circuit unit 12 of the present disclosure.

The amplified current flows through a compensating unit 13 and a transmission unit 14 to the first through line 21, the second through line 22, and/or the third through line 23 to compensate for noise.

The compensating unit 13 may include a compensation transformer 131, and a specific configuration and function may be the same as in the embodiment illustrated in FIG. 36 described above.

The transmission unit 14 may include a compensation capacitor 141, and one end of each capacitor of the compensation capacitor 141 is connected to the compensation transformer 131, and the other end is connected to the first through line 21 to the third through line 23, respectively.

The embodiment illustrated in FIG. 46 illustrates the embodiment illustrated in FIG. 36 in a three-phase three-wire structure, but the present disclosure is not limited thereto, and the embodiment illustrated in FIG. 12 may be applied to the embodiment illustrated in FIGS. 44 and 45.

Figure 47:
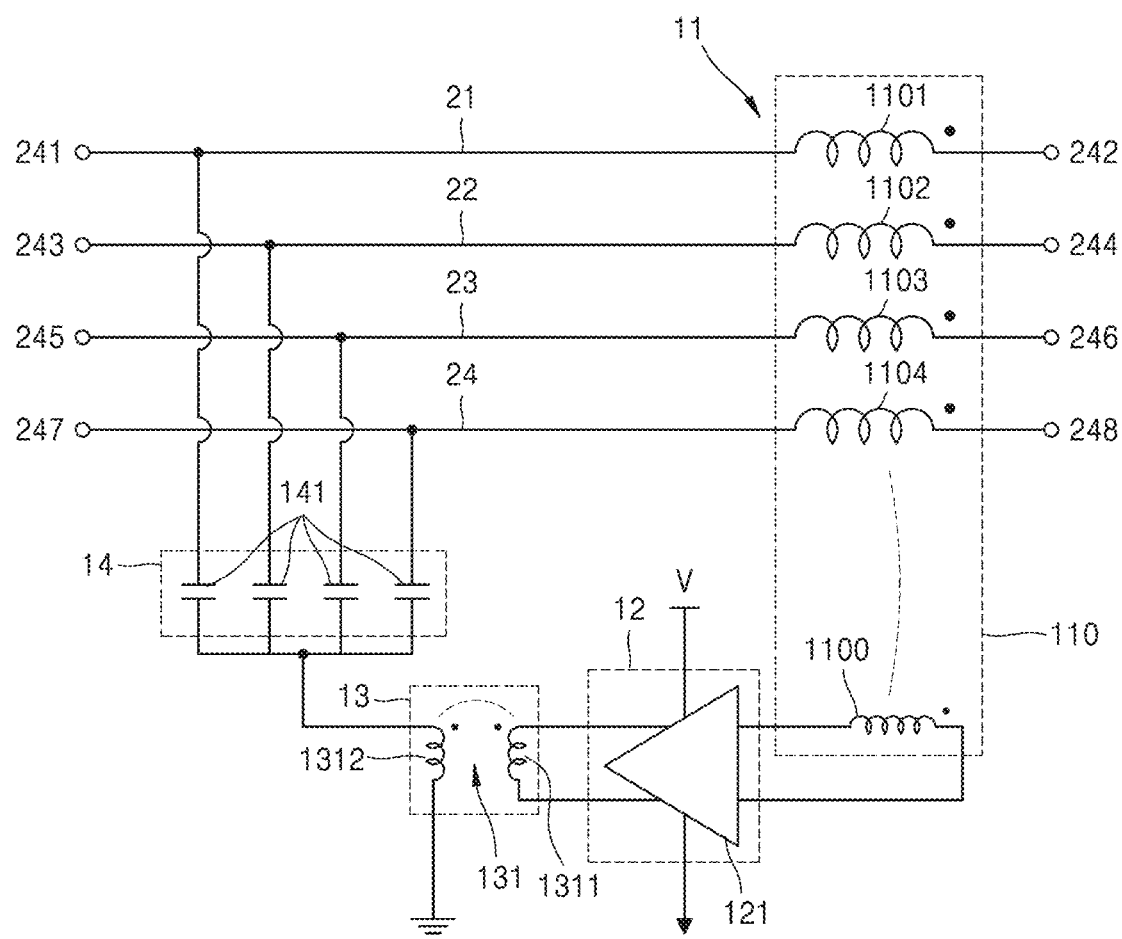
FIG. 47 illustrates a more specific example of a divided active electromagnetic interference filter module according to another embodiment.

FIG. 47 illustrates a configuration of a divided active electromagnetic interference filter module 1000 according to another embodiment.

Unlike the single-phase embodiment illustrated in FIG. 36 and the three-phase three-wire embodiment illustrated in FIG. 12, the embodiment illustrated in FIG. 47 is a three-phase four-wire structure type divided active electromagnetic interference filter module 1000.

Referring to FIG. 47, a first through line 21, a second through line 22, a third through line 23 and a fourth through line 24 pass through a substrate, and their both ends may be electrically connected to a 1-1 th pin 241 to a 1-8 th pin 148, respectively. According to the embodiment, the first through line 21 may be R-phase, the second through line 22 may be S-phase, the third through line 23 may be T-phase, and the fourth through line 24 may be an N-phase power line.

A noise sensing unit 11 may include a sensing transformer 110 capable of sensing noise, and the sensing transformer may include a first reference winding 1101 to a fourth reference winding 1104 connected to the first through line 21 to the fourth through line 24, respectively, and a sensing winding 1100 formed on the same core as the first reference winding 1101 to the fourth reference winding 1104.

The first reference winding 1101 to the fourth reference winding 1104 may be a primary winding connected to a power line, and the sensing winding 1100 may be a secondary winding.

The first reference winding 1101 to the fourth reference winding 1104 may be in the form of windings wound around the core, respectively, but are not limited thereto, and at least one of the first reference winding 1101, the second reference winding 1102, the third reference winding 1103 and the fourth reference winding 1104 may be a structure passing through the core.

The sensing winding 1100 may have a structure in which the core is wound at least once or passes through the core on which the first reference winding 1101 to the fourth reference winding 1104 is wound or passed once.

The sensing winding 1100 is isolated from the power line as in the above-described embodiments, and may sense a noise current generated from a second device 3. As in the embodiment of FIG. 36, the primary winding and the secondary winding may be wound in consideration of the direction of generation of magnetic flux and/or magnetic flux density.

The sensing winding 1100 supplies induced current to an active circuit unit 12, and the active circuit unit 12 amplifies it to generate an amplified current. The active circuit unit 12 may be designed to generate the amplified current in consideration of the transformation ratio of the sensing transformer described above and a transformation ratio of a compensation transformer 131 to be described later. The active circuit unit 12 may be implemented by various means, and according to an embodiment, the active circuit unit 12 may include an OP AMP 121. According to another embodiment, the active circuit unit 12 may include a plurality of passive elements such as resistors and capacitors in addition to an OP AMP. Further, according to another embodiment, the active circuit unit 12 may include a bipolar junction transistor (BJT) and/or a plurality of passive elements such as resistors and capacitors. However, the present disclosure is not necessarily limited thereto, and the means for amplification described in the present disclosure may be used without limitation as the active circuit unit 12 of the present disclosure.

The amplified current flows through a compensating unit 13 and a transmission unit 14 to the first through line 21, the second through line 22, the third through line 23, and/or the fourth through line 24 to compensate for noise.

The compensating unit 13 may include a compensation transformer 131, and the transmission unit 14 may include a compensation capacitor 141, the specific configuration and function may be the same as those of the embodiments illustrated in FIGS. 36 and 46 described above. One end of each capacitor of the compensation capacitor 141 is connected to the compensation transformer 131, and the other end is connected to the first through line 21 to the fourth through line 24, respectively.

The embodiment illustrated in FIG. 47 illustrates the embodiment illustrated in FIG. 36 in a three-phase four-wire structure, but the present disclosure is not necessarily limited thereto, and the embodiment illustrated in FIG. 47 may be applied to the embodiment illustrated in FIGS. 44 and 45.

Figure 48:
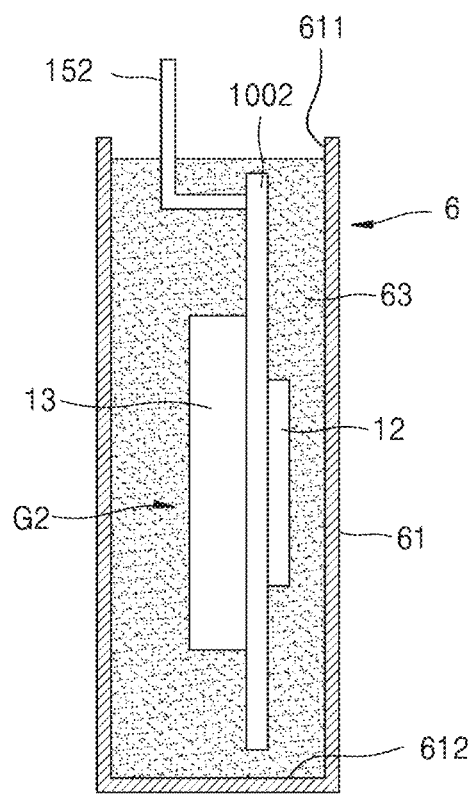
FIG. 48 is a partial cross-sectional view of a divided active electromagnetic interference filter module according to an embodiment.
Figure 49:
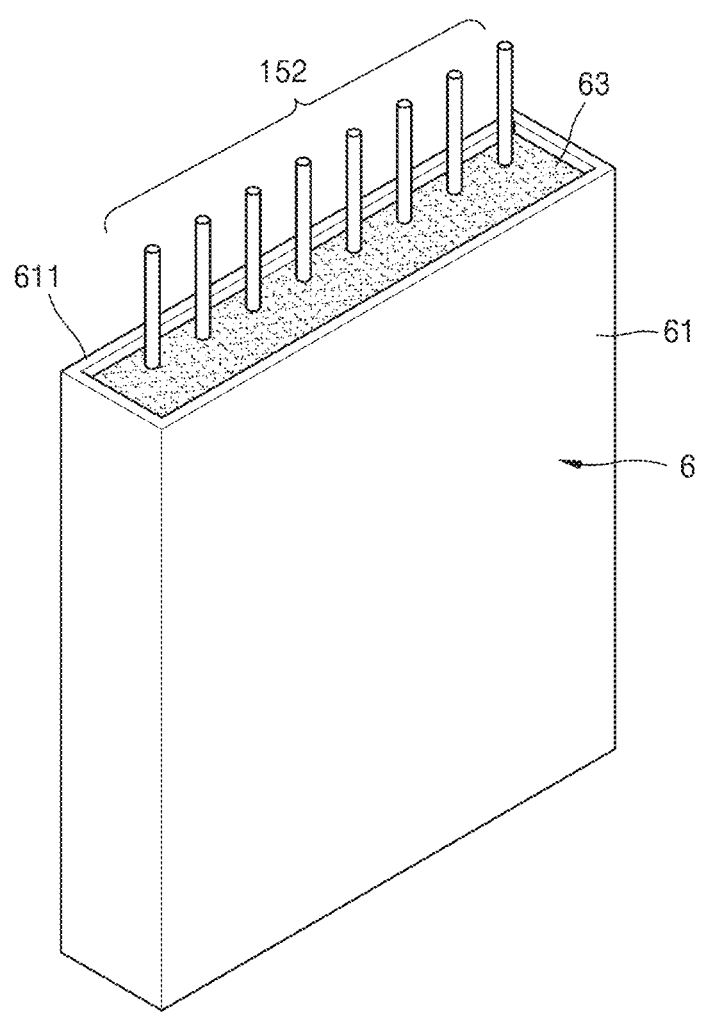
FIG. 49 is a partial perspective view of a divided active electromagnetic interference filter module according to the embodiment illustrated in FIG. 48.

In the divided active electromagnetic interference filter module 1000 of the embodiments as described above, a second substrate 1002 and a second element group G2 installed on the second substrate 1002 is implemented as a sealing structure blocked from an outside through an encapsulation structure 6 as illustrated in FIGS. 48 and 49, and may be single modularized.

According to the embodiment illustrated in FIGS. 48 and 49, the second element group G2 is installed on the second substrate 1002, an active circuit unit 102 is installed on one surface of the second substrate 1002, and a compensating unit 13 is installed on the other surface of the second substrate 1002.

According to an embodiment, the encapsulation structure 6 may include a support 61 and a filling part 63.

The support 61 is formed of an insulating material and includes a space located therein. The space of the support 61 may be defined by an opening 611 and a bottom 612. In some cases, the support 61 may be formed of a heat transferable material. In this case, a heat dissipation mechanism such as a heat sink may be further installed on the support 61, and thus heat dissipation by the support 61 may be smoothly performed.

The second substrate 1002 described above is accommodated in the space of support 61. The second substrate 1002 may be accommodated in the support 61 in a vertically erected form, and at this time, connection pins of a second electrical connection part 152 located on a border of the second substrate 1002 may protrude to an outside of the opening 611. Therefore, both sides of the second substrate 1002 may be arranged to face an inner sidewall of the support 61, respectively.

On the other hand, according to one embodiment, the divided active electromagnetic interference filter module 1000 may include the filling part 63 provided to fill at least a part of the space of the support 61.

The second substrate 1002 may be fixed to the inside of the support 61 by the filling part 63.

The filling part 63 may be provided with a heat-resistant and/or insulating resin material. According to one embodiment, the filling part 63 may include an epoxy resin, and may further include a curing agent.

The divided active electromagnetic interference filter module 1000 having the above structure may have a box structure in which the second electrical connection part 152 protrudes in an in-line shape.

Since the divided active electromagnetic interference filter module 1000 may be easily installed in various devices, and has a structure independent of external devices, especially the second element group G2 may be protected from external stimuli and/or impact, and breakage of the divided active electromagnetic interference filter module 1000 may be prevented. Accordingly, the durability of the entire equipment requiring the divided active electromagnetic interference filter module 1000 may be improved. In addition, the second element group G2 may be protected from a polluting environment such as external dust. And, when the support 61 and/or the filling part 63 includes a heat-dissipating material, since heat emitted from the second element group G2 may be radiated to the outside, deterioration of the second element group G2 may be prevented.

FIGS. 48 and 49 illustrate the embodiment illustrated in FIG. 41, the present disclosure is not necessarily limited thereto, and the second substrate 1002 and the second element group G2 according to other embodiments may be sealed in the same manner.

On the other hand, in the above-described embodiment, the second substrate 1002 is described as being disposed perpendicular to the first substrate 1001 and being coupled to the first substrate 1001, the present disclosure is not necessarily limited thereto.

That is, in a design structure in which a height of protrusion from a first substrate 1001 is limited, a second substrate 1002 may be disposed in a horizontal state with respect to the first substrate 1001 and coupled to the first substrate 1001. In this case, a second electrical connection part 152 installed on the second substrate 1002 may have a structure capable of horizontally bonding the second substrate 1002 to the first substrate 1001. For example, in the embodiment illustrated in FIG. 14, the second electrical connection part 152 may extend vertically from a surface of the second substrate 1002 without being bent. In this case, the second substrate 1002 may be molded by a filling part 63 with the surface being horizontally accommodated on the support of a flat box.

In this way, the present disclosure may implement a divided active electromagnetic interference filter module 1000 provided in a simple modular form, and may provide a divided active electromagnetic interference filter module 1000 to implement more advanced functions by mixing various materials into the filling part in the manufacturing process. For example, by adding an insulating, heat transfer and/or heat-dissipating material to the filling part, an additional configuration related to cooling may be implemented.

In addition, physical protection for internal devices may be provided by a support provided in one case, and in some cases, a heat dissipation mechanism such as a heat sink is further installed on the support, so that heat dissipation by the support may be smoothly performed.

Meanwhile, the embodiments described in the detailed description of the present specification may each belong to one of four categories of embodiments for convenience. The four categories of embodiments are Active current compensation device capable of detecting malfunction; Active current compensation device including power conversion unit embedded therein; Active current compensation device including integrated circuit unit and non-integrated circuit unit; and Active current compensation device including one-chip integrated circuit (IC).

Four categories of embodiments are classified only for convenience of description, and it goes without saying that each of the embodiments described herein may belong to a plurality of categories overlappingly.

In addition, the drawings appended to the present specification may each belong to one of the categories of embodiments. In more detail, FIGS. 50 to 58 may belong to the first category (Active current compensation device capable of detecting malfunction). And FIGS. 59 to 75 may belong to the second category (Active current compensation device including power conversion unit embedded therein). And FIGS. 66 to 71 may belong to the third category (Active current compensation device including integrated circuit unit and non-integrated circuit unit). And FIGS. 72 to 77 may belong to the fourth category (Active current compensation device including one-chip integrated circuit). In the present specification, the same reference number may be assigned to the same or corresponding component in the drawings in the same category. However, in the drawings in different categories, even though the same reference number is assigned, the reference number may refer to different components. For example, a malfunction detection unit 180 of FIG. 50 belonging to the first category and a power management unit 180 of FIG. 59 belonging to the second category may indicate different components although the same reference numeral is assigned thereto.

Hereinafter, active current compensation device capable of detecting malfunction, which is the first category of invention, will be described with reference to FIGS. 50 to 58.

Figure 50:
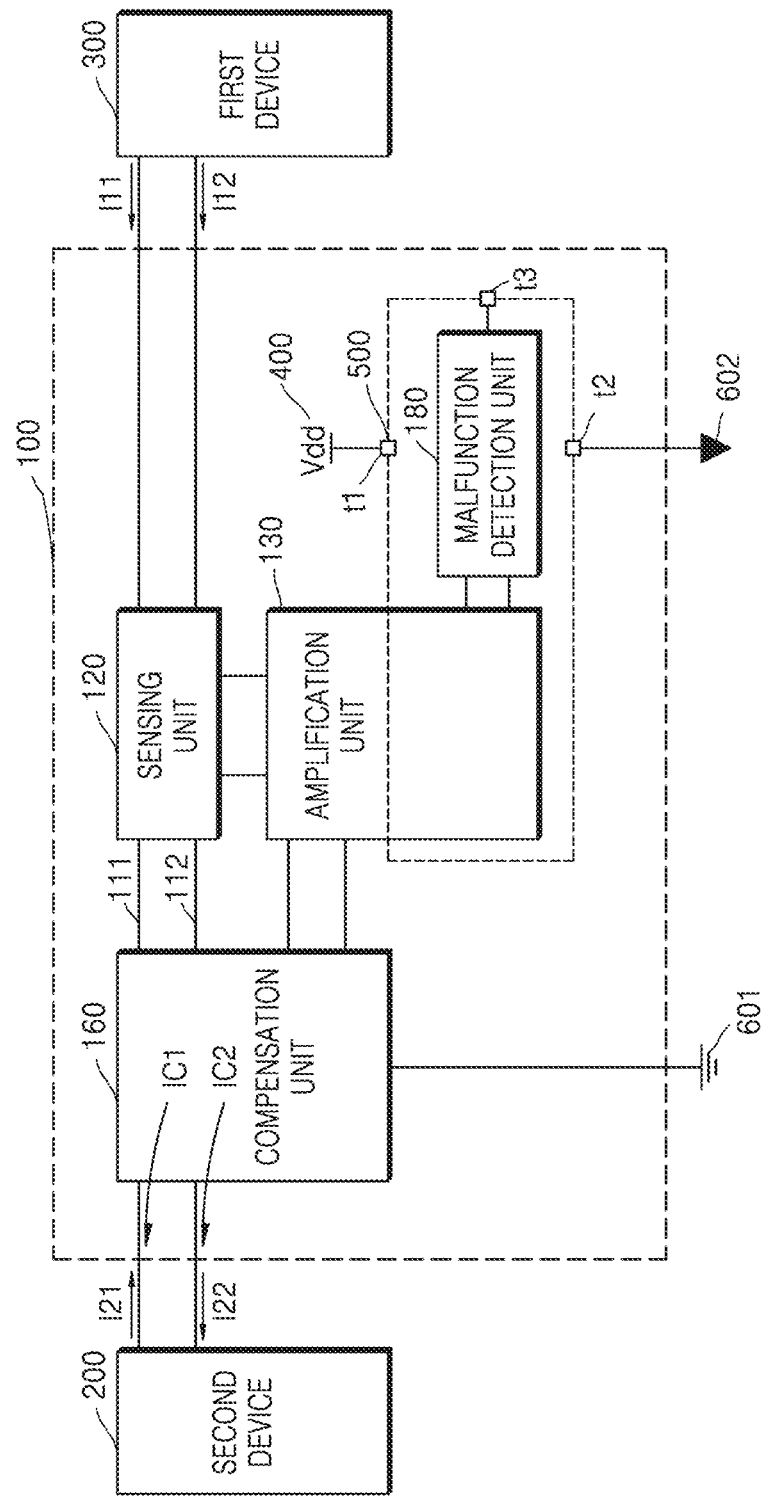
FIG. 50 schematically illustrates a configuration of a system including an active current compensation device according to an embodiment of the present disclosure.

FIG. 50 schematically illustrates a configuration of a system including an active current compensation device 100 according to an embodiment of the present disclosure. The active current compensation device 100 may actively compensate for first currents I11 and I12 (e.g., electromagnetic interference (EMI) noise current) that are input as a common-mode (CM) current through two or more high-current paths 111 and 112 from a first device 300.

Referring to FIG. 50, the active current compensation device 100 may include a sensing unit 120, an amplification unit 130, a malfunction detection unit 180, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. For example, the second device 200 may be a device that produces and supplies power, and may also be a device (e.g., an electric vehicle charging device) that supplies power produced by another device. Of course, the second device 200 may also be a device that supplies stored energy. However, the present disclosure is not limited thereto.

A power converter may be located on the first device 300 side. For example, the first currents I11 and I12 may be input to the current compensation device 100 due to a switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 58:
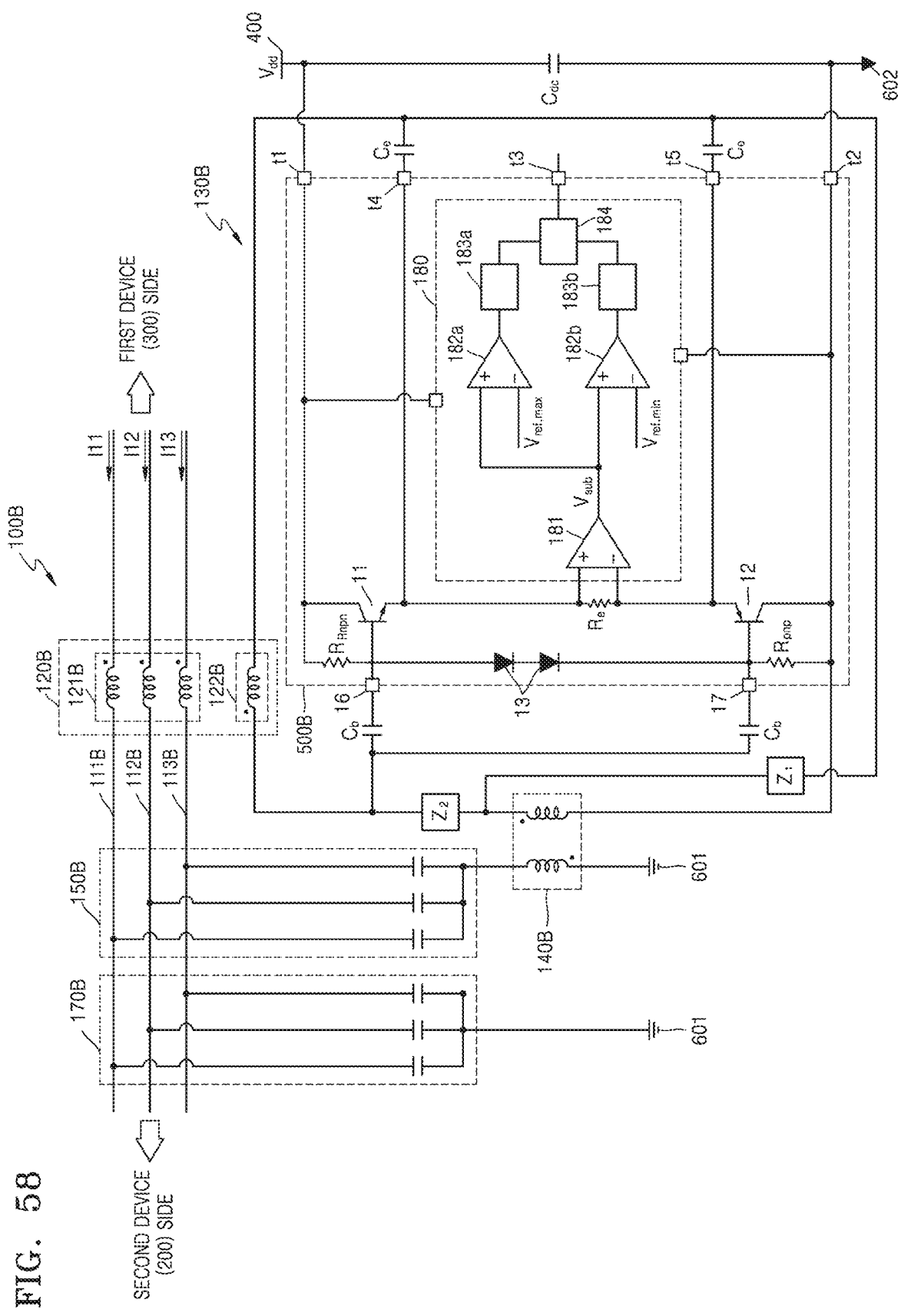
FIG. 58 schematically illustrates a configuration of an active current compensation device according to an embodiment of the present disclosure.

Meanwhile, the two or more high-current paths 111 and 112 may include two paths as shown in FIG. 50, may include three paths as shown in FIG. 58, or may include four paths.

The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portions of the high-current paths 111 and 112 may pass through the sensing unit 120, but a portion of the sensing unit 120, which generates the output signal according to the sensing result, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may mean that the magnitude and/or phase of an object to be amplified is adjusted. The amplification unit 130 may be implemented by various components, and may include active elements. In an embodiment, the amplification unit 130 may include bipolar junction transistors (BJTs). For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure. A second reference potential 602 of the amplification unit 130 and a first reference potential 601 of the current compensation device 100 may be distinguished from each other.

The malfunction detection unit 180 may detect a malfunction or failure of the amplification unit 130. According to an embodiment, signals at two nodes included in the amplification unit 130 may be differentially input to the malfunction detection unit 180. The malfunction detection unit 180 may detect a differential signal between the two nodes included in the amplification unit 130. The malfunction detection unit 180 may detect the malfunction of the amplification unit 130 using the input differential signal. For example, the malfunction detection unit 180 may detect the malfunction of the amplification unit 130 by determining whether the differential signal satisfies a predetermined condition. The malfunction detection unit 180 may output a signal indicating whether the amplification unit 130 is malfunctioning. According to an embodiment, the malfunction detection unit 180 may include active elements.

The malfunction detection unit 180 and at least a portion of the amplification unit 130 may be physically embedded into one IC chip 500.

Figure 51:
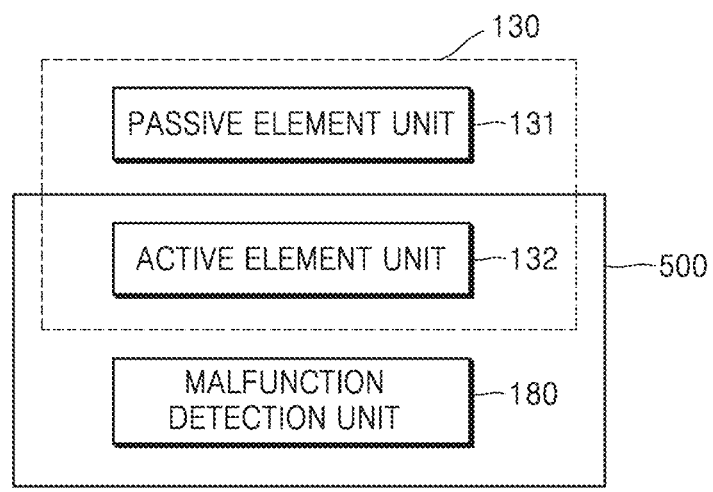
FIG. 51 illustrates an inclusion relation of an amplification unit and a malfunction detection unit with respect to an integrated circuit (IC) chip, according to an embodiment of the present disclosure.

FIG. 51 illustrates an inclusion relation of the amplification unit 130 and the malfunction detection unit 180 with respect to the IC chip 500, according to an embodiment of the present disclosure.

Referring to FIG. 51, the amplification unit 130 may include a passive element unit 131 and an active element unit 132. The passive element unit 131 includes only passive elements, and the active element unit 132 includes active elements. In an embodiment, the active element unit 132 may further include passive elements as well as the active elements. Examples of a detailed configuration of the amplification unit 130 including the passive element unit 131 and the active element unit 132 will be described below with reference to FIGS. 53 and 54.

Referring to FIGS. 50 and 51 together, a combination of the passive element unit 131 and the active element unit 132 may perform a function of generating an amplified signal from the output signal output from the sensing unit 120. The amplified signal may be input to the compensation unit 160.

As described above, signals at two nodes included in the amplification unit 130 may be differentially input to the malfunction detection unit 180. The malfunction detection unit 180 may sense a differential signal of the two nodes. The two nodes may be two nodes included in the active element unit 132. In an embodiment, the two nodes may also be connected to the passive element unit 131.

In an embodiment, the active element unit 132 of the amplification unit 130 and the malfunction detection unit 180 may be physically integrated into the single IC chip 500. However, this is merely an embodiment, and of course, in other embodiments, the passive element unit 131 and the active element unit 132 of the amplification unit 130 and the malfunction detection unit 180 may be physically integrated into the single IC chip 500.

The malfunction detection unit 180 may include active elements. Here, a reference potential of the malfunction detection unit 180 may be equal to the second reference potential 602, which is the reference potential of the amplification unit 130. The reference potential of the malfunction detection unit 180 may be different from the first reference potential 601, which is the reference potential of the current compensation device 100 (e.g., a reference potential of the compensation unit 160).

The amplification unit 130 and the malfunction detection unit 180 may receive power from a power supply 400 that is distinguished from the first device 300 and/or the second device 200. The amplification unit 130 may receive the power from the power supply 400, and amplify the output signal output from the sensing unit 120 to generate an amplified current. The malfunction detection unit 180 may receive power from a power supply 600 and generate an output signal indicating whether a differential signal input from the amplification unit 130 is in a predetermined range. The output signal may indicate whether the amplification unit 130 is malfunctioning.

The power supply 400 may be a device that receives power from a power source that is independent of the first device 300 and the second device 200 and generates input power of the amplification unit 130 and the malfunction detection unit 180. Alternatively, the power supply 400 may also be a device that receives power from any one of the first device 300 and the second device 200 and generates input power of the amplification unit 130 and the malfunction detection unit 180.

The IC chip 500 may include a terminal t1 to be connected to the power supply 400, a terminal t2 to be connected to the second reference potential 602, and a terminal t3 for outputting the output signal of the malfunction detection unit 180. The IC chip 500 may further include other terminals.

For example, in an embodiment in which only the active element unit 132 of the amplification unit 130 other than the passive element unit 131 is integrated into the IC chip 500 together with the malfunction detection unit 180, the other terminals may be connected to the passive element unit 131.

For another example, in an embodiment in which the passive element unit 131 and the active element unit 132, which are included in the amplification unit 130, and the malfunction detection unit 180 are all integrated into the single IC chip 500, the other terminals may be connected to an output terminal of the sensing unit 120 and an input terminal of the compensation unit 160.

The compensation unit 160 may generate a compensation current on the basis of the amplified output signal generated by the amplification unit 130. An output side of the compensation unit 160 may be connected to the high-current paths 111 and 112 to allow compensation currents IC1 and IC2 to flow to the high-current paths 111 and 112, but may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

In order to cancel the first currents I11 and I12, the compensation unit 160 may inject the compensation currents IC1 and IC2 into the high-current paths 111 and 112 through the two or more high-current paths 111 and 112, respectively. The compensation currents IC1 and IC2 may have the same magnitude and an opposite phase compared to the first currents I11 and I12.

Figure 52:
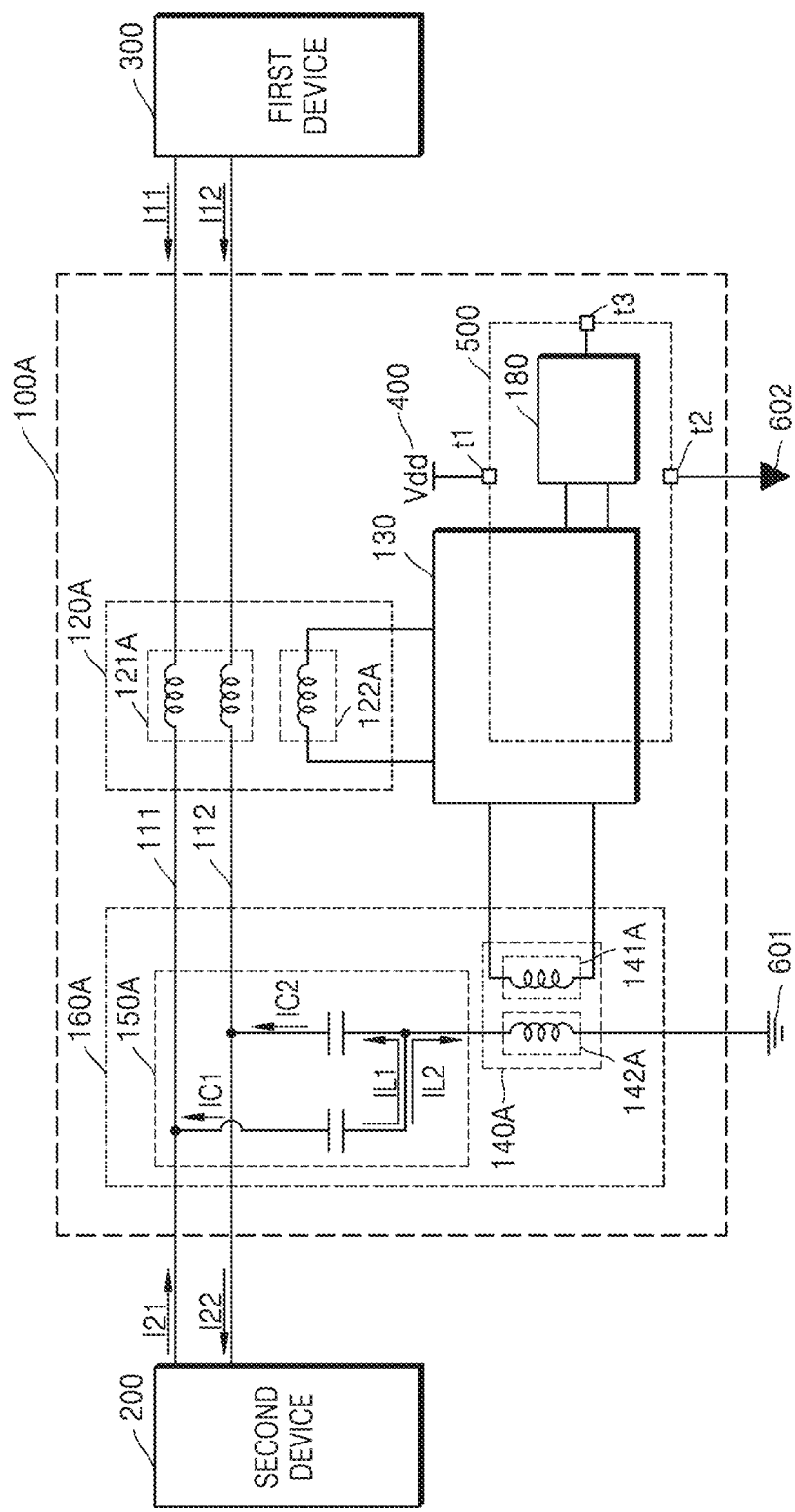
FIG. 52 illustrates a more specific example of the embodiment described with reference to FIG. 50, and schematically illustrates an active current compensation device according to an embodiment of the present disclosure.

FIG. 52 illustrates a more specific example of the embodiment described with reference to FIG. 50, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 52, the active current compensation device 100A may include a sensing transformer 120A, an amplification unit 130, a malfunction detection unit 180, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. For example, the primary side 121A and the secondary side 122A of the sensing transformer 120A may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and supply the induced current to the amplification unit 130.

The amplification unit 130 may amplify the current that is sensed by the sensing transformer 120A and induced in the secondary side 122A. For example, the amplification unit 130 may amplify the magnitude of the induced current at a predetermined ratio and/or adjust a phase of the induced current.

The malfunction detection unit 180 may detect a malfunction or failure of the amplification unit 130. According to an embodiment, a differential signal between two nodes included in the amplification unit 130 may be input to the malfunction detection unit 180. The malfunction detection unit 180 may detect whether the amplification unit 130 is malfunctioning by detecting whether the input differential signal is in a predetermined range. The malfunction detection unit 180 may output a signal, which indicates whether the amplification unit 130 is malfunctioning, through an output terminal t3. The malfunction detection unit 180 may include active elements.

According to various embodiments of the present disclosure, the malfunction detection unit 180 and at least a portion of the amplification unit 130 may be physically integrated together into the single IC chip 500.

The amplification unit 130 and the malfunction detection unit 180 may be connected to the second reference potential 602, and the second reference potential 602 may be distinguished from the first reference potential 601 of the current compensation device 100A (or the compensation unit 160A). The amplification unit 130 and the malfunction detection unit 180 may be connected to a power supply 400.

The IC chip 500 may include a terminal t1 to be connected to the power supply 400, a terminal t2 to be connected to the second reference potential 602, and the terminal t3 through which the output signal of the malfunction detection unit 180 is output.

According to an embodiment, only an active element unit 132 of the amplification unit 130 other than a passive element unit 131 may be integrated into the IC chip 500 together with the malfunction detection unit 180. In this case, the IC chip 500 may further include a terminal to be connected to the passive element unit 131.

According to an embodiment, both the passive element unit 131 and the active element unit 132 included in the amplification unit 130 may be integrated into the IC chip 500 together with the malfunction detection unit 180. In this case, the IC chip 500 may further include a terminal to be connected to an output terminal of the sensing unit 120 and a terminal to be connected to an input terminal of the compensation unit 160.

The compensation unit 160A may be an example of the compensation unit 160 described above. The compensation unit 160A may include a compensation transformer 140A and a compensation capacitor unit 150A. An amplified current amplified by the above-described amplification unit 130 flows through a primary side 141A of the compensation transformer 140A.

The compensation transformer 140A may be a component for isolating the amplification unit 130 including active elements from the high-current paths 111 and 112. That is, the compensation transformer 140A may be a component for generating a compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, the malfunction detection unit 180, and the secondary side 122A of the sensing transformer 120A may be connected to the second reference potential 602, which is distinguished from the reference potential of the other components of the active current compensation device 100A. The first reference potential 601 of the current compensation device 100A and the second reference potential 602 of the amplification unit 130 may be distinguished from each other.

As described above, in an embodiment of the present disclosure, the component generating the compensation current uses a reference potential (i.e., the second reference potential 602) different from that of the other components and uses the separate power supply 400 and thus may operate in a state of being isolated from the other components, thereby improving the reliability of the active current compensation device 100A.

In the compensation transformer 140A, when a turns ratio of the primary side 141A and the secondary side 142A is 1:Ninj, and a self-inductance of the primary side 141A of the compensation transformer 140A is Linj, the secondary side 142A may have a self-inductance of Ninj2*Linj. In this case, the current induced in the secondary side 142A has a magnitude that is 1/Ninj times that of the current (i.e., the amplified current) flowing in the primary side 141A. The primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*Ninj.

As described above, the compensation capacitor unit 150A may provide a path through which the current generated by the compensation transformer 140A flows to each of the two high-current paths 111 and 112.

The compensation capacitor unit 150A may include two Y-capacitors (Y-caps) each having one end connected to the secondary side 142A of the compensation transformer 140A and the other end connected to the high-current paths 111 and 112. One ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow in the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A may be implemented as an isolated structure by using the compensation transformer 140A and the sensing transformer 120A.

Figure 53:
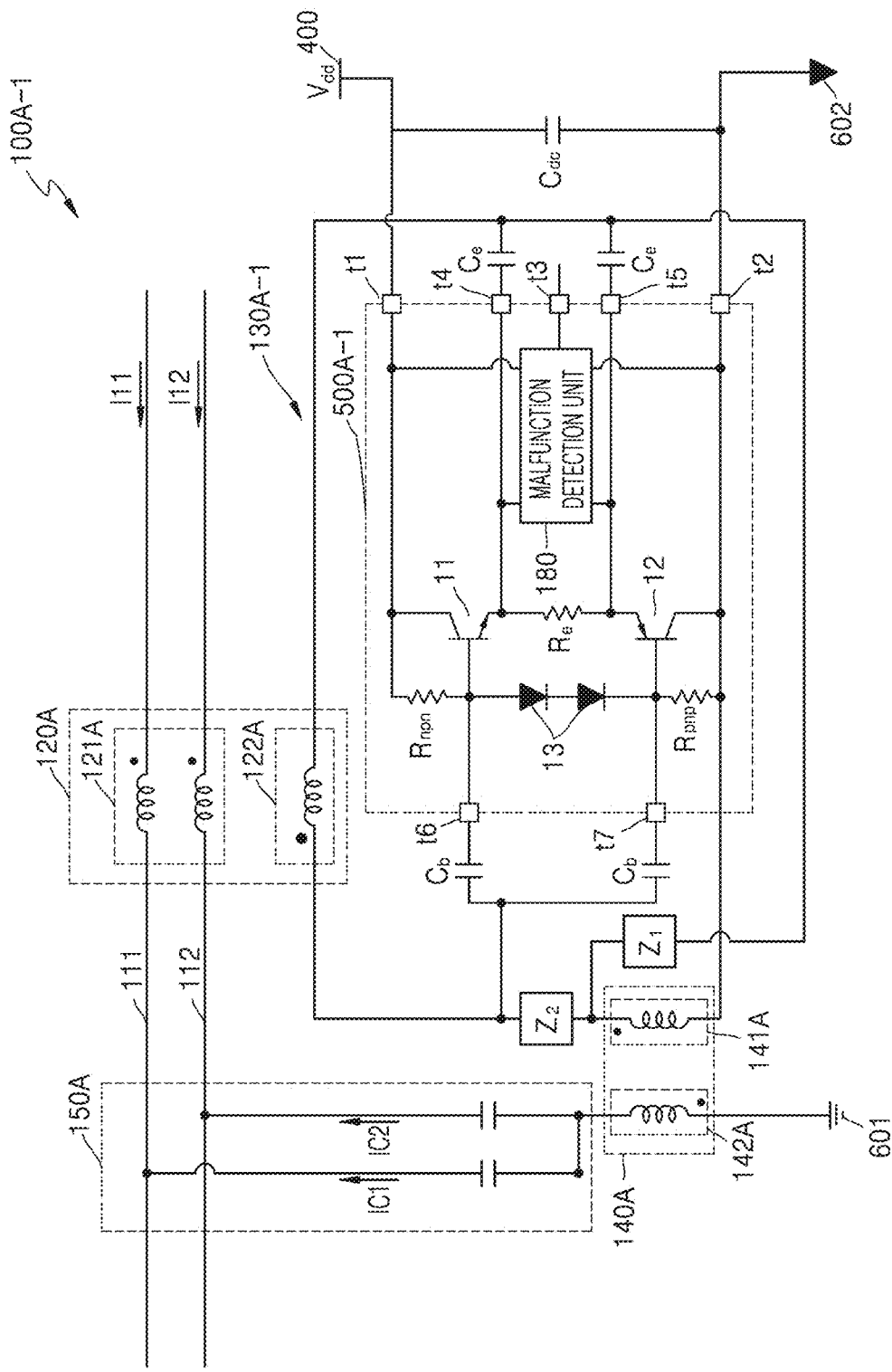
FIG. 53 illustrates a more specific example of the embodiment described with reference to FIG. 52, and schematically illustrates an active current compensation device according to an embodiment of the present disclosure.

FIG. 53 illustrates a more specific example of the embodiment described with reference to FIG. 52, and schematically illustrates an active current compensation device 100A-1 according to an embodiment of the present disclosure. The active current compensation device 100A-1 shown in FIG. 53 is an example of the active current compensation device 100A shown in FIG. 52. An amplification unit 130A-1 included in the active current compensation device 100A-1 is an example of the amplification unit 130 of the active current compensation device 100A.

The amplification unit 130A-1 included in the active current compensation device 100A-1 may include a passive element unit and an active element unit. The passive element unit of the amplification unit 130A-1 may include Cb, Ce, Z1, Z2, and Cdc. The active element unit of the amplification unit 130A-1 may include a first transistor 11, a second transistor 12, a diode 13, Rnpn, Rpnp, and Re.

In an embodiment, the first transistor 11 may be an npn BJT, and the second transistor 12 may be a pnp BJT. For example, the amplification unit 130A-1 may have a push-pull amplifier structure including an npn BJT and a pnp BJT.

An induced current induced in a secondary side 122A by a sensing transformer 120A may be differentially input to the amplification unit 130A-1. Only alternating current (AC) signals may be selectively coupled through Cb and Ce included in the amplification unit 130A-1.

The power supply 400 supplies a DC voltage Vdd, which is based on the second reference potential 602, to drive the amplification unit 130A-1 and a malfunction detection unit 180. Cdc is a DC decoupling capacitor for the DC voltage Vdd, and may be connected in parallel between the power supply 400 and the second reference potential 602. Only AC signals may be coupled between both collectors of the first transistor 11 (e.g., an npn BJT) and the second transistor 12 (e.g., a pnp BJT) through Cdc.

In the active element unit of the amplification unit 130A-1, an operating point of each of the first and second transistors 11 and 12 may be controlled through Rnpn, Rpnp, and Re. Rnpn may connect a collector terminal of the first transistor 11 (e.g., an npn BJT), which is a terminal of the power supply 400, and a base terminal of the first transistor 11 (e.g., npn BJT). Rpnp may connect a collector terminal of the second transistor 12 (e.g., a pnp BJT), which is a terminal of the second reference potential 602, and a base terminal of the second transistor 12 (e.g., a pnp BJT). Re may connect an emitter terminal of the first transistor 11 and an emitter terminal of the second transistor 12.

The secondary side 122A of the sensing transformer 120A according to an embodiment may be connected between a base side and an emitter side of each of the first and second transistors 11 and 12. A primary side 141A of a compensation transformer 140A according to an embodiment may be connected between a collector side and the base side of each of the first and second transistors 11 and 12. Here, the connection includes an indirectly connected case. The amplification unit 130A-1 according to an embodiment may have a regression structure in which an output current is injected back into the base of each of the first and second transistors 11 and 12. Due to the regression structure, the amplification unit 130A-1 may stably obtain a constant current gain for operating the active current compensation device 100A-1.

When an input voltage of the amplification unit 130A-1 has a positive swing of greater than zero due to a noise signal, the first transistor 11 (e.g., an npn BJT) may operate. In this case, an operating current may flow through a first path passing through the first transistor 11. When the input voltage of the amplification unit 130A-1 has a negative swing of less than zero due to a noise signal, the second transistor 12 (e.g., a pnp BJT) may operate. In this case, the operating current may flow through a second path passing through the second transistor 12.

In various embodiments, noise to be compensated for may have a high level depending on the first device 300, and thus it may be desirable to use the power supply 400 with voltage as high as possible. For example, the power supply 400 may be independent of the first device 300 and the second device 200.

As power is supplied from the power supply 400, the nodes of the first transistor 11 and the second transistor 12 may swing greatly in a common mode. For example, voltages at base and emitter nodes of each of the first and second transistors 11 and 12 may swing in a common mode.

By confirming whether the active element unit of the amplification unit 130A-1 operates normally as described above, it is possible to confirm whether the active current compensation device 100A-1 itself operates normally. In other words, it is possible to confirm whether the active current compensation device 100A-1 operates normally by confirming whether a DC bias of the amplification unit 130A-1 is normal.

As described above, since the voltage swings at the nodes of each of the first and second transistors 11 and 12 in a common mode, a malfunction may be detected by sensing only a differential DC voltage between the first transistor 11 and the second transistor 12. That is, in order to detect the malfunction of the amplification unit 130A-1, only the differential DC voltage between the first transistor 11 and the second transistor 12 may be selectively sensed.

For example, when the differential DC voltage between one node of the first transistor 11 and one node of the second transistor 12 satisfies a predetermined condition, the active current compensation device 100A-1 may be determined to be normal.

Accordingly, the malfunction detection unit 180 according to an embodiment may output a signal indicating the malfunction of the amplification unit 130A-1 by using the differential DC voltage between two nodes included in the amplification unit 130A-1.

For example, a differential signal between one node of the first transistor 11 and one node of the second transistor 12 may be input to the malfunction detection unit 180. In an embodiment, the differential signal may be a differential DC voltage between the emitter of the first transistor 11 and the emitter of the second transistor 12.

According to an embodiment, the malfunction detection unit 180 may output a signal indicating a normal state through an output terminal t3 when the differential DC voltage between the emitter of the first transistor 11 and the emitter of the second transistor 12 is in a predetermined range. The malfunction detection unit 180 may output a signal indicating a malfunction state through the output terminal t3 when the differential DC voltage is outside the predetermined range.

In embodiments of the present disclosure, the malfunction detection unit 180 and at least a portion of the amplification unit 130A-1 may be physically integrated into one IC chip 500A-1.

In an embodiment, as shown in FIG. 53, the active element unit of the amplification unit 130A-1 and the malfunction detection unit 180 may be integrated into the single IC chip 500A-1. For example, the first transistor 11, the second transistor 12, the diode 13, Rnpn, Rpnp, and Re of the active element unit and the malfunction detection unit 180 may be integrated into the single IC chip 500A-1. In this case, the IC chip 500A-1 may include a terminal t1 to be connected to the power supply 400, a terminal t2 to be connected to the second reference potential 602, the terminal t3 through which the output signal of the malfunction detection unit 180 is output, and terminals (e.g., t4, t5, t6, and t7) to be connected to the passive element unit. For example, the terminals to be connected to the passive element unit may include the terminal t4 corresponding to the emitter of the first transistor 11 and the terminal t5 corresponding to the emitter of the second transistor 12. In the embodiment described with reference to FIG. 53, two terminals t4 and t5 each corresponding to the emitter may also correspond to differential inputs of the malfunction detection unit 180. Each of the terminals t4 and t5 corresponding to the emitters may be connected to Ce of the passive element unit. In addition, the terminals to be connected to the passive element unit may include the terminal t6 corresponding to the base of the first transistor 11 and the terminal t7 corresponding to the base of the second transistor 12. Each of the terminals t6 and t7 corresponding to the bases may be connected to Cb of the passive element unit.

However, the present disclosure is not limited thereto. In other embodiments, the IC chip 500A-1 may further include at least a portion of the passive element unit of the amplification unit 130A-1. In other embodiments, the IC chip 500A-1 may include all of the active element unit and the passive element unit of the amplification unit 130A-1 and the malfunction detection unit 180.

According to embodiments of the present disclosure, by embedding the malfunction detection unit 180 in the IC chip 500A-1 in which the active element unit of the amplification unit 130A-1 is integrated, it is possible to achieve a reduction in size and price as compared to a case of separately configuring the malfunction detection unit 180 using commonly used commercial elements. In addition, by integrating the malfunction detection unit 180 and at least a portion of the amplification unit 130A-1 into the single IC chip 500A-1, the IC chip 500A-1 or the current compensation device 100A-1 may have versatility as an independent component and may be commercialized.

A detailed description of the malfunction detection unit 180 will be given below with reference to FIGS. 55 to 57.

Figure 54:
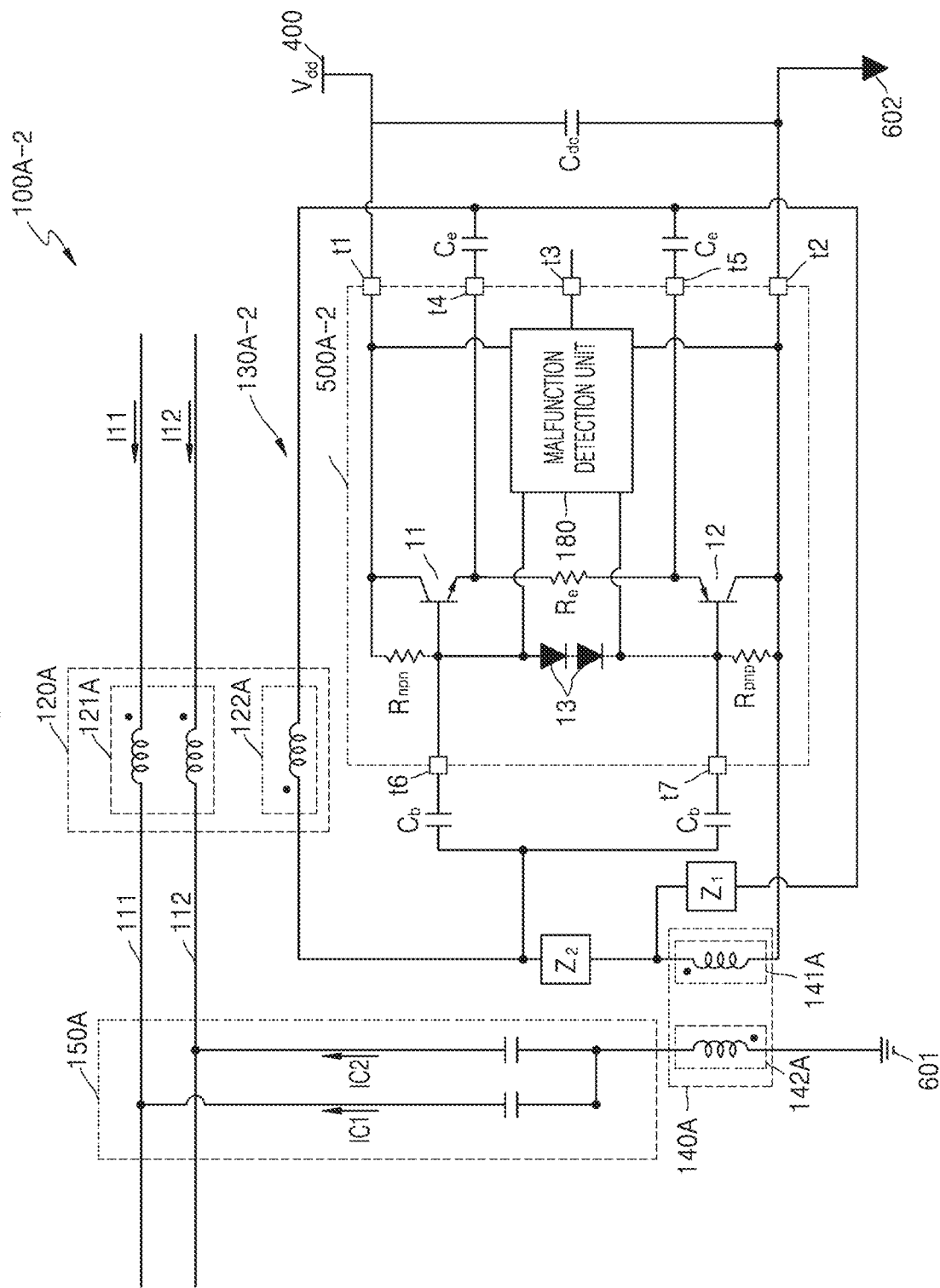
FIG. 54 illustrates another more specific example of the embodiment described with reference to FIG. 52, and schematically illustrates an active current compensation device according to an embodiment of the present disclosure.

FIG. 54 illustrates another more specific example of the embodiment described with reference to FIG. 52, and schematically illustrates an active current compensation device 100A-2 according to an embodiment of the present disclosure. The active current compensation device 100A-2 shown in FIG. 54 is an example of the active current compensation device 100A shown in FIG. 52. An amplification unit 130A-2 included in the active current compensation device 100A-2 is an example of the amplification unit 130 of the active current compensation device 100A.

The amplification unit 130A-2 shown in FIG. 54 corresponds to the amplification unit 130A-1 shown in FIG. 53, but positions (nodes) to which a malfunction detection unit 180 is connected are different. Specifically, in an IC chip 500A-2, a differential DC voltage between a base of a first transistor 11 and a base of a second transistor 12 may be input to the malfunction detection unit 180. Accordingly, since a description of the amplification unit 130A-2 corresponds to the description of the amplification unit 130A-1, the amplification unit 130A-2 will be briefly described.

In an embodiment, a passive element unit of the amplification unit 130A-2 may include Cb, Ce, Z1, Z2, and Cdc. An active element unit of the amplification unit 130A-2 may include the first transistor 11, the second transistor 12, a diode 13, Rnpn, Rpnp, and Re. In an embodiment, the first transistor 11 may be an npn BJT, and the second transistor 12 may be a pnp BJT. For example, the amplification unit 130A-2 may have a push-pull amplifier structure including an npn BJT and a pnp BJT. The amplification unit 130A-2 according to an embodiment may have a regression structure in which an output current is injected back into the base of each of the first and second transistors 11 and 12.

When an input voltage of the amplification unit 130A-2 has a positive swing of greater than zero due to a noise signal, the first transistor 11 (e.g., an npn BJT) may operate. When the input voltage of the amplification unit 130A-2 has a negative swing of less than zero due to a noise signal, the second transistor 12 (e.g., a pnp BJT) may operate.

As power is supplied from the power supply 400, a voltage may swing greatly at base and emitter nodes of each of the first and second transistors 11 and 12 in a common mode. Here, it is possible to confirm whether the active current compensation device 100A-2 operates normally by confirming whether a DC bias of the amplification unit 130A-2 is normal.

As described above, since the voltage swings at the base and emitter nodes of each of the first and second transistors 11 and 12 in a common mode, a malfunction may be detected by sensing only a differential DC voltage between one node of the first transistor 11 and one node of the second transistor 12.

According to the embodiment described with reference to FIG. 54, the differential DC voltage between the base of the first transistor 11 and the base of the second transistor 12 may be input to the malfunction detection unit 180. According to an embodiment, the malfunction detection unit 180 may output a signal indicating a normal state through an output terminal t3 when the differential DC voltage between the base of the first transistor 11 and the base of the second transistor 12 is in a predetermined range. The malfunction detection unit 180 may output a signal indicating a malfunction state through the output terminal t3 when the differential DC voltage between the base of the first transistor 11 and the base of the second transistor 12 is outside the predetermined range.

In embodiments of the present disclosure, the malfunction detection unit 180 and at least a portion of the amplification unit 130A-2 may be physically integrated into the single IC chip 500A-2.

In an embodiment, as shown in FIG. 54, the active element unit of the amplification unit 130A-2 and the malfunction detection unit 180 may be integrated into the single IC chip 500A-2. For example, the first transistor 11, the second transistor 12, the diode 13, Rnpn, Rpnp, and Re of the active element unit and the malfunction detection unit 180 may be integrated into the single IC chip 500A-2. In this case, the IC chip 500A-2 may include a terminal t1 to be connected to the power supply 400, a terminal t2 to be connected to the second reference potential 602, the terminal t3 through which the output signal of the malfunction detection unit 180 is output, and terminals (e.g., t4, t5, t6, and t7) to be connected to the passive element unit. For example, the terminals to be connected to the passive element unit may include the terminal t4 corresponding to an emitter of the first transistor 11 and the terminal t5 corresponding to an emitter of the second transistor 12. Each of the terminals t4 and t5 corresponding to the emitters may be connected to Ce of the passive element unit. In addition, the terminals to be connected to the passive element unit may include the terminal t6 corresponding to the base of the first transistor 11 and the terminal t7 corresponding to the base of the second transistor 12. In the embodiment described with reference to FIG. 54, two terminals t6 and t7 each corresponding to the base may also correspond to differential inputs of the malfunction detection unit 180. Each of the terminals t6 and t7 corresponding to the bases may be connected to Cb of the passive element unit.

However, the present disclosure is not limited thereto. In other embodiments, the IC chip 500A-2 may further include at least a portion of the passive element unit of the amplification unit 130A-2. In other embodiments, the IC chip 500A-2 may include all of the active element unit and the passive element unit of the amplification unit 130A-2 and the malfunction detection unit 180.

A detailed description of the malfunction detection unit 180 will be given below with reference to FIGS. 55 to 57.

In the following, the description of the amplification unit 130 is equally applicable to the amplification units 130A-1 and 130A-2.

Figure 55:
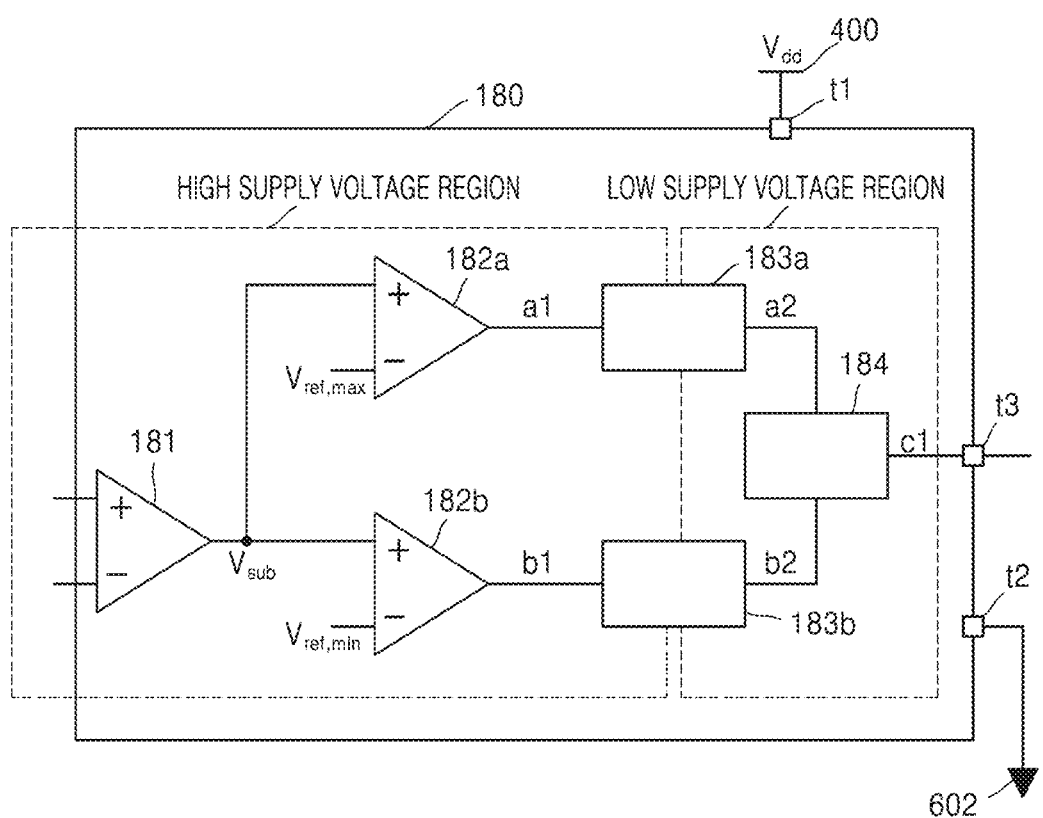
FIG. 55 illustrates a functional configuration of the malfunction detection unit according to an embodiment of the present disclosure.

FIG. 55 illustrates a functional configuration of the malfunction detection unit 180 according to an embodiment of the present disclosure.

Referring to FIG. 55, the malfunction detection unit 180 may include a subtractor 181, a first comparator 182a, a second comparator 182b, a first level shifter 183a, a second level shifter 183b, and a logic circuit 184. However, this is merely an embodiment, the malfunction detection unit 180 of the present disclosure is not limited thereto.

The malfunction detection unit 180 is applicable to the IC chips 500, 500A-1, and 500A-2 according to the various embodiments described above.

In various embodiments, signals of the two nodes included in the amplification unit 130, 130A-1, or 130A-2 may be differentially input to the subtractor 181 of the malfunction detection unit 180. As described above, a signal of one node of the first transistor 11 and a signal of one node of the second transistor 12 may be differentially input to the subtractor 181.

The subtractor 181 may selectively sense only a differential DC voltage between the node of the first transistor 11 and the node of the second transistor 12. Since the subtractor 181 senses a differential voltage at the two nodes, the subtractor 181 may ignore a common mode swing at the two nodes. The subtractor 181 may output the sensed differential DC voltage as a differential DC voltage Vsub.

In an embodiment, in the case of the IC chip 500A-1 shown in FIG. 53, the subtractor 181 may output the differential DC voltage Vsub between the emitter of the first transistor 11 and the emitter of the second transistor 12. In this case, input terminals of the subtractor 181 may share nodes with the emitters of the first and second transistors 11 and 12.

In an embodiment, in the case of the IC chip 500A-2 shown in FIG. 54, the subtractor 181 may output the differential DC voltage Vsub between the base of the first transistor 11 and the base of the second transistor 12. In this case, the input terminals of the subtractor 181 may share nodes with the bases of the first and second transistors 11 and 12.

Meanwhile, a voltage at each input terminal of the subtractor 181 may swing, and the swing may correspond to a magnitude of a rated voltage Vdd of the amplification unit 130. Thus, the subtractor 181 should have a rated voltage corresponding to the rated voltage Vdd of the amplification unit 130. Accordingly, the subtractor 181 may be driven by receiving the supply voltage Vdd of the power supply 400 as it is.

Since the malfunction detection unit 180 should not affect the operation of the amplification unit 130, the subtractor 181 of the malfunction detection unit 180 may have a high input impedance. For example, the subtractor 181 may be configured as a circuit having an input impedance of greater than 10 KOhm.

According to an embodiment, the subtractor 181 may include a rail-to-rail operational amplifier.

The first and second comparators 182a and 182b may detect whether a magnitude of the differential DC voltage Vsub, which is an output of the subtractor 181, is in a predetermined range. When the magnitude of the differential DC voltage Vsub is in the predetermined range, the amplification unit 130 may be determined to be normal, and when the magnitude of the differential DC voltage Vsub is outside the predetermined range, the amplification unit 130 may be determined to be malfunctioning. For example, when the differential DC voltage Vsub is between a maximum reference voltage Vref, max and a minimum reference voltage Vref, min, the amplification unit 130 may be normal. When the differential DC voltage Vsub is higher than the maximum reference voltage Vref, max or lower than the minimum reference voltage Vref, min, the amplification unit 130 may be malfunctioning.

The maximum reference voltage Vref, max and the minimum reference voltage Vref, min may be preset according to various embodiments. Hereinafter, criteria for setting the maximum reference voltage Vref, max and the minimum reference voltage Vref, min will be described.

In the embodiment described with reference to in FIG. 53, the subtractor 181 may sense the differential DC voltage Vsub between the emitter of the first transistor 11 and the emitter of the second transistor 12. When the amplification unit 130 operates normally, the differential DC voltage Vsub may correspond to Ie*Re. Here, Re is a resistor connecting the emitter terminal of the first transistor 11 and the emitter terminal of the second transistor 12, and Ie represents current flowing through Re. Ie and Re may be determined according to the design. In the present embodiment, the maximum reference voltage Vref, max may be set to be higher than Ie*Re by a specified magnitude. The minimum reference voltage Vref, min may be set to be lower than Ie*Re by a specified magnitude.

In the embodiment described with reference to FIG. 54, the subtractor 181 may sense the differential DC voltage Vsub between the base of the first transistor 11 and the base of the second transistor 12. When the amplification unit 130 operates normally, the differential DC voltage Vsub may correspond to Ie*Re+2Vbe, bjt. Here, Re is a resistor connecting the emitter terminal of the first transistor 11 and the emitter terminal of the second transistor 12, and Ie represents current flowing through Re. Ie and Re may be determined according to the design. Vbe, bjt represents voltage between the base and the emitter of the first transistor 11 or the second transistor 12. In the present embodiment, the maximum reference voltage Vref, max may be set to be higher than Ie*Re+2Vbe, bjt by a specified magnitude. The minimum reference voltage VREF, MIN may be set to be lower than Ie*Re+2Vbe, bjt by a specified magnitude. For example, the maximum reference voltage Vref, max may be set to 2 V and the minimum reference voltage Vref, min may be set to 1.4 V. However, the present disclosure is not limited thereto.

The first comparator 182a may output a first signal a1 indicating whether the differential DC voltage Vsub is lower than the maximum reference voltage Vref, max. The second comparator 182b may output a second signal b1 indicating whether the differential DC voltage Vsub is higher than the minimum reference voltage Vref, min.

Meanwhile, a high voltage may still exist at the input terminal of each of the first and second comparators 182a and 182b, and thus the first and second comparators 182a and 182b may each have a rated voltage corresponding to the rated voltage Vdd of the amplification unit 130. Accordingly, the first and second comparators 182a and 182b may be driven by receiving the supply voltage Vdd of the power supply 400 as it is.

According to an embodiment, the first and second comparators 182a and 182b may include an open-loop two-stage operational amplifier.

The first and second level shifters 183a and 183b may lower voltages of the output signals of the comparators 182a and 182b, respectively.

Since a gate voltage of a metal oxide semiconductor field effect transistor (MOSFET) included in the logic circuit 184 is lower than the rated voltage Vdd of each of the comparators 182a and 182b, the first and second signals a1 and b1 may be input to the logic circuit 184 after the voltage thereof is lowered. Accordingly, by using the level shifters 183a and 183b, only the voltage level of the first and second signals a1 and b1 may be lowered while a sign thereof is maintained.

The first signal a1 output from the first comparator 182a may be input to the first level shifter 183a. The first level shifter 183a may output a third signal a2 by lowering the voltage level of the first signal a1.

The second signal b1 output from the second comparator 182b may be input to the second level shifter 183b. The second level shifter 183b may output a fourth signal b2 by lowering the voltage level of the second signal b1.

A rated voltage of an input terminal of each of the level shifters 183a and 183b may correspond to the supply voltage Vdd of the power supply 400. A rated voltage of an output terminal of each of the level shifters 183a and 183b may be lower than the supply voltage Vdd.

For example, the supply voltage Vdd of the power supply 400 may be 12 V, and the rated voltage of the output terminal of each of the level shifters 183a and 183b may be 5 V.

The third signal a2 and the fourth signal b2 may be input to the logic circuit 184. The logic circuit 184 may use the third signal a2 and the fourth signal b2 to output a fifth signal c1 indicating whether the differential DC voltage Vsub is between the maximum reference voltage Vref, max and the minimum reference voltage Vref, min. The fifth signal c1 may be a digital signal of "0" or "1." For example, when the fifth signal c1 indicates "0," the amplification unit 130 may be in a normal state, and when the fifth signal c1 indicates "1," the amplification unit 130 may be in a malfunction state. Of course, the reverse of the above description may be possible.

Figure 56:
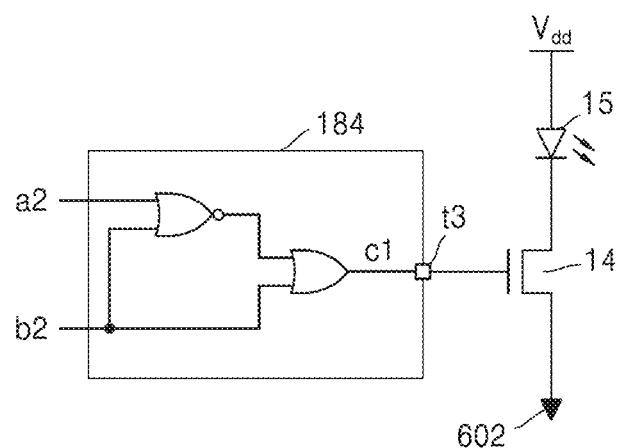
FIG. 56 is a schematic view of a logic circuit according to an embodiment of the present disclosure.

FIG. 56 is a schematic view of the logic circuit 184 according to an embodiment of the present disclosure.

Referring to FIG. 56, the third signal a2, which is an output of the first level shifter 183a, and the fourth signal b2, which is an output of the second level shifter 183b, may be input to the logic circuit 184. The logic circuit may output the fifth signal c1 on the basis of inputs of the third signal a2 and the fourth signal b2. For example, the logic circuit 184 may have a truth table as shown in Table 1 below.

TABLE 1

| Inputs | | Outputs |
| --- | --- | --- |
| a2 | b2 | c1 |
| 0 | 0 | 1 |
| 0 | 1 | 1 |
| 1 | 0 | 0 |
| 1 | 1 | 1 |

In an embodiment, the first comparator 182a may output a high signal indicating "1" when the differential DC voltage Vsub is less than the maximum reference voltage Vref, max. In this case, since the first signal a1 indicates "1," the third signal a2 may also indicate "1."

In an embodiment, the second comparator 182b may output a low signal indicating "0" when the differential DC voltage Vsub is greater than the minimum reference voltage Vref, min. In this case, since the second signal b1 indicate "0," the fourth signal b2 may also indicate "0."

According to the above-described embodiment, when the fifth signal c1 in Table 1 indicates "0," the amplification unit 130 is determined to operate normally. When the fifth signal c1 indicates "1," the amplification unit 130 is determined to be malfunctioning.

However, the logic circuit 184 and the truth table shown in FIG. 56 are merely examples, and the present disclosure is not limited thereto. According to various embodiments, the malfunction detection unit 180 may be designed to output the fifth signal c1 indicating whether the amplification unit 130 is malfunctioning.

Referring to FIG. 56, a light-emitting diode (LED) driver 14 may be connected to the output terminal t3 of the logic circuit 184. The LED driver 14 may drive an LED 15 outside the IC chip 500 on the basis of the fifth signal c1.

For example, when the fifth signal c1 indicates "1," the LED driver 14 may turn on the external LED 15. The turned-on external LED 15 may indicate a malfunction state. When the fifth signal c1 indicates "0," the LED driver 14 may turn off the external LED 15. The turned-off external LED 15 may indicate a normal state.

The logic circuit 184 may be provided as a small size MOSFET for efficiency. The fifth signal c1, which is an output of the logic circuit 184, may have, for example, a magnitude of 0 V or more and 5 V or less. The LED driver 14 connected to the output terminal t3 of the logic circuit 184 may be, for example, an N-type metal-oxide-semiconductor (NMOS) LED driver.

Meanwhile, as described above, the output terminal of each of the level shifters 183a and 183b and the logic circuit 184 may have a rated voltage lower than that of the input terminal of each of the subtractor 181, the comparators 182a and 182b, and the level shifters 183a and 183b.

Accordingly, supply voltage Vdd may be supplied to the input terminal each of the subtractor 181, the comparators 182a and 182b, and the level shifters 183a and 183b. A supply voltage lower than supply voltage Vdd may be supplied to the logic circuit 184 and the output terminals of the level shifters 183a and 183b. As an example, the input terminal of each of the subtractor 181, the comparators 182a and 182b, and the level shifters 183a and 183b may be driven by 12 V. The logic circuit 184 and the output terminals of the level shifters 183a and 183b may be driven by the voltage of 5 V. Accordingly, referring to FIG. 55, the input terminals of the subtractor 181, the comparators 182a and 182b, and the level shifters 183a and 183b are illustrated as being included in a high supply voltage region, and the logic circuit 184 and the output terminals of the level shifters 183a and 183b are illustrated as being included in a low supply voltage region. The high supply voltage region and the low supply voltage region are terms used to distinguish between components driven by a high supply voltage and components driven by a low supply voltage, rather than representing actual physical regions.

Figure 57:
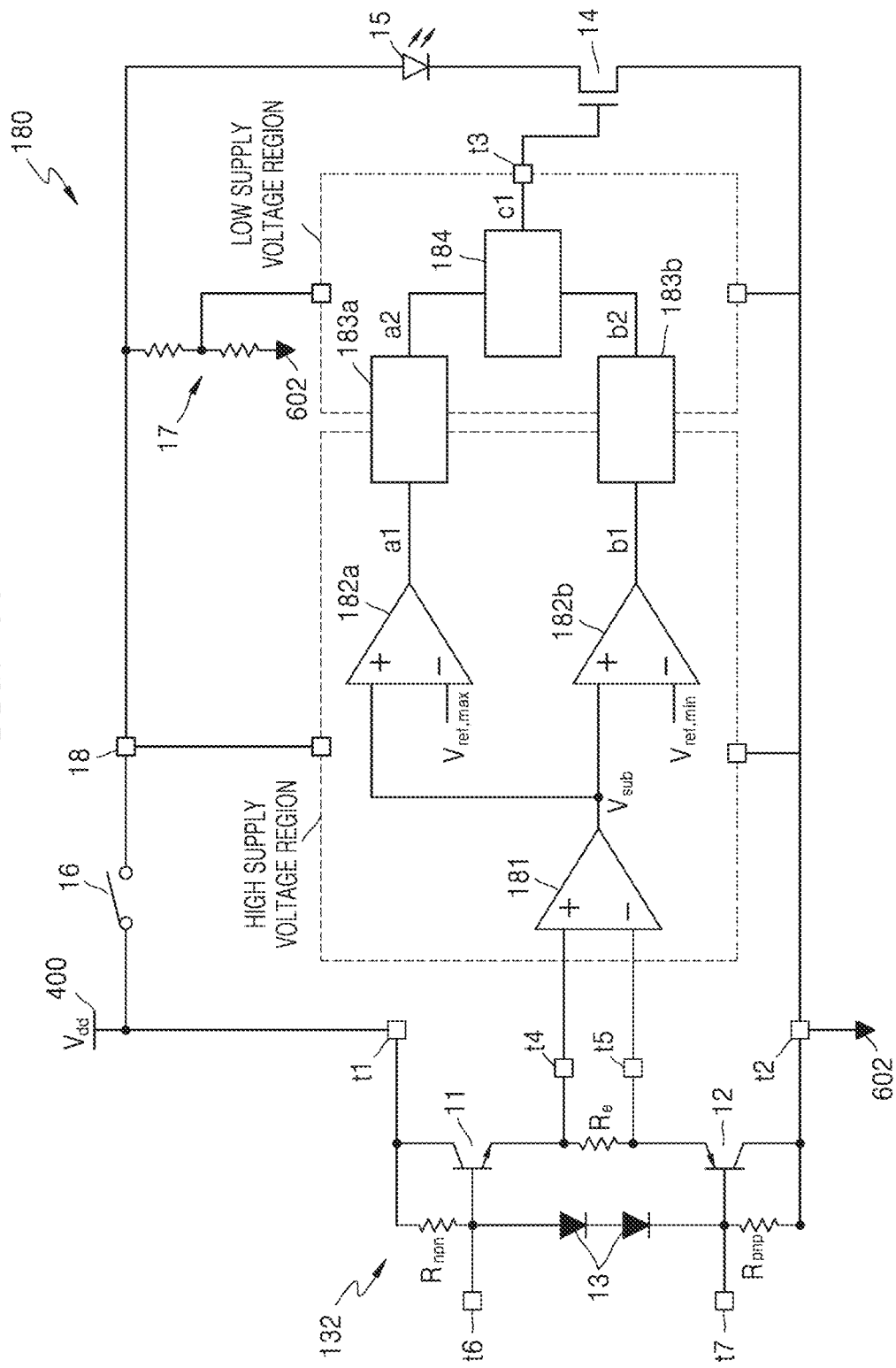
FIG. 57 is a circuit diagram of an active element unit and the malfunction detection unit according to an embodiment of the present disclosure.

FIG. 57 is a circuit diagram of an active element unit 132 and a malfunction detection unit 180 according to an embodiment of the present disclosure.

Referring to FIG. 57, the active element unit 132 of the amplification unit 130 may include a first transistor 11, a second transistor 12, a diode 13, Rnpn, Rpnp, and Re.

The malfunction detection unit 180 may include a subtractor 181, first and second comparators 182a and 182b, first and second level shifters 183a and 183b, and a logic circuit 184. The malfunction detection unit 180 may further include an LED driver 14 at an output terminal of the logic circuit 184.

Since the malfunction detection unit 180 should not affect an operation of the amplification unit 130 including the active element unit 132, the subtractor 181 of the malfunction detection unit 180 may have a high input impedance.

The malfunction detection unit 180 may only operate when a malfunction test is required without having to always operate. Accordingly, in order to reduce unnecessary power consumption, a switch 16 may be provided to selectively turn off only the malfunction detection unit 180.

The switch 16 may be present outside an IC chip 500. The IC chip 500 may further include a separate terminal t8 to selectively supply power to the malfunction detection unit 180 on the basis of the state of the switch 16. The switch 16 may be connected between the power supply 400 and the terminal t8.

Meanwhile, the malfunction detection unit 180 may include components driven by a high supply voltage and components driven by a low supply voltage. For example, input terminals of the subtractor 181, the comparators 182a and 182b, and the level shifters 183a and 183b may be driven by the high supply voltage Vdd. The logic circuit 184 and output terminals of the level shifters 183a and 183b may be driven by a voltage lower than the supply voltage Vdd due to a voltage dividing circuit 17.

In an embodiment, the active element unit 132 and the malfunction detection unit 180 may be physically integrated into the single IC chip 500. For example, the IC chip 500 may include a terminal t1 to be connected to the power supply 400, a terminal t2 to be connected to the second reference potential 602, and an output terminal t3 of the malfunction detection unit 180, terminals (e.g., t4, t5, t6, and t7) to be connected to a passive element unit, and the terminal t8 used for turning on/off the operation of the malfunction detection unit 180.

Meanwhile, the embodiment in which an emitter node of each of the first and second transistors 11 and 12 is connected to the input terminal of the subtractor 181 is illustrated in FIG. 57, but according to an embodiment, a base node of each of the first and second transistors 11 and 12 may be connected to the input terminal of the subtractor 181.

FIG. 58 schematically illustrates a configuration of an active current compensation device 100B according to an embodiment of the present disclosure. Hereinafter, descriptions of contents overlapping with contents described with reference to FIGS. 50 to 57 will be omitted.

Referring to FIG. 58, the active current compensation device 100B may actively compensate for first currents I11, I12, and I13 input as a common-mode current with respect to each of first through third high-current paths 111B, 112B, and 113B connected to the first device 300.

To this end, the active current compensation device 100B according to an embodiment of the present disclosure may include first through third high-current paths 111B, 112B, and 113B, a sensing transformer 120B, an amplification unit 130B, a malfunction detection unit 180, a compensation transformer 140B, and a compensation capacitor unit 150B.

When it is described in comparison with the active current compensation devices 100A, 100A-1, and 100A-2 according to the above-described embodiments, the active current compensation device 100B according to the embodiment described with reference to FIG. 58 includes first through third high-current paths 111B, 112B, and 113B and thus has differences in the sensing transformer 120B and the compensation capacitor unit 150B. Thus, the active current compensation device 100B will now be described below focusing on differences described above.

The active current compensation device 100B may include a first high-current path 111B, a second high-current path 112B, and a third high-current path 113B that are distinguished from each other. According to an embodiment, the first high-current path 111B may be an R-phase power line, the second high-current path 112B may be an S-phase power line, and the third high-current path 113B may be a T-phase power line. The first currents I11, I12, and I13 may be input as a common-mode current with respect to each of the first high-current path 111B, the second high-current path 112B, and the third high-current path 113B.

A primary side 121B of the sensing transformer 120B may be disposed in each of the first to third high-current paths 111B to 113B to generate an induced current in a secondary side 122B. Magnetic flux densities generated by the sensing transformer 120B due to the first currents I11, I12, and I13 on the first through third high-current paths 111B, 112B, and 113B may be reinforced with each other.

Meanwhile, in the active current compensation device 100B, the amplification unit 130B may be implemented as one of the amplification units including the amplification unit 130A-1 and the amplification unit 130A-2. FIG. 58 illustrates the amplification unit 130B corresponding to the amplification unit 130A-1 as an example.

The malfunction detection unit 180 and at least a portion of the amplification unit 130B may be physically integrated into one IC chip 500B. For example, as shown in FIG. 58, an active element unit of the amplification unit 130B and the malfunction detection unit 180 may be integrated into the single IC chip 500B. The active element unit may include, for example, a first transistor 11, a second transistor 12, a diode 13, Rnpn, Rpnp, and Re. However, the present disclosure is not limited thereto, and at least some components of a passive element unit including Cb, Ce, Z1, Z2, and Cdc may also be integrated into the IC chip 500B. Meanwhile, FIG. 58 illustrates an embodiment in which a voltage of an emitter node of the first transistor 11 and a voltage of an emitter node of the second transistor 12 are differentially input to the malfunction detection unit 180. However, the present disclosure is not limited thereto, and according to an embodiment, the voltage of a base node of the first transistor 11 and a voltage of a base node of the second transistor 12 may be differentially input to the malfunction detection unit 180. The first transistor 11 may be an npn BJT, and the second transistor 12 may be a pnp BJT.

The IC chip 500B may include a terminal t1 to be connected to the power supply 400, a terminal t2 to be connected to the second reference potential 602, a terminal t3 through which an output signal of the malfunction detection unit 180 is output, and terminals (e.g., t4, t5, t6, and t7) to be connected to the passive element unit. However, the present disclosure is not limited thereto, and according to an embodiment, as shown in FIG. 57, the IC chip 500B may further include a terminal t8 to be connected to a switch 16 for selectively supplying power to the malfunction detection unit 180. In this case, the switch 16 may be connected between the power supply 400 and the terminal t8.

Although not shown in FIG. 58, according to an embodiment, as shown in FIG. 57, an LED driver 14 and an external LED 15 may be connected to the output terminal t3 of the malfunction detection unit 180. The external LED 15 may indicate a normal or malfunction state of the active current compensation device 100B.

Meanwhile, the compensation capacitor unit 150B may provide paths through which compensation currents IC1, IC2, and IC3 generated by the compensation transformer 140B flow to the first to third high-current paths 111B to 113B, respectively.

The active current compensation device 100B may further include a decoupling capacitor unit 170B on an output side thereof (i.e., the second device 200 side). One ends of capacitors included in the decoupling capacitor unit 170B may be connected to the first high-current path 111B, the second high-current path 112B, and the third high-current path 113B, respectively. The opposite end of each of the capacitors may be connected to the first reference potential 601 of the current compensation device 100B.

The decoupling capacitor unit 170B may prevent the performance of outputting the compensation current of the active current compensation device 100B from being significantly changed according to a change in an impedance value of the second device 200. An impedance ZY of the decoupling capacitor unit 170B may be designed to have a value less than a value specified in a first frequency band for which noise reduction is to be performed. As the decoupling capacitor unit 170B is coupled, the current compensation device 100B may be used as an independent module in any system (e.g., a three-phase three-wire system).

According to an embodiment, the decoupling capacitor unit 170B may be omitted from the active current compensation device 100B.

The active current compensation device 100B according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

The active current compensation devices 100, 100A, 100A-1, 100A-2, and 100B according to various embodiments have little increase in size and heat generation, in high-power systems as compared with passive EMI filters. By integrating the active element unit and the malfunction detection unit into the single IC chip 500, 500A-1, 500A-2, or 500B, the IC chip 500, 500A-1, 500A-2, or 500B may have versatility as an independent component and may be commercialized. In addition, the current compensation device 100, 100A, 100A-1, 100A-2, or 100B respectively including the IC chip 500, 500A-1, 500A-2, or 500B may also be manufactured as an independent module and commercialized. The current compensation device 100, 100A, 100A-1, 100A-2, or 100B may detect a malfunction as an independent module regardless of the characteristics of a peripheral electrical system.

Hereinafter, active current compensation device including power conversion unit embedded therein, which is the second category of invention, will be described with reference to FIGS. 59 to 65.

Figure 59:
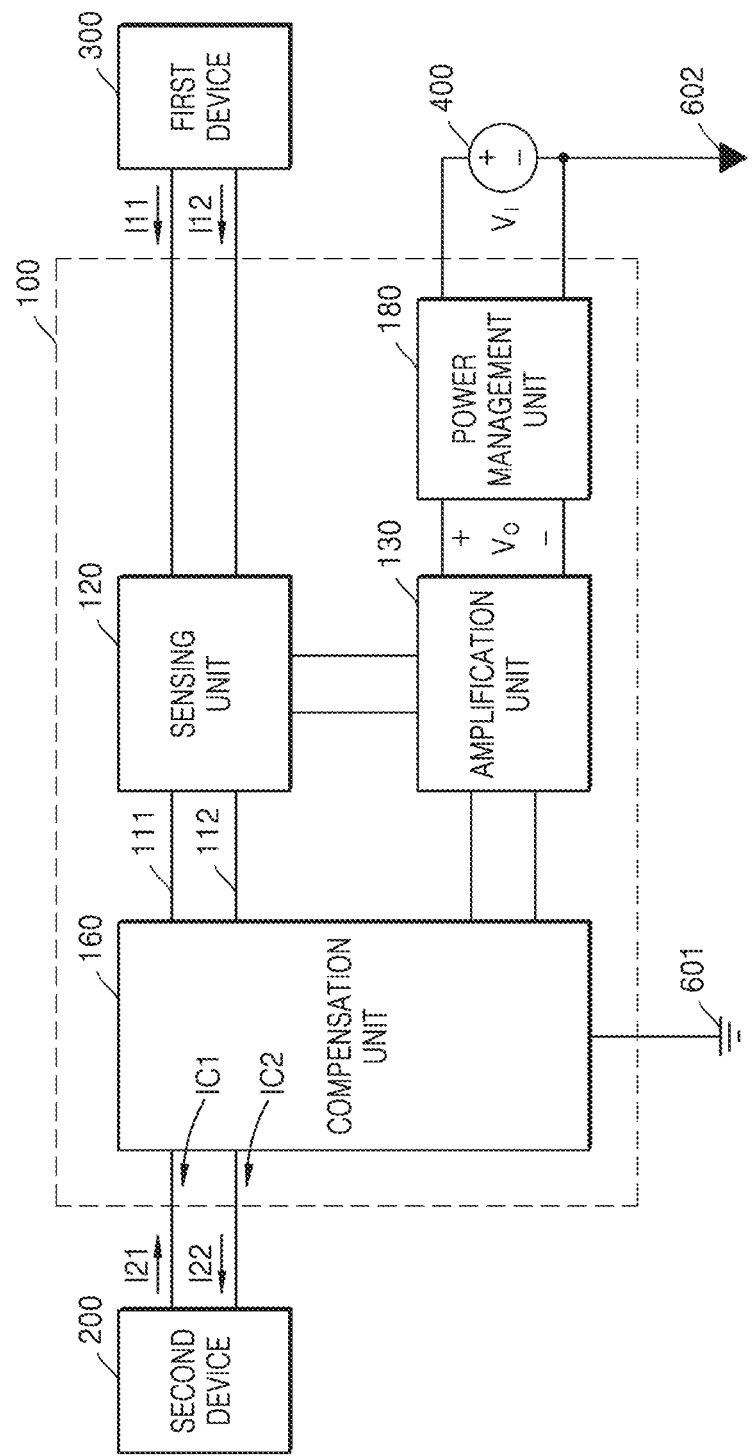
FIG. 59 schematically illustrates a configuration of a system including an active current compensation device according to an embodiment of the present disclosure.

FIG. 59 schematically illustrates a configuration of a system including an active current compensation device 100 according to an embodiment of the present disclosure. The active current compensation device 100 may actively compensate for first currents I11 and I12 (e.g., EMI noise current) that are input as a common-mode current through two or more high-current paths 111 and 112 from a first device 300.

Referring to FIG. 59, the active current compensation device 100 may include a sensing unit 120, an amplification unit 130, a power management unit 180, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. The second device 200 may be a device that supplies stored energy. However, the present disclosure is not limited thereto.

A power converter may be located on the first device 300 side. For example, the first currents I11 and I12 may be input to the current compensation device 100 due to a switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 65:
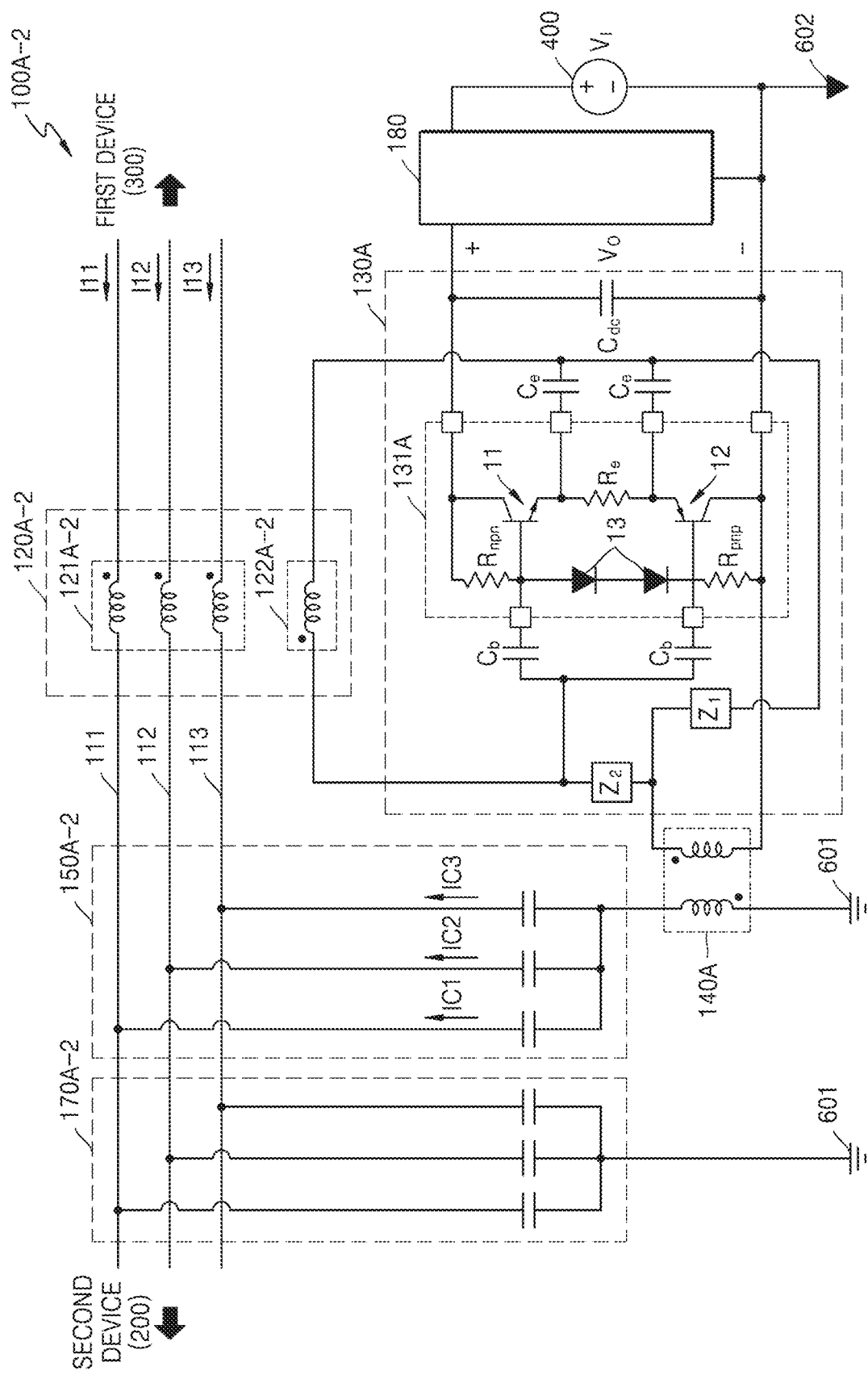
FIG. 65 schematically illustrates a configuration of an active current compensation device according to an embodiment of the present disclosure.

Meanwhile, the two or more high-current paths 111 and 112 may include two paths as shown in FIG. 59, or may include three paths as shown in FIG. 65. In addition, the two or more high-current paths 111 and 112 may include four paths. The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portion of the high-current paths 111 and 112 may pass through the sensing unit 120, but a portion of the sensing unit 120, which generates an output signal according to the sensing, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112. However, the sensing unit 120 is not limited to the sensing transformer.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may mean that the magnitude and/or phase of an object to be amplified is adjusted. The amplification unit 130 may be implemented by various components, and may include active elements. In an embodiment, the amplification unit 130 may include BJTs. For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure.

According to an embodiment, a second reference potential 602 of the amplification unit 130 and a first reference potential 601 of the current compensation device 100 may be distinguished from each other. For example, when the amplification unit 130 is isolated from the high-current paths 111 and 112, the second reference potential 602 of the amplification unit 130 and the first reference potential 601 of the current compensation device 100 may be distinguished from each other.

However, the present disclosure is not limited thereto. For example, when the amplification unit 130 is not isolated from the high-current paths 111 and 112, the reference potential of the amplification unit and the reference potential of the current compensation device may not be distinguished from each other.

The amplification unit 130 may receive power from a power supply 400 that is distinguished from the first device 300 and/or the second device 200. The amplification unit 130 may receive the power from the power supply 400, and amplify the output signal output from the sensing unit 120 to generate an amplified current.

The power supply 400 may be, for example, a device that receives power from any one of the first device 300 and the second device 200 and generates input power of the amplification unit 130. The power supply 400 may be, for example, a switching mode power supply (SMPS) of the first device 300 or the second device 200. The power supply 400 may output a DC voltage VI based on the second reference potential 602. The output voltage VI of the power supply 400 may be used to drive the amplification unit 130.

Meanwhile, there is an optimized DC voltage level required for the amplification unit 130, but the power supply 400 may not be able to output the optimized voltage level required for the amplification unit 130. Specifically, the output DC voltage VI of the power supply 400 may vary depending on the system (e.g., the first device 300 or the second device 200). For example, although the optimal supply voltage of the amplification unit 130 is 12 V, the output voltage VI of the power supply 400 may vary depending on the system, such as 15 V, 24 V, 48 V, or the like. Thus, when the output voltage VI of the power supply 400 is directly supplied to the amplification unit 130, the amplification unit 130 may be unstable in operation or cause a malfunction.

Accordingly, the active current compensation device 100 according to an embodiment of the present disclosure may include the power management unit 180 between the amplification unit 130 and the power supply 400. The power management unit 180 may receive the voltage VI output from the power supply 400 and convert the voltage VI into an output voltage VO. The output voltage VO of the power management unit 180 may be input to the amplification unit 130. VI may vary as 15 V, 24V, 48V, or the like depending on the system, but VO is a value fixed to the optimized voltage level required for the amplification unit 130.

The power management unit 180 may be a DC-DC converter. The power management unit 180 may be a power management IC (PMIC).

According to an embodiment of the present disclosure, at least a portion of the amplification unit 130 and at least a portion of the power management unit 180 may be integrated into one IC chip. For example, by embedding at least a portion of the amplification unit 130 and at least a portion of the power management unit 180 into the single IC chip, the IC chip may have versatility as an independent component and may be commercialized.

The compensation unit 160 may generate compensation currents IC1 and IC2 on the basis of the amplified output signal generated by the amplification unit 130. An output side of the compensation unit 160 may be connected to the high-current paths 111 and 112 to allow the compensation currents IC1 and IC2 to flow to the high-current paths 111 and 112.

According to an embodiment, the output side of the compensation unit 160 may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

However, the present disclosure is not limited thereto. According to an embodiment, the output side of the compensation unit 160 may also be isolated from the amplification unit 130. In this case, the amplification unit 130 may not be isolated from the high-current paths 111 and 112.

In order to cancel the first currents I11 and I12, the compensation unit 160 may inject the compensation currents IC1 and IC2 into the high-current paths 111 and 112 through the two or more high-current paths 111 and 112, respectively. The compensation currents IC1 and IC2 may have the same magnitude and an opposite phase compared to the first currents I11 and I12.

Figure 60:
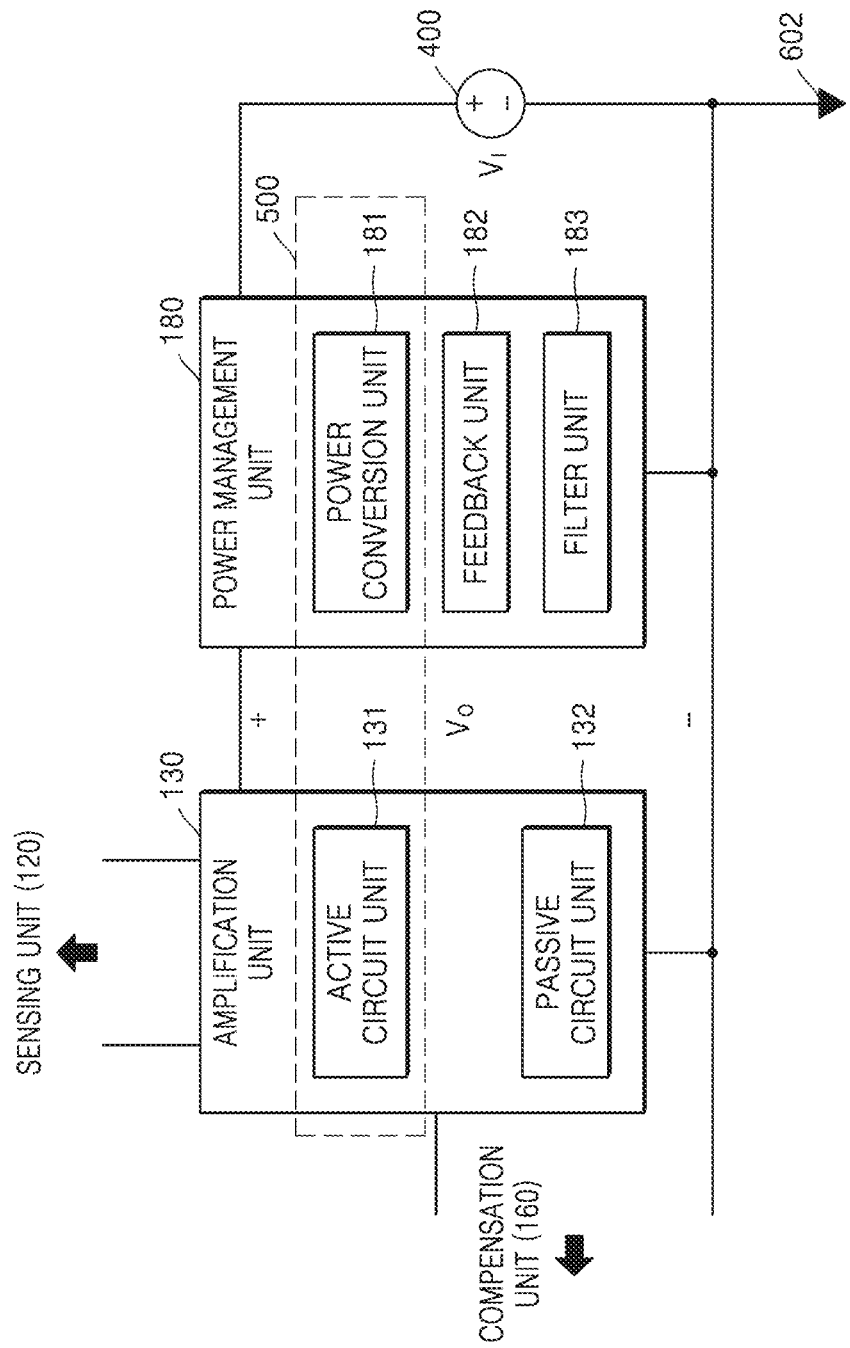
FIG. 60 illustrates an example of a functional configuration of an amplification unit and a power management unit according to an embodiment of the present disclosure.

FIG. 60 illustrates an example of a functional configuration of the amplification unit 130 and the power management unit 180 according to an embodiment of the present disclosure.

Referring to FIG. 60, the amplification unit 130 may include an active circuit unit 131 and a passive circuit unit 132. The passive circuit unit 132 includes only passive elements, and the active circuit unit 131 includes active elements. The active circuit unit 131 may further include passive elements as well as the active elements. Examples of a detailed configuration of the amplification unit 130 including the active circuit unit 131 and the passive circuit unit 132 will be described below with reference to FIG. 62.

The power management unit 180 may include a power conversion unit 181, a feedback unit 182, and a filter unit 183. The power conversion unit 181 may convert the arbitrary input voltage VI into the output voltage VO. The feedback unit 182 is a feedback control system that allows the same output voltage VO to be output even when the arbitrary input voltage VI is input. The filter unit 183 is a DC voltage/current filter. The filter unit 183 may be located at an input terminal or an output terminal of the power management unit 180. Examples of a detailed configuration of the power management unit 180 will be described below with reference to FIGS. 63 and 64.

According to an embodiment, the active circuit unit 131 of the amplification unit 130 and the power conversion unit 181 of the power management unit 180 may be physically integrated into one IC chip 500. However, this is merely an embodiment, and in other embodiments, at least some elements of the active circuit unit 131, the power management unit 180, and the feedback unit 182 may be physically integrated into the single IC chip 500. Of course, in other embodiments, all of the amplification unit 130 and the power management unit 180 may be physically integrated into the single IC chip 500.

The power management unit 180 may include active elements. Here, a reference potential of the power management unit 180 may be equal to the second reference potential 602, which is a reference potential of the amplification unit 130. The reference potential of the power management unit 180 may be different from the first reference potential 601, which is a reference potential of the current compensation device 100 (e.g., a reference potential of the compensation unit 160).

The amplification unit 130 may receive power from the power supply 400 through the power management unit 180. The amplification unit 130 may receive the output voltage VO of the power management unit 180, and amplify the output signal output by the sensing unit 120 to generate the amplified current. The amplified current may be input to the compensation unit 160.

Figure 61:
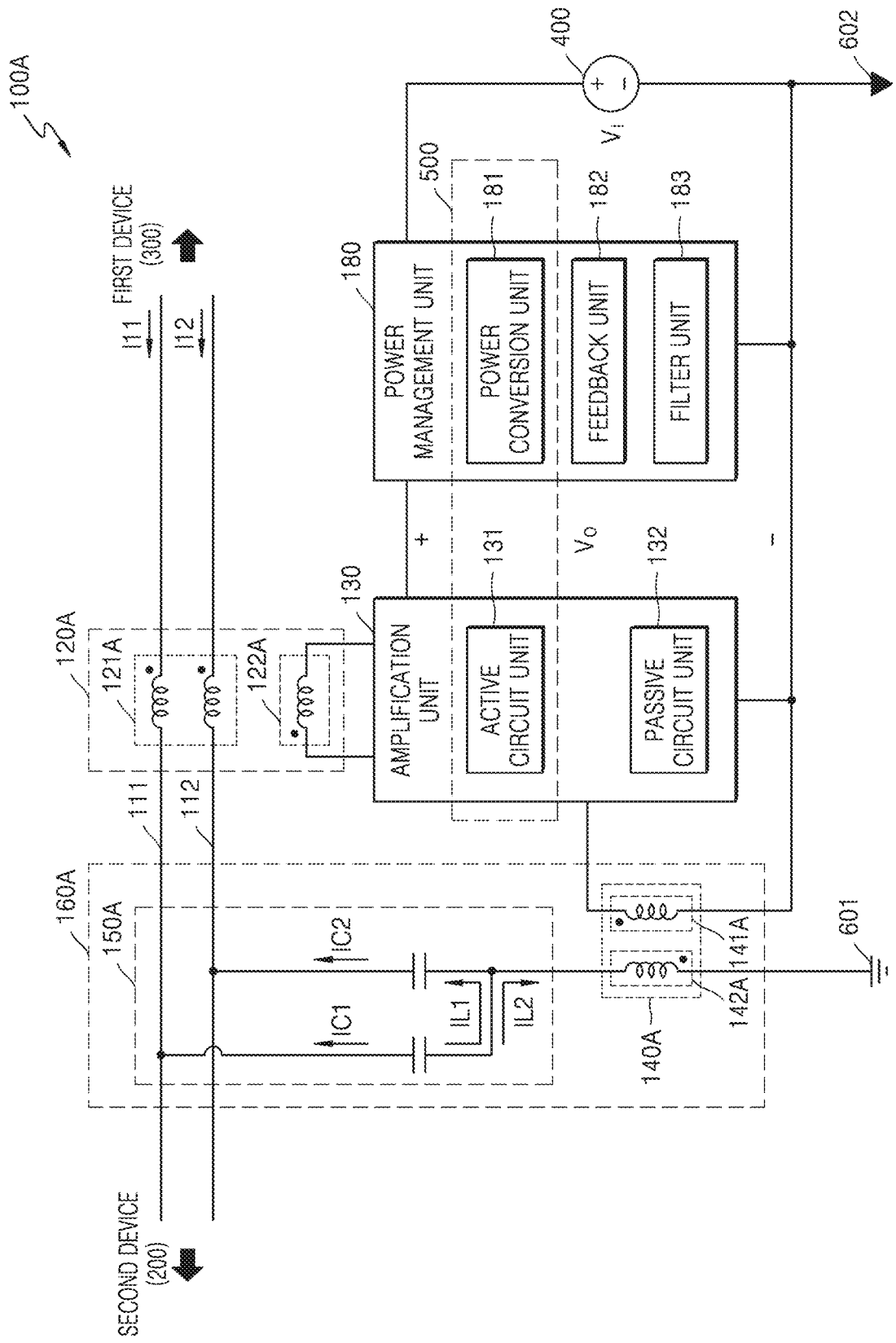
FIG. 61 illustrates a more specific example of the embodiment described with reference to FIG. 59, and schematically illustrates an active current compensation device according to an embodiment of the present disclosure.

FIG. 61 illustrates a more specific example of the embodiment described with reference to FIG. 59, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 61, the active current compensation device 100A may include a sensing transformer 120A, an amplification unit 130, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. In an example, the primary side 121a and the secondary side 122a of the sensing transformer 120a may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and provide the induced current or an induced voltage to the amplification unit 130.

The amplification unit 130 may amplify the current that is sensed by the sensing transformer 120A and induced in the secondary side 122A. For example, the amplification unit 130 may amplify the magnitude of the induced current at a predetermined ratio and/or adjust a phase of the induced current.

According to various embodiments of the present disclosure, the amplification unit 130 may include an active circuit unit 131 and a passive circuit unit 132 that is a configuration other than the active circuit unit.

The active circuit unit 131 may include active elements. The active circuit unit 131 may be connected to the power supply 400 to drive the active elements. The active circuit unit 131 may receive power from the power supply 400 through a power management unit 180. The power management unit 180 may receive an arbitrary DC voltage VI from the power supply 400 and output a constant output voltage VO to the active circuit unit 131. The power supply 400, the power management unit 180, and the amplification unit 130 may all be connected to the second reference potential 602. Thus, both the input voltage VI and the output voltage VO of the power management unit 180 are voltages based on the second reference potential 602. The second reference potential 602 may be distinguished from the first reference potential 601 of the current compensation device 100A (or the compensation unit 160A).

The power management unit 180 may include a filter unit 183, a feedback unit 182, and a power conversion unit 181 that is a configuration other than the filter unit 183 and the feedback unit 182. According to an embodiment, the active circuit unit 131 of the amplification unit 130 and the power conversion unit 181 of the power management unit 180 may be physically embedded into one IC chip 500. The IC chip 500 may convert the input voltage VI having an arbitrary level into the voltage VO of a level optimized for the active circuit unit 131 and operate the active circuit unit 131. The IC chip 500 may have versatility as an independent component and may be commercialized.

The compensation unit 160A may be an example of the compensation unit 160 described above. In an embodiment, the compensation unit 160A may include a compensation transformer 140A and a compensation capacitor unit 150A. The amplified current amplified by the above-described amplification unit 130 flows through a primary side 141A of the compensation transformer 140A.

The compensation transformer 140A according to an embodiment may be a component for isolating the amplification unit 130 including active elements from the high-current paths 111 and 112. That is, the compensation transformer 140A may be a component for generating compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, and the secondary side 122A of the sensing transformer 120A may be connected to the second reference potential 602, which is distinguished from the reference potential of the other components of the active current compensation device 100A. The first reference potential 601 of the current compensation device 100A according to an embodiment and the second reference potential 602 of the amplification unit 130 may be distinguished from each other.

As described above, in the current compensation device 100A according to an embodiment, the component generating the compensation current uses a reference potential (i.e., the second reference potential 602) different from that of the other components and thus may operate in a state of being isolated from the other components, thereby improving the reliability of the active current compensation device 100A. However, the current compensation device according to the present disclosure is not limited to such an isolating structure.

In the compensation transformer 140A according to an embodiment, when a turns ratio of the primary side 141A and the secondary side 142A is 1:Ninj, and a self-inductance of the primary side 141A of the compensation transformer 140A is Linj, the secondary side 142A may have a self-inductance of Ninj2*Linj. In this case, the current induced in the secondary side 142A has a magnitude that is 1/Ninj times that of the current (i.e., the amplified current) flowing in the primary side 141A. In an example, the primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*Ninj. However, since a magnetic coupling loss may occur in an actual situation, a target current gain of the amplification unit 130 may be designed to be higher than Nsen*Ninj.

As described above, the compensation capacitor unit 150A may provide a path through which the current generated by the compensation transformer 140A flows to each of the two high-current paths 111 and 112.

The compensation capacitor unit 150A may include Y-capacitors (Y-cap) each having one end connected to the secondary side 142A of the compensation transformer 140A and the other end connected to the high-current paths 111 and 112. For example, one ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow to the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A according to an embodiment may be implemented as an isolated structure by using the compensation transformer 140A and the sensing transformer 120A.

Figure 62:
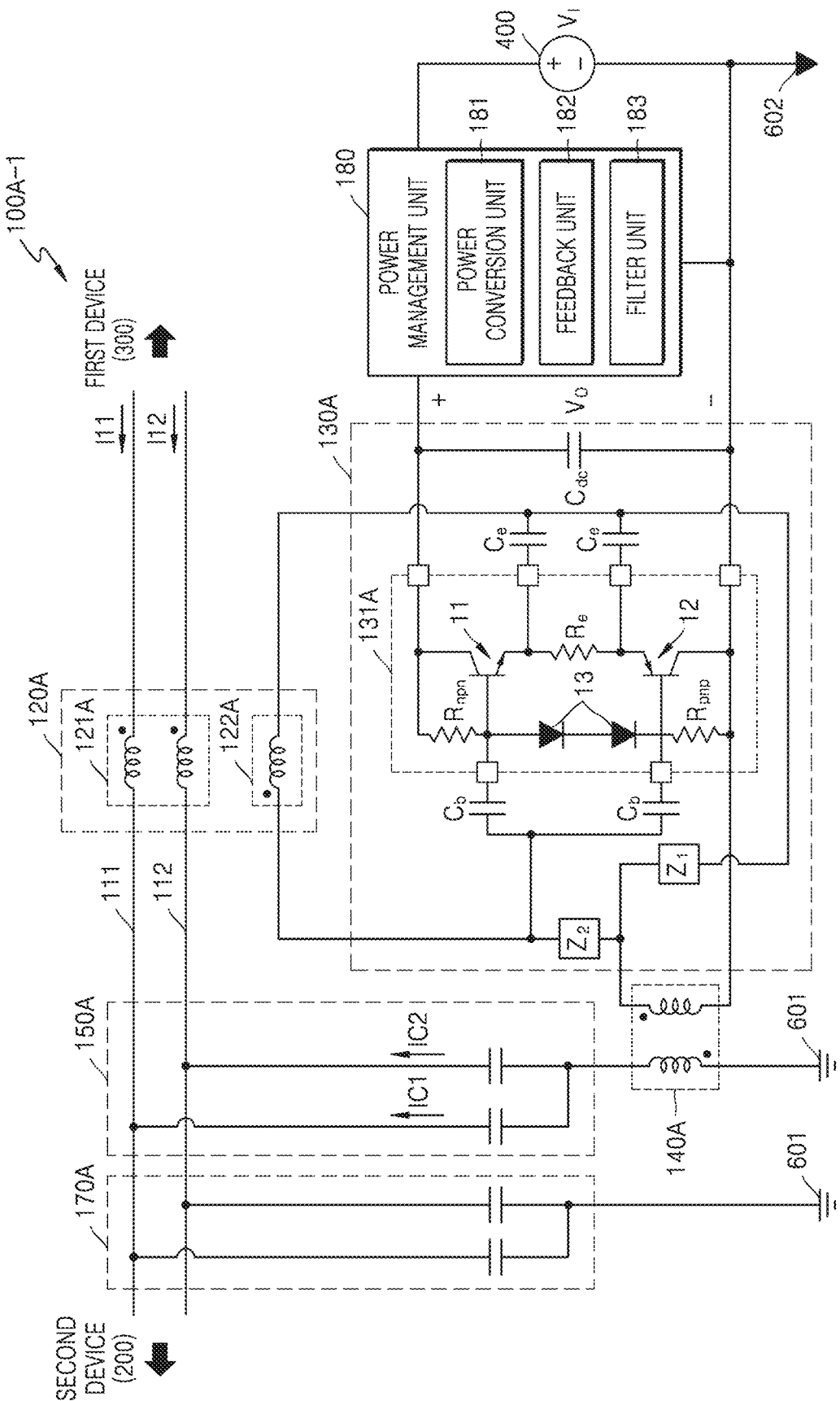
FIG. 62 illustrates a more specific example of the embodiment described with reference to FIG. 61, and schematically illustrates an active current compensation device according to an embodiment of the present disclosure.

FIG. 62 illustrates a more specific example of the embodiment described with reference to FIG. 61, and schematically illustrates an active current compensation device 100A-1 according to an embodiment of the present disclosure. The active current compensation device 100A-1, an amplification unit 130A, and an active circuit unit 131A illustrated in FIG. 62 are respectively exemplary of the active current compensation device 100A, the amplification unit 130, and the active circuit unit 131 illustrated in FIG. 61.

The active current compensation device 100A-1 according to an embodiment may include a sensing transformer 120A, the amplification unit 130A, a compensation transformer 140A, and a compensation capacitor unit 150A. In an embodiment, the active current compensation device 100A-1 may further include a decoupling capacitor unit 170A on an output side thereof (i.e., the second device 200 side). In other embodiments, the decoupling capacitor unit 170A may be omitted. Descriptions of the sensing transformer 120A, the compensation transformer 140A, and the compensation capacitor unit 150A are redundant and thus omitted.

In an embodiment, an induced current induced in a secondary side 122A by the sensing transformer 120A may be differentially input to the amplification unit 130A.

The amplification unit 130A of the active current compensation device 100A-1 according to an embodiment may include the active circuit unit 131A and a passive circuit unit. In the amplification unit 130A, the other components other than the active circuit unit 131A may be included in the passive circuit unit. In embodiments of the present disclosure, the active circuit unit 131A is physically implemented in one chip together with a power conversion unit 181 of a power management unit 180. Components included in the passive circuit unit may be commercial discrete elements. The passive circuit unit may be implemented differently depending on an embodiment. The passive circuit unit may be modified so that the active circuit unit 131A is applicable to the active current compensation device 100 of various designs.

The active circuit unit 131A may include an npn BJT 11, a pnp BJT 12, a diode 13, and one or more resistors.

In an embodiment, the one or more resistors included in the active circuit unit 131A may include Rnpn, Rpnp, and/or Re. In the active circuit unit 131A, the resistor Rnpn may connect a collector node and a base node of the npn BJT 11. In the active circuit unit 131A, the resistor Rpnp may connect a collector node and a base node of the pnp BJT 12. In the active circuit unit 131A, the resistor Re may connect an emitter node of the npn BJT 11 and an emitter node of the pnp BJT 12.

The active circuit unit 131A may be driven by power supplied from the power supply 400 through the power management unit 180. To this end, an output terminal of the power management unit 180 may supply a DC voltage VO between the collector node of the npn BJT 11 and the collector node of the pnp BJT 12. The collector node of the pnp BJT 12 may correspond to the second reference potential 602, and the collector node of the npn BJT 11 may correspond to the output voltage VO of the power management unit 180, which is based on the second reference potential 602.

In an embodiment, in the active circuit unit 131A, the biasing diode 13 may connect the base node of the npn BJT 11 and the base node of the pnp BJT 12. That is, one end of the diode 13 may be connected to the base node of the npn BJT 11, and the other end of the diode 13 may be connected to the base node of the pnp BJT 12.

According to embodiments of the present disclosure, the resistors Rnpn, Rpnp, Re, and/or the biasing diode 13 included in the active circuit unit 131A may be used for DC biasing of the BJTs 11 and 12. In an embodiment of the present disclosure, the resistors Rnpn, Rpnp, and Re, and the biasing diode 13 are general-purpose components in various active current compensation devices 100 and 100A, and thus may be integrated in an IC chip 500.

Although omitted in FIG. 62, the active circuit unit 131A and the power conversion unit 181 may be integrated into the single IC chip 500 in various embodiments of the present disclosure. The IC chip 500 may include a terminal corresponding to a base of the npn BJT 11, a terminal corresponding to a collector of the npn BJT 11, a terminal corresponding to an emitter of the npn BJT 11, and a terminal corresponding to a base of the pnp BJT 12, a terminal corresponding to a collector of the pnp BJT 12, and a terminal corresponding to an emitter of the pnp BJT 12. In addition, the IC chip 500 may further include terminals of the power conversion unit 181 to be described below with reference to FIG. 63.

At least one of the above-described terminals of the IC chip 500 may be connected to the passive circuit unit. The active circuit unit 131A and the passive circuit unit may be combined together to function as the amplification unit 130A.

In an embodiment, the passive circuit unit may include capacitors Cb, Ce, and Cdc, and impedances Z1 and Z2.

According to an embodiment, the capacitors Cb of the passive circuit unit may be connected to base terminals, respectively, in the active circuit unit 131A. The capacitors Ce of the passive circuit unit may be connected to emitter terminals, respectively, in the active circuit unit 131A. In the outside of the IC chip 500, a collector terminal of the pnp BJT 12 may be connected to the second reference potential 602. In the outside of the IC chip 500, the capacitor Cdc of the passive circuit unit may be connected between both collector terminals.

The capacitors Cb and Ce included in the passive circuit unit may respectively block DC voltages at the base node and the emitter node of each of the BJTs 11 and 12. Only AC signals may be selectively coupled through the capacitors Cb and Ce.

The capacitor Cdc is a DC decoupling capacitor for the voltage VO, and may be connected in parallel with respect to the output voltage VO of the power management unit 180. Only AC signals may be selectively coupled between both collectors of the npn BJT 11 and the pnp BJT 12 through the capacitors Cdc.

A current gain of the amplification unit 130A may be controlled by a ratio of the impedances Z1 and Z2. Z1 and Z2 may be flexibly designed depending on a turns ratio of each of the sensing transformer 120A and the compensation transformer 140A and a required target current gain. Thus, Z1 and Z2 may be implemented outside the IC chip 500 (i.e., in the passive circuit unit).

A combination of the active circuit unit 131A and Cb, Ce, Cdc, Z1, and Z2 of the passive circuit unit may function as the amplification unit 130A. For example, the amplification unit 130A may have a push-pull amplifier structure including an npn BJT and a pnp BJT.

In an embodiment, a secondary side 122A of the sensing transformer 120A may be connected between a base side and an emitter side of each of the BJTs 11 and 12. In an embodiment, a primary side 141A side of the compensation transformer 140A may be connected between the collector side and the base side of each of the BJTs 11 and 12. Here, the connection includes an indirectly connected case.

In an embodiment, the amplification unit 130A may have a regression structure in which an output current is injected back into a base of each of the BJTs 11 and 12. Due to the regression structure, the amplification unit 130A may stably obtain a constant current gain for operating the active current compensation device 100A-1.

For example, when an input voltage of the amplification unit 130A has a positive swing of greater than zero due to a noise signal, the npn BJT 11 may operate. In this case, the operating current may flow through a first path passing through the npn BJT 11. When the input voltage of the amplification unit 130A has a negative swing of less than zero due to a noise signal, the pnp BJT 12 may operate. In this case, the operating current may flow through a second path passing through the pnp BJT 12.

In the active circuit unit 131A, an operating point of each of the BJTs may be controlled through the resistors Rnpn, Rpnp, and Re. The resistors Rnpn, Rpnp, and Re may be designed according to the operating point of the BJT.

An inductor, the capacitors (e.g., Cb, Ce, and Cdc), Z1, and Z2 of the passive circuit unit are discrete components, and may be implemented around the IC chip 500.

Capacitance of each of the capacitors Cb, Ce, and Cdc required for an AC signal to couple through each of the capacitors Cb, Ce, and Cdc may be several µF or more (e.g., 10 µF). Such a capacitance value is difficult to be implemented in the IC chip 500, and thus the capacitors Cb, Ce, and Cdc may be implemented outside the IC chip 500.

The impedances Z1 and Z2 may be implemented outside the IC chip 500 to achieve design flexibility for various power systems or various first devices 300. Z1 and Z2 may be flexibly designed depending on the turns ratio of each of the sensing transformer 120A and the compensation transformer 140A and the required target current gain.

Meanwhile, the active current compensation device 100A-1 may further include the decoupling capacitor unit 170A on an output side thereof (i.e., the second device 200 side). One ends of capacitors included in the decoupling capacitor unit 170A may be connected to the first high-current path 111 and the second high-current path 112, respectively. The opposite end of each of the capacitors may be connected to the first reference potential 601 of the current compensation device 100A-1.

The decoupling capacitor unit 170A may prevent the performance of outputting the compensation current of the active current compensation device 100A-1 from being significantly changed according to a change in an impedance value of the second device 200. An impedance ZY of the decoupling capacitor unit 170A may be designed to have a value less than a value specified in a first frequency band for which noise reduction is to be performed. As the decoupling capacitor unit 170A is coupled, the current compensation device 100A-1 may be used as an independent module in any system.

According to an embodiment, the decoupling capacitor unit 170A may be omitted from the active current compensation device 100A-1.

Figure 63:
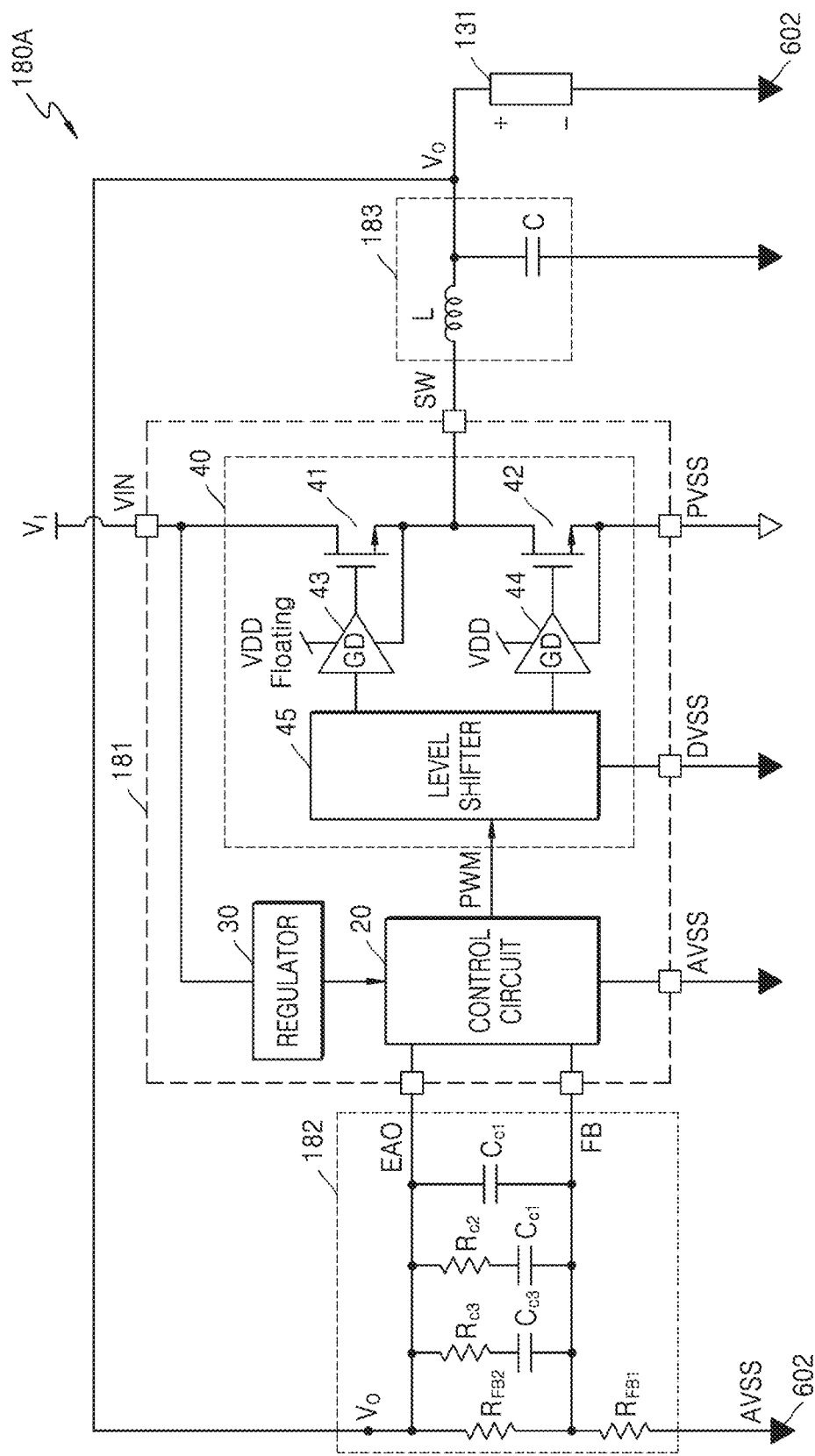
FIG. 63 schematically illustrates the power management unit according to an embodiment of the present disclosure.

FIG. 63 schematically illustrates a power management unit 180 according to an embodiment of the present disclosure. The power management unit 180 may include a power conversion unit 181, a feedback unit 182, and a filter unit 183. FIG. 63 illustrates the components of the power management unit 180 in more detail.

The power management unit 180 may be a PMIC. In an embodiment, the power management unit 180 may be a voltage drop converter, for example, a buck converter.

An output DC voltage VI of the power supply 400 is input through an input terminal VIN of the power conversion unit 181. VI may vary depending on the system, such as 15 V, 24 V, 48 V, or the like.

The power conversion unit 181 may convert the arbitrary input voltage VI into a set output voltage VO. A value of VO may be set to an optimized voltage level (e.g., 12 V) required for the active circuit unit 131.

The power conversion unit 181 may include a control circuit 20, a regulator 30, and a switch portion 40. The components of the power conversion unit 181 are embedded in one IC chip 500 together with the active circuit unit 131.

The regulator 30 may generate a DC low voltage, for driving internal circuits (e.g., the control circuit 20), from the input voltage VI. For example, the input voltage VI may have a high voltage range of 12 V or more, and the internal circuits of the power conversion unit 181 may be efficient only when being driven by a voltage as low as 5 V. Accordingly, the regulator 30 is a circuit configured to supply a DC low voltage (e.g., 5 V) for an internal IC of the power conversion unit 181. The regulator 30 may be referred to as a linear regulator, a pre-regulator, an on-chip supply, a low dropout (LDO) regulator, or the like.

The control circuit 20 is driven by receiving the DC low voltage generated by the regulator 30. The control circuit 20 includes circuits necessary to generate a constant output voltage from an input voltage in an arbitrary range. The control circuit 20 may generate a pulse width modulation (PWM) signal that is a switching signal required to output a constant voltage from the input voltage in an arbitrary range. A detailed configuration of the control circuit 20 will be described below with reference to FIG. 64.

The switch portion 40 may generate a constant output voltage VO by performing a switching operation according to the switching signal (i.e., the PWM signal) input from the control circuit 20. The switch portion 40 may include a level shifter 45, a first driver 43, a second driver 44, a first switch 41, and a second switch 42. The first and second switches 41 and 42 may be MOSFETs. The first switch 41 may be a high-side MOSFET, and the second switch 42 may be a low-side MOSFET. Since an input capacitance of a gate terminal of the MOSFET is high, the first and second drivers 43 and 44, each of which has a sufficient output, may be placed in the front end of the MOSFET.

In various embodiments of the present disclosure, the control circuit 20, the regulator 30, and the switch portion 40 are embedded in the single IC chip 500 together with the active circuit unit 131.

The feedback unit 182 is connected to the control circuit 20 and is disposed outside the IC chip 500. The feedback unit 182 is a feedback control system that allows the same output voltage VO to be output even when the arbitrary input voltage VI is input. The feedback unit 182 may be composed of commercial discrete elements. Accordingly, necessary tuning may be performed on the compensation circuit according to the situation from the outside of the IC chip 500. However, the present disclosure is not limited thereto, and according to embodiments, some elements (e.g., resistors) of the feedback unit 182 may be embedded together in the IC chip 500.

The filter unit 183 is a DC voltage/current filter, and may be located at an output terminal of the power conversion unit

181. However, the present disclosure is not limited thereto, and when the power management unit 180 is a boost converter, the filter unit 183 may be located at an input terminal of the power conversion unit 181. Meanwhile, the filter unit 183 may be configured by commercial discrete elements in the outside of the IC chip 500.

The power management unit 180 may finally output VO through the power conversion unit 181, the feedback unit 182, and the filter unit 183. The final output voltage VO of the power management unit 180 is input to the active circuit unit 131 of the amplification unit 130. VO may be set to an optimal voltage level for driving the active circuit unit 131.

Figure 64:
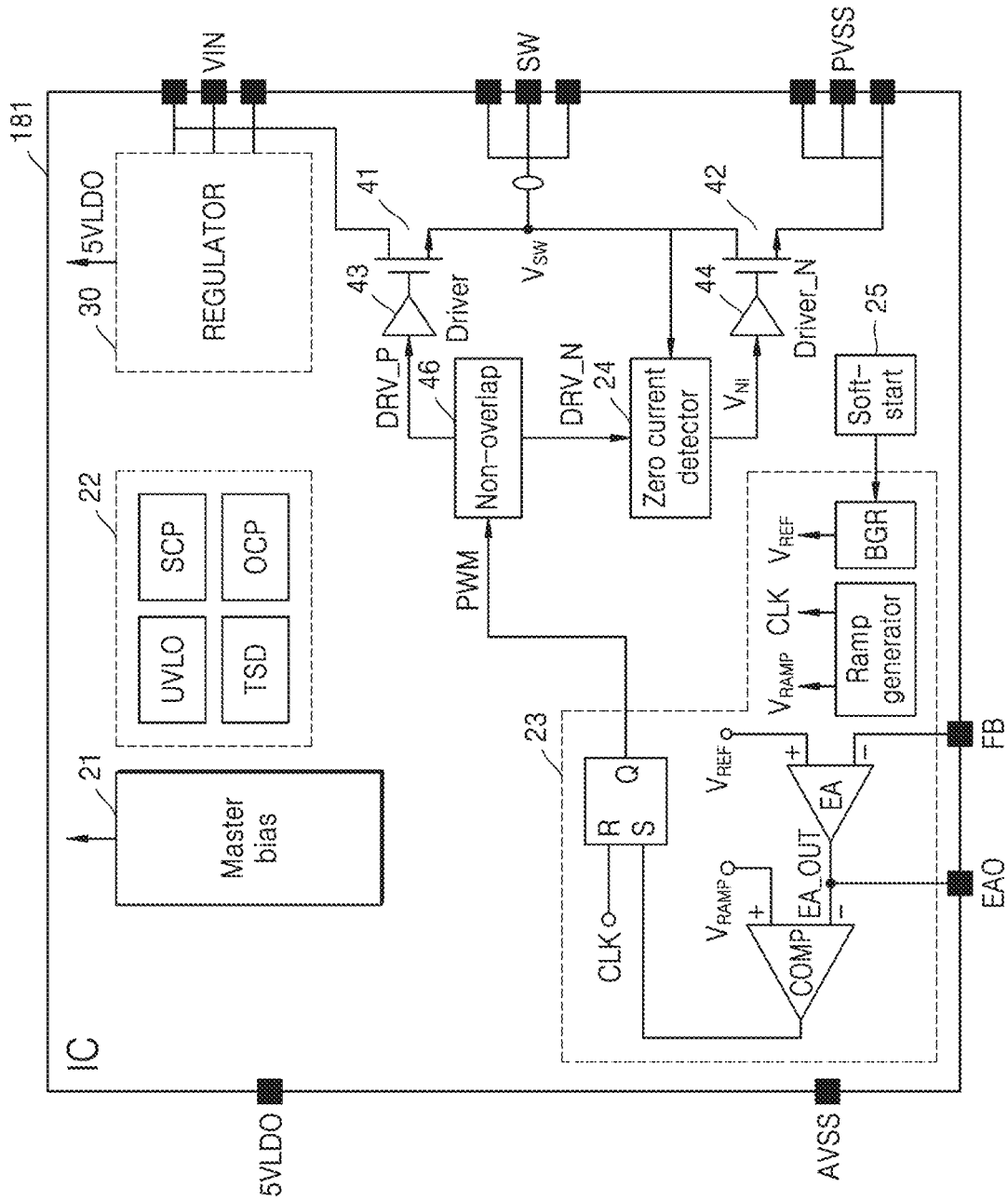
FIG. 64 illustrates a more specific example of a power conversion unit shown in FIG. 63.

FIG. 64 illustrates a more specific example of the power conversion unit 181 shown in FIG. 63.

Referring to FIGS. 63 and 64 together, the control circuit 20 of the power conversion unit 181 may include a voltage redistribution circuit 21, a protection circuit 22, a pulse width modulation circuit 23, a zero current detector 24, and a soft start circuit 25. The regulator 30 of FIG. 64 corresponds to the regulator 30 of FIG. 63.

The regulator 30 may generate a DC low voltage, for driving the internal circuit of the power conversion unit 181, from the input voltage VI. The DC low voltage generated from the regulator 30 may be, for example, about 5 V.

The voltage redistribution circuit 21 may receive the DC low voltage generated by the regulator 30. The voltage redistribution circuit 21 redistributes the DC low voltage input from the regulator 30 into DC bias voltages suitable for IC internal circuit blocks. For example, the voltage redistribution circuit 21 may redistribute the DC bias voltages to a band gap reference (BGR) block, a Ramp generator block, and the like. The voltage redistribution circuit 21 may be referred to as a master bias or the like.

The protection circuit 22 may include one or more protection circuits for various situations. In an embodiment, the protection circuit 22 may include an under voltage lock out (UVLO) circuit. When the output voltage of the regulator 30 drops below a specified voltage, the UVLO circuit may forcibly turn off an operation of the power conversion unit 181 to block unstable operation.

In an embodiment, the protection circuit 22 may include a short current protection (SCP) circuit. The SCP circuit may protect the power conversion unit 181 from a short-circuit current.

In an embodiment, the protection circuit 22 may include an over current protection (OCP) circuit. The OCP circuit may protect the power conversion unit 181 from overcurrent.

In an embodiment, the protection circuit 22 may include a thermal shutdown (TSD) circuit. The TSD circuit may shut down the circuit for protection when a temperature of the IC exceeds a specified value for reasons such as, for example, the overcurrent.

The pulse width modulation circuit 23 performs a core function of the control circuit 20. The pulse width modulation circuit 23 generates a PWM signal that is a switching signal necessary to output a constant output voltage VO from the input voltage in an arbitrary range. The first switch 41 and the second switch 42 may be selectively turned on or off according to the PWM signal generated by the pulse width modulation circuit 23 to generate a voltage signal VSW. The voltage signal output through one terminal SW of the IC chip 500 may be supplied to the active circuit unit 131 as the DC output voltage VO through the filter unit 183 and the feedback unit 182.

According to an embodiment, the pulse width modulation circuit 23 may include a BGR block, a Ramp generator block, an error amplifier EA, a comparator, and an RS latch.

In an embodiment, the BGR block is a voltage bias circuit for outputting a constant voltage VREF even when a temperature or voltage changes. The BGR block may supply the constant voltage VREF to the error amplifier EA even when a temperature or voltage changes.

The Ramp generator block may generate a ramp signal VRAMP and a clock signal CLK that are required to generate the PWM signal.

The error amplifier EA is an amplifier necessary for a feedback circuit. One of input terminals of the error amplifier EA may be connected to the feedback unit 182 through one terminal FB of the IC chip 500. The feedback unit 182 outside the IC chip 500 may be connected to an non-inverting terminal of the error amplifier EA through the terminal FB of the IC chip 500.

The comparator may output a digital signal that is generated based on a comparison between an output signal EA_OUT of the error amplifier EA and the ramp signal VRAMP. Meanwhile, an output terminal of the error amplifier EA may form one terminal EAO of the IC chip 500. The feedback unit 182 outside the IC chip 500 may be connected to the output terminal of the error amplifier EA through the terminal EAO. The terminal EAO may correspond to the non-inverting terminal among the input terminals of the comparator.

The RS latch may transmit the PWM signal to the switch portion 40 in response to the clock signal CLK.

The first switch 41 and the second switch 42 may each be turned on according to an on or off digital signal of the PWM signal. At this point, when the first switch 41 and the second switch 42 are simultaneously turned on even for a short period of time, the MOSFETs may be damaged due to overcurrent. Accordingly, in order to prevent a situation in which the first and second switches 41 and 42 are simultaneously turned on, the switch portion 40 may include a non-overlap circuit 46.

The PWM signal output from the RS latch may be transmitted to the non-overlap circuit 46 of the switch portion 40. The non-overlap circuit 46 may generate a short-time section in which both the first switch 41 and the second switch 42 are turned off. The short period of time may be referred to as a dead-time, and may be, for example, several tens of nanoseconds (nsec). The non-overlap circuit 46 may be referred to as a dead-time generator.

Meanwhile, the first and second switches 41 and 42 may be MOSFETs. The first switch 41 may be a high-side MOSFET, and the second switch 42 may be a low-side MOSFET. Since an input capacitance of a gate terminal of the MOSFET is high, the first and second drivers 43 and 44, each of which has a sufficient output, may be placed in the front end of the MOSFET.

Meanwhile, the control circuit 20 may further include a zero current detector 24.

In a situation in which a current of 0 A or a reverse current is generated in the second switch 42, which is a low-side MOSFET, the power management unit 180 should operate in a discontinuous current mode (DCM) for efficiency. To this end, when the reverse current in the second switch 42 is detected, the zero current detector 24 may block the PWM signal that is input to the second switch 42.

Meanwhile, the control circuit 20 may further include the soft start circuit 25.

When the power management unit 180 (i.e., a converter) is suddenly driven in an OFF state, a voltage may be instantaneously applied to an output capacitor or the like to generate a transient current, and the MOSFET may be malfunctioning. In order to prevent this, the soft start circuit 25 may slowly increase the output voltage or the like even in a situation in which the converter is suddenly driven.

FIG. 65 schematically illustrates a configuration of an active current compensation device 100A-2 according to an embodiment of the present disclosure. Hereinafter, descriptions of contents overlapping with contents described with reference to FIGS. 59 to 64 will be omitted.

Referring to FIG. 65, the active current compensation device 100A-2 may actively compensate for first currents I11, I12, and I13 input as a common-mode current with respect to each of first through third high-current paths 111, 112, and 113 connected to the first device 300.

To this end, the active current compensation device 100A-2 may include first through third high-current paths 111, 112, and 113, a sensing transformer 120A-2, an amplification unit 130A, a compensation transformer 140A, and a compensation capacitor unit 150A-2.

When it is described in comparison with the active current compensation devices 100A and 100A-1 according to the above-described embodiments, the active current compensation device 100A-2 according to the embodiment described with reference to FIG. 65 includes first through third high-current paths 111, 112, and 113, and thus has differences in the sensing transformer 120A-2 and the compensation capacitor unit 150A-2. Thus, the active current compensation device 100A-2 will now be described below focusing on differences described above.

The active current compensation device 100A-2 may include a first high-current path 111, a second high-current path 112, and a third high-current path 113 that are distinguished from each other. According to an embodiment, the first high-current path 111 may be an R-phase power line, the second high-current path 112 may be an S-phase power line, and the third high-current path 113 may be a T-phase power line. The first currents I11, I12, and I13 may be input as a common-mode current with respect to each of the first high-current path 111, the second high-current path 112, and the third high-current path 113.

A primary side 121A-2 of the sensing transformer 120A-2 may be disposed in each of the first to third high-current paths 111 to 113 to generate an induced current in a secondary side 122A-2. Magnetic flux densities generated by the sensing transformer 120A-2 due to the first currents I11, I12, and I13 on the first through third high-current paths 111, 112, and 113 may be reinforced with each other.

In the active current compensation device 100A-2 according to the embodiment described with reference to FIG. 65, the amplification unit 130A may correspond to the above-described amplification unit 130A.

The compensation capacitor unit 150A-2 may provide paths through which compensation currents IC1, IC2, and IC3 generated by the compensation transformer 140A flow to the first to third high-current paths 111 to 113, respectively.

The active current compensation device 100A-2 may further include a decoupling capacitor unit 170A-2 on an output side thereof (i.e., the second device 200 side). One ends of capacitors included in the decoupling capacitor unit 170A-2 may be connected to the first high-current path 111, the second high-current path 112, and the third high-current path 113, respectively. The opposite end of each of the capacitors may be connected to the first reference potential 601 of the current compensation device 100A-2.

The decoupling capacitor unit 170A-2 may prevent the performance of outputting the compensation current of the active current compensation device 100A-2 from being significantly changed according to a change in an impedance value of the second device 200. An impedance ZY of the decoupling capacitor unit 170A-2 may be designed to have a value less than a value specified in a first frequency band for which noise reduction is to be performed. As the decoupling capacitor unit 170A-2 is coupled, the current compensation device 100A-2 may be used as an independent module in any system (e.g., a three-phase three-wire system).

According to an embodiment, the decoupling capacitor unit 170A-2 may be omitted from the active current compensation device 100A-2.

The active current compensation device 100A-2 according to the embodiment described above may be used to compensate (or cancel) for the first currents I1 1, 112, and 113 traveling from a load of a three-phase three-wire power system to a power source.

Of course, according to the technical spirit of the present disclosure, the active current compensation device according to various embodiments may be modified to be also applicable to a three-phase four-wire system.

In various embodiments of the present disclosure, an active circuit unit 131A included in the amplification unit 130A and a power conversion unit 181 included in a power management unit 180 may be physically integrated into one IC chip 500. Even when a voltage VI in an arbitrary range is input from the power supply 400, the IC chip 500 may convert the voltage VI into a voltage VO optimized for driving the active circuit unit 131A thereinside through the power conversion unit 181, and drive the active circuit unit 131A. Accordingly, the IC chip 500 may have versatility as an independent component and may be commercialized. In addition, the active circuit unit 131A included in the amplification unit 130A may stably operate regardless of the characteristics of a peripheral system.

Hereinafter, active current compensation device including integrated circuit unit and non-integrated circuit unit, which is the third category of invention, will be described with reference to FIGS. 66 to 71.

Figure 66:
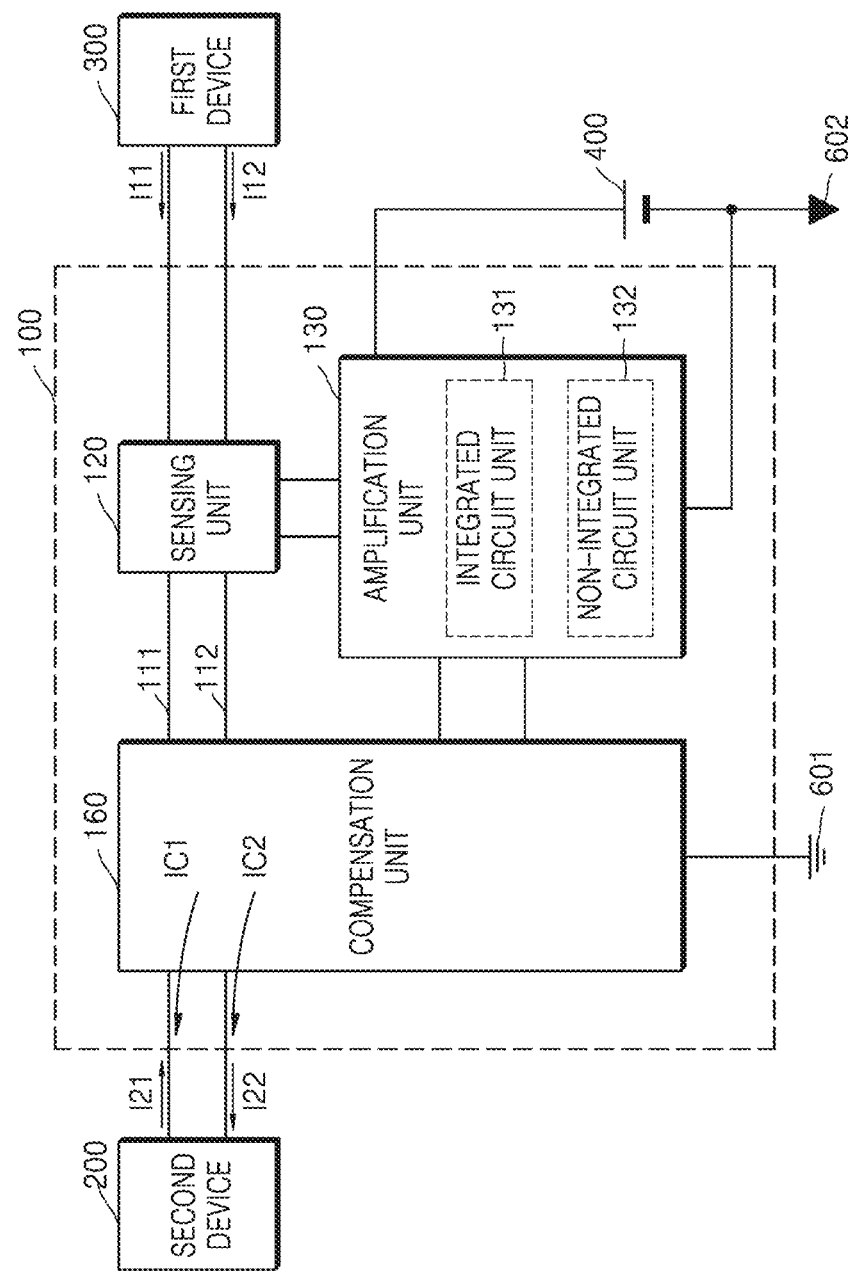
FIG. 66 schematically illustrates a configuration of a system including an active current compensation device according to an embodiment of the present disclosure.

FIG. 66 schematically illustrates a configuration of a system including an active current compensation device 100 according to an embodiment of the present disclosure. The active current compensation device 100 may actively compensate for first currents I11 and I12 (e.g., an EMI noise current) that are input as a common-mode current through two or more high-current paths 111 and 112 from a first device 300.

Referring to FIG. 66, the active current compensation device 100 may include a sensing unit 120, an amplification unit 130, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. The second device 200 may also be a device that supplies stored energy. However, the present disclosure is not limited thereto.

A power converter may be located on the first device 300 side. For example, the first currents I11 and I12 may be input to the current compensation device 100 due to the switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 69:
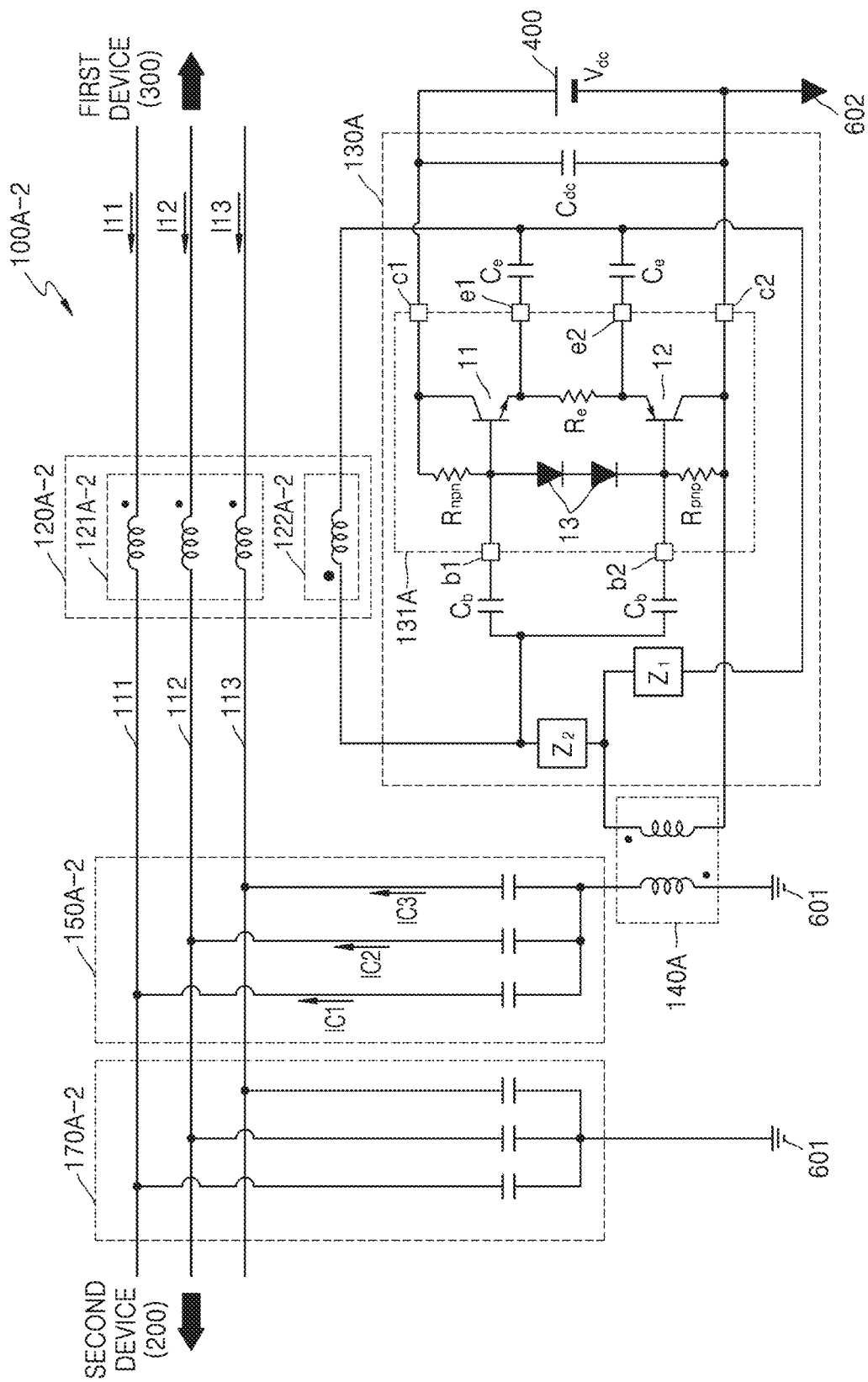
FIG. 69 schematically illustrates a configuration of an active current compensation device according to an embodiment of the present disclosure.
Figure 71:
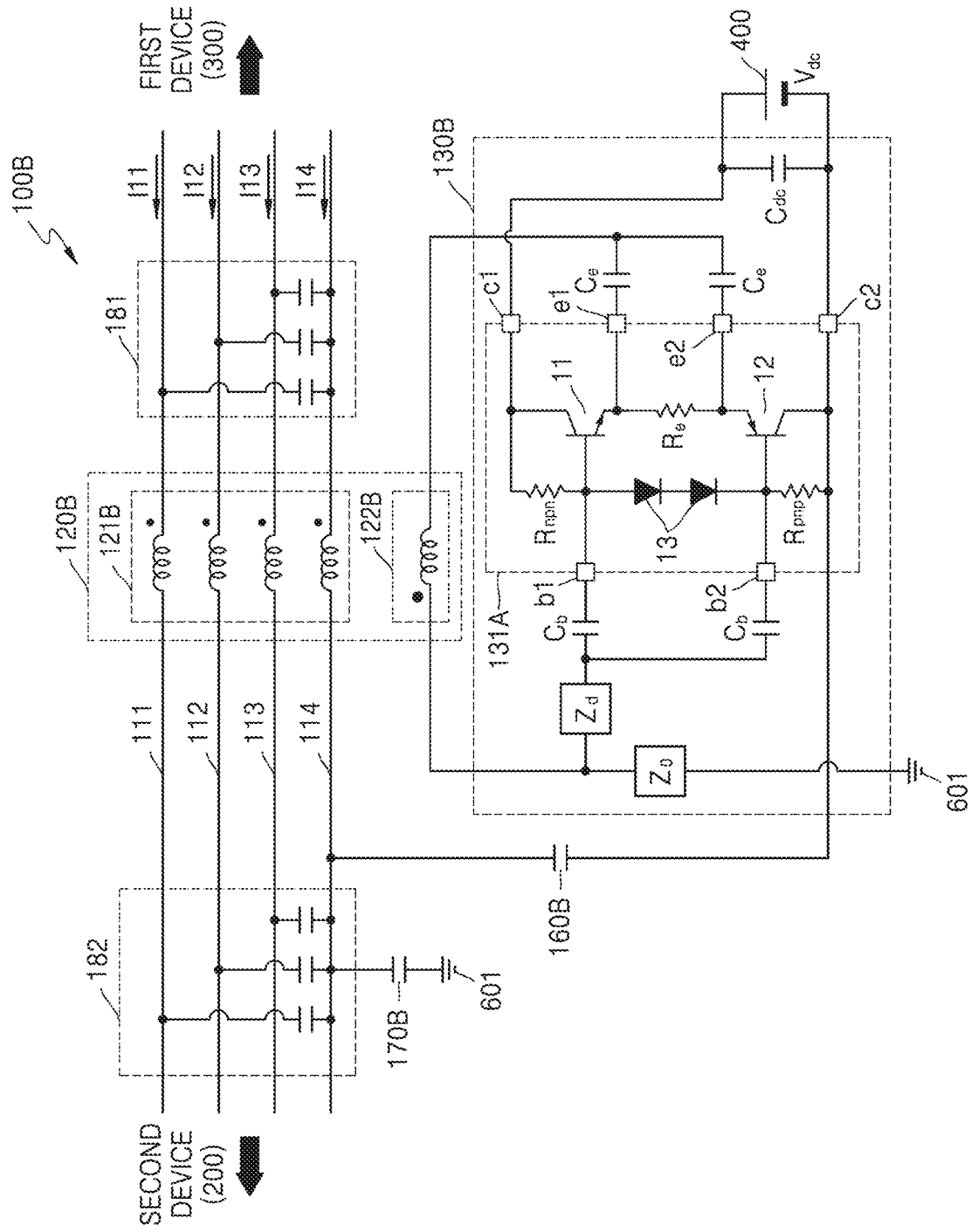
FIG. 71 schematically illustrates a configuration of an active current compensation device according to an embodiment of the present disclosure.

Meanwhile, the two or more high-current paths 111 and 112 may include two paths as shown in FIG. 66, or may include three paths or four paths as shown in FIGS. 69 and 71. The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portion of the high-current paths 111 and 112 may pass through the sensing unit 120, but a portion of the sensing unit 120, which generates an output signal according to the sensing, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112. However, the sensing unit 120 is not limited to the sensing transformer.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may mean that the magnitude and/or phase of an object to be amplified is adjusted. The amplification unit 130 may be implemented by various components, and may include active elements. In an embodiment, the amplification unit 130 may include BJTs. For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure.

According to an embodiment, a second reference potential 602 of the amplification unit 130 and a first reference potential 601 of the current compensation device 100 may be distinguished from each other. For example, when the amplification unit 130 is isolated from the high-current paths 111 and 112, the second reference potential 602 of the amplification unit 130 and the first reference potential 601 of the current compensation device 100 may be distinguished from each other.

However, the present disclosure is not limited thereto. For example, in a case in which an amplification unit 130B is not isolated from the high-current paths 111 and 112 as shown in FIG. 71, a reference potential of the amplification unit 130B and a reference potential of a current compensation device 100B may not be distinguished from each other.

The amplification unit 130 according to various embodiments of the present disclosure may include an integrated circuit unit 131 and a non-integrated circuit unit 132. The integrated circuit unit 131 may include essential components of the active current compensation device 100. The essential components may include, for example, active elements. Accordingly, the active elements included in the amplification unit 130 may be integrated in the integrated circuit unit 131 of the amplification unit 130. In the amplification unit 130, the non-integrated circuit unit 132 may not include active elements. The integrated circuit unit 131 may further include passive elements as well as the active elements.

The integrated circuit unit 131 according to an embodiment of the present disclosure may physically be one IC chip. The integrated circuit unit 131 according to an embodiment of the present disclosure is applicable to the active current compensation device 100 of various designs. The one-chip integrated circuit unit 131 according to an embodiment of the present disclosure has versatility as an independent module and is applicable to the current compensation device 100 of various designs.

The non-integrated circuit unit 132 according to an embodiment of the present disclosure may be modified according to the design of the active current compensation device 100.

The integrated circuit unit 131 may include terminals to be connected to the non-integrated circuit unit 132. The integrated circuit unit 131 and the non-integrated circuit unit 132 may be combined together to function as the amplification unit 130. The combination of the integrated circuit unit 131 and the non-integrated circuit unit 132 may perform a function of generating an amplified signal from the output signal output from the sensing unit 120. The amplified signal may be input to the compensation unit 160.

Examples of the detailed configuration of the amplification unit 130 including the integrated circuit unit 131 and the non-integrated circuit unit 132 will be described below with reference to FIGS. 68 to 71.

As described above, the active current compensation device 100 according to various embodiments is characterized in that the amplification unit is divided into the integrated circuit unit and the non-integrated circuit unit.

The amplification unit 130 may receive power from a power supply 400 that is distinguished from the first device 300 and/or the second device 200. The amplification unit 130 may receive the power from the power supply 400, and amplify the output signal output from the sensing unit 120 to generate an amplified current.

The power supply 400 may be a device that receives power from a power source that is independent of the first device 300 and the second device 200 and generates input power of the amplification unit 130. Alternatively, the power supply 400 may also be a device that receives power from any one of the first device 300 and the second device 200 and generates input power of the amplification unit 130.

The integrated circuit unit 131, which is an IC chip, may include a terminal to be connected to the power supply 400, a terminal to be connected to the second reference potential 602, and a terminal to be connected to the non-integrated circuit unit 132.

The compensation unit 160 may generate compensation currents IC1 and IC2 on the basis of the amplified output signal generated by the amplification unit 130. An output side of the compensation unit 160 may be connected to the high-current paths 111 and 112 to allow the compensation currents IC1 and IC2 to flow to the high-current paths 111 and 112.

According to an embodiment, the output side of the compensation unit 160 may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

However, the present disclosure is not limited thereto. According to an embodiment, as shown in FIG. 71, an output side of a compensation unit 160B may not be isolated from the amplification unit 130B. In this case, the amplification unit 130B may not be isolated from the high-current paths 111 and 112.

Referring to FIG. 66 again, in order to cancel the first currents I11 and I12, the compensation unit 160 may inject the compensation currents IC1 and IC2 to the high-current paths 111 and 112 through the two or more high-current paths 111 and 112, respectively. The compensation currents IC1 and IC2 may have the same magnitude and an opposite phase compared to the first currents I11 and I12.

Figure 67:
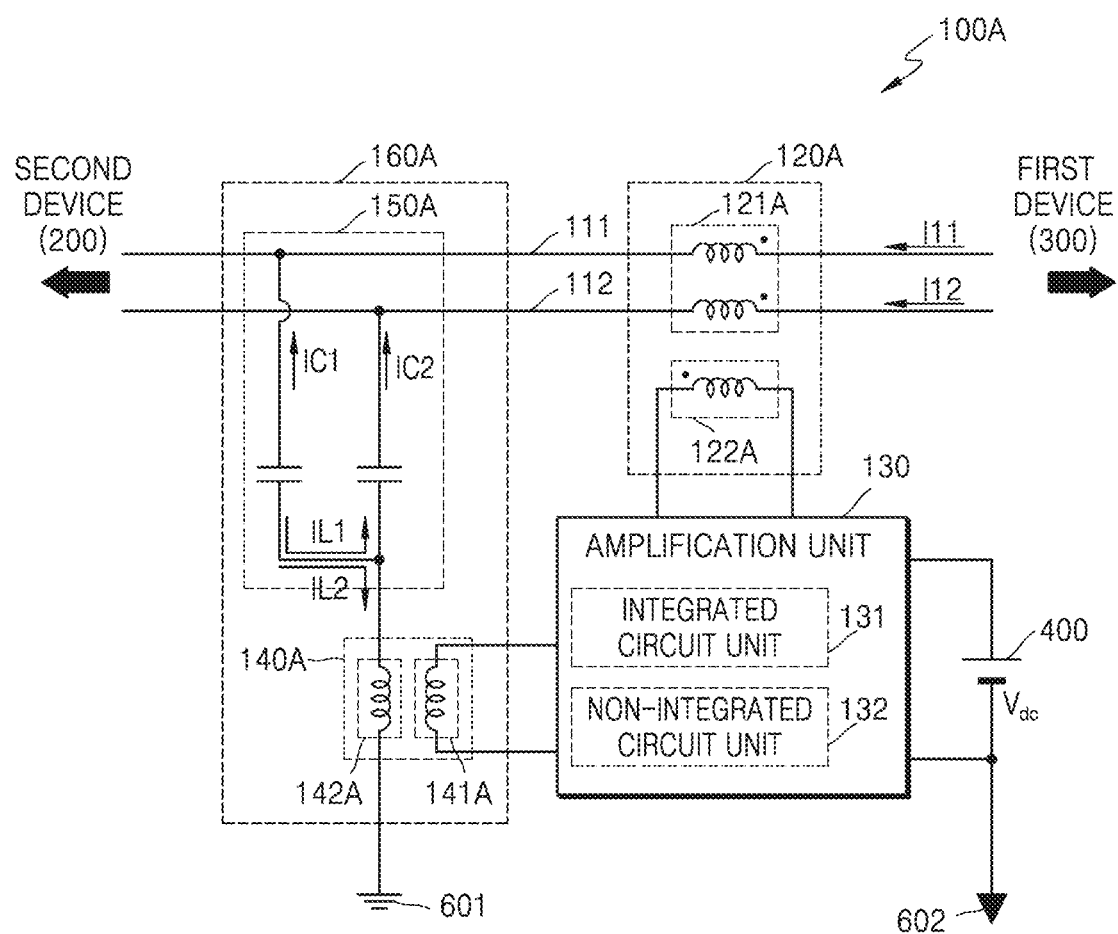
FIG. 67 illustrates a more specific example of the embodiment described with reference to FIG. 66, and schematically illustrates an active current compensation device according to an embodiment of the present disclosure.

FIG. 67 illustrates a more specific example of the embodiment described with reference to FIG. 66, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 67, the active current compensation device 100A may include a sensing transformer 120A, an amplification unit 130, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. For example, the primary side 121A and the secondary side 122A of the sensing transformer 120A may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and supply the induced current or an induced voltage to the amplification unit 130.

The amplification unit 130 may amplify the current or voltage that is sensed by the sensing transformer 120A and induced in the secondary side 122A. For example, the amplification unit 130 may amplify the magnitude of the induced current or voltage at a predetermined ratio and/or adjust the phase of the induced current or voltage.

According to various embodiments of the present disclosure, the amplification unit 130 may include an integrated circuit unit 131 configured as one IC chip, and a non-integrated circuit unit 132 that is a component other than one IC chip.

According to an embodiment, the amplification unit 130 may be connected to the second reference potential 602, and the second reference potential 602 may be distinguished from the first reference potential 601 of the current compensation device 100A (or the compensation unit 160A). The amplification unit 130 may be connected to the power supply 400.

The IC chip, which is the integrated circuit unit 131, may include a terminal to be connected to the power supply 400, a terminal to be connected to the second reference potential 602, and a terminal to be connected to the non-integrated circuit unit 132.

The compensation unit 160A may be an example of the compensation unit 160 described above. In an embodiment, the compensation unit 160A may include a compensation transformer 140A and a compensation capacitor unit 150A. The amplified current amplified by the above-described amplification unit 130 flows through a primary side 141A of the compensation transformer 140A.

The compensation transformer 140A according to an embodiment may be a component for isolating the amplification unit 130 including active elements from the high-current paths 111 and 112. That is, the compensation transformer 140A may be a component for generating compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, and the secondary side 122A of the sensing transformer 120A may be connected to the second reference potential 602, which is distinguished from the reference potential of the other components of the active current compensation device 100A. The first reference potential 601 of the current compensation device 100A according to an embodiment and the second reference potential 602 of the amplification unit 130 may be distinguished from each other.

As described above, in the current compensation device 100A according to an embodiment, the component generating the compensation current uses a reference potential (i.e., the second reference potential 602) different from that of the other components and uses the separate power supply 400, and thus may operate in a state of being isolated from the other components, thereby the improving reliability of the active current compensation device 100A. However, the active current compensation device including the integrated circuit unit 131 and the non-integrated circuit unit 132 according to the present disclosure is not limited to such an isolating structure. The active current compensation device 100B having a non-isolating structure according to an embodiment of the present disclosure will be described below with reference to FIG. 71.

In the compensation transformer 140A according to an embodiment, when a turns ratio of the primary side 141A and the secondary side 142A is 1:Ninj, and a self-inductance of the primary side 141A of the compensation transformer 140A is Linj, the secondary side 142A may have a self-inductance of Ninj2*Linj. In this case, the current induced in the secondary side 142A has a magnitude that is 1/Ninj times that of the current (i.e., the amplified current) flowing in the primary side 141A. The primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*Ninj.

As described above, the compensation capacitor unit 150A may provide a path through which the current generated by the compensation transformer 140A flows to each of the two high-current paths 111 and 112.

The compensation capacitor unit 150A may include two Y-capacitors (Y-caps) each having one end connected to the secondary side 142A of the compensation transformer 140A and the other end connected to the high-current paths 111 and 112. One ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow to the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A according to an embodiment may be implemented as an isolated structure by using the compensation transformer 140A and the sensing transformer 120A.

Figure 68:
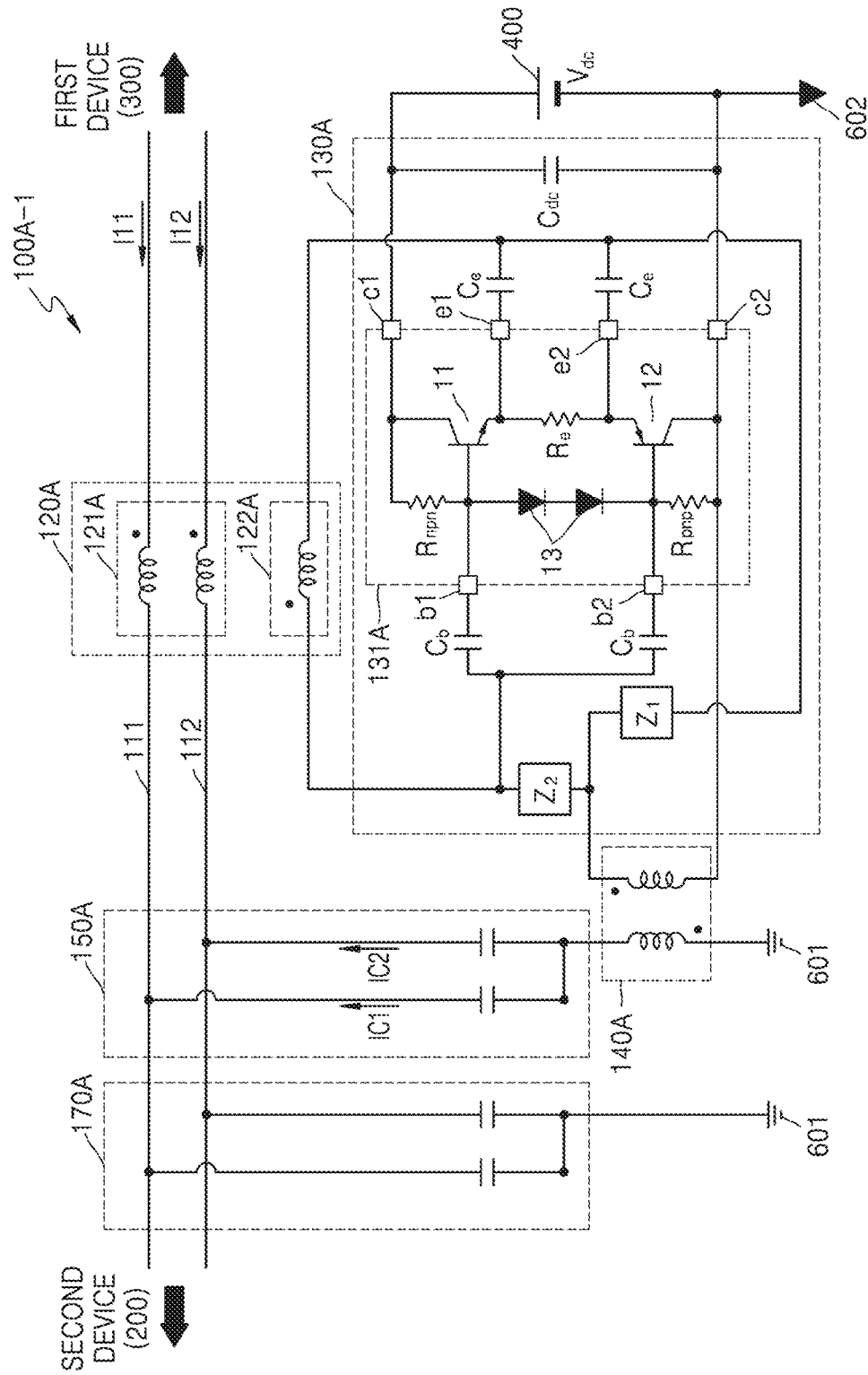
FIG. 68 illustrates a more specific example of the embodiment described with reference to FIG. 67, and schematically illustrates an active current compensation device according to an embodiment of the present disclosure.

FIG. 68 illustrates a more specific example of the embodiment described with reference to FIG. 67, and schematically illustrates an active current compensation device 100A-1 according to an embodiment of the present disclosure. The active current compensation device 100A-1 shown in FIG. 68 is an example of the active current compensation device 100A shown in FIG. 67. An amplification unit 130A included in the active current compensation device 100A-1 is an example of the amplification unit 130 of the active current compensation device 100A.

The active current compensation device 100A-1 according to an embodiment may include a sensing transformer 120A, the amplification unit 130A, a compensation transformer 140A, and a compensation capacitor unit 150A. In an embodiment, the active current compensation device 100A-1 may further include a decoupling capacitor unit 170A on an output side thereof (i.e., the second device 200 side). In other embodiments, the decoupling capacitor unit 170A may be omitted. Descriptions of the sensing transformer 120A, the compensation transformer 140A, and the compensation capacitor unit 150A are redundant and thus omitted.

The amplification unit 130A of the active current compensation device 100A-1 according to an embodiment may include an integrated circuit unit 131A and a non-integrated circuit unit. In the amplification unit 130A, the other components other than the integrated circuit unit 131A may be included in the non-integrated circuit unit. For example, in the amplification unit 130A, components included in the non-integrated circuit unit may be commercial discrete elements, but the present disclosure is not limited thereto.

In an embodiment, the integrated circuit unit 131A may include a first transistor 11, a second transistor 12, and/or one or more resistors. In an embodiment, the first transistor 11 may be an npn BJT, and the second transistor 12 may be a pnp BJT. For example, the amplification unit 130A may have a push-pull amplifier structure including an npn BJT and a pnp BJT.

For example, the one or more resistors included in the integrated circuit unit 131A may include resistors Rnpn, Rpnp, and/or Re. For example, the resistor Rnpn may connect a collector terminal and a base terminal of the first transistor 11, the resistor Rpnp may connect a collector terminal and a base terminal of the second transistor 12, and the resistor Re may connect an emitter terminal of the first transistor 11 and an emitter terminal of the second transistor 12.

In an embodiment, the integrated circuit unit 131A of the amplification unit 130A may further include a diode 13 in addition to the first transistor 11, the second transistor 12, and the one or more resistors. For example, one end of the diode 13 may be connected to the base terminal of the first transistor 11, and the other end of the diode 13 may be connected to the base terminal of the second transistor 12. In an embodiment, the diode 13 may be replaced by a resistor.

In an embodiment, the resistors Rnpn, Rpnp, Re, and/or the biasing diode 13 included in the integrated circuit unit 131A may be used for DC biasing of the BJTs. The above-described components are general-purpose components in various active current compensation devices, and may be integrated into the one-chip integrated circuit unit 131A.

In the amplification unit 130A, the components other than the integrated circuit unit 131A may be included in the non-integrated circuit unit. The integrated circuit unit 131A may be physically implemented as one IC chip. The non-integrated circuit unit may include commercial discrete elements. The non-integrated circuit unit may be implemented differently depending on an embodiment.

In the embodiment described with reference to FIG. 68, the non-integrated circuit unit may include, for example, capacitors Cb, Ce, and Cdc, and impedances Z1 and Z2.

In an embodiment, an induced current induced in a secondary side 122A by the sensing transformer 120A may be differentially input to the amplification unit 130A. Only AC signals may be selectively coupled through the capacitors Cb and Ce included in the amplification unit 130A. The capacitors Cb and Ce may respectively block DC voltages at the base node and the emitter node of each of the first and second transistors 11 and 12.

In an embodiment, the power supply 400 supplies a DC voltage Vdc, which is based on the second reference potential 602, to drive the amplification unit 130A. The capacitor Cdc is a DC decoupling capacitor for the voltage Vdc, and may be connected in parallel between the power supply 400 and the second reference potential 602. Only AC signals may be coupled between both collectors of the first transistor 11 (e.g., an npn BJT) and the second transistor 12 (e.g., a pnp BJT) through the capacitor Cdc.

A current gain of the amplification unit 130A may be controlled by a ratio of the impedances Z1 and Z2. Accordingly, Z1 and Z2 may be implemented outside the one-chip integrated circuit unit 131A. Z1 and Z2 may be flexibly designed depending on a turns ratio of each of the sensing transformer 120A and the compensation transformer 140A and a required target current gain.

In the integrated circuit unit 131A, an operating point of each of the first and second transistors 11 and 12 (e.g., BJT) may be controlled through the resistors Rnpn, Rpnp, and Re. The resistors Rnpn, Rpnp, and Re may be designed according to the operating point of the BJT. The resistor Rnpn may connect the collector terminal of the first transistor 11 (e.g., an npn BJT), which is a terminal of the power supply 400, and the base terminal of the first transistor 11 (e.g., an npn BJT). The resistor Rpnp may connect the collector terminal of the second transistor 12 (e.g., a pnp BJT), which is a terminal of the second reference potential 602, and the base terminal of the second transistor 12 (e.g., a pnp BJT). The resistor Re may connect the emitter terminal of the first transistor 11 and the emitter terminal of the second transistor 12.

The secondary side 122A of the sensing transformer 120A according to an embodiment may be connected between a base side and an emitter side of each of the first and second transistors 11 and 12. A primary side 141A of the compensation transformer 140A according to an embodiment may be connected between a collector side and the base side of each of the first and second transistors 11 and 12. Here, the connection includes an indirectly connected case. The amplification unit 130A according to an embodiment may have a regression structure in which an output current is injected back into a base of each of the first and second transistors 11 and 12. Due to the regression structure, the amplification unit 130A may stably obtain a constant current gain for operating the active current compensation device 100A-1.

When an input voltage of the amplification unit 130A has a positive swing of greater than zero due to a noise signal, the first transistor 11 (e.g., an npn BJT) may operate. In this case, an operating current may flow through a first path passing through the first transistor 11. When the input voltage of the amplification unit 130A has a negative swing of less than zero due to a noise signal, the second transistor 12 (e.g., a pnp BJT) may operate. In this case, the operating current may flow through a second path passing through the second transistor 12.

The integrated circuit unit 131A may be implemented as a one-chip IC. According to an embodiment, the first transistor 11, the second transistor 12, the diode 13, Rnpn, Rpnp, and Re of the integrated circuit unit 131A may be integrated into the one-chip IC.

The one-chip IC may include a terminal b1 corresponding to the base of the first transistor 11, a terminal c1 corresponding to the collector of the first transistor 11, a terminal e1 corresponding to an emitter of the first transistor 11, a terminal b2 corresponding to the base of the second transistor 12, a terminal c2 corresponding to the collector of the second transistor 12, and a terminal e2 corresponding to an emitter of the second transistor 12. However, the present disclosure is not limited thereto, and the one-chip IC of the integrated circuit unit 131A may further include other terminals in addition to the terminals b1, b2, c1, c2, e1, and e2. In various embodiments, at least one of the terminals b1, b2, c1, c2, e1, and e2 of the integrated circuit unit 131A may be connected to the non-integrated circuit unit. The integrated circuit unit 131A and the non-integrated circuit unit may be combined together to function as the amplification unit 130A according to an embodiment.

According to the embodiment described with reference to FIG. 68, the capacitors Cb of the non-integrated circuit unit may be connected to the base terminal b1 of the first transistor 11 and the base terminal b2 of the second transistor 12, respectively. The capacitors Ce of the non-integrated circuit unit may be connected to the emitter terminal e1 of the first transistor 11 and the emitter terminal e2 of the second transistor 12, respectively. The external power supply 400 may be connected between the collector terminal c1 of the first transistor 11 and the collector terminal c2 of the second transistor 12. The collector terminal c2 of the second transistor 12 may correspond to the second reference potential 602. The decoupling capacitor Cdc of the non-integrated circuit unit may be connected between the collector terminal c1 of the first transistor 11 and the collector terminal c2 of the second transistor 12.

A combination of the integrated circuit unit 131A and Cb, Ce, Cdc, Z1, and Z2 of the non-integrated circuit unit may function as the amplification unit 130A according to the embodiment described with reference to FIG. 68.

According to various embodiments of the present disclosure, essential components of the active current compensation device 100A or 100A-1 may be integrated in the one-chip integrated circuit unit 131A. Accordingly, the size of the amplification unit 130 or 130A may be minimized by using the one-chip integrated circuit unit 131 or 131A as compared with a case of using discrete semiconductor devices.

An inductor, the capacitors (e.g., Cb, Ce, and Cdc), Z1, and Z2 of the non-integrated circuit unit are discrete components, and may be implemented around the one-chip integrated circuit unit 131A.

Capacitance of each of the capacitors Cb, Ce, and Cdc required for an AC signal to couple through each of the capacitors Cb, Ce, and Cdc may be several µF or more (e.g., 10 µF). Such a capacitance value is difficult to be implemented in the one-chip integrated circuit unit, and thus the capacitors Cb, Ce, and Cdc may be implemented outside the integrated circuit unit, that is, in the non-integrated circuit unit.

The impedances Z1 and Z2 may be implemented outside the integrated circuit unit, i.e., in the non-integrated circuit unit, to achieve design flexibility for various power systems or various first devices 300. Z1 and Z2 may be flexibly designed depending on a turns ratio of each of the sensing transformer 120A and the compensation transformer 140A and a required target current gain. It is possible to design various current compensation devices that allow the same integrated circuit unit 131A to be applied to various power systems by adjusting the impedances Z1 and Z2. In particular, the size and impedance characteristics of the sensing transformer 120A should vary depending on a maximum rated current of the first device 300. Thus, in order to make a ratio of an injected current to a sensed noise current uniform in a wide frequency range, a proper design of Z1 and Z2 is required. Z1 and Z2 may be designed so that the ratio of the injected current to the sensed noise current becomes 1 in a wide frequency range by adjusting the turns ratio of each of the sensing transformer 120A and the compensation transformer 140A and a ratio of Z1 and Z2. To this end, the impedances Z1 and Z2 may be implemented outside the integrated circuit unit 131A for design flexibility. In an embodiment, each of Z1 and Z2 may include a series connection of a resistor and a capacitor.

The integrated circuit unit 131A according to various embodiments of the present disclosure is designed in consideration of scalability, and thus may be used in various types of active current compensation devices. For example, the integrated circuit unit 131A may use the current compensation device 100A-1 shown in FIG. 68, a current compensation device 100A-2 shown in FIG. 69, and a current compensation device 100A-3 shown in FIG. 70, and the current compensation device 100B shown in FIG. 71. The same type of integrated circuit unit 131A may be used in various embodiments, and the non-integrated circuit unit may be designed differently depending on an embodiment.

In various embodiments of the present disclosure, since the amplification unit 130 is divided into the integrated circuit unit and the non-integrated circuit unit, various types of active current compensation devices may be mass-produced by mass-producing the integrated circuit unit. In addition, the size of the active current compensation device may be minimized.

As described above, the active current compensation devices 100, 100A, 100A-1, 100A-2, 100A-3, and 100B according to various embodiments are characterized in that the amplification unit is divided into the integrated circuit unit and the non-integrated circuit unit.

Meanwhile, the active current compensation device 100A-1 may further include the decoupling capacitor unit 170A on an output side thereof (i.e., the second device 200 side). One ends of capacitors included in the decoupling capacitor unit 170A may be connected to the first high-current path 111 and the second high-current path 112, respectively. The opposite end of each of the capacitors may be connected to the first reference potential 601 of the current compensation device 100A-1.

The decoupling capacitor unit 170A may prevent the performance of outputting the compensation current of the active current compensation device 100A-1 from being significantly changed according to a change in an impedance value of the second device 200. An impedance ZY of the decoupling capacitor unit 170A may be designed to have a value less than a value specified in a first frequency band for which noise reduction is to be performed. As the decoupling capacitor unit 170A is coupled, the current compensation device 100A-1 may be used as an independent module in any system.

According to an embodiment, the decoupling capacitor unit 170A may be omitted from the active current compensation device 100A-1.

FIG. 69 schematically illustrates a configuration of the active current compensation device 100A-2 according to an embodiment of the present disclosure. Hereinafter, descriptions of contents overlapping with contents described with reference to FIGS. 67 and 68 will be omitted.

Referring to FIG. 69, the active current compensation device 100A-2 may actively compensate for first currents I11, I12, and I13 input as a common-mode current with respect to each of first through third high-current paths 111, 112, and 113 connected to the first device 300.

To this end, the active current compensation device 100A-2 may include first through third high-current paths 111, 112, and 113, a sensing transformer 120A-2, an amplification unit 130A, a compensation transformer 140A, and a compensation capacitor unit 150A-2.

When it is described in comparison with the active current compensation devices 100A and 100A-1 according to the above-described embodiments, the active current compensation device 100A-2 according to the embodiment described with reference to FIG. 69 includes first through third high-current paths 111, 112, and 113, and thus has differences in the sensing transformer 120A-2 and the compensation capacitor unit 150A-2. Thus, the active current compensation device 100A-2 will now be described below focusing on differences described above.

The active current compensation device 100A-2 may include a first high-current path 111, a second high-current path 112, and a third high-current path 113 that are distinguished from each other. According to an embodiment, the first high-current path 111 may be an R-phase power line, the second high-current path 112 may be an S-phase power line, and the third high-current path 113 may be a T-phase power line. The first currents I11, I12, and I13 may be input as a common-mode current with respect to each of the first high-current path 111, the second high-current path 112, and the third high-current path 113.

A primary side 121A-2 of the sensing transformer 120A-2 may be disposed in each of the first to third high-current paths 111 to 113 to generate an induced current in a secondary side 122A-2. Magnetic flux densities generated by the sensing transformer 120A-2 due to the first currents I11, I12, and I13 on the first through third high-current paths 111, 112, and 113 may be reinforced with each other.

In the active current compensation device 100A-2 according to the embodiment described with reference to FIG. 69, the amplification unit 130A may correspond to the above-described amplification unit 130A.

The compensation capacitor unit 150A-2 may provide paths through which compensation currents IC1, IC2, and IC3 generated by the compensation transformer 140A flow to the first to third high-current paths 111 to 113, respectively.

The active current compensation device 100A-2 may further include a decoupling capacitor unit 170A-2 on an output side thereof (i.e., the second device 200 side). One ends of capacitors included in the decoupling capacitor unit 170A-2 may be connected to the first high-current path 111, the second high-current path 112, and the third high-current path 113, respectively. The opposite end of each of the capacitors may be connected to the first reference potential 601 of the current compensation device 100A-2.

The decoupling capacitor unit 170A-2 may prevent the performance of outputting the compensation current of the active current compensation device 100A-2 from being significantly changed according to a change in an impedance value of the second device 200. An impedance ZY of the decoupling capacitor unit 170A-2 may be designed to have a value less than a value specified in a first frequency band for which noise reduction is to be performed. As the decoupling capacitor unit 170A-2 is coupled, the current compensation device 100A-2 may be used as an independent module in any system (e.g., a three-phase three-wire system).

According to an embodiment, the decoupling capacitor unit 170A-2 may be omitted from the active current compensation device 100A-2.

The active current compensation device 100A-2 according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

The amplification unit 130A according to an embodiment of the present disclosure is applicable to the single-phase (two-wire) system shown in FIG. 67, the three-phase three-wire system shown in FIG. 68, and a three-phase four-wire system not shown in the drawing. Since a one-chip integrated circuit unit 131A is applicable to several systems, the integrated circuit unit 131A may have versatility in the active current compensation devices according to various embodiments.

As described above with reference to FIG. 68, the integrated circuit unit 131A may include a first transistor 11, a second transistor 12, and/or one or more resistors. In addition, according to an embodiment, the integrated circuit unit 131A may further include a diode 13. In an embodiment, the diode 13 may be replaced by a resistor.

An IC chip having the integrated circuit unit 131A embedded therein may include a base terminal b1 of the first transistor 11, a collector terminal c1 of the first transistor 11, an emitter terminal e1 of the first transistor 11, a base terminal b2 of the second transistor 12, a collector terminal c2 of the second transistor 12, and an emitter terminal e2 of the second transistor 12. However, the present disclosure is not limited thereto, and the one-chip IC of the integrated circuit unit 131A may further include other terminals in addition to the terminals b1, b2, c1, c2, e1, and e2.

The integrated circuit unit 131A may be combined with a non-integrated circuit unit including discrete components such as an inductor, capacitors (e.g., Cb, Ce, and Cdc), Z1 and Z2 to configure the current compensation device according to various embodiments. For example, the discrete components of the non-integrated circuit unit may be commonly used commercial elements. However, the present disclosure is not limited thereto.

Discrete components such as the inductor, the capacitors (e.g., Cb, Ce, and Cdc), Z1 and Z2 are implemented around the IC chip in which the integrated circuit unit 131A is embedded.

Capacitance of each of the capacitors Cb, Ce, and Cdc required for a low-frequency AC signal to couple through each of the capacitors Cb, Ce, and Cdc may be several μF or more. Such a capacitance value is difficult to be implemented in the IC chip in which the integrated circuit unit 131A is embedded, and thus the capacitors Cb, Ce, and Cdc may be implemented outside the integrated circuit unit, that is, in the non-integrated circuit unit.

The impedances Z1 and Z2 may be implemented outside the integrated circuit unit, i.e., in the non-integrated circuit unit, to achieve design flexibility for various first devices 300. It is possible to design various current compensation devices that allow the same integrated circuit unit 131A to be applied to various power systems by adjusting the impedances Z1 and Z2. In particular, the size and impedance characteristics of the sensing transformer 120A should vary depending on a maximum rated current of the first device 300. Thus, in order to make a ratio of an injected current to a sensed noise current uniform in a wide frequency range, a proper design of Z1 and Z2 is required. Accordingly, Z1 and Z2 may be implemented outside the integrated circuit unit 131A, that is, in the non-integrated circuit unit for design flexibility. In an embodiment, Z1 may be a series connection of a resistor R1 and a capacitor C1, and Z2 may be a series connection of a resistor R2 and a capacitor C2. Since C1 and C2 are additionally implemented in series next to R1 and R2 respectively, the ratio of the injected current to the sensed noise current in a low-frequency range may exhibit better performance.

Figure 70:
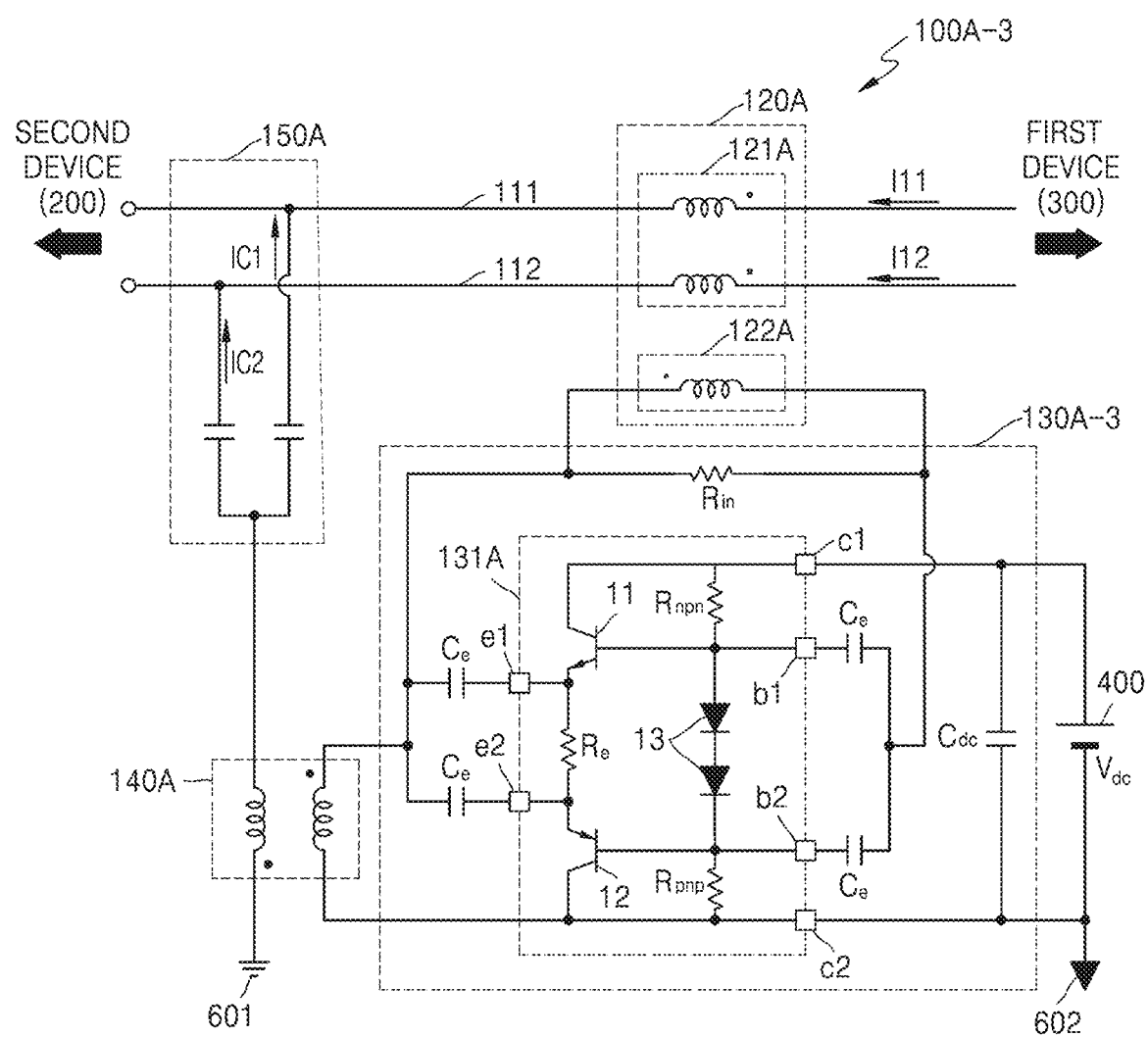
FIG. 70 schematically illustrates a configuration of an active current compensation device according to an embodiment of the present disclosure.

FIG. 70 schematically illustrates a configuration of the active current compensation device 100A-3 according to an embodiment of the present disclosure. Hereinafter, descriptions of contents overlapping with contents described with reference to FIGS. 67 and 68 will be omitted.

Referring to FIG. 70, the active current compensation device 100A-3 may actively compensate for first currents I11 and I12 input as a common-mode current with respect to each of high-current paths 111 and 112 connected to the first device 300.

To this end, the active current compensation device 100A-3 may include two high-current paths 111 and 112, a sensing transformer 120A, an amplification unit 130A-3, a compensation transformer 140A, and a compensation capacitor unit 150A.

The active current compensation device 100A-3 may be an example of the active current compensation device 100A illustrated in FIG. 67. The amplification unit 130A-3 may be an example of the amplification unit 130 illustrated in FIG. 67.

The amplification unit 130A-3 of the active current compensation device 100A-3 according to an embodiment may include an integrated circuit unit 131A and a non-integrated circuit unit. From among components of the amplification unit 130A-3, other components than the integrated circuit unit 131A may be included in the non-integrated circuit unit.

The integrated circuit unit 131A may correspond to the above-described integrated circuit unit 131A. That is, the above-described integrated circuit unit 131A is also applicable to the active current compensation device 100A-3 according to the embodiment described with reference to FIG. 70. Accordingly, since a description of the integrated circuit unit 131A is redundant, the integrated circuit unit 131A will be briefly described.

As described above, the integrated circuit unit 131A may include a first transistor 11, a second transistor 12, and/or one or more resistors. In an embodiment, the first transistor 11 may be an npn BJT, and the second transistor 12 may be a pnp BJT. For example, the amplification unit 130A-3 may have a push-pull amplifier structure including an npn BJT and a pnp BJT. The integrated circuit unit 131A may further include a diode 13 in addition to the first transistor 11, the second transistor 12, and the one or more resistors. For example, one end of the diode 13 may be connected to a base terminal of the first transistor 11, and the other end of the diode 13 may be connected to a base terminal of the second transistor 12. In an optional embodiment, the diode 13 may be replaced by a resistor.

An induced current induced in a secondary side 122A by the sensing transformer 120A may be differentially input to the amplification unit 130A-3. A resistor Rin may be connected in parallel to the secondary side 122A at an input end of the amplification unit 130A-3. An input impedance of the amplification unit 130A-3 may be adjusted through the resistor Rin. Only AC signals may be selectively coupled through the capacitors Cb and Ce.

The power supply 400 supplies a DC low voltage Vdc, which is based on the second reference potential 602, to drive the amplification unit 130A-3. Cdc is a DC decoupling capacitor and may be connected in parallel to the power supply 400. Only AC signals may be coupled between both collectors of the first transistor 11 (e.g., an npn BJT) and the second transistor 12 (e.g., a pnp BJT) through Cdc.

The above-described resistor Rin and capacitors Cb, Ce, and Cdc may be included in the non-integrated circuit unit.

Meanwhile, in the sensing transformer 120A, when a turns ratio of a primary side 121A and the secondary side 122A is 1:Nsen, current induced in the secondary side 122A has a magnitude of 1/Nsen times that of the first currents I11 and I12. In addition, in the compensation transformer 140A, when a turns ratio of a primary side 141A and a secondary side 142A is 1:Ninj, current (e.g., amplified current) induced in the secondary side 142A has a magnitude of 1/Ninj times that of current flowing in the primary side 141A. Accordingly, in order to generate compensation currents IC1 and IC2, which have the same magnitude and an opposite phase compared to the first currents I11 and I12 to cancel the first currents I11 and I12, a current gain of the amplification unit 130A-3 may be designed to be Nsen*Ninj.

Meanwhile, a current flowing through a collector and an emitter of a BJT varies according to a voltage applied between a base and the emitter of the BJT. When an input voltage of the amplification unit 130A-3 has a positive swing of greater than zero due to noise, the first transistor 11 (e.g., an npn BJT) may operate. When the input voltage of the amplification unit 130A-3 has a negative swing of less than zero due to a noise signal, the second transistor 12 (e.g., a pnp BJT) may operate.

The active current compensation device 100A-3 according to the embodiment described above may be used to compensate (or cancel) for the first currents I11 and I12 traveling from a load of a single-phase (two-wire) power system to a power source. However, the present disclosure is not limited thereto.

FIG. 71 schematically illustrates a configuration of the active current compensation device 100B according to an embodiment of the present disclosure.

Referring to FIG. 71, the active current compensation device 100B may actively compensate for first currents I11, I12, I13, and I14 input as a common-mode current with respect to each of first through fourth high-current paths 111, 112, 113, and 114 connected to the first device 300.

The active current compensation device 100B according to an embodiment may include first through fourth high-current paths 111, 112, 113, and 114, a noise coupling capacitor unit 181, a sensing transformer 120B, the amplification unit 130B, and the compensation unit 160B, a compensation distribution capacitor unit 182, and a decoupling capacitor 170B.

Unlike the current compensation devices 100A, 100A-1, 100A-2, and 100A-3 according to the above-described embodiments, the active current compensation device 100B may not be isolated from the first through fourth high-current paths 111, 112, 113, and 114. However, the same integrated circuit unit 131A as in the above-described embodiments may also be used in the active current compensation device 100B.

The active current compensation device 100B according to an embodiment may include a first high-current path 111, a second high-current path 112, a third high-current path 113, and a fourth high-current path 114 that are distinguished from each other. According to an embodiment, the first high-current path 111 may be an R-phase power line, the second high-current path 112 may be an S-phase power line, the third high-current path 113 may be a T-phase power line, and the fourth high-current path 114 may be an N-phase power line. The first currents I11, I12, I13, and I14 may be input as a common-mode current with respect to each of the first high-current path 111, the second high-current path 112, the third high-current path 113, and the fourth high-current path 114.

In an embodiment, the active current compensation device 100B may include the noise-coupling capacitor unit 181 on an input side thereof (i.e., the first device 300 side). The noise-coupling capacitor unit 181 may include X-capacitors (X-cap) for coupling noise between phases.

A primary side 121B of the sensing transformer 120B is disposed on each of the first high-current path 111, the second high-current path 112, the third high-current path 113, and the fourth high-current path 114 to generate an induced current in a secondary side 122B. Magnetic flux densities generated by the sensing transformer 120B due to the first currents I11, I12, I13, and I14 on the first through fourth high-current paths 111, 112, 113, and 114 may be reinforced with each other.

The amplification unit 130B may be divided into an integrated circuit unit 131A and a non-integrated circuit unit. In the amplification unit 130B, the other components other than the integrated circuit unit 131A may be included in the non-integrated circuit unit. For example, the components included in the non-integrated circuit unit may be commercial discrete elements, but the present disclosure is not limited thereto.

The integrated circuit unit 131A may correspond to the above-described integrated circuit unit 131A. That is, the above-described integrated circuit unit 131A is also applicable to the active current compensation device 100B according to the embodiment described with reference to FIG. 71. Accordingly, since a description of the integrated circuit unit 131A is redundant, the description thereof will be omitted.

In the amplification unit 130B, the non-integrated circuit unit may be implemented differently from the above-described embodiments. In this embodiment, the non-integrated circuit unit may include impedances Z0 and Zd, and capacitors Cb, Ce, and Cdc.

The impedances Z0 and Zd may be connected to a base side of each of first and second transistors 11 and 12. Here, the connection includes an indirect connection. The impedance Zd may be provided for high-frequency stabilization. For example, impedance Zd may be a resistor or a ferrite bead. However, the present disclosure is not limited thereto. The impedance Z0 may be provided for low-frequency stabilization. In addition, impedance Z0 may block DC signals. For example, impedance Z0 may be a series connection of a resistor and a capacitor. However, the present disclosure is not limited thereto.

Meanwhile, the amplification unit of the current compensation device 100B is not limited to the amplification unit 130B. The amplification unit of the current compensation device 100B may be implemented by one of the amplification units including the above-described amplification unit 130A, amplification unit 130A-1, amplification unit 130A-2, and amplification unit 130A-3. However, the present disclosure is not limited thereto.

The compensation unit 160B may inject a compensation current into one high-current path (e.g., the fourth high-current path 114). The compensation distribution capacitor unit 182 may be provided on an output side of the active current compensation device 100B (i.e., the second device 200 side). The compensation distribution capacitor unit 182 may include X-capacitors.

The active current compensation device 100B may include the decoupling capacitor 170B on the output side thereof (i.e., the second device 200 side). The decoupling capacitor 170B may be a Y-capacitor for impedance decoupling at an AC power terminal.

The active current compensation device 100B according to the embodiment described above may be used to compensate (or cancel) for the first currents I11, I12, I13, and I14 traveling from a load of a three-phase four-wire power system to a power source.

The active current compensation devices 100, 100A, 100A-1, 100A-2, 100A-3, and 100B according to various embodiments have little increase in size and heat generation in high-power systems as compared with passive EMI filters.

The active current compensation devices according to various embodiments include the one-chip integrated circuit unit 131 or 131A, so that the size thereof is minimized as compared with a case in which discrete semiconductor devices are included. The integrated circuit unit 131A is commonly and universally applicable to the active current compensation devices including the active current compensation devices 100, 100A, 100A-1, 100A-2, 100A-3, and 100B according to various embodiments.

The integrated circuit unit 131A and the active current compensation device including the same according to various embodiments may be used in various power electronic products regardless of a power rating. The integrated circuit unit 131A and the active current compensation device including the same according to various embodiments are expandable to a high power/high noise system.

Due to the one-chip integrated circuit unit 131A, the function of the active current compensation device may be expanded without having additional components.

The integrated circuit unit 131A according to various embodiments may have sufficient durability against an excessive voltage of the high-current path in which the active current compensation device is installed.

Hereinafter, Active current compensation device including one-chip integrated circuit, which is the fourth category of invention, will be described with reference to FIGS. 72 to 77.

Figure 72:
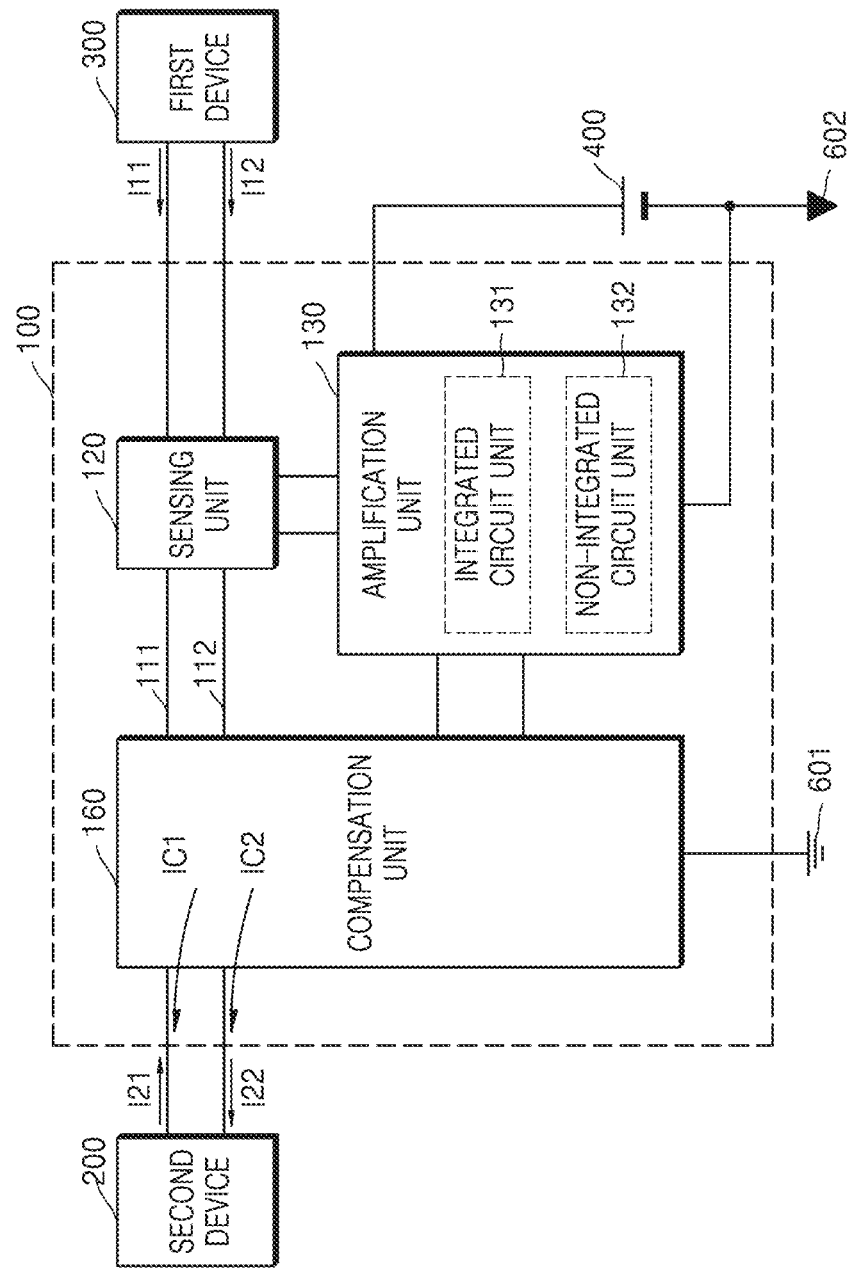
FIG. 72 schematically illustrates a configuration of a system including an active current compensation device according to an embodiment of the present disclosure.

FIG. 72 schematically illustrates a configuration of a system including an active current compensation device 100 according to an embodiment of the present disclosure. The active current compensation device 100 may actively compensate for first currents I11 and I12 (e.g., an EMI noise current) that are input as a common-mode current through two or more high-current paths 111 and 112 from a first device 300.

Referring to FIG. 72, the active current compensation device 100 may include a sensing unit 120, an amplification unit 130, and a compensation unit 160.

In the present specification, the first device 300 may be any of various types of power systems using power supplied by a second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, the present disclosure is not limited thereto.

In the present specification, the second device 200 may be any of various types of systems for supplying power to the first device 300 in the form of current and/or voltage. The second device 200 may be a device that supplies stored energy. However, the present disclosure is not limited thereto.

A power converter may be located on the first device 300 side. For example, the first currents I11 and I12 may be input to the current compensation device 100 due to a switching operation of the power converter. That is, the first device 300 side may correspond to a noise source and the second device 200 side may correspond to a noise receiver.

The two or more high-current paths 111 and 112 may be paths for transmitting the power supplied from the second device 200, that is, second currents I21 and I22, to the first device 300, for example, may be power lines. For example, the two or more high-current paths 111 and 112 may be a live line and a neutral line. At least some portions of the high-current paths 111 and 112 may pass through the current compensation device 100. The second currents I21 and I22 may be an alternating current having a frequency of a second frequency band. The second frequency band may be, for example, a band having a range of 50 Hz to 60 Hz.

Further, the two or more high-current paths 111 and 112 may also be paths through which noise generated by the first device 300, that is, the first currents I11 and I12, is transmitted to the second device 200. The first currents I11 and I12 may be input as a common-mode current with respect to each of the two or more high-current paths 111 and 112. The first currents I11 and I12 may be currents that are unintentionally generated in the first device 300 due to various causes. For example, the first currents I11 and I12 may be noise currents generated by virtual capacitance between the first device 300 and the surrounding environment. Alternatively, the first currents I11 and I12 may be noise currents generated due to a switching operation of the power converter of the first device 300. The first currents I11 and I12 may be currents having a frequency of a first frequency band. The first frequency band may be a frequency band higher than the second frequency band described above. The first frequency band may be, for example, a band having a range of 150 KHz to 30 MHz.

Figure 77:
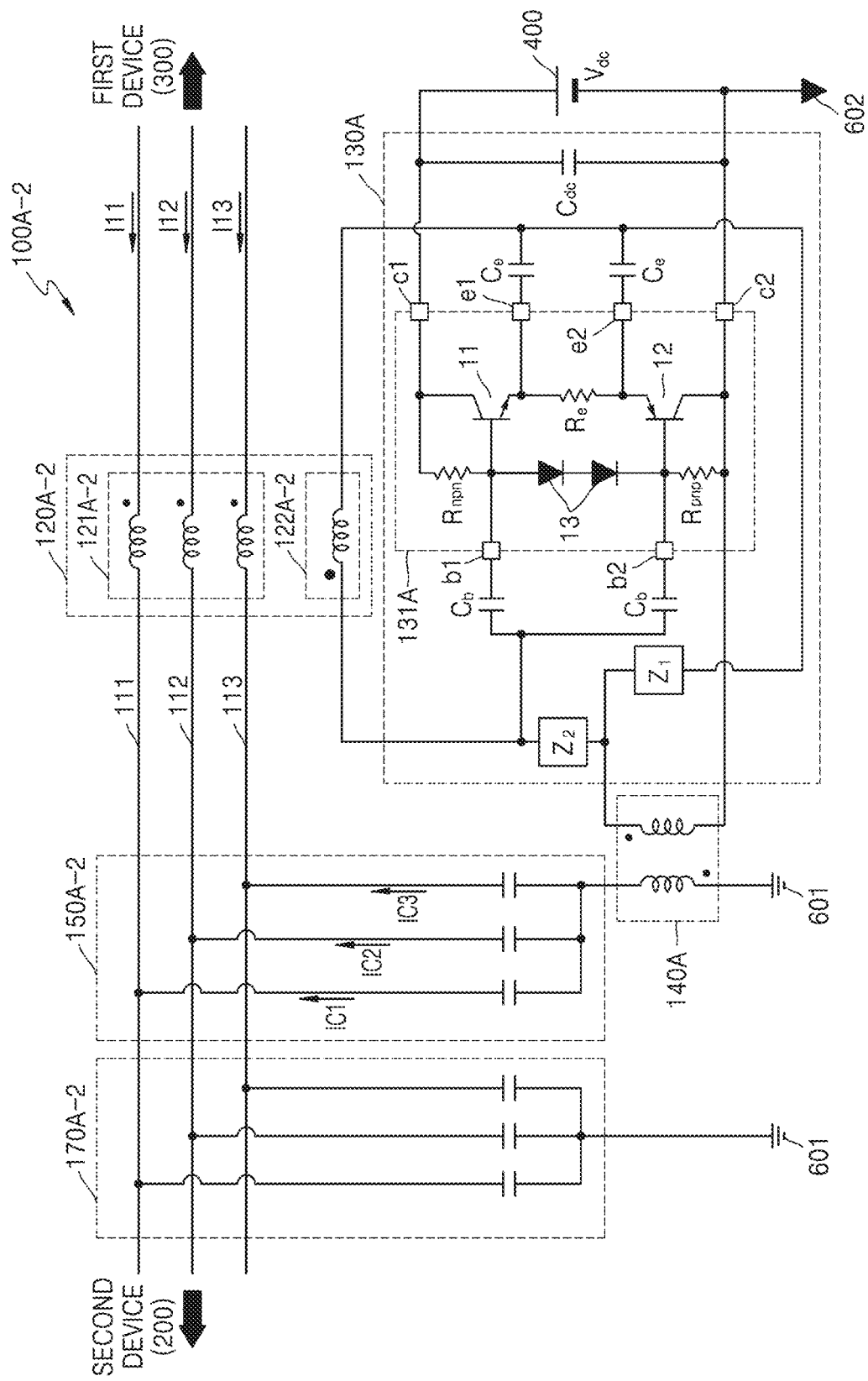
FIG. 77 schematically illustrates a configuration of an active current compensation device according to an embodiment of the present disclosure.

Meanwhile, the two or more high-current paths 111 and 112 may include two paths as shown in FIG. 72, or may include three paths as shown in FIG. 77. In addition, the two or more high-current paths 111 and 112 may include four paths. The number of the high-current paths 111 and 112 may vary depending on the type and/or form of power used by the first device 300 and/or the second device 200.

The sensing unit 120 may sense the first currents I11 and I12 on the two or more high-current paths 111 and 112 and generate an output signal corresponding to the first currents I11 and I12. That is, the sensing unit 120 may refer to a component that senses the first currents I11 and I12 on the high-current paths 111 and 112. In order for the sensing unit 120 to sense the first currents I11 and I12, at least some portion of the high-current paths 111 and 112 may pass through the sensing unit 120, but a portion of the sensing unit 120, which generates an output signal according to the sensing, may be isolated from the high-current paths 111 and 112. For example, the sensing unit 120 may be implemented as a sensing transformer. The sensing transformer may sense the first currents I11 and I12 on the high-current paths 111 and 112 in a state of being isolated from the high-current paths 111 and 112. However, the sensing unit 120 is not limited to the sensing transformer.

According to an embodiment, the sensing unit 120 may be differentially connected to input terminals of the amplification unit 130.

The amplification unit 130 may be electrically connected to the sensing unit 120, and may amplify the output signal output from the sensing unit 120 to generate an amplified output signal. The term "amplification" by the amplification unit 130, as used herein, may indicate the adjustment of the magnitude and/or phase of an object to be amplified. The amplification unit 130 may be implemented by various components, and may include active elements. In an embodiment, the amplification unit 130 may include BJTs. For example, the amplification unit 130 may include a plurality of passive elements, such as resistors and capacitors, in addition to the BJTs. However, the present disclosure is not limited thereto, and the component for the "amplification" described in the present disclosure may be used without being limited to the amplification unit 130 of the present disclosure.

According to an embodiment, a second reference potential 602 of the amplification unit 130 and a first reference potential 601 of the current compensation device 100 may be distinguished from each other. For example, when the amplification unit 130 is isolated from the high-current paths 111 and 112, the second reference potential 602 of the amplification unit 130 and the first reference potential 601 of the current compensation device 100 may be distinguished from each other.

However, the present disclosure is not limited thereto. For example, when the amplification unit 130 is not isolated from the high-current paths 111 and 112, the reference potential of the amplification unit and the reference potential of the current compensation device may not be distinguished from each other.

The amplification unit 130 according to various embodiments of the present disclosure may include a one-chip integrated circuit (IC) 131 and a non-integrated circuit unit 132. The one-chip IC 131 may include essential components of the active current compensation device 100. The essential components may include active elements. That is, the active elements included in the amplification unit 130 may be integrated into the one-chip IC 131. In the amplification unit 130, the non-integrated circuit unit 132 may not include active elements. The IC 131 may further include passive elements as well as the active elements.

The IC 131 according to an embodiment of the present disclosure may physically be one IC chip. The IC 131 according to an embodiment of the present disclosure is applicable to the active current compensation device 100 of various designs. The one-chip IC 131 according to an embodiment of the present disclosure has versatility as an independent module and is applicable to the current compensation device 100 of various designs.

The non-integrated circuit unit 132 according to an embodiment of the present disclosure may be modified according to the design of the active current compensation device 100.

The one-chip IC 131 may include terminals b1, b2, e1, and e2 to be connected to the non-integrated circuit unit 132. The IC 131 and the non-integrated circuit unit 132 may be combined together to function as the amplification unit 130. The combination of the IC 131 and the non-integrated circuit unit 132 may perform a function of generating an amplified signal from the output signal output from the sensing unit 120. The amplified signal may be input to the compensation unit 160.

Examples of the detailed configuration of the amplification unit 130 including the IC 131 and the non-integrated circuit unit 132 will be described below with reference to FIGS. 74, 76, and 77.

The amplification unit 130 may receive power from a power supply 400 that is distinguished from the first device 300 and/or the second device 200. The amplification unit 130 may receive the power from the power supply 400, and amplify the output signal output from the sensing unit 120 to generate an amplified current.

The power supply 400 may be a device that receives power from a power source that is independent of the first device 300 and the second device 200 and generates input power of the amplification unit 130. Alternatively, the power supply 400 may also be a device that receives power from any one of the first device 300 and the second device 200 and generates input power of the amplification unit 130.

The one-chip IC 131 may include a terminal c1 to be connected to the power supply 400, a terminal c2 to be connected to the second reference potential 602, and the terminals b1, b2, e1, and e2 to be connected to the non-integrated circuit unit 132. In other embodiments, the one-chip IC 131 may further include terminals for other functions.

The power supply 400 may supply a DC voltage Vdc, which is based on the second reference potential 602, to drive the amplification unit 130. A capacitor Cdc for providing decoupling for Vdc may be connected in parallel to the power supply 400. The capacitor Cdc may be connected outside the IC 131, and may be connected between the power terminal c1 and the terminal c2 corresponding to the second reference potential.

In the amplification unit 130, the other components other than the IC 131 may be included in the non-integrated circuit unit 132. Thus, the capacitor Cdc may be referred to as being included in the non-integrated circuit unit 132.

The compensation unit 160 may generate compensation currents IC1 and IC2 on the basis of the amplified output signal generated by the amplification unit 130. An output side of the compensation unit 160 may be connected to the high-current paths 111 and 112 to allow the compensation currents IC1 and IC2 to flow to the high-current paths 111 and 112.

According to an embodiment, the output side of the compensation unit 160 may be isolated from the amplification unit 130. For example, the compensation unit 160 may include a compensation transformer for the isolation. For example, the output signal of the amplification unit 130 may flow through a primary side of the compensation transformer, and the compensation current based on the output signal may be generated on a secondary side of the compensation transformer.

However, the present disclosure is not limited thereto. According to an embodiment, the output side of the compensation unit 160 may also be isolated from the amplification unit 130. In this case, the amplification unit 130 may not be isolated from the high-current paths 111 and 112.

In order to cancel the first currents I11 and I12, the compensation unit 160 may inject the compensation currents IC1 and IC2 into the high-current paths 111 and 112 through the two or more high-current paths 111 and 112, respectively. The compensation currents IC1 and IC2 may have the same magnitude and an opposite phase compared to the first currents I11 and I12.

Figure 73:
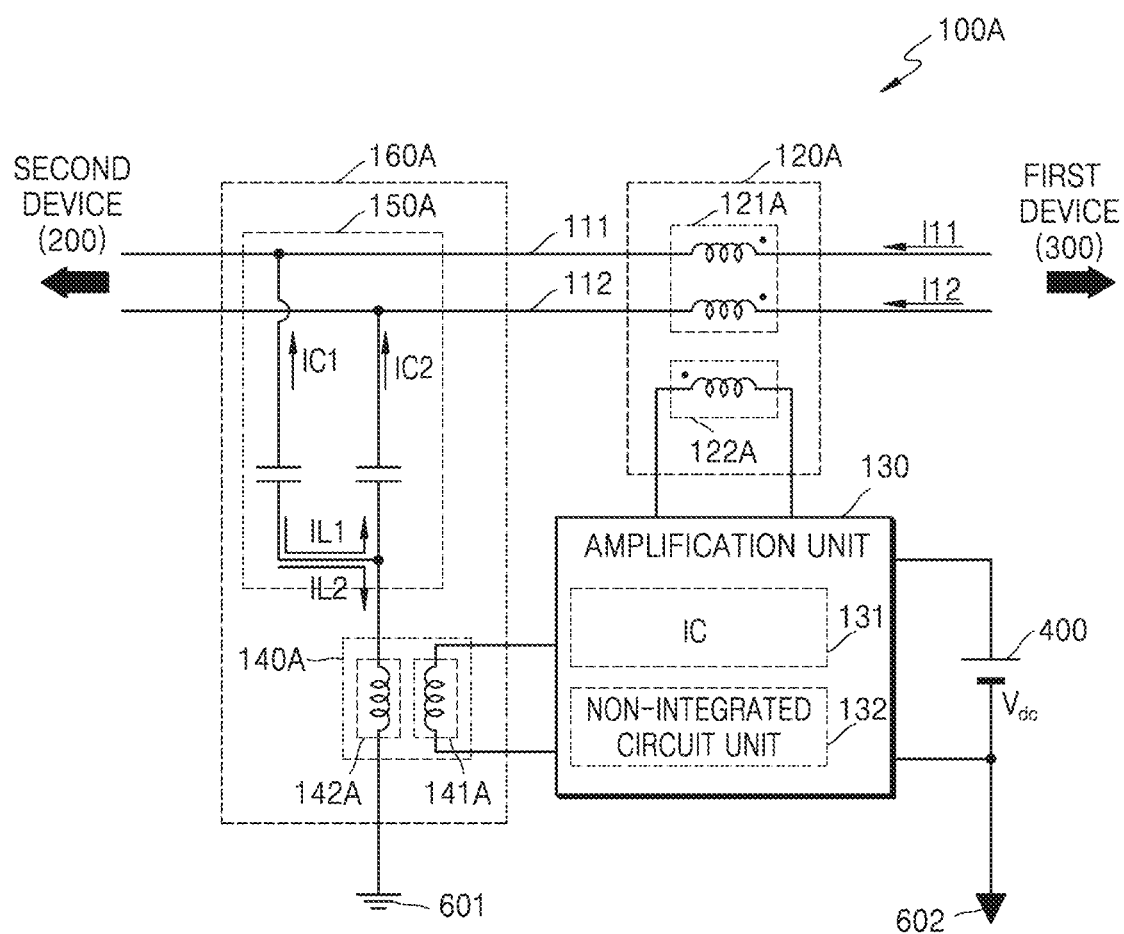
FIG. 73 illustrates a more specific example of the embodiment described with reference to FIG. 72, and schematically illustrates an active current compensation device according to an embodiment of the present disclosure.

FIG. 73 illustrates a more specific example of the embodiment described with reference to FIG. 72, and schematically illustrates an active current compensation device 100A according to an embodiment of the present disclosure. The active current compensation device 100A may actively compensate for first currents I11 and I12 (e.g., a noise current) input as a common-mode current with respect to each of two high-current paths 111 and 112 connected to the first device 300.

Referring to FIG. 73, the active current compensation device 100A may include a sensing transformer 120A, an amplification unit 130, and a compensation unit 160A.

In an embodiment, the sensing unit 120 described above may include the sensing transformer 120A. In this case, the sensing transformer 120A may be a component for sensing the first currents I11 and I12 on the high-current paths 111 and 112 in a state of being isolated from the high-current paths 111 and 112. The sensing transformer 120A may sense the first currents I11 and I12 that are noise currents input through the high-current paths 111 and 112 (e.g., power lines) from the first device 300 side.

The sensing transformer 120A may include a primary side 121A disposed on the high-current paths 111 and 112 and a secondary side 122A differentially connected to input terminals of the amplification unit 130. The sensing transformer 120A may generate an induced current, which is directed to the secondary side 122A (e.g., a secondary winding), on the basis of magnetic flux densities induced due to the first currents I11 and I12 at the primary side 121A (e.g., a primary winding) disposed on the high-current paths 111 and 112. The primary side 121A of the sensing transformer 120A may be, for example, a winding in which each of a first high-current path 111 and a second high-current path 112 is wound around one core. However, the present disclosure is not limited thereto, and the primary side 121A of the sensing transformer 120A may have a form in which the first high-current path 111 and the second high-current path 112 pass through the core.

Specifically, the sensing transformer 120A may be configured such that the magnetic flux density induced due to the first current I11 on the first high-current path 111 (e.g., a live line) and the magnetic flux density induced due to the first current I12 on the second high-current path 112 (e.g., neutral line) are overlapped (or reinforced) with each other. In this case, the second currents I21 and I22 also flow through the high-current paths 111 and 112, and thus the sensing transformer 120A may be configured such that a magnetic flux density induced due to the second current I21 on the first high-current path 111 and a magnetic flux density induced due to the second current I22 on the second high-current path 112 cancel each other. In addition, as an example, the sensing transformer 120A may be configured such that magnitudes of the magnetic flux densities, which are induced due to the first currents I11 and I12 of a first frequency band (e.g., a band having a range of 150 KHz to 30 MHz), are greater than magnitudes of the magnetic flux densities induced due to the second currents I21 and I22 of a second frequency band (for example, a band in a range of 50 Hz to 60 Hz).

As described above, the sensing transformer 120A may be configured such that the magnetic flux densities induced due to the second currents I21 and I22 may cancel each other so that only the first currents I11 and I12 may be sensed. That is, the current induced in the secondary side 122A of the sensing transformer 120A may be a current into which the first currents I11 and I12 are converted at a predetermined ratio.

For example, in the sensing transformer 120A, when a turns ratio of the primary side 121A and the secondary side 122A is 1:Nsen, and a self-inductance of the primary side 121A of the sensing transformer 120A is Lsen, the secondary side 122A may have a self-inductance of Nsen2*Lsen. In this case, the current induced in the secondary side 122A has a magnitude that is 1/Nsen times that of the first currents I11 and I12. In an example, the primary side 121a and the secondary side 122a of the sensing transformer 120a may be coupled with a coupling coefficient of Ksen.

The secondary side 122A of the sensing transformer 120A may be connected to the input terminals of the amplification unit 130. For example, the secondary side 122A of the sensing transformer 120A may be differentially connected to the input terminals of the amplification unit 130 and provide the induced current or an induced voltage to the amplification unit 130.

The amplification unit 130 may amplify the current that is sensed by the sensing transformer 120A and induced in the secondary side 122A. For example, the amplification unit 130 may amplify the magnitude of the induced current at a predetermined ratio and/or adjust a phase of the induced current.

According to various embodiments of the present disclosure, the amplification unit 130 may include a one-chip IC 131 and a non-integrated circuit unit 132 that is a component other than the IC chip.

The IC 131 may include active elements. The IC 131 may be connected to the power supply 400, which is based on the second reference potential 602, to drive the active elements. The second reference potential 602 may be distinguished from the first reference potential 601 of the current compensation device 100A (or the compensation unit 160A).

The one-chip IC 131 may include a terminal c1 to be connected to the power supply 400, a terminal c2 to be connected to the second reference potential 602, and terminals b1, b2, e1, and e2 to be connected to the non-integrated circuit unit 132.

The compensation unit 160A may be an example of the above-described compensation unit 160. In an embodiment, the compensation unit 160A may include a compensation transformer 140A and a compensation capacitor unit 150A. The amplified current amplified by the above-described amplification unit 130 flows through a primary side 141A of the compensation transformer 140A.

The compensation transformer 140A according to an embodiment may be a component for isolating the amplification unit 130 including active elements from the high-current paths 111 and 112. That is, the compensation transformer 140A may be a component for generating compensation current (in a secondary side 142A) to be injected into the high-current paths 111 and 112 on the basis of the amplified current in a state of being isolated from the high-current paths 111 and 112.

The compensation transformer 140A may include the primary side 141A differentially connected to output terminals of the amplification unit 130 and the secondary side 142A connected to the high-current paths 111 and 112. The compensation transformer 140A may induce a compensation current, which is directed toward the secondary side 142A (e.g., a secondary winding), on the basis of a magnetic flux density induced due to the amplified current flowing through the primary side 141A (e.g., a primary winding).

In this case, the secondary side 142A may be disposed on a path connecting the compensation capacitor unit 150A, which will be described below, and the first reference potential 601 of the current compensation device 100A. That is, one end of the secondary side 142A is connected to the high-current paths 111 and 112 through the compensation capacitor unit 150A, and the other end of the secondary side 142A may be connected to the first reference potential 601 of the active current compensation device 100A. Meanwhile, the primary side 141A of the compensation transformer 140A, the amplification unit 130, and the secondary side 122A of the sensing transformer 120A may be connected to the second reference potential 602, which is distinguished from the reference potential of the other components of the active current compensation device 100A. The first reference potential 601 of the current compensation device 100A according to an embodiment and the second reference potential 602 of the amplification unit 130 may be distinguished from each other.

As described above, in the current compensation device 100A according to an embodiment, the component generating the compensation current uses a reference potential (i.e., the second reference potential 602) different from that of the other components and uses the separate power supply 400, and thus, may operate in a state of being isolated from the other components, thereby improving the reliability of the active current compensation device 100A. However, the active current compensation device including the IC 131 and the non-integrated circuit unit 132 according to the present disclosure is not limited to such an isolating structure. The active current compensation device according to an embodiment of the present disclosure may not be isolated from the high-current path.

In the compensation transformer 140A according to an embodiment, when a turns ratio of the primary side 141A and the secondary side 142A is 1:Ninj, and a self-inductance of the primary side 141A of the compensation transformer 140A is Linj, the secondary side 142A may have a self-inductance of Ninj2*Linj. In this case, the current induced in the secondary side 142A has a magnitude that is 1/Ninj times that of the current (i.e., the amplified current) flowing in the primary side 141A. In an example, the primary side 141A and the secondary side 142A of the compensation transformer 140A may be coupled with a coupling coefficient of kinj.

The current converted through the compensation transformer 140A may be injected into the high-current paths 111 and 112 (e.g., power lines) through the compensation capacitor unit 150A as compensation currents IC1 and IC2. Accordingly, the compensation currents IC1 and IC2 may have the same magnitude and an opposite phase compared to the first currents I11 and I12 to cancel the first currents I11 and I12. Accordingly, a magnitude of a current gain of the amplification unit 130 may be designed to be Nsen*Ninj. However, since a magnetic coupling loss may occur in an actual situation, a target current gain of the amplification unit 130 may be designed to be higher than Nsen*Ninj.

As described above, the compensation capacitor unit 150A may provide a path through which the current generated by the compensation transformer 140A flows to each of the two high-current paths 111 and 112.

The compensation capacitor unit 150A may include Y-capacitors (Y-cap) each having one end connected to the secondary side 142A of the compensation transformer 140A and the other end connected to the high-current paths 111 and 112. For example, one ends of the two Y-caps share a node connected to the secondary side 142A of the compensation transformer 140A, and the opposite ends of the two Y-caps may have a node connected to the first high-current path 111 and the second high-current path 112.

The compensation capacitor unit 150A may allow the compensation currents IC1 and IC2 induced by the compensation transformer 140A to flow to the power line. As the compensation currents IC1 and IC2 compensate (cancel) for the first currents I11 and I12, the current compensation device 100A may reduce noise.

Meanwhile, the compensation capacitor unit 150A may be configured such that a current IL1 flowing between the two high-current paths 111 and 112 through the compensation capacitors has a magnitude less than a first threshold magnitude. In addition, the compensation capacitor unit 150A may be configured such that a current IL2 flowing between each of the two high-current paths 111 and 112 and the first reference potential 601 through the compensation capacitors has a magnitude less than a second threshold magnitude.

The active current compensation device 100A according to an embodiment may be implemented as an isolated structure by using the compensation transformer 140A and the sensing transformer 120A.

Figure 74:
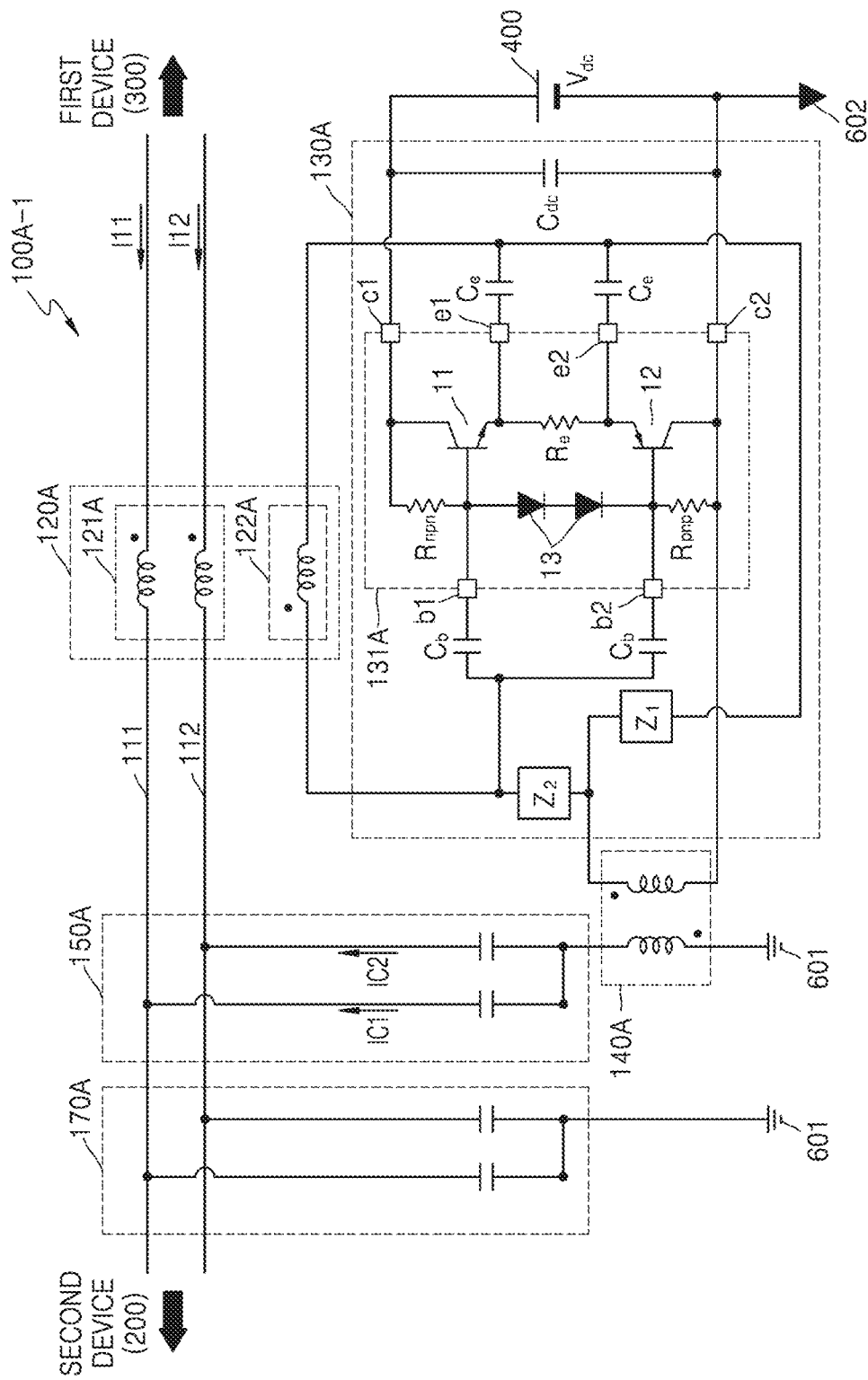
FIG. 74 illustrates a more specific example of the embodiment described with reference to FIG. 73, and schematically illustrates an active current compensation device according to an embodiment of the present disclosure.

FIG. 74 illustrates a more specific example of the embodiment described with reference to FIG. 73, and schematically illustrates an active current compensation device 100A-1 according to an embodiment of the present disclosure. The active current compensation device 100A-1, an amplification unit 130A, and an IC 131A illustrated in FIG. 74 are respectively exemplary of the active current compensation device 100A, the amplification unit 130, and the IC 131 illustrated in FIG. 73.

The active current compensation device 100A-1 according to an embodiment may include a sensing transformer 120A, the amplification unit 130A, a compensation transformer 140A, and a compensation capacitor unit 150A. In an embodiment, the active current compensation device 100A-1 may further include a decoupling capacitor unit 170A on an output side thereof (i.e., the second device 200 side). In other embodiments, the decoupling capacitor unit 170A may be omitted. Descriptions of the sensing transformer 120A, the compensation transformer 140A, and the compensation capacitor unit 150A are redundant and thus omitted.

In an embodiment, an induced current induced in a secondary side 122A by the sensing transformer 120A may be differentially input to the amplification unit 130A.

The amplification unit 130A of the active current compensation device 100A-1 according to an embodiment may include the one-chip IC 131A and a non-integrated circuit unit. In the amplification unit 130A, the other components other than the iC 131A may be included in the non-integrated circuit unit. In embodiments of the present disclosure, the IC 131A is physically implemented in one chip. Components included in the non-integrated circuit unit may be commercial discrete elements. The non-integrated circuit unit may be implemented differently depending on an embodiment. The non-integrated circuit unit may be modified so that the same one-chip IC 131A is applicable to the active current compensation device 100 of various designs.

The one-chip IC 131A may include an npn BJT 11, a pnp BJT 12, a diode 13, and one or more resistors.

In an embodiment, the one or more resistors included in the IC 131A may include Rnpn, Rpnp, and/or Re. In the IC 131A, the resistor Rnpn may connect a collector node and a base node of the npn BJT 11. In the IC 131A, then resistor Rpnp may connect a collector node and a base node of the pnp BJT 12. In the IC 131A, the resistor Re may connect an emitter node of the npn BJT 11 and an emitter node of the pnp BJT 12.

The power supply 400 may supply a DC voltage Vdc between the collector node of the npn BJT 11 and the collector node of the pnp BJT 12 to drive the amplification unit 130A. The collector node of the pnp BJT 12 may correspond to the second reference potential 602, and the collector node of the npn BJT 11 may correspond to the supply voltage Vdc of the power supply 400, which is based on the second reference potential 602.

In an embodiment, in the IC 131A, the biasing diode 13 may connect the base node of the npn BJT 11 and the base node of the pnp BJT 12. That is, one end of the diode 13 may be connected to the base node of the npn BJT 11, and the other end of the diode 13 may be connected to the base node of the pnp BJT 12.

According to embodiments of the present disclosure, the resistors Rnpn, Rpnp, and Re, and/or the biasing diode 13 included in the IC 131A may be used for DC biasing of the BJTs 11 and 12. In an embodiment of the present disclosure, the resistors Rnpn, Rpnp, and Re, and the biasing diode 13 are general-purpose components in various active current compensation devices 100 and 100A, and thus may be integrated in the one-chip IC 131A.

The one-chip IC 131A according to an embodiment of the present disclosure may include a terminal b1 corresponding to a base of the npn BJT 11 and a terminal c1 corresponding to a collector of the npn BJT 11, a terminal e1 corresponding to an emitter of the npn BJT 11, a terminal b2 corresponding to a base of the pnp BJT 12, a terminal c2 corresponding to a collector of the pnp BJT 12, and a terminal e2 corresponding to an emitter of the pnp BJT 12. However, the present disclosure is not limited thereto, and the one-chip IC 131A may further include other terminals in addition to the terminals b1, b2, c1, c2, e1, and e2.

In various embodiments, at least one of the terminals b1, b2, c1, c2, e1, and e2 of the one-chip IC 131A may be connected to the non-integrated circuit unit. The one-chip IC 131A and the non-integrated circuit unit may be combined together to function as the amplification unit 130A according to an embodiment.

In an embodiment, the non-integrated circuit unit may include capacitors Cb, Ce, and Cdc, and impedances Z1 and Z2.

According to an embodiment, the capacitors Cb of the non-integrated circuit unit may be respectively connected to the base terminals b1 and b2 of the one-chip IC 131A. The capacitors Ce of the non-integrated circuit unit may be respectively connected to the emitter terminals e1 and e2 of the IC 131A. In the outside of the IC 131A, the collector terminal c2 of the pnp BJT 12 may be connected to the second reference potential 602. In the outside of the IC 131A, the power supply 400 may be connected between both collector terminals c1 and c2. In the outside of the IC 131A, the capacitor Cdc of the non-integrated circuit unit may be connected between both collector terminals c1 and c2.

The capacitors Cb and Ce included in the non-integrated circuit unit may respectively block DC voltages at the base node and the emitter node of each of the BJTs 11 and 12. Only AC signals may be selectively coupled through the capacitors Cb and Ce.

The capacitor Cdc is a DC decoupling capacitor for the voltage Vdc, and may be connected in parallel with respect to the supply voltage Vdc of the power supply 400. Only AC signals may be coupled between both collectors of the npn BJT 11 and the pnp BJT 12 through the capacitors Cdc.

A current gain of the amplification unit 130A may be controlled by a ratio of the impedances Z1 and Z2. Z1 and Z2 may be flexibly designed depending on a turns ratio of each of the sensing transformer 120A and the compensation transformer 140A and a required target current gain. Accordingly, Z1 and Z2 may be implemented outside the one-chip IC 131A (i.e., in the non-integrated circuit unit).

A combination of the IC 131A and Cb, Ce, Cdc, Z1, and Z2 of the non-integrated circuit unit may function as the amplification unit 130A according to an embodiment. For example, the amplification unit 130A may have a push-pull amplifier structure including an npn BJT and a pnp BJT.

In an embodiment, the secondary side 122A side of the sensing transformer 120A may be connected between a base side and an emitter side of each of the BJTs 11 and 12. In an embodiment, a primary side 141A of the compensation transformer 140A may be connected between a collector side and the base side of each of the BJTs 11 and 12. The connection in the present embodiment includes an indirect connection.

In an embodiment, the amplification unit 130A may have a regression structure in which an output current is injected back into the base of each of the BJTs 11 and 12. Due to the regression structure, the amplification unit 130A may stably obtain a constant current gain for operating the active current compensation device 100A-1.

For example, when an input voltage of the amplification unit 130A has a positive swing of greater than zero due to a noise signal, the npn BJT 11 may operate. In this case, the operating current may flow through a first path passing through the npn BJT 11. When the input voltage of the amplification unit 130A has a negative swing of less than zero due to a noise signal, the pnp BJT 12 may operate. In this case, the operating current may flow through a second path passing through the pnp BJT 12.

In the IC 131A, an operating point of each of the BJTs may be controlled through the resistors Rnpn, Rpnp, and Re. The resistors Rnpn, Rpnp, and Re may be designed according to the operating point of the BJT.

According to an embodiment of the present disclosure, elements having temperature characteristics may be integrated in the one-chip IC 131A. According to an embodiment, the npn BJT 11, the pnp BJT 12, the biasing diode 13, Rnpn, Rpnp, and Re may be integrated into the one-chip IC 131A. When the elements are integrated into a one-chip, a size of the amplification unit 130A may be minimized as compared with a case in which discrete elements are used. In the present document, the elements having temperature characteristics may refer to elements having certain circuit characteristics in a wide temperature range, for example, from extremely low to high temperatures. The elements having temperature characteristics may refer to elements in which element characteristics vary according to a temperature that changes in a wide temperature range. According to an embodiment of the present disclosure, by embedding the active elements having temperature characteristics in the one-chip IC 131A, it is possible to implement the one-chip IC 131A having constant (or stable) circuit characteristics even when a temperature changes. According to an embodiment of the present disclosure, it is possible to implement the amplification unit 130A and the active current compensation device 100A-1, which exhibit constant performance even when a temperature changes, by embedding the active elements having temperature characteristics in the one-chip IC 131A. That is, the one-chip IC 131A may be designed such that the amplification unit 130A exhibits constant performance even when a temperature changes. Here, the expression "the amplification unit 130A exhibits constant performance" is used as a meaning including that the amplification unit 130A maintains stable performance in a predetermined range.

In addition, according to an embodiment of the present disclosure, a temperature may be shared by the elements (e.g., the BJTs 11 and 12, the diode 13, Re, and the like) having temperature characteristics. Accordingly, characteristics according to a temperature may be easily predicted through, for example, simulation or the like. Thus, it is possible to design the amplification unit 130A that is controllable and predictable even when a temperature changes. On the other hand, when discrete elements are used as the BJTs, the diode, and the resistors, since temperature characteristics of the elements may be different, it may be difficult to predict the operation of the amplification unit.

In addition, according to an embodiment of the present disclosure, even when the number of semiconductor devices increases, the size and production cost of the IC 131A or the active current compensation device 100A may increase insignificantly. Accordingly, the one-chip IC 131A and the active current compensation device 100A may be easily mass-produced.

An inductor, the capacitors (e.g., Cb, Ce, and Cdc), Z1, and Z2 of the non-integrated circuit unit are discrete components, and may be implemented around the one-chip IC 131A.

Capacitance of each of the capacitors Cb, Ce, and Cdc required for an AC signal to couple through each of the capacitors Cb, Ce, and Cdc may be several $\mu F$ or more (e.g., 10 $\mu F$). Such a capacitance value is difficult to be implemented in the one-chip IC, and thus the capacitors Cb, Ce, and Cdc may be implemented outside the IC 131A, that is, in the non-integrated circuit unit.

Depending on the design of the non-integrated circuit unit, the one-chip IC 131A may be used for the first device 300 (or the second device 200) of various power systems. For example, the one-chip IC 131A may be independent of a power rating of the first device 300, and the non-integrated circuit unit may be designed according to the power rating of the first device 300. For example, values of impedances Z1 and Z2 may be determined on the basis of a turns ratio of each of the sensing transformer 120A and the compensation transformer 140A and a target current gain of the amplification unit 130A. A configuration of the one-chip IC 131A may be independent of the turns ratio and the target current gain.

The impedances Z1 and Z2 may be implemented outside the IC, i.e., in the non-integrated circuit unit, to achieve design flexibility for various power systems or various first devices 300. Z1 and Z2 may be flexibly designed depending on the turns ratio of each of the sensing transformer 120A and the compensation transformer 140A and the required target current gain. It is possible to design various current compensation devices that allow the same IC 131A to be applied to various power systems by adjusting the impedances Z1 and Z2.

In particular, the size and impedance characteristics of the sensing transformer 120A should vary depending on a maximum rated current of the first device 300. Thus, in order to make a ratio of an injected current to a sensed noise current uniform in a wide frequency range, a proper design of Z1 and Z2 is required. Z1 and Z2 may be designed so that the ratio of the injected current to the sensed noise current becomes 1 in a wide frequency range by adjusting the turns ratio of each of the sensing transformer 120A and the compensation transformer 140A and a ratio of Z1 and Z2. To this end, the impedances Z1 and Z2 may be implemented outside the IC 131A for design flexibility. In an embodiment, Z1 may be a series connection of a resistor R1 and a capacitor C1, and Z2 may be a series connection of a resistor R2 and a capacitor C2. Since C1 and C2 are additionally implemented in series next to R1 and R2 respectively, the ratio of the injected current to the sensed noise current in a low-frequency range may exhibit better performance.

The IC 131A according to various embodiments of the present disclosure is designed in consideration of scalability, and thus may be used in various types of active current compensation devices. The same type of IC 131A may be used in various embodiments, and the non-integrated circuit unit may be designed differently depending on an embodiment.

Meanwhile, the active current compensation device 100A-1 may further include the decoupling capacitor unit 170A on an output side thereof (i.e., the second device 200 side). One ends of capacitors included in the decoupling capacitor unit 170A may be connected to a first high-current path 111 and a second high-current path 112, respectively. The opposite end of each of the capacitors may be connected to the first reference potential 601 of the current compensation device 100A-1.

The decoupling capacitor unit 170A may prevent the performance of outputting the compensation current of the active current compensation device 100A-1 from being significantly changed according to a change in an impedance value of the second device 200. An impedance ZY of the decoupling capacitor unit 170A may be designed to have a value less than a value specified in a first frequency band which is subjected to a decrease in noise reduction. As the decoupling capacitor unit 170A is coupled, the current compensation device 100A-1 may be used as an independent module in any system.

According to an embodiment, the decoupling capacitor unit 170A may be omitted from the active current compensation device 100A-1.

Figure 75:
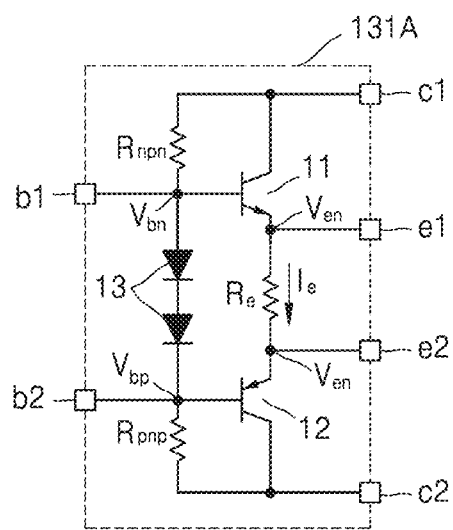
FIG. 75 schematically illustrates a one-chip IC according to an embodiment of the present disclosure.

FIG. 75 schematically illustrates the one-chip IC 131A according to an embodiment of the present disclosure. The one-chip IC 131A is the same as described above and thus will be omitted.

A DC bias circuit for BJT should be designed to have a constant DC operating point as much as possible even when a temperature changes. According to embodiments of the present disclosure, a DC bias circuit for the BJTs 11 and 12 may be designed to have a stable DC operating point in a certain range even when a temperature changes.

Referring to FIG. 75, the biasing diode 13 and the resistors Rnpn, Rpnp, and Re may be used in the DC bias design. In order to bias the BJT, a forward voltage of the biasing diode 13 may have to be equal to or slightly higher than twice a base-emitter voltage of the BJT. In an embodiment of the present disclosure, the biasing diode 13 and the resistor Re may prevent a thermal runaway of the BJTs 11 and 12.

In general, when a current flows through a BJT and heat is generated, a current gain of the BJT increases, which in turn generates more heat. The thermal runaway indicates a phenomenon in which the BJT is damaged by continuously increasing heat generated due to such a positive feedback.

According to an embodiment of the present disclosure, a DC bias current may be adjusted and the thermal runaway may be prevented from occurring by providing the resistor Re between the emitter node of the npn BJT 11 and the emitter node of the pnp BJT 12. Since the resistor Re is increased as the temperature increases, the increase in current Ie may be prevented. Accordingly, the resistor Re may act as a negative feedback element with respect to the current Ie or heat.

According to an embodiment of the present disclosure, by providing the diode 13 between the base node of the npn BJT 11 and the base node of the pnp BJT 12, the thermal runaway may be prevented from occurring. The diode 13 has a characteristic of decreasing the forward voltage compared to a forward current as a temperature increases. Accordingly, in an embodiment of the present disclosure, the diode 13 formed between the base terminals of the BJTs 11 and 12 may serve to lower the voltage between the base terminals thereof as a temperature increases. As a result, the BJTs 11 and 12 may be turned on relatively less easily when the diode 13 is present than when the diode 13 is not present. Accordingly, an increase of the current Ie in response to an increase in temperature may be relatively reduced. Thus, the diode 13 may act as a negative feedback element for the current Ie.

As described above, since the positive feedback according to a temperature and the negative feedback by resistor Re and the diode 13 act together on the BJTs 11 and 12, the BJTs 11 and 12 may maintain a constant current range even when a temperature changes.

When DC bias voltages in the npn BJT 11 and the pnp BJT 12 are well balanced, the DC emitter current Ie may be obtained as in Equation 1 below.

$$I_e \approx \frac{V_{dc} - 2V_{be} - 2R_{bias}I_d}{R_e + \frac{2R_{bias}}{h_{fe} + 1}} \quad \text{[Equation 1]}$$

In Equation 1, Vdc is a voltage supplied between the collector of the npn BJT 11 and the collector of the pnp BJT 12, Id is a forward bias current of the diode 13, and Vbe is a base-emitter voltage of the BJT, and hfe is a current gain of the BJT. In addition, in an embodiment, Rbias=Rnpn=Rpnp.

In an embodiment, values of Id and Vbe may be designed according to IV (current-voltage) characteristics of the diode 13 and the BJTs 11 and 12 in the customized IC 131A.

Figure 76:
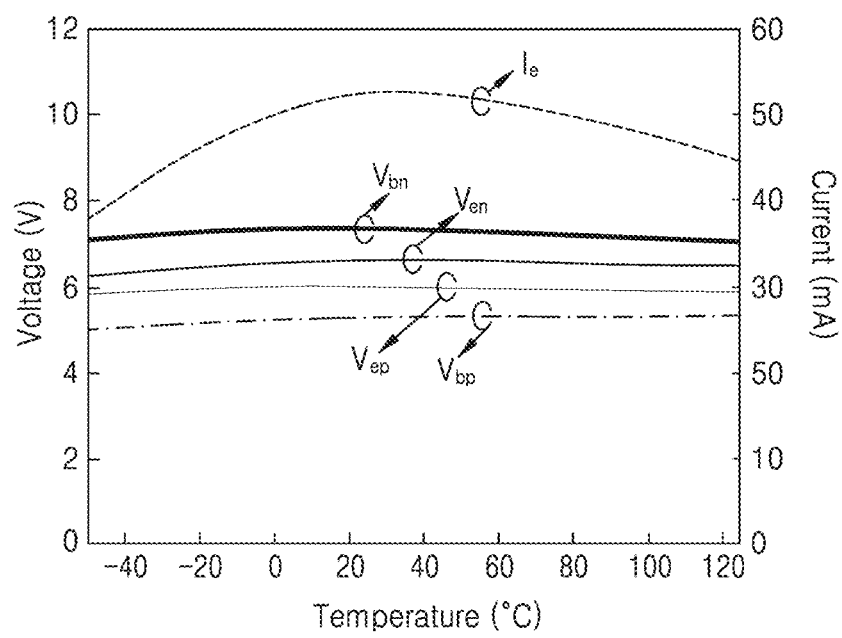
FIG. 76 illustrates simulation results of bias current and voltage of the one-chip IC shown in FIG. 75 according to a temperature.

FIG. 76 illustrates simulation results of bias current and voltage of the one-chip IC 131A shown in FIG. 75 according to a temperature. The graph shown in FIG. 76 shows a DC simulation result of the IC 131A according to a temperature change in a range of −50° C. to 125° C.

Ie is a DC emitter current, Vbn is a voltage of the base node of the npn BJT 11 with respect to the second reference potential 602 (i.e., DC ground reference), Ven is a voltage of the emitter node of the npn BJT 11 with respect to the second reference potential 602, Vbp is a voltage of the base node of the pnp BJT 12 with respect to the second reference potential 602, and Vep is a voltage of the emitter node of the pnp BJT 12 with respect to the second reference potential 602.

Referring to FIG. 76, it can be seen that Vbe (=Vbn−Ven) of the npn BJT 11 and Vbe (=Vep−Vbp) of the pnp BJT 12 are maintained at about 0.75 V in an entire temperature range. In addition, the DC bias voltage is well balanced at around 6 V, which is half of Vdc. That is, a distribution of each node voltage Vbn, Ven, Vbp, or Vep according to a temperature may be constant. As the distribution of each node voltage according to a temperature change is constant, this may advantageously affect the performance of the active current compensation device 100A-1.

According to an embodiment, it can be seen that the current Ie is maintained at a constant level in a range of about 40 to 50 mA even when the temperature is increased up to 125° C. The current Ie does not increase beyond a certain range while the temperature is increased but rather decreases slightly at 40° C. or more. In other words, it can be seen that the thermal runaway does not occur since the current Ie does not continuously increase even when the temperature is increased.

As a result, due to the fact that the bias resistor Re and the diode 13 is embedded into the one-chip IC 131A, the thermal runaway may be prevented from occurring even without using additional discrete components.

On the other hand, when the elements (e.g., the BJTs 11 and 12, the diode 13, resistor Re, and the like) having temperature characteristics are discrete elements, it is difficult for the temperature to be shared by the elements. In this case, the temperature characteristics of the resistors, the diode 13, and the BJTs 11 and 12 may be different from each other. Accordingly, it may be difficult to predict and control the bias voltage and current according to the actual temperature. In addition, in the case of configuring the amplification unit with commercial discrete elements, it is difficult to freely design I-V (current-voltage) characteristics, and thus the optimum design for the active current compensation device may be difficult to achieve. In addition, when discrete elements are used, production costs can be continuously increased according to the number of semiconductor devices.

In embodiments of the present disclosure, as the amplification unit of the active current compensation device includes the one-chip IC 131A, the emitter current Ie and the voltage may be adjusted as desired in consideration of the characteristics of a semiconductor device. In embodiments of the present disclosure, since elements having temperature characteristics are formed in the one-chip IC and a temperature is shared thereby, characteristics of the elements according to a temperature may be easily predicted. In the case of the one-chip IC 131A according to embodiments of the present disclosure, an increase in size due to an increase in the number of semiconductor devices may be insignificant, and an increase in costs due to mass production may also be insignificant.

FIG. 77 schematically illustrates a configuration of an active current compensation device 100A-2 according to an embodiment of the present disclosure. Hereinafter, descriptions of contents overlapping with contents described with reference to FIGS. 73 to 76 will be omitted.

Referring to FIG. 77, the active current compensation device 100A-2 may actively compensate for first currents I11, I12, and I13 input as a common-mode current with respect to each of first through third high-current paths 111, 112, and 113 connected to the first device 300.

To this end, the active current compensation device 100A-2 may include first through third high-current paths 111, 112, and 113, a sensing transformer 120A-2, an amplification unit 130A, a compensation transformer 140A, and a compensation capacitor unit 150A-2.

When it is described in comparison with the active current compensation devices 100A and 100A-1 according to the above-described embodiments, the active current compensation device 100A-2 according to the embodiment described with reference to FIG. 77 includes first through fourth high-current paths 111, 112, and 113, and thus has differences in the sensing transformer 120A-2 and the compensation capacitor unit 150A-2. Thus, the active current compensation device 100A-2 will now be described below focusing on differences described above.

The active current compensation device 100A-2 may include a first high-current path 111, a second high-current path 112, and a third high-current path 113 that are distinguished from each other. According to an embodiment, the first high-current path 111 may be an R-phase power line, the second high-current path 112 may be an S-phase power line, and the third high-current path 113 may be a T-phase power line. The first currents I11, I12, and I13 may be input as a common-mode current with respect to each of the first high-current path 111, the second high-current path 112, and the third high-current path 113.

A primary side 121A-2 of the sensing transformer 120A-2 may be disposed in each of the first to third high-current paths 111 to 113 to generate an induced current in a secondary side 122A-2. Magnetic flux densities generated by the sensing transformer 120A-2 due to the first currents I11, I12, and I13 on the first through third high-current paths 111, 112, and 113 may be reinforced with each other.

The amplification unit 130A of the active current compensation device 100A-2 according to the embodiment described with reference to FIG. 77, may correspond to the amplification unit 130A described above.

The compensation capacitor unit 150A-2 may provide paths through which compensation currents IC1, IC2, and IC3 generated by the compensation transformer 140A flow to the first to third high-current paths 111 to 113, respectively.

The active current compensation device 100A-2 may further include a decoupling capacitor unit 170A-2 on an output side thereof (i.e., the second device 200 side). One ends of capacitors included in the decoupling capacitor unit 170A-2 may be connected to the first high-current path 111, the second high-current path 112, and the third high-current path 113, respectively. The opposite end of each of the capacitors may be connected to the first reference potential 601 of the current compensation device 100A-2.

The decoupling capacitor unit 170A-2 may prevent the performance of outputting the compensation current of the active current compensation device 100A-2 from being significantly changed according to a change in an impedance value of the second device 200. An impedance ZY of the decoupling capacitor unit 170A-2 may be designed to have a value less than a value specified in a first frequency band for which noise reduction is to be performed. As the decoupling capacitor unit 170A-2 is coupled, the current compensation device 100A-2 may be used as an independent module in any system (e.g., a three-phase three-wire system).

According to an embodiment, the decoupling capacitor unit 170A-2 may be omitted from the active current compensation device 100A-2.

The active current compensation device 100A-2 according to the embodiment described above may be used to compensate (or cancel) for the first currents I11, I12, and I13 traveling from a load of a three-phase three-wire power system to a power source.

Of course, according to the technical spirit of the present disclosure, the active current compensation device according to various embodiments may be modified to be also applicable to a three-phase four-wire system.

The amplification unit 130A according to an embodiment of the present disclosure is applicable to the single-phase (two-wire) system shown in FIG. 74, the three-phase three-wire system shown in FIG. 77, and a three-phase four-wire system not shown in the drawing. Since a one-chip IC 131A is applicable to several systems, the IC 131A may have versatility in the active current compensation devices according to various embodiments.

The particular implementations shown and described herein are illustrative examples of the embodiments and are not intended to otherwise limit the scope of the embodiments in any way. For the sake of brevity, conventional electronics, control systems, software development and other functional aspects of the systems may not be described in detail. Further, the connecting lines or connectors shown in the drawings are intended to represent example functional relationships and/or physical or logical couplings between the various elements. It should be noted that many alternative or additional functional relationships, physical connections, or logical connections may be present in a practical device.

An active current compensation device according to various embodiments of the present disclosure configured as described above may reduce the price, area, volume, weight, and heat generation in a high-power system as compared with a passive filter configured with a CM choke.

Further, an active current compensation device according to various embodiments of the present disclosure may detect a failure or malfunction of an active circuit unit.

Further, in various embodiments of the present disclosure, one IC chip in which an active circuit unit and a malfunction detection unit are embedded together may be provided. By embedding the malfunction detection unit in the chip in which the active circuit unit is integrated, the size and price may be reduced as compared with a case of separately configuring the malfunction detection unit using commonly used commercial elements.

Further, by integrating the active circuit unit and the malfunction detection unit into the single IC chip, the IC chip may have versatility as an independent component and may be commercialized.

In addition, a current compensation device including the above-described IC chip may also be manufactured as an independent module and commercialized. The current compensation device may detect a malfunction as an independent module regardless of the characteristics of a peripheral electrical system.

An active current compensation device according to various embodiments of the present disclosure configured as described above is applicable to any of various systems by including an embedded power conversion unit.

In various embodiments of the present disclosure, by embedding an active circuit unit and the power conversion unit in one IC chip, the IC chip may have versatility as an independent component and may be commercialized.

In addition, the current compensation device including the above-described IC chip may also be manufactured as an independent module and commercialized. The active circuit unit included in the current compensation device may stably operate regardless of the characteristics of a peripheral electrical system.

An active current compensation device according to various embodiments of the present disclosure configured as described above may reduce the price, area, volume, weight, and heat generation in a high-power system as compared with a passive filter configured with a CM choke.

Further, an active current compensation device according to various embodiments of the present disclosure is minimized in size as compared with a case in which discrete semiconductor devices are included.

Further, an integrated circuit unit according to various embodiments of the present disclosure may be universally applied to active current compensation devices of various designs.

Further, the active current compensation device including the integrated circuit unit according to various embodiments of the present disclosure may be used in various power electronic products regardless of power rating. Accordingly, the active current compensation device according to various embodiments of the present disclosure is expandable to a high power/high noise system.

Further, the active current compensation device including the integrated circuit unit according to various embodiments of the present disclosure may be easily mass-produced.

Further, the active current compensation device and/or the one-chip integrated circuit unit according to various embodiments of the present disclosure may have versatility as an independent module and may be commercialized.

An active current compensation device according to embodiments of the present disclosure configured as described above may reduce the price, area, volume, weight, and heat generation in a high-power system as compared with a passive filter configured with a CM choke.

Further, an active current compensation device according to embodiments of the present disclosure may prevent a thermal runaway phenomenon. The active current compensation device according to embodiments of the present disclosure may maintain a current in a constant range against a change in temperature by utilizing both positive and negative feedback for a temperature of a BJT.

Further, in an active current compensation device according to embodiments of the present disclosure, elements having temperature characteristics are formed in a one-chip IC and a temperature is shared thereby, and thus characteristics of the elements according to a temperature may be easily predicted.

Accordingly, it is possible to design an active circuit unit (or an amplification unit) that is controllable and predictable even when the temperature changes.

An amplification unit according to embodiments of the present disclosure includes a one-chip IC, and thus may be designed so that current-voltage (I-V) characteristics are controllable as compared with a case of being configured with commercial discrete elements. That is, the one-chip IC according to embodiments of the present disclosure may be custom designed. That is, current and voltage in the one-chip IC may be controllable.

Further, even when the one-chip IC and the active current compensation device including the same according to embodiments of the present disclosure are mass-produced, an increase in production cost may be insignificant. In addition, an increase in size due to an increase in the number of semiconductor devices may be insignificant.

Of course, the scope of the present disclosure is not limited by these effects.

All embodiments described herein may be applied in combination with each other.

Although the present disclosure has been described with reference to one embodiment illustrated in the accompanying drawings, it will be understood that this is merely exemplary, and that various modifications and equivalent other embodiments will be possible therefrom by those of ordinary skill in the art. Accordingly, the true protection scope of the present disclosure should be defined only by the appended claims.

What is claimed is:

1. A divided active electromagnetic interference filter module comprising:
    a first substrate;
    a first element group disposed on the first substrate, the first element group including a noise sensor configured to sense electromagnetic noise; and
    a second substrate different from and coupled to the first substrate;
    a second element group disposed on the second substrate, the second element group including an compensator configured to generate a compensation signal for the electromagnetic noise,
    wherein the first substrate and the second substrate are arranged to be perpendicular to each other.

2. The divided active electromagnetic interference filter module of claim 1, further comprising:
    a first electrical connection part interposed between the first substrate and the second substrate to electrically connect at least a portion of the first substrate and at least a portion of the second substrate.

3. The divided active electromagnetic interference filter module of claim 2, further comprising a second electrical connection part coupled to the second substrate and provided to be coupled to the first electrical connection part.

4. The divided active electromagnetic interference filter module of claim 3, wherein the second electrical connection part is provided in-line along a border of the second substrate.

5. The divided active electromagnetic interference filter module of claim 2, further comprising an encapsulation structure provided to separate the second substrate and the second element group from an outside.

6. The divided active electromagnetic interference filter module of claim 1, further comprising:
    at least two through lines electrically connected to at least two power lines.

7. The divided active electromagnetic interference filter module of claim 6, wherein the noise sensor comprises a sensing transformer configured to sense the electromagnetic noise and generate an induced signal, and wherein the sensing transformer comprises:
    at least two reference windings electrically connected to the through lines respectively; and
    a sensing winding formed in the same core as the reference windings.

8. The divided active electromagnetic interference filter module of claim 7, wherein the reference windings and the sensing winding are disposed on the first substrate.

9. The divided active electromagnetic interference filter module of claim 6, wherein the second element group further comprises:
    an active circuit electrically connected to the noise sensor and configured to generate an amplified signal from the induced signal.

10. The divided active electromagnetic interference filter module of claim 9, wherein the compensator is electrically connected to the active circuit and configured to generate the compensation signal based on the amplified signal.

11. The divided active electromagnetic interference filter module of claim 9, wherein the second element group further comprises:
    a transmission circuit, electrically connected to the active circuit and including a compensation capacitor, configured to provide a path for the compensation signal through the through lines.

12. The divided active electromagnetic interference filter module of claim 9, wherein the active circuit and the compensator are disposed on the second substrate.

13. The divided active electromagnetic interference filter module of claim 11, wherein the active circuit, the compensator and the transmission circuit are disposed on the second substrate.

14. The divided active electromagnetic interference filter module of claim 6, wherein the through lines pass through the first substrate and comprise a patterned wiring thin film.

15. The divided active electromagnetic interference filter module of claim 1, wherein the first element group and the second element group are in perpendicular arrangement with respect to each other.

* * * * *